(12) United States Patent
Zhao et al.

(10) Patent No.: US 11,846,024 B2
(45) Date of Patent: Dec. 19, 2023

(54) LASER-ASSISTED METAL-ORGANIC CHEMICAL VAPOR DEPOSITION DEVICES AND METHODS OF USE THEREOF FOR SUPPRESSING BACKGROUND CARBON INCORPORATION

(71) Applicant: Ohio State Innovation Foundation, Columbus, OH (US)

(72) Inventors: Hongping Zhao, Columbus, OH (US); Zhaoying Chen, Columbus, OH (US); Yuxuan Zhang, Columbus, OH (US)

(73) Assignee: Ohio State Innovation Foundation, Columbus, OH (US)

( * ) Notice: Subject to any disclaimer, the term of this patent is extended or adjusted under 35 U.S.C. 154(b) by 344 days.

(21) Appl. No.: 17/201,815

(22) Filed: Mar. 15, 2021

(65) Prior Publication Data

US 2022/0290301 A1  Sep. 15, 2022

(51) Int. Cl.
| | | |
|---|---|---|
| *C23C 16/48* | (2006.01) | |
| *H01L 21/67* | (2006.01) | |
| *C23C 16/46* | (2006.01) | |
| *H01L 21/02* | (2006.01) | |

(52) U.S. Cl.
CPC ............ *C23C 16/483* (2013.01); *C23C 16/46* (2013.01); *H01L 21/0254* (2013.01); *H01L 21/0262* (2013.01); *H01L 21/67023* (2013.01); *H01L 21/67115* (2013.01); *H01L 21/67207* (2013.01)

(58) Field of Classification Search
CPC ....... C23C 16/483; C23C 16/46; C23C 16/34; C23C 16/45508; C23C 16/45565; C23C 16/4584; H01L 21/0254; H01L 21/0262; H01L 21/67023; H01L 21/67115; H01L 21/67207; H01L 21/02521; H01L 21/67109; H01L 21/67103
See application file for complete search history.

(56) References Cited

U.S. PATENT DOCUMENTS

| | | | |
|---|---|---|---|
| 4,726,320 A | | 2/1988 | Ichikawa |
| 5,810,923 A | * | 9/1998 | Yano ................. H01L 21/02197 |
| | | | 257/E21.271 |
| 10,233,544 B2 | * | 3/2019 | Lu ........................... C22C 11/00 |
| 11,486,039 B2 | * | 11/2022 | Zhao ....................... C30B 25/14 |
| 2010/0300359 A1 | | 12/2010 | Armour et al. |
| 2011/0033638 A1 | | 2/2011 | Ponnekanti et al. |
| 2013/0243971 A1 | | 9/2013 | Thompson et al. |
| 2016/0203972 A1 | | 7/2016 | Sundaram et al. |
| 2016/0340783 A1 | | 11/2016 | Lu et al. |

(Continued)

FOREIGN PATENT DOCUMENTS

JP  H02156086 A  6/1990

OTHER PUBLICATIONS

Zhang et al., "Laser-Assisted Metal-Organic Chemical Vapor, Deposition of Gallium Nitride", Physical Status Solidi. RRL, 2100202, 8 pages, May 16, 2021 (Year: 2021).*

(Continued)

*Primary Examiner* — Dale E Page
*Assistant Examiner* — Quovaunda Jefferson
(74) *Attorney, Agent, or Firm* — Meunier Carlin & Curfman LLC

(57) ABSTRACT

Disclosed herein are laser-assisted metal-organic chemical vapor deposition devices and methods of use thereof for suppressing background carbon incorporation.

20 Claims, 26 Drawing Sheets

(56) References Cited

U.S. PATENT DOCUMENTS

| | | |
|---|---|---|
| 2017/0226636 A1 | 8/2017 | Xiao |
| 2021/0355581 A1 | 11/2021 | Zhao et al. |

OTHER PUBLICATIONS

Ban VS., Mass spectrometric studies of vapor-phase crystal growth II, GaN. J. Electrochem. Soc. 1972, 119, 761-765.

Golgir HR et al. Fast Growth of GaN Epilayers via Laser-Assisted Metal-Organic Chemical Vapor Deposition for Ultraviolet Photodetector Applications, ACS Appl. Mater. Interfaces 2017, 9, 21539-21547.

Golgir HR et al. Low-temperature growth of crystalline gallium nitride films using vibrational excitation of ammonia molecules in laser-assisted metalorganic chemical vapor deposition. Cryst. Growth Des. 2014, 14, 6248-6253.

Lyons JL et al. Carbon impurities and the yellow luminescence in GaN, Appl. Phys. Lett. 97, 2010, 152108.

Matsuoka T et al. Optical bandgap energy of wurtzite InN, Applied Physics Letters 2002, 81(7), 1246-1248.

Mishra UK et al. AlGaN/GaN HEMTs—an overview of device operation and applications, Proceedings of the IEEE 2002, 90(6), 1022-1031.

Mukai T et al. Characteristics of InGaN-based UV/blue/green/amber/red light-emitting diodes, Japanese Journal of Applied Physics 1999, 38(7R), 3976.

Nagashima T et al. Structural and optical properties of carbon-doped AlN substrates grown by hydride vapor phase epitaxy using AlN substrates prepared by physical vapor transport[J]. Applied Physics Express, 2012, 5(12): 125501.

Ohta H et al. "5.0 kV breakdown-voltage vertical GaN p-n junction diodes," Jpn. J. Appl. Phys. 57(4S), 2018, 04FG09.

Usikov A et al. New results on HVPE growth of AlN, GaN, InN and their alloys, Phys. Stat. Sol.(c), 2008, 5(6), 1825-1828.

Wang X et al. Molecular beam epitaxy growth of GaN, AlN and InN, Progress in Crystal Growth and Characterization of Materials 2004, 48, 42-103.

Watson IM. Metal organic vapour phase epitaxy of AlN, GaN, InN and their alloys: A key chemical technology for advanced device applications, Coordination Chemistry Reviews 2013, 257(13-14), 2120-2141.

White AH et al. The decomposition of ammonia at high temperatures, J. Am. Chem. Soc. 1905, 27, 373-386.

Wu J. When group-III nitrides go infrared: New properties and perspectives, Journal of Applied Physics 2009, 106(1), 011101.

Wu S et al. Unambiguous Identification of Carbon Location on the N Site in Semi-insulating GaN. Physical review letters, 2018, 121(14): 145505.

Yang J et al. Emission efficiency enhanced by reducing the concentration of residual carbon impurities in InGaN/GaN multiple quantum well light emitting diodes[J]. Optics Express, 2016, 24(13): 13824-13831.

Zare RN. Laser control of chemical reactions. Science 1998, 279, 1875.

Zhang Y et al. Metalorganic Chemical Vapor Deposition Gallium Nitride with Fast Growth Rate for Vertical Power Device Applications, Phys. Status Solidi A Jan. 5, 2021, 2000469.

International Search Report and Written Opinion dated May 16, 2022 in International Application No. PCT/US22/12656 (18 pages).

Golgir. Laser-assisted Metal Organic Chemical Vapor Deposition of Gallium Nitride, Dissertation, 2017.

Zhang et al. Laser-Assisted Metal-Organic Chemical Vapor Deposition of Gallium Nitride, Phys. Status Solidi (RRL) 2021, 15, 2100202.

\* cited by examiner

LASER-ASSISTED METAL-ORGANIC CHEMICAL VAPOR DEPOSITION DEVICES AND METHODS OF USE THEREOF FOR SUPPRESSING BACKGROUND CARBON INCORPORATION

STATEMENT OF GOVERNMENT SUPPORT

This invention was made with government support under Grant No. DE-AR0001036 awarded by U.S. Department of Energy. The government has certain rights in the invention.

BACKGROUND

Semiconductor material systems are of interest for both optoelectronic and power electronic device applications. The fabrication of many semiconductor films mainly relies on epitaxy technology. Epitaxy methods include, for example, hydride vapor phase epitaxy (HYPE), molecular beam epitaxy (MBE), and metal-organic chemical vapor deposition (MOCVD). The issue of background C impurity in nitride-based semiconductors represents one of the key bottlenecks for advancing device technologies. Therefore, methods for minimizing background C impurity in nitride-based semiconductors are needed. The devices and methods discussed herein address these and other needs.

SUMMARY

In accordance with the purposes of the disclosed devices, methods, and systems as embodied and broadly described herein, the disclosed subject matter relates to Laser-assisted metal-organic chemical vapor deposition devices and methods of use thereof. Also disclosed herein are methods of use of the devices described herein.

For example, described herein are laser-assisted metal-organic chemical vapor deposition (MOCVD) devices, the devices comprising: a wall defining a chamber; a set of laser windows, wherein each of the laser windows defines an exterior face, an interior face opposite and spaced apart from the exterior face, and an optical path extending between the interior face and the exterior face; wherein each of the laser windows is disposed within the wall such that the interior face further defines the chamber; a set of conduits, wherein each of the conduits defines an inlet, an outlet opposite and spaced apart from the inlet, and a path for fluid flow extending from the inlet to the outlet; and wherein, when the device is assembled together with a rotatable substrate support surface disposed within the chamber and a laser device for producing a laser beam: at least one of the set of laser windows is configured such that the interior face of the laser window directs the laser beam from the laser device across the chamber in a plane that is above and substantially parallel to the rotatable substrate support surface disposed within the chamber, wherein the laser beam is disposed above the rotatable substrate support surface by a distance of 10 mm or less; and the outlets of the set of conduits are configured to introduce a first precursor and a second precursor into the chamber toward the rotatable substrate support surface, such that the first precursor and the second precursor flow through the laser beam within the chamber prior to reaching the rotatable substrate support surface.

In some examples, the first precursor is a V-group precursor and the second precursor is a III-group precursor.

In some examples, the outlets of the set of conduits are configured to introduce the first precursor and the second precursor substantially perpendicular to a central axis of the of laser beam within the chamber.

In some examples, the devices further comprise a source distributor, wherein the set of conduits are defined by the source distributor. In some examples, the outlets of the set of conduits are evenly spaced throughout the source distributor.

In some examples, the set of conduits comprise a set of first conduits and a set of second conduits, the outlets of the set of first conduits being configured to introduce the first precursor into the chamber toward the rotatable substrate support surface, the outlets of the set of second conduits being configured to introduce the second precursor into the chamber toward the rotatable substrate support surface.

In some examples, the laser beam is disposed above the rotatable substrate support surface by a distance of 5 mm or less.

In some examples, the set of laser windows comprises a plurality of laser windows positioned within the wall, wherein the plurality of laser windows are spaced around the periphery of the chamber. In some examples, the plurality of laser windows are evenly spaced around the periphery of the chamber. In some examples, each laser window is disposed opposite another laser window across the chamber. In some examples, at least one of the set of laser windows is configured such that the interior face of the laser window receives the laser beam after it has traversed the chamber.

In some examples, the devices further comprise a laser dumper configured to receive the laser beam after is has traversed the laser window.

In some examples, the devices further comprise a laser device for producing the laser beam.

Also disclosed herein are laser-assisted metal-organic chemical vapor deposition (MOCVD) devices, the devices comprising: a wall defining a chamber; a plurality of laser windows, wherein each of the laser windows defines an exterior face, an interior face opposite and spaced apart from the exterior face, and an optical path extending between the interior face and the exterior face; wherein each of the laser windows is disposed within the wall such that the interior face further defines the chamber; wherein the plurality of laser windows comprises one or more laser window pairs, each laser window in each pair being disposed opposite the other across the chamber; a source distributor defining a set of conduits, wherein each of the set of conduits defines an inlet, an outlet opposite and spaced apart from the inlet, and a path for fluid flow extending from the inlet to the outlet; wherein, when the device is assembled together with a rotatable substrate support disposed within the chamber, a laser device for producing a laser beam, and a laser dumper for receiving the laser beam: one of the laser windows in each pair is configured such that the interior face of the laser window directs the laser beam from the laser device across the chamber in a plane that is above and substantially parallel to the rotatable substrate support surface disposed within the chamber, wherein the laser beam is disposed above the rotatable substrate support surface by a distance of 10 mm or less; the other laser window in each pair is configured such that the interior face of the laser window receives the laser beam after it has traversed the chamber and directs the received laser beam to the laser dumper; and the outlets of the set of conduits are configured to introduce a first precursor and a second precursor into the chamber toward the rotatable substrate support surface, such that the first precursor and the second precursor flow through the laser beam within the chamber prior to reaching the rotatable substrate support surface. In some examples, the first precursor is a V-group precursor and the second precursor is a III-group precursor. In some examples, the laser beam is disposed above the rotatable substrate support surface by a distance of 5 mm or less.

Also disclosed herein are methods of depositing a material from a first precursor and a second precursor on one or more substrates disposed on rotatable substrate support surface within a chamber via laser-assisted metal-organic chemical vapor deposition, the methods comprising: directing a laser beam across a chamber in a plane that is above and substantially parallel to a rotatable substrate support surface disposed within the chamber, wherein the laser beam is disposed above the rotatable substrate support surface by a distance of 10 mm or less; introducing a first precursor and a second precursor into the chamber toward the rotatable substrate support surface, such that the first precursor and the second precursor flow through the laser beam within the chamber prior to reaching the rotatable substrate support surface; and heating the one or more substrates at a temperature sufficient to thermally decompose the second precursor at or near the one or more substrates, thereby generating a thermal decomposition species (e.g., an active species) in situ; wherein the laser beam comprises electromagnetic radiation with at least one wavelength that overlaps with at least a portion of a vibrational mode of the first precursor, thereby generating an irradiated first precursor (e.g., an active species) in situ; wherein the irradiated first precursor and the thermal decomposition species react to form the material, which deposits on the one or more substrates. In some examples, the first precursor is a V-group precursor and the second precursor is a III-group precursor. In some examples, the method suppresses incorporation of carbon into the material.

Also disclosed herein are materials made by the methods described herein, wherein the material has a lower amount of carbon incorporated therein relative to the amount of carbon incorporated in a material made using a comparable method, but wherein the laser beam is located at a distance greater than 10 mm above the rotatable substrate support surface.

Additional advantages of the disclosed devices, systems, and methods will be set forth in part in the description which follows, and in part will be obvious from the description. The advantages of the disclosed devices, systems, and methods will be realized and attained by means of the elements and combinations particularly pointed out in the appended claims. It is to be understood that both the foregoing general description and the following detailed description are exemplary and explanatory only and are not restrictive of the disclosed systems and methods, as claimed.

The details of one or more embodiments of the invention are set forth in the accompanying drawings and the description below. Other features, objects, and advantages of the invention will be apparent from the description and drawings, and from the claims.

BRIEF DESCRIPTION OF THE FIGURES

The accompanying figures, which are incorporated in and constitute a part of this specification, illustrate several aspects of the disclosure, and together with the description, serve to explain the principles of the disclosure.

DETAILED DESCRIPTION

Figure 1:
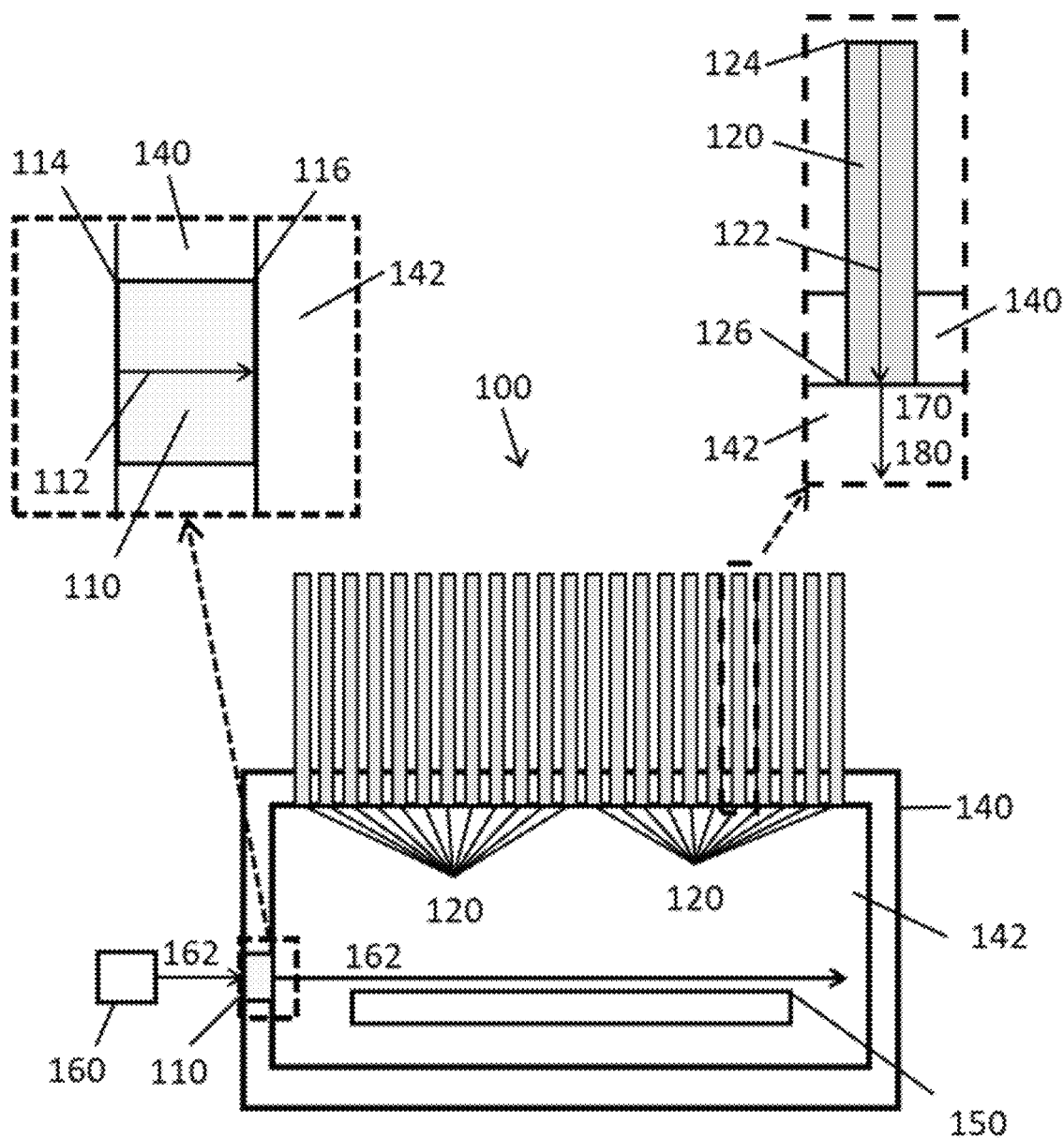
FIG. 1 is a cross-sectional plan view of a schematic of an example device as disclosed herein according to one implementation.

The devices, methods, and systems described herein may be understood more readily by reference to the following detailed description of specific aspects of the disclosed subject matter and the Examples included therein.

Before the present devices, methods, and systems are disclosed and described, it is to be understood that the aspects described below are not limited to specific synthetic methods or specific reagents, as such may, of course, vary. It is also to be understood that the terminology used herein is for the purpose of describing particular aspects only and is not intended to be limiting.

Also, throughout this specification, various publications are referenced. The disclosures of these publications in their entireties are hereby incorporated by reference into this application in order to more fully describe the state of the art to which the disclosed matter pertains. The references disclosed are also individually and specifically incorporated by reference herein for the material contained in them that is discussed in the sentence in which the reference is relied upon.

In this specification and in the claims that follow, reference will be made to a number of terms, which shall be defined to have the following meanings.

Throughout the description and claims of this specification the word "comprise" and other forms of the word, such as "comprising" and "comprises," means including but not limited to, and is not intended to exclude, for example, other additives, components, integers, or steps.

As used in the description and the appended claims, the singular forms "a," "an," and "the" include plural referents unless the context clearly dictates otherwise. Thus, for example, reference to "a composition" includes mixtures of two or more such compositions, reference to "an agent" includes mixtures of two or more such agents, reference to "the component" includes mixtures of two or more such components, and the like.

"Optional" or "optionally" means that the subsequently described event or circumstance can or cannot occur, and that the description includes instances where the event or circumstance occurs and instances where it does not.

Ranges can be expressed herein as from "about" one particular value, and/or to "about" another particular value. By "about" is meant within 5% of the value, e.g., within 4, 3, 2, or 1% of the value. When such a range is expressed, another aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

"Exemplary" means "an example of" and is not intended to convey an indication of a preferred or ideal embodiment. "Such as" is not used in a restrictive sense, but for explanatory purposes.

It is understood that throughout this specification the identifiers "first" and "second" are used solely to aid in distinguishing the various components and steps of the disclosed subject matter. The identifiers "first" and "second" are not intended to imply any particular order, amount, preference, or importance to the components or steps modified by these terms.

Disclosed herein are devices for laser-assisted metal-organic chemical vapor deposition devices.

Devices 100

FIG. 1 shows a schematic cross-sectional plan view of a laser-assisted metal-organic chemical vapor deposition (MOCVD) device 100 according to one implementation. Referring to FIG. 1, the device 100 comprises a wall 140 defining a chamber 142. The wall 140 can, in some examples be hollow such that a cooling medium can be included within the wall 140, for example to dissipate heat (e.g., from the heater, from the laser energy, or a combination thereof). In some examples, the cooling medium can comprise water.

Referring again to FIG. 1, the device 100 further comprises a set of laser windows 110, wherein each of the laser windows 110 defines an exterior face 114, an interior face 116 opposite and spaced apart from the exterior face 114, and an optical path 112 extending between the interior face 116 and the exterior face 114; wherein each of the laser windows 110 is disposed within the wall 140 such that the interior face 116 further defines the chamber 142.

The set of laser windows 110 can include one or more laser windows 110 (e.g., 1 or more, 2 or more, 3 or more, 4 or more, 5 or more, 6 or more, 7 or more, 8 or more, 9 or more, 10 or more, 15 or more, 20 or more, 25 or more, 30 or more, 40 or more, 50 or more, 60 or more, 70 or more, 80 or more, 90 or more, 100 or more, 150 or more, 200 or more, 250 or more, 300 or more, 350 or more, 400 or more, 450 or more, 500 or more, 600 or more, 700 or more, 800 or more, 900 or more, or 1000 or more). The number of laser windows 110 can be selected in view of the size of the chamber 142, the size of the rotatable substrate support surface 150, or a combination thereof.

Figure 2:
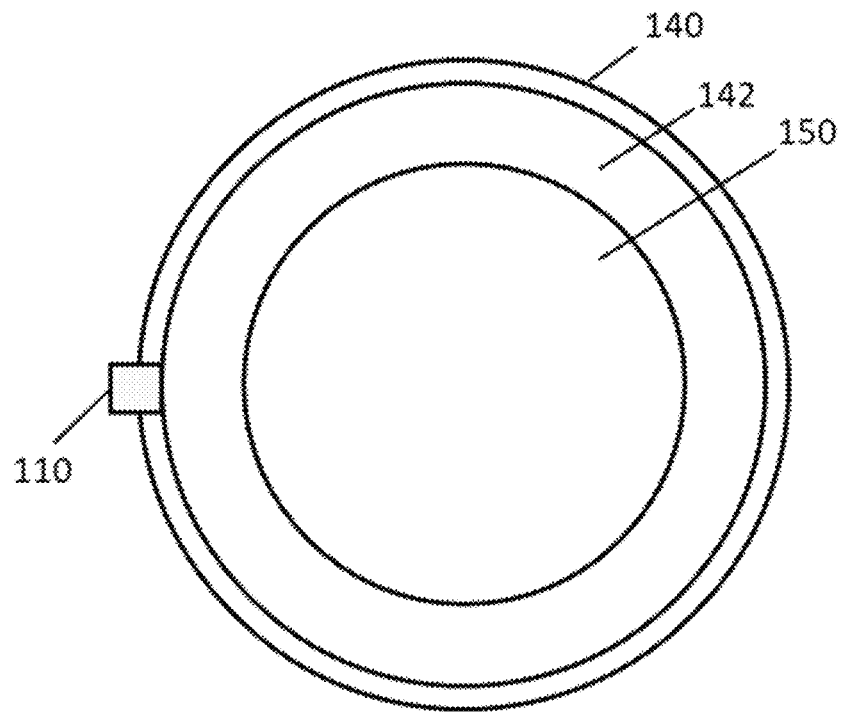
FIG. 2 is a schematic cross-sectional plan view (e.g., top down) of an example device having one laser window.
Figure 3:
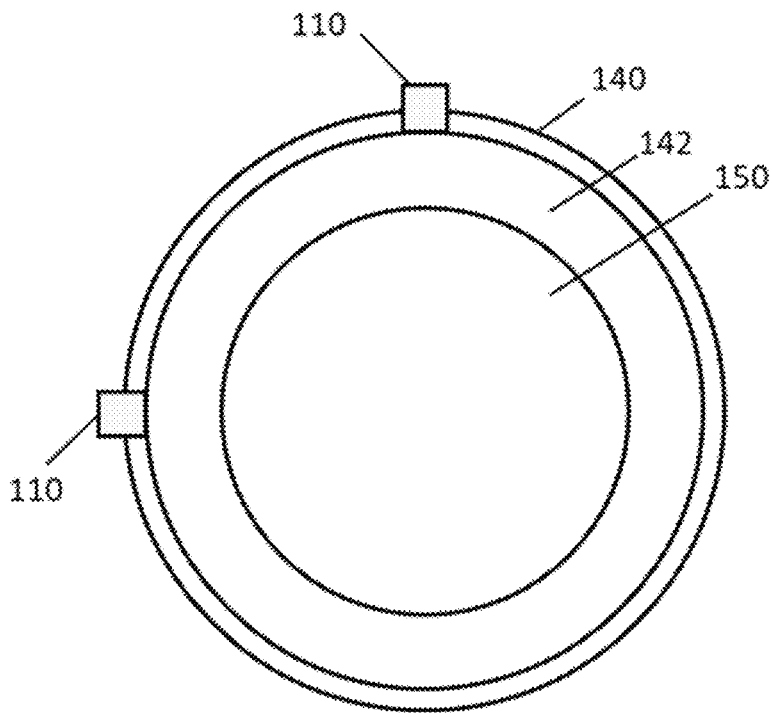
FIG. 3 is a schematic cross-sectional plan view (e.g., top down) of an example device having two laser windows.
Figure 5:
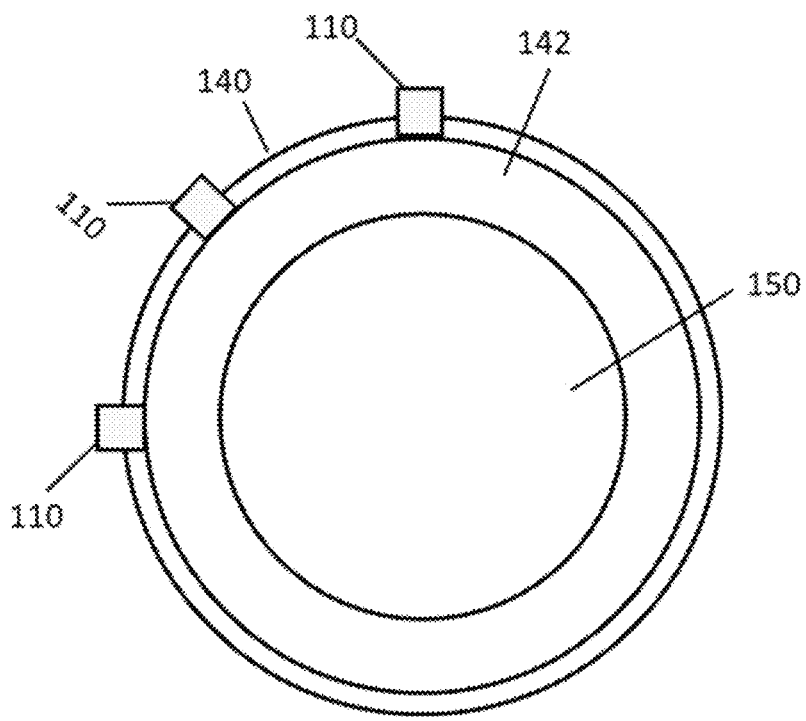
FIG. 5 is a schematic cross-sectional plan view (e.g., top down) of an example device having three laser windows.
Figure 6:
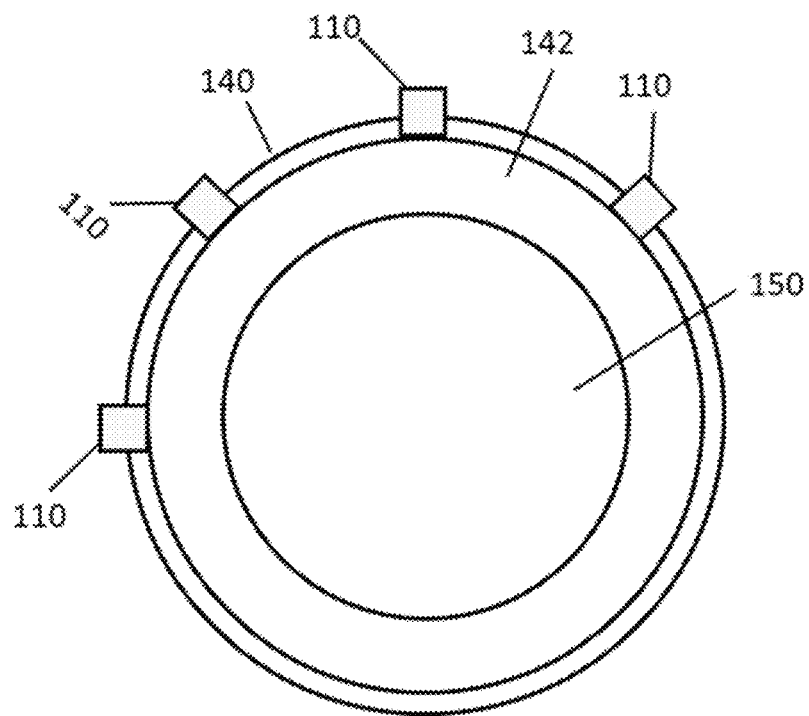
FIG. 6 is a schematic cross-sectional plan view (e.g., top down) of an example device having four laser windows.
Figure 7:
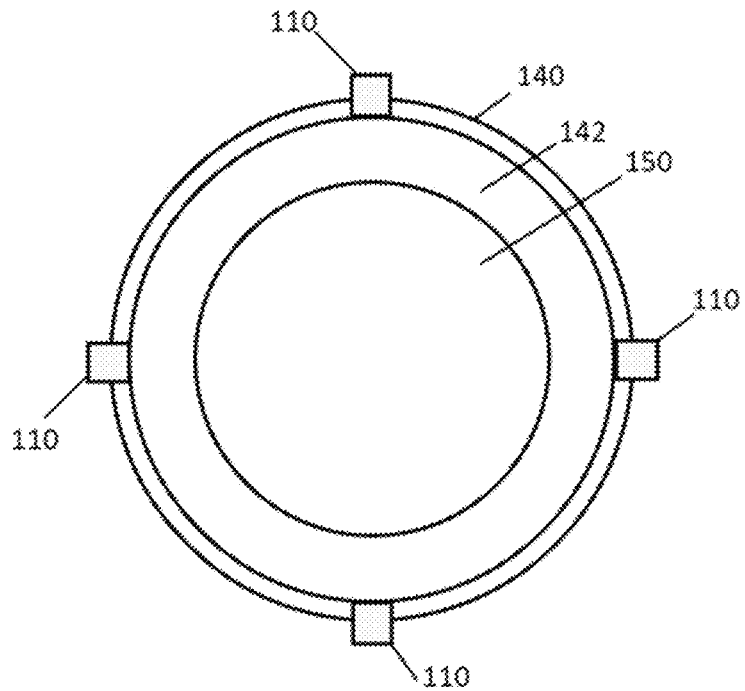
FIG. 7 is a schematic cross-sectional plan view (e.g., top down) of an example device having four laser windows.
Figure 8:
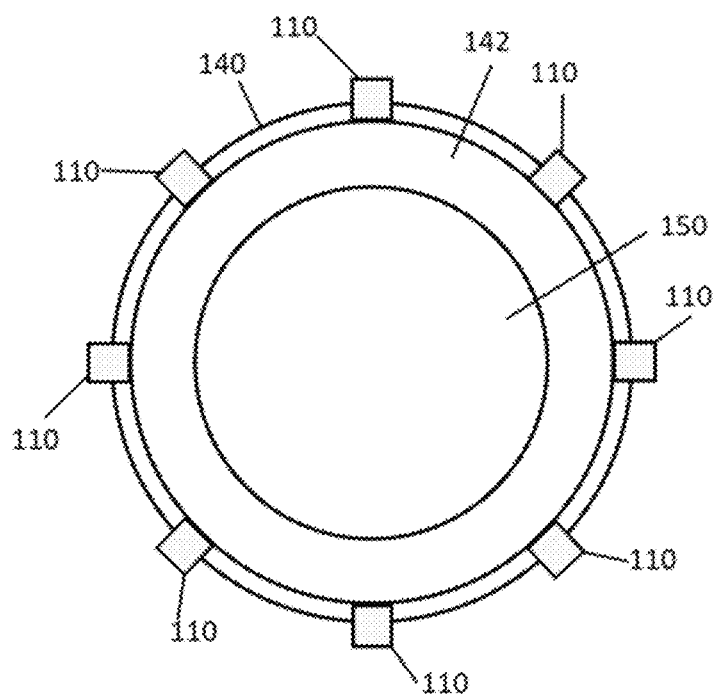
FIG. 8 is a schematic cross-sectional plan view (e.g., top down) of an example device having eight laser windows.

In some examples, the set of laser windows 110 is a single laser window 110, as shown for example in FIG. 2. In some examples, the set of laser windows 110 is a plurality of laser windows 110 (e.g., 2 or more, 3 or more, 4 or more, 5 or more, 6 or more, 7 or more, 8 or more, 9 or more, 10 or more, 15 or more, 20 or more, 25 or more, 30 or more, 40 or more, 50 or more, 60 or more, 70 or more, 80 or more, 90 or more, 100 or more, 150 or more, 200 or more, 250 or more, 300 or more, 350 or more, 400 or more, 450 or more, 500 or more, 600 or more, 700 or more, 800 or more, 900 or more, or 1000 or more), the plurality of laser windows 110 being positioned within the wall 140 and spaced around the periphery of the chamber 142. The set of laser windows can, for example, include 2 laser windows positioned within the wall 140 and spaced around the periphery of the chamber 142, as shown for example in FIG. 3 and FIG. 4. Referring now to FIG. 5, the set of laser windows can, for example, include 3 laser windows positioned within the wall 140 and spaced around the periphery of the chamber 142. Referring now to FIG. 6 and FIG. 7, the set of laser windows can, for example, include 4 laser windows positioned within the wall 140 and spaced around the periphery of the chamber 142. Referring now to FIG. 8, the set of laser windows can, for example, include 8 laser windows positioned within the wall 140 and spaced around the periphery of the chamber 142.

In some examples, the set of laser windows 110 is a plurality of laser windows 110, the plurality of laser windows 110 being positioned within the wall 140 and spaced around the periphery of the chamber 142, as shown, for example, in FIG. 3-FIG. 8.

Figure 4:
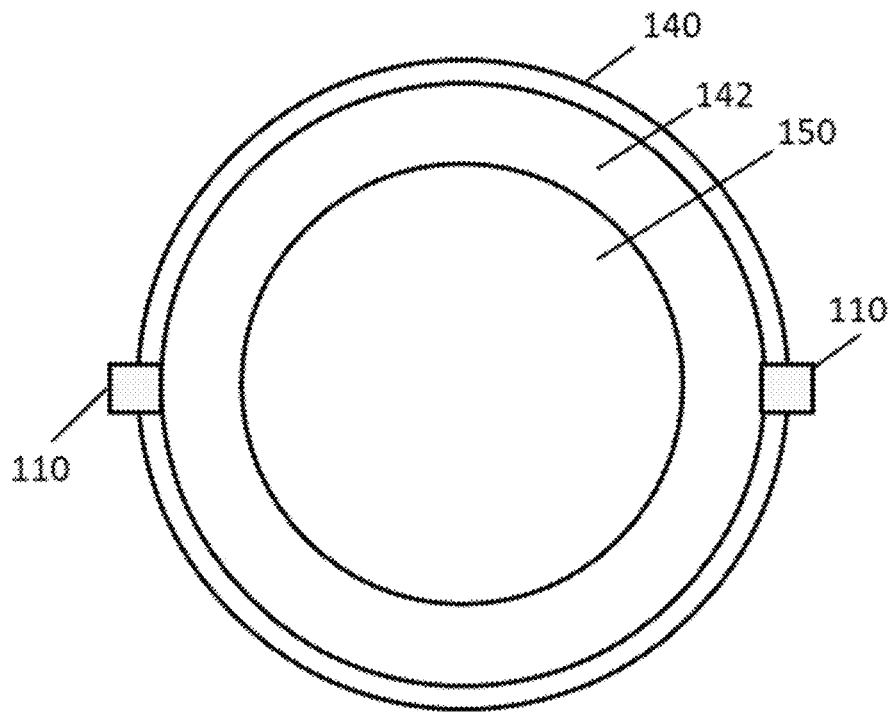
FIG. 4 is a schematic cross-sectional plan view (e.g., top down) of an example device having two laser windows.

In some examples, the plurality of laser windows 110 are evenly spaced around the periphery of the chamber 142, as shown, for example, in FIG. 4, FIG. 7, and FIG. 8. In certain examples, the chamber has a substantially circular cross-section and the plurality of laser windows 110 are evenly spaced around the circumference of the chamber 142, as shown, for example, in FIG. 4, FIG. 7, and FIG. 8. In some examples, the set of laser windows 110 comprises an even number of laser windows 110, wherein each laser window 110 is disposed opposite another laser window 110 across the chamber 142, as shown, for example, in FIG. 4, FIG. 7, and FIG. 8.

Each of the one or more laser windows 110 can comprise any suitable material, such as, for example, ZnSe, ZnS, NaCl, KBr, and combinations thereof.

The cross-sectional shape of each of the set of laser windows 110 in a plane perpendicular to the central longitudinal axis of said laser window 110 can be any shape, such as a regular shape, an irregular shape, an isotropic shape, or an anisotropic shape. In some examples, the cross-sectional shape of the set of laser windows 110 can be substantially circular, ovate, ovoid, elliptic, triangular, rectangular, polygonal, etc. In some examples, the cross-sectional shape of the set of laser windows 110 can be substantially circular.

The interior face 116 and the exterior face 114 of each of the set of laser windows 110 can independently be any shape, such as a regular shape, an irregular shape, an isotropic shape, or an anisotropic shape. In some examples, the interior face 116 and/or the exterior face 114 of the set of laser windows 110 can have a shape that is substantially circular, ovate, ovoid, elliptic, triangular, rectangular, polygonal, etc. In some examples, the shape of the interior face 116 and/or the exterior face 114 of the set of laser windows 110 can be substantially circular. The interior face 116 and/or the exterior face 114 of each of the set of laser windows 110 can, for example, be the cross-section in a plane perpendicular to the longitudinal axis of said laser window 110, such that the shape of the interior face 116 and/or the exterior face 114 of each of the set of laser windows 110 can be the cross-sectional shape of each of the set of laser windows 110.

The number of laser windows 110, the arrangement of the laser windows 110, the cross-sectional shape of the laser windows 110, or a combination thereof can be selected, for example, in view of the number of laser beams 162 within the chamber 142, the size of the laser beam(s) 162, the wavelength(s) of the laser beam(s) 162, the intensity of the laser beam(s) 162 within the chamber 142, the size of the chamber 142, the size of the rotatable substrate support surface 150, or a combination thereof.

Referring again to FIG. 1, the device 100 further comprises a set of conduits 120, wherein each of the conduits defines an inlet 124, an outlet 126 opposite an spaced apart from the inlet 124, and a path for fluid flow extending from the inlet 124 to the outlet 126. When the device 100 is assembled together with a rotatable substrate support surface 150 disposed within the chamber 142 and a laser device 160 for producing a laser beam 162: at least one of the set of laser windows 110 is configured such that the interior face 116 of the laser window 110 directs the laser beam 162 from the laser device 160 across the chamber 142 in a plane that is above and substantially parallel to the rotatable substrate support surface 150 disposed within the chamber 142, wherein the laser beam 162 is disposed above the rotatable substrate support surface by a distance of 10 mm or less; and the outlets 126 of the set of conduits 120 are configured to introduce a first precursor 170 and a second precursor 180 into the chamber 142 toward the rotatable substrate support surface 150, such that the first precursor 170 and the second precursor 180 flow through the laser beam 162 within the chamber 142 prior to reaching the rotatable substrate support surface 150.

As used herein, "a set of conduits 120" and "the set of conduits 120" are meant to include any number of conduits 120 in any arrangement. Thus, for example "a set of conduits 120" includes one or more conduits 120 (e.g., 2 or more, 3 or more, 4 or more, 5 or more, 6 or more, 7 or more, 8 or more, 9 or more, 10 or more, 15 or more, 20 or more, 25 or more, 30 or more, 40 or more, 50 or more, 60 or more, 70 or more, 80 or more, 90 or more, 100 or more, 150 or more, 200 or more, 250 or more, 300 or more, 350 or more, 400 or more, 450 or more, 500 or more, 600 or more, 700 or more, 800 or more, 900 or more, or 1000 or more). In some embodiments, the set of conduits 120 can comprise a plurality of conduits 120. In some embodiments, the set of conduits 120 can comprise a plurality of conduits 120 arranged in an ordered array.

The cross-sectional shape of each of conduits 120 in a plane perpendicular to the central longitudinal axis of said conduit 120 can be any shape, such as a regular shape, an irregular shape, an isotropic shape, or an anisotropic shape. In some examples, the cross-sectional shape of each of conduits 120 in the set of conduits 120 can be substantially circular, ovate, ovoid, elliptic, triangular, rectangular, polygonal, etc. In some examples, the cross-sectional shape of each of the conduits 120 can be substantially circular.

The set of conduits 120 can have an average characteristic dimension. The term "characteristic dimension," as used herein refers to the largest straight line distance between two points in the plane of the cross-sectional shape of each of the set of conduits. "Average characteristic dimension" and "mean characteristic dimension" are used interchangeably herein, and generally refer to the statistical mean characteristic dimension of the conduits in a population of conduits. For example, for a cylindrical set of conduits, the cross-sectional shape can be substantially circular and the average characteristic dimension can refer to the diameter.

The average characteristic dimension of the set of conduits 120 can, for example, be 0.1 millimeter (mm) or more (e.g., 0.25 mm or more, 0.5 mm or more, 0.75 mm or more, 1 mm or more, 1.25 mm or more, 1.5 mm or more, 1.75 mm or more, 2 mm or more, 2.25 mm or more, 2.5 mm or more, 2.75 mm or more, 3 mm or more, 3.25 mm or more, 3.5 mm or more, 3.75 mm or more, 4 mm or more, 4.25 mm or more, 4.5 mm or more, 4.75 mm or more, 5 mm or more, 5.5 mm or more, 6 mm or more, 6.5 mm or more, 7 mm or more, 7.5 mm or more, 8 mm or more, 8.5 mm or more, 9 mm or more, or 9.5 mm or more). In some examples, the average characteristic dimension of the set of conduits 120 can be 10 millimeters (mm) or less (e.g., 9.5 mm or less, 9 mm or less, 8.5 mm or less, 8 mm or less, 7.5 mm or less, 7 mm or less, 6.5 mm or less, 6 mm or less, 5.5 mm or less, 5 mm or less, 4.75 mm or less, 4.5 mm or less, 4.25 mm or less, 4 mm or less, 3.75 mm or less, 3.5 mm or less, 3.25 mm or less, 3 mm or less, 2.75 mm or less, 2.5 mm or less, 2.25 mm or less, 2 mm or less, 1.75 mm or less, 1.5 mm or less, 1.25 mm or less, 1 mm or less, 0.75 mm or less, 0.5 mm or less, or 0.25 mm or less). The average characteristic dimension of the set of conduits 120 can range from any of the minimum values described above to any of the maximum values described above. For example, the average characteristic dimension of the set of conduits 120 can be from 0.1 mm to 10 mm (e.g., from 0.1 mm to 5 mm, from 5 mm to 10 mm, from 0.1 mm to 2.5 mm, from 2.5 mm to 5 mm, from 5 mm to 7.5 mm, from 7.5 mm to 10 mm, from 0.1 mm to 9.5 mm, from 0.5 mm to 10 mm, or from 0.5 mm to 9.5 mm).

The inlets 124 and the outlets 126 of each of the conduits 120 can, independently, be any shape, such as a regular shape, an irregular shape, an isotropic shape, or an anisotropic shape. In some examples, the inlets 124 and/or the outlets 126 of the set of conduits 120 can have a shape that is substantially circular, ovate, ovoid, elliptic, triangular, rectangular, polygonal, etc. In some examples, the shape of the inlets 124 and/or the outlets 126 of the set of conduits 120 can be substantially circular. The inlet 124 and/or the outlet 126 of each of the set of conduits 120 can, for example, be the cross-section in a plane perpendicular to the central longitudinal axis of said conduit 120, such that the shape of the inlet 124 and/or the outlet 126 of each of the set of conduits 120 can be the cross-sectional shape of each of the conduits 120.

The inlets 124 and the outlets 126 of the set of conduits 120 can, independently, have an average characteristic dimension. The term "characteristic dimension," as used herein refers to the largest straight line distance between two points in the plane of the inlet or the outlet. "Average characteristic dimension" and "mean characteristic dimension" are used interchangeably herein, and generally refer to the statistical mean characteristic dimension of the inlets and/or the outlets in a population of inlets and/or outlets. For example, for a cylindrical set of conduits 120, the inlets 124 and/or the outlets 126 can be substantially circular in shape and the average characteristic dimension can refer to the diameter.

The average characteristic dimension of the inlets 124 and/or the outlets 126 of the set of conduits 120 can, for example, be 0.1 millimeter (mm) or more (e.g., 0.25 mm or more, 0.5 mm or more, 0.75 mm or more, 1 mm or more, 1.25 mm or more, 1.5 mm or more, 1.75 mm or more, 2 mm or more, 2.25 mm or more, 2.5 mm or more, 2.75 mm or more, 3 mm or more, 3.25 mm or more, 3.5 mm or more, 3.75 mm or more, 4 mm or more, 4.25 mm or more, 4.5 mm or more, 4.75 mm or more, 5 mm or more, 5.5 mm or more, 6 mm or more, 6.5 mm or more, 7 mm or more, 7.5 mm or more, 8 mm or more, 8.5 mm or more, 9 mm or more, or 9.5 mm or more). In some examples, the average characteristic dimension of the inlets 124 and/or the outlets 126 of the set of conduits 120 can be 10 millimeters (mm) or less (e.g., 9.5 mm or less, 9 mm or less, 8.5 mm or less, 8 mm or less, 7.5 mm or less, 7 mm or less, 6.5 mm or less, 6 mm or less, 5.5 mm or less, 5 mm or less, 4.75 mm or less, 4.5 mm or less, 4.25 mm or less, 4 mm or less, 3.75 mm or less, 3.5 mm or less, 3.25 mm or less, 3 mm or less, 2.75 mm or less, 2.5 mm or less, 2.25 mm or less, 2 mm or less, 1.75 mm or less, 1.5 mm or less, 1.25 mm or less, 1 mm or less, 0.75 mm or less, 0.5 mm or less, or 0.25 mm or less). The average characteristic dimension of the inlets 124 and/or the outlets 126 of the set of conduits 120 can range from any of the minimum values described above to any of the maximum values described above. For example, the average characteristic dimension of the inlets 124 and/or the outlets 126 of the set of conduits 120 can be from 0.1 mm to 10 mm (e.g., from 0.1 mm to 5 mm, from 5 mm to 10 mm, from 0.1 mm to 2.5 mm, from 2.5 mm to 5 mm, from 5 mm to 7.5 mm, from 7.5 mm to 10 mm, from 0.1 mm to 9.5 mm, from 0.5 mm to 10 mm, or from 0.5 mm to 9.5 mm).

In some examples, the each of the outlets 126 of the set of conduits 120 can further comprise a nozzle (not shown) fluidly connected to each of the outlets 126 of the set of conduits 120. Each nozzle can, for example, have an average characteristic dimension and a cross-sectional shape, wherein the average characteristic dimension of the nozzles, the cross-sectional shape of the nozzles, or a combination thereof can be the same or different than that of the outlets 126 of the set of conduits 120. In some examples, the average characteristic dimension of the nozzles can be smaller than the average characteristic dimension of the outlets 126 of the set of conduits 120. In some examples, the cross-sectional shape of the nozzles can be substantially circular. The average characteristic dimension of the nozzles, the cross-sectional shape of the nozzles, the orientation of the nozzles, or a combination thereof can be used to affect and/or control how the first precursor 170 and/or the second precursor 180 is/are introduced into the chamber 142 (e.g., speed, direction, volume, etc.).

The number of conduits 120, the arrangement of the conduits 120, the cross-sectional shape of the conduits 120, the shape of the outlets 126 of the conduits 120, the average characteristic dimension of the outlets 126 of the conduits 120, the presence or absence of the nozzles fluidly connected to each of the outlets 126 of the set of conduits 120, the average characteristic dimension of the nozzles fluidly connected to each of the outlets 126 of the set of conduits 120 (when present), the cross-sectional shape of the nozzles fluidly connected to each of the outlets 126 of the set of conduits 120 (when present), or a combination thereof can be selected, for example, in view of the number of laser beams 162 within the chamber 142, the size of the laser beam(s) 162, the wavelength(s) of the laser beam(s) 162, the intensity of the laser beam(s) 162 within the chamber 142, the size of the chamber 142, the size of the rotatable substrate support surface 150, or a combination thereof.

Figure 9:
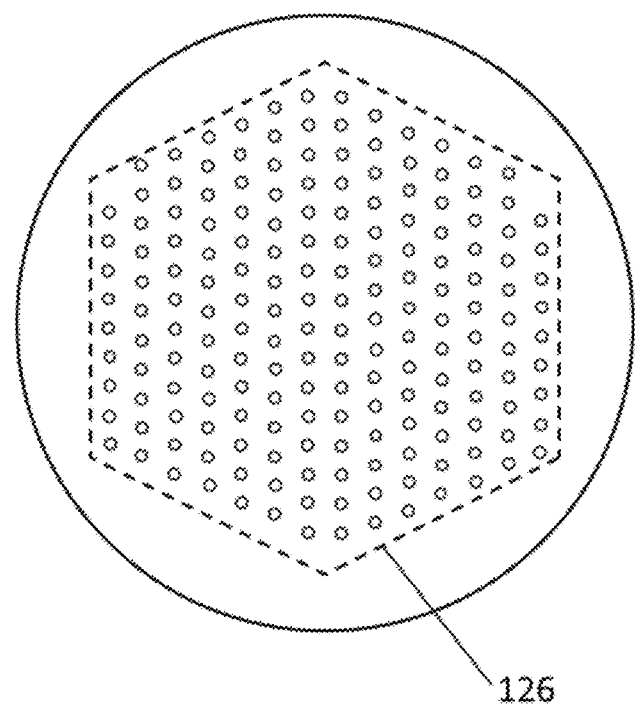
FIG. 9 is a schematic cross-sectional plan view (e.g., bottom up) of the arrangement of the outlets of the set of conduits in one implementation of an example.

FIG. 9 is a schematic cross-sectional plan view of an example device 100 (e.g., a bottom up view, such as of the device shown in FIG. 1) showing the arrangement of the outlets 126 of the set of conduits 120 in one implementation of the device 100. Referring now to FIG. 9, in some examples, the outlets 126 of the conduits 120 are located in an ordered array.

The outlets 126 of the set of conduits 120 are configured to introduce a first precursor 170 and a second precursor 180 into the chamber 142 toward the rotatable substrate support surface 150, such that the first precursor 170 and the second precursor 180 flow through the laser beam 162 within the chamber 142 prior to reaching the rotatable substrate support surface 150. In some examples, the outlets 126 of the set of conduits 120 are configured to introduce the first precursor 170 and the second precursor 180 substantially perpendicular to a central axis of the laser beam 162 within the chamber 142. In some examples, the outlets 126 of the set of conduits 120 are configured to introduce the first precursor 170 and the second precursor 180 substantially perpendicular to the rotatable substrate support surface 150.

In some examples, the outlets 126 of the set of conduits 120 are configured to introduce the first precursor 170 and the second precursor 180 substantially uniformly throughout the chamber 142. In some examples, the outlets 126 of the set of conduits 120 are positioned in an ordered array and evenly spaced throughout the chamber 142, such that the outlets 126 of the set of conduits 120 are configured to introduce the first precursor 170 and the second precursor 180 substantially uniformly throughout the chamber 142.

In some examples, the set of conduits 120 comprises a plurality of conduits 120 and the plurality of conduits 120 can comprise a set of first conduits and a set of second conduits, the outlets of the set of first conduits being configured to introduce the first precursor 170 into the chamber 142 toward the rotatable substrate support surface 150, the outlets of the set of second conduits being configured to introduce the second precursor 180 into the chamber 142 toward the rotatable substrate support surface 150. In some examples, the outlet of one or more of the first set of conduits is/are located adjacent the outlet of at least one of the second set of conduits. In some examples, the outlet of one or more of the first set of conduits is/are located directly adjacent the outlet of at least one of the second set of conduits. In some examples, the outlets of the first set of conduits are located in an ordered array and the outlets of the second set of conduits are located in an ordered array, evenly spaced and interspersed between the outlets of the first set of conduits.

Figure 10:
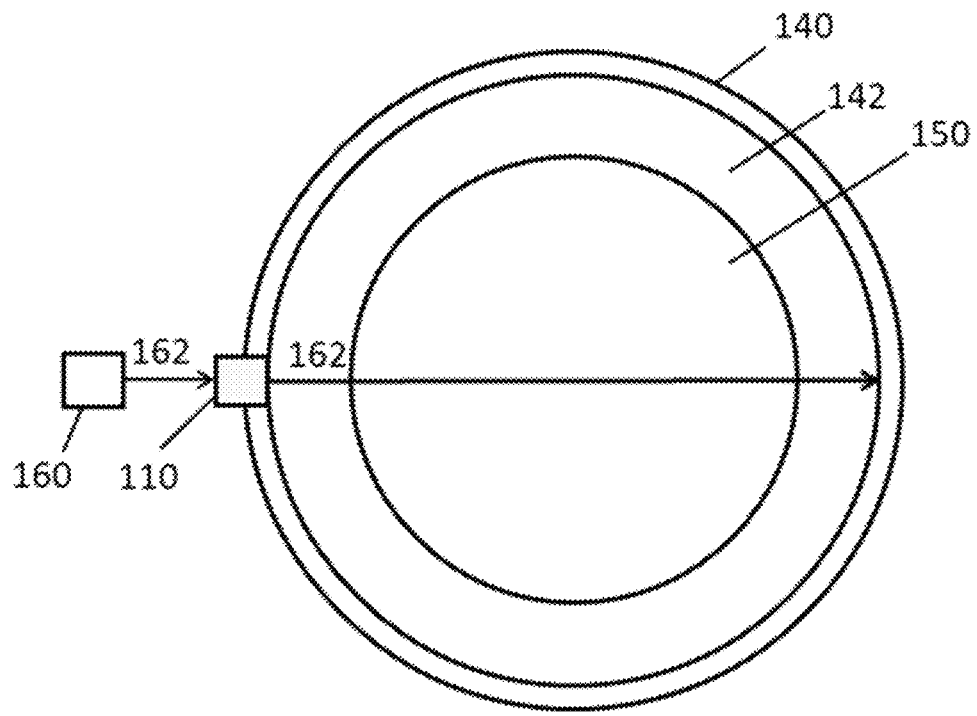
FIG. 10 is a schematic cross-sectional plan view (e.g., top down) of an example device having one laser window configured such that the interior face of the laser window directs a laser beam across the chamber in a plane that is above and substantially parallel to the rotatable substrate support surface disposed within the chamber.
Figure 11:
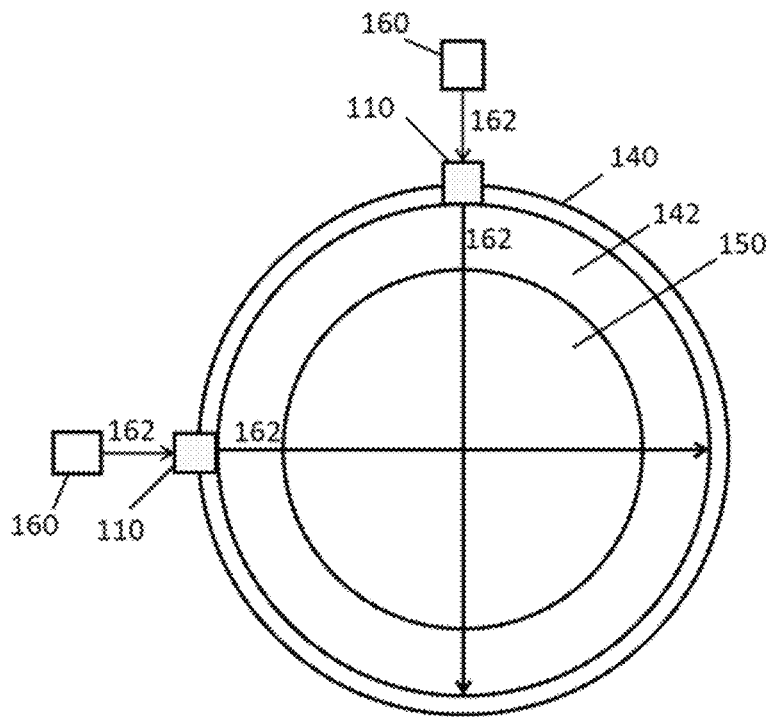
FIG. 11 is a schematic cross-sectional plan view (e.g., top down) of an example device having two laser windows, each of which is configured such that the interior face of the laser window directs a laser beam across the chamber in a plane that is above and substantially parallel to the rotatable substrate support surface disposed within the chamber.
Figure 12:
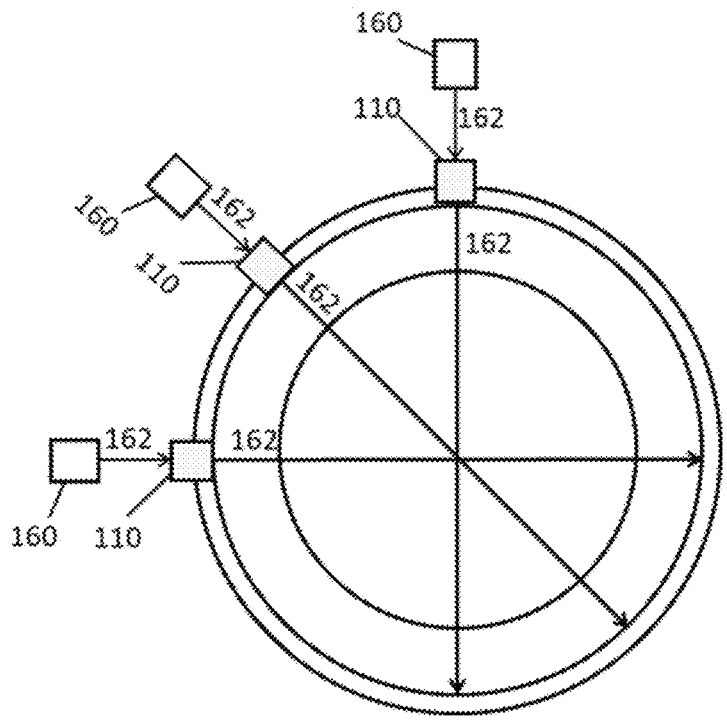
FIG. 12 is a schematic cross-sectional plan view (e.g., top down) of an example device having three laser windows, each of which is configured such that the interior face of the laser window directs a laser beam across the chamber in a plane that is above and substantially parallel to the rotatable substrate support surface disposed within the chamber.
Figure 13:
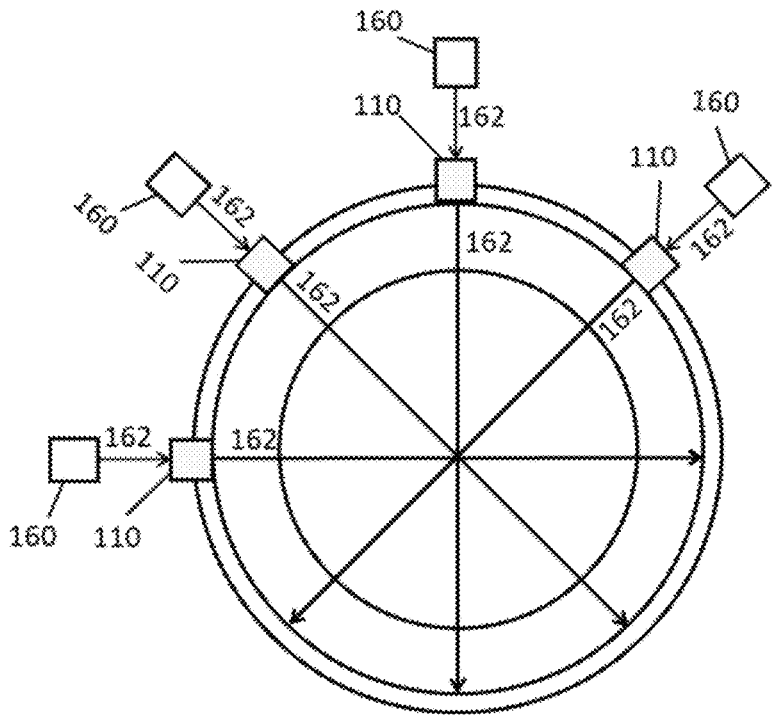
FIG. 13 is a schematic cross-sectional plan view (e.g., top down) of an example device having four laser windows, each of which is configured such that the interior face of the laser window directs a laser beam across the chamber in a plane that is above and substantially parallel to the rotatable substrate support surface disposed within the chamber.

At least one of the set of laser windows 110 is configured such that the interior face 116 of the laser window 110 directs a laser beam 162 across the chamber 142 in a plane that is above and substantially parallel to the rotatable substrate support surface 150 disposed within the chamber 142. In some examples, the device 100 includes one laser window 110 which is configured such that the interior face 116 of the laser window 110 directs a laser beam 162 across the chamber 142 in a plane that is above and substantially parallel to the rotatable substrate support surface 150 disposed within the chamber 142, as shown in FIG. 10. In some examples, the device 100 includes two laser windows 110, each of which is configured such that the interior face 116 of the laser window 110 directs a laser beam 162 across the chamber 142 in a plane that is above and substantially parallel to the rotatable substrate support surface 150 disposed within the chamber 142, as shown in FIG. 11. In some examples, the device 100 includes three laser windows 110, each of which is configured such that the interior face 116 of the laser window 110 directs a laser beam 162 across the chamber 142 in a plane that is above and substantially parallel to the rotatable substrate support surface 150 disposed within the chamber 142, as shown in FIG. 12. In some examples, the device 100 includes four laser windows 110, each of which is configured such that the interior face 116 of the laser window 110 directs a laser beam 162 across the chamber 142 in a plane that is above and substantially parallel to the rotatable substrate support surface 150 disposed within the chamber 142, as shown in FIG. 13. In some examples, the device 100 includes a plurality of laser windows 110, each of which is configured such that the interior face 116 of the laser window 110 directs a laser beam 162 across the chamber 142 in a plane that is above and substantially parallel to the rotatable substrate support surface 150 disposed within the chamber 142.

The laser beam 162 (e.g., the one or more laser beams 162) introduced into the chamber 142 is directed across the chamber 142 in a plane that is above and substantially parallel to the rotatable substrate support surface 150 disposed within the chamber 142 such that the laser beam 162 is disposed above the rotatable substrate support surface 150 by a distance of 10 millimeters (mm) or less (e.g., 9.5 mm or less, 9 mm or less, 8.5 mm or less, 8 mm or less, 7.5 mm or less, 7 mm or less, 6.5 mm or less, 6 mm or less, 5.5 mm or less, 5 mm or less, 4.75 mm or less, 4.5 mm or less, 4.25 mm or less, 4 mm or less, 3.75 mm or less, 3.5 mm or less, 3.25 mm or less, 3 mm or less, 2.75 mm or less, 2.5 mm or less, 2.25 mm or less, 2 mm or less, 1.75 mm or less, 1.5 mm or less, 1.25 mm or less, 1 mm or less, 0.75 mm or less, 0.5 mm or less, or 0.25 mm or less). In some examples the laser beam 162 is disposed above the rotatable substrate support surface 150 by a distance of 0 mm or more (e.g., 0.25 mm or more, 0.5 mm or more, 0.75 mm or more, 1 mm or more, 1.25 mm or more, 1.5 mm or more, 1.75 mm or more, 2 mm or more, 2.25 mm or more, 2.5 mm or more, 2.75 mm or more, 3 mm or more, 3.25 mm or more, 3.5 mm or more, 3.75 mm or more, 4 mm or more, 4.25 mm or more, 4.5 mm or more, 4.75 mm or more, 5 mm or more, 5.5 mm or more, 6 mm or more, 6.5 mm or more, 7 mm or more, 7.5 mm or more, 8 mm or more, 8.5 mm or more, 9 mm or more, or 9.5 mm or more). The distance that the laser beam 162 is disposed above the rotatable substrate support surface 150 can range from any of the minimum values described above to any of the maximum values described above. For example, the laser beam 162 can be disposed above the rotatable substrate support surface by a distance of from 0 mm to 10 mm (e.g., from 0 mm to 5 mm, from 5 mm to 10 mm, from 0 mm to 2.5 mm, from 2.5 mm to 5 mm, from 5 mm to 7.5 mm, from 7.5 mm to 10 mm, from 0 mm to 9 mm, from 1 mm to 10 mm, from 1 mm to 9 mm, from 0 mm to 8 mm, from 0 mm to 6 mm, from 0 mm to 4 mm, or from 1 mm to 3 mm).

Each of the one or more laser beams 162 comprises electromagnetic radiation with at least one wavelength that overlaps with at least a portion of a vibrational mode of the first precursor 170, thereby generating an active species (e.g., an irradiated first precursor) in situ. In some examples, the wavelength of the laser beam 162 is selected in view of the identity of the first precursor 170, such that the laser beam 162 comprise electromagnetic radiation with at least one wavelength that overlaps with at least a portion of a vibrational mode of the first precursor 170, such that irradiation of the first precursor 170 with the laser beam(s) 162 can enhance the cracking efficiency of the first precursor 170.

In some examples, the device 100 is configured to deposit a material via laser-assisted metal-organic vapor deposition from the first precursor 170 and the second precursor 180 on one or more substrates disposed on the rotatable substrate support surface 150 within the chamber 142. In some examples, the distance at which the laser beam 162 is located above the rotatable substrate support surface 150 can be selected, for example, such that background incorporation of carbon into the deposited material is suppressed (e.g., reduced or minimized relative to the amount of carbon incorporated in the deposited semiconductor when the laser beam 162 is located at a distance greater than 10 mm above the rotatable substrate support surface).

In some examples, the device 100 is configured to deposit a III-V semiconductor, such that the first precursor 170 comprises a V-group precursor and the second precursor 180 comprises a III-group precursor.

The first precursor 170 can, for example, comprise a V-group precursor, such as a compound, element, or composition comprising N, P, As, Sb, Bi, or a combination thereof. In some examples, the first precursor 170 can comprise a nitrogen species. In some examples, the first precursor 170 can comprise $NH_3$. The first precursor 170 can, for example, comprise a fluid, such as a gas. In some examples, the devices 100 can further comprise a first precursor source (not shown) fluidly coupled to the chamber 142 via the set of conduits 120.

The second precursor 180 can, for example, comprise a III-group precursor, such as compound, element, or composition comprising B, Al, Ga, In, Tl, or a combination thereof. In some examples, the second precursor 180 can comprise a gallium species. In some examples, the second precursor 180 can comprise trimethylgallium, triethylgallium, or a combination thereof. The second precursor 180 can, for example, comprise a fluid, such as a gas. In some examples, the devices 100 can further comprise a second precursor source (not shown) fluidly coupled to the chamber 142 via the set of conduits 120.

In some examples, the device 100 is configured to deposit a group III oxide semiconductor, such that the first precursor 170 comprises an oxygen containing precursor and the second precursor 180 comprises a III-group precursor.

In some examples, the device 100 is configured to deposit a group II-VI semiconductor material, such that the first precursor 170 comprises a VI-group precursor (e.g., a compound/composition/element comprising O, S, Se, Te, or a combination thereof) and the second precursor 180 comprises a II-group precursor (e.g., a compound/composition/ element comprising Be, Mg, Ca, Sr, Ba, Zn, Cd, Hg, or a combination thereof).

In some examples, the device 100 is configured to deposit a group II-IV-$V_2$ semiconductor, such that the first precursor 170 comprises a V-group precursor (e.g., a compound, element, or composition comprising N, P, As, Sb, Bi, or a combination thereof) and the second precursor 180 comprises a mixture of a II-group precursor (e.g., a compound/ composition/element comprising Be, Mg, Ca, Sr, Ba, Zn, Cd, Hg, or a combination thereof) and a IV-group precursor (e.g., a compound/composition/element comprising C, Si, Ge, Sn, Pb, or a combination thereof).

In some examples, the device 100 is configured to introduce the first precursor 170 into the chamber 142 continuously or intermittently. In some examples, the device 100 is configured to introduce the second precursor 180 continuously or intermittently.

In some examples, the device 100 is configured to introduce the first precursor 170 and the second precursor 180 into the chamber 142 alternately. In some examples, the device 100 is configured to introduce the first precursor 170 and the second precursor 180, wherein at least a portion of the introduction of the second precursor 180 is concurrent with at least a portion of the introduction of the first precursor 170, or vice versa. In some examples, the device 100 is configured to introduce the first precursor 170 and the second precursor 180 to the chamber simultaneously.

In some examples, the outlets 126 of the set of conduits 120 are further configured to introduce a dopant (e.g., one or more dopants) into the chamber 142 toward the rotatable substrate support surface 150. The one or more dopants can be selected in view of the first precursor 170 and/or the second precursor 180. The one or more dopants can be, for example, a fluid, such as a gas. In some examples, the one or more dopants can comprise an n-type dopant (e.g., silane ($SiH_4$), germane ($GeH_4$), disilane ($Si_2H_6$)), a p-type dopant (e.g., bis(cyclopentadienyl)magnesium ($Cp_2Mg$), bis(methylcyclopentadienyl)magnesium (($MeCp)_2Mg$)), or a combination thereof. In some examples, the one or more dopants can comprise silane ($SiH_4$), germane ($GeH_4$), disilane ($Si_2H_6$), bis(cyclopentadienyl)magnesium ($Cp_2Mg$), bis(methylcyclopentadienyl)magnesium (($MeCp)_2Mg$), or a combination thereof. The one or more dopants can, for example, be mixed with the first precursor 170 and/or the second precursor 180 prior to introduction into the chamber 142. In some examples, the device 100 is configured to introduce the first precursor 170, the second precursor 180, and the one or more dopants into the chamber 142 consecutively in turn. In some examples, the device 100 is configured to introduce the first precursor 170 and the one or more dopants, wherein at least a portion of the introduction of the one or more dopants is concurrent with at least a portion of the introduction of the first precursor 170, or vice versa. In some examples, the device 100 is configured to introduce the second precursor 180 and the one or more dopants, wherein at least a portion of the introduction of the one or more dopants is concurrent with at least a portion of the introduction of the second precursor 180, or vice versa. In some examples, the device is configured to introduce the first precursor 170, the second precursor 180, and the one or more dopants into the chamber 142 simultaneously.

In some examples, the outlets 126 of the set of conduits 120 are further configured to introduce a carrier gas (e.g., one or more carrier gases) into the chamber 142 toward the rotatable substrate support surface 150. The one or more carrier gases can be selected in view of the first precursor 170, the second precursor 180, the one or more dopants (when present), or a combination thereof. The one or more carrier gases can be, for example, argon, helium, $H_2$, $N_2$, and the like, or combinations thereof. The one or more carrier gases can, for example, be mixed with the first precursor 170, the second precursor 180, the one or more dopants (when present), or a combination thereof prior to introduction into the chamber 142. In some examples, the device 100 is configured to introduce the first precursor 170, the second precursor 180, the one or more dopants (when present), or a combination thereof concurrently with at least a portion of the introduction of the one or more carrier gases.

The devices 100 described herein can further comprise or be assembled with a variety of additional components. The devices 100 can, for example, be assembled together with, or in some examples can further comprise, the rotatable substrate support surface 150.

The rotatable substrate support surface 150 can be any shape, such as a regular shape, an irregular shape, an isotropic shape, or an anisotropic shape. In some examples, the shape of the rotatable substrate support surface can be substantially circular, ovate, ovoid, elliptic, triangular, rectangular, polygonal, etc. In some examples, the shape of the rotatable substrate support surface can be substantially circular. The size and shape of the rotatable substrate support surface 150 can, for example, be selected in view of the size and shape of the chamber 142.

The rotatable substrate support surface 150 can support one or more substrates (not shown) (e.g., 2 or more, 3 or more, 4 or more, 5 or more, 6 or more, 7 or more, 8 or more, 9 or more, 10 or more, 15 or more, 20 or more, 25 or more, 30 or more, 35 or more, 40 or more, 45 or more, 50 or more, 60 or more, 70 or more, 80 or more, 90 or more, 100 or more, 150 or more, 200 or more, 250 or more, 300 or more, 350 or more, 400 or more, 450 or more, 500 or more, 600 or more, 700 or more, 800 or more, 900 or more, 1000 or more, 1500 or more, or 2000 or more) to be coated with a material via laser-assisted metal-organic vapor deposition from the first precursor 170 and the second precursor 180 (and one or more dopants, if present) within the chamber 142. The devices 100 can, for example, be assembled together with, or in some examples can further comprise the one or more substrates (not shown) disposed on the rotatable substrate support surface 150.

The number of substrates disposed on the rotatable substrate support surface 150 can be selected, for example, in view of the size of the one or more substrates and/or the size of the rotatable substrate support surface 150. The devices 100 can, for example, be configured to rotate the rotatable substrate support 150 surface to thereby provide a more uniform coating of the material on the one or more substrates via laser-assisted metal-organic vapor deposition.

The one or more substrates can have an average characteristic dimension. The average characteristic dimension of the one or more substrates can, for example, be 1 inch or more (e.g., 2 inches or more, 3 inches or more, 4 inches or more, 5 inches or more, 6 inches or more, 7 inches or more, 8 inches or more, 9 inches or more, 10 inches or more, 11 inches or more, 12 inches or more, 13 inches or more, 14 inches or more, 15 inches or more, 16 inches or more, 17 inches or more, 18 inches or more, 19 inches or more, 20 inches or more, 25 inches or more, 30 inches or more, or 35 inches or more). In some examples, the average characteristic dimension of the one or more substrates can be 36 inches or less (e.g., 35 inches or less, 30 inches or less, 25 inches or less, 20 inches or less, 19 inches or less, 18 inches or less, 17 inches or less, 16 inches or less, 15 inches or less, 14 inches or less, 13 inches or less, 12 inches or less, 11 inches or less, 10 inches or less, 9 inches or less, 8 inches or less, 7 inches or less, 6 inches or less, 5 inches or less, 4 inches or less, 3 inches or less, or 2 inches or less). The average characteristic dimension of the one or more substrates can range from any of the minimum values described above to any of the maximum values described above. For example, the average characteristic dimension of the one or more substrates can be from 1 inch to 36 inches (e.g., from 1 inch to 18 inches, from 18 inches to 36 inches, from 1 inch to 6 inches, from 6 inches to 12 inches, from 12 inches to 18 inches, from 18 inches to 24 inches, from 24 inches to 30 inches, from 30 inches to 36 inches, from 2 inches to 36 inches, from 1 inch to 30 inches, from 2 inches to 30 inches, from 1 inch to 18 inches, from 1 inch to 12 inches, or from 2 inches to 8 inches).

The one or more substrates can be any shape, such as a regular shape, an irregular shape, an isotropic shape, or an anisotropic shape. In some examples, the shape of the one or more substrates can be substantially circular, ovate, ovoid, elliptic, triangular, rectangular, polygonal, etc. In some examples, the shape of the one or more substrates can be substantially circular, such that the average characteristic dimension is the diameter.

The one or more substrates can comprise any suitable material. Examples of suitable substrates include, but are not limited to, bulk GaN, GaN template, sapphire, $Al_2O_3$, $LiAlO_2$, Si, SiC, zinc oxide, bulk AlN, AlN on sapphire template, and combinations thereof.

The devices 100 can, for example, be assembled together with, or in some examples can further comprise, a laser device 160 (e.g., one or more laser devices 160) for producing a laser beam 162 (e.g., one or more laser beams 162). In some examples, the devices 100 can comprise one laser device 160, as shown in FIG. 10. In some examples, the devices 100 can comprise two laser devices 160, as shown in FIG. 11. In some examples, the devices 100 can comprise three laser devices 160, as shown in FIG. 12. In some examples, the devices 100 can comprise four laser devices 160, as shown in FIG. 13.

Each laser device 160 can, for example, comprise one or more lasers. In some examples, the laser device 160 can further comprise a laser distributor and/or beam splitter for splitting each of the one or more lasers into a plurality of laser beams 162. In some examples, the laser device 160 can further comprise a beam shaper to control/adjust the shape of the laser beam. In some examples, the laser device 160 can further comprise a beam sizer to control/adjust the size (e.g., diameter) of the laser beam. In some examples, the laser device 160 can further comprise a beam directing and positioning module to control/adjust the direction and/or position of the laser beam. In some examples, the laser device 160 can further comprise one or more lenses, for example to control/adjust the size, shape, direction, position, uniformity (e.g., with respect to intensity), etc. of the laser beam. The one or more lenses can be any type of lens, such as a simple lens, a compound lens, a spherical lens, a toric lens, a biconvex lens, a plano-convex lens, a plano-concave lens, a negative meniscus lens, a positive meniscus lens, a biconcave lens, a converging lens, a diverging lens, a cylindrical lens, a Fresnel lens, a lenticular lens, a gradient index lens, or a combination thereof.

The wavelength(s) of the one or more lasers can be selected, for example, in view of the identity of the first precursor 170. In some examples, the one or more lasers can comprise an infrared laser. In some examples, the one or more lasers can comprise a $CO_2$ laser, such as a tunable $CO_2$ laser.

Figure 14:
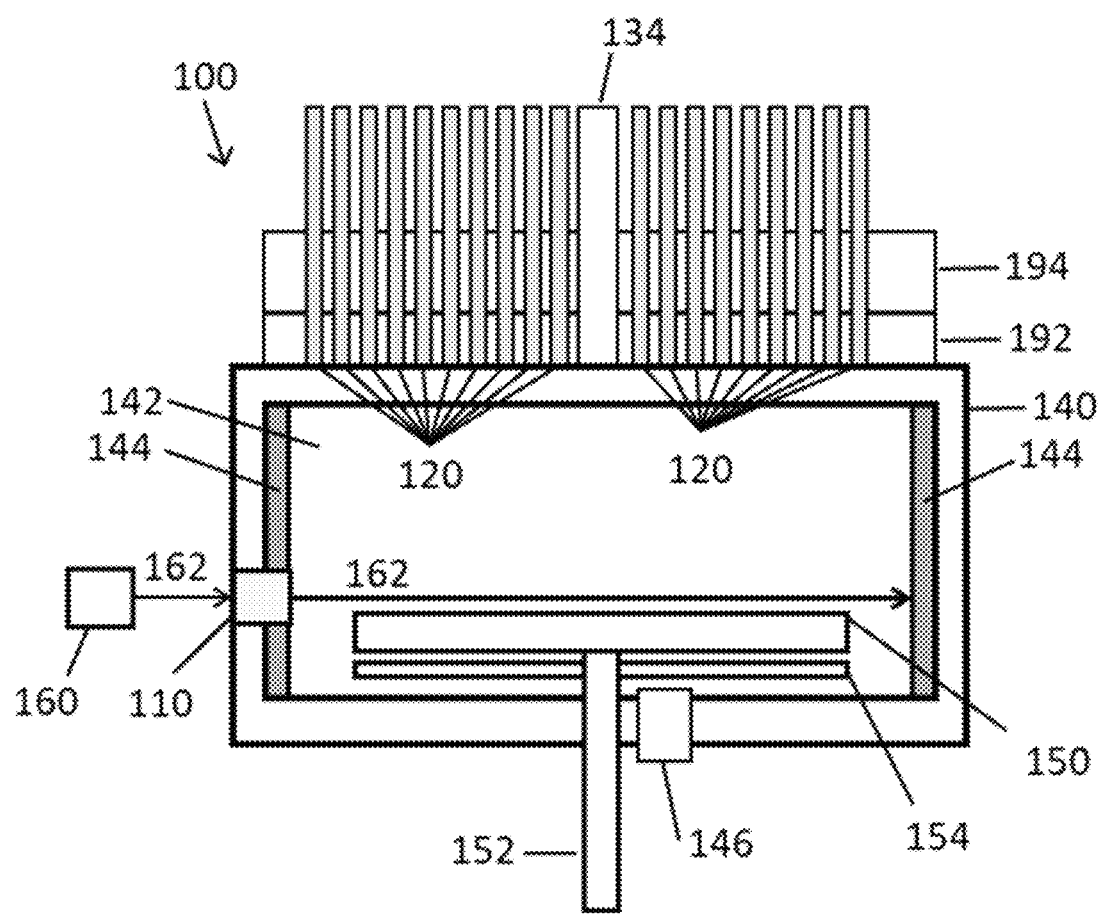
FIG. 14 is a schematic cross-sectional plan view of an example device as disclosed herein according to one implementation.

The devices 100 described herein can further comprise or be assembled with a variety of additional components, for example as shown in FIG. 14. Though the some of the elements are only shown in FIG. 14, any of the one or more additional elements or any combination of the one or more additional elements shown in FIG. 14 can be present in any of the other embodiments of the devices 100 described herein.

Referring now to FIG. 14, in some examples, the interior surface of wall 140 (e.g., the surface of the wall 140 within the chamber 142) can further comprise a coating 144, wherein the coating 144 can comprise a material that can absorb at least a portion of the laser beam energy. The interior face 116 of each of the set of laser windows 110 is substantially free of the coating 144, when present. Though the coating 144 is only shown in FIG. 14, the coating 144 can be present in any of the other embodiments of the devices 100 described herein.

In some examples, the wall 140 can further comprise an exhaust port 146 which fluidly couples the chamber 142 with an external environment. Though the exhaust port 146 is only shown in FIG. 14, the exhaust port 146 can be present in any of the other embodiments of the devices 100 described herein.

In some examples, the rotatable substrate support surface 150 can be coupled to or further comprise a rotary spindle 152. For example, the rotatable substrate support surface 150 can be centrally mounted on the rotary spindle 152, and the rotary spindle 152 can be rotated to rotate the rotatable substrate support surface 150. In some examples, the rotary spindle 152 can further be coupled to a means for rotating the rotary spindle 152. The devices 100 can, for example, be configured to rotate the rotary spindle 152 and thus rotate the rotatable substrate support surface 150 to thereby provide a more uniform coating of the material on the one or more substrates via laser-assisted metal-organic vapor deposition. Though the rotary spindle 152 is only shown in FIG. 14, the rotary spindle 152 can be present in any of the other embodiments of the devices 100 described herein.

In some examples, the devices 100 can further be assembled with, or in some examples can further comprise, a heater 154 thermally coupled to the rotatable substrate support surface 150 within the chamber 142. The heater 154 can, for example, be located below the rotatable substrate support surface 150, and optionally spaced apart from the rotatable substrate support surface 150, relative to the position of the outlets 126 of the set of conduits 120. In some examples, the devices 100 can further comprise a means for controlling the temperature of (e.g., heating) the heater 154. Though the heater 154 is only shown in FIG. 14, the heater 154 can be present in any of the other embodiments of the devices 100 described herein.

In some examples, the heater 154 can be heated such that the one or more substrates is at a temperature of 100° C. or more (e.g., 150° C. or more, 200° C. or more, 250° C. or more, 300° C. or more, 350° C. or more, 400° C. or more, 450° C. or more, 500° C. or more, 550° C. or more, 600° C. or more, 650° C. or more, 700° C. or more, 750° C. or more, 800° C. or more, 850° C. or more, 900° C. or more, 950° C. or more, 1000° C. or more, 1100° C. or more, 1200° C. or more, 1300° C. or more, 1400° C. or more, 1500° C. or more, 1600° C. or more, 1700° C. or more, 1800° C. or more, or 1900° C. or more). In some examples, the heater 154 can be heated such that the one or more substrates is at a temperature of 2000° C. or less (e.g., 1900° C. or less, 1800° C. or less, 1700° C. or less, 1600° C. or less, 1500° C. or less, 1400° C. or less, 1300° C. or less, 1200° C. or less, 1100° C. or less, 1000° C. or less, 950° C. or less, 900° C. or less, 850° C. or less, 800° C. or less, 750° C. or less, 700° C. or less, 650° C. or less, 600° C. or less, 550° C. or less, 500° C. or less, 450° C. or less, 400° C. or less, 350° C. or less, 300° C. or less, 250° C. or less, 200° C. or less, or 150° C. or less). The temperature at which the one or more substrates are heated by the heater 154 can range from any of the minimum values described above to any of the maximum values described above. For example, the heater 154 can be heated such that the one or more substrates is at a temperature of from 100° C. to 2000° C. (e.g., from 100° C. to 1000° C., from 1000° C. to 2000° C., from 100° C. to 500° C., from 500° C. to 900° C., from 900° C. to 1300° C., from 1300° C. to 1700° C., from 1700° C. to 2000° C., from 400° C. to 2000° C., from 100° C. to 1500° C., or from 400° C. to 1500° C.). In some examples, the temperature at which the one or more substrates are heated by the heater 154 can be selected in view of the identity of the second precursor 180, such that the temperature at which the one or more substrates are heated by the heater can thermally decompose the second precursor at or near the one or more substrates, to thereby form an active species (e.g., a thermal decomposition species) in situ.

The devices 100 can, for example, be assembled together with, or in some examples can further comprise, a cooling plate 192 disposed outside the chamber 142 adjacent and thermally coupled to the portion of the wall 140 substantially parallel with and spaced apart from the rotatable substrate support surface 150. The cooling plate can 192, in some examples, be in contact with the portion of the wall 140 substantially parallel with and spaced apart from the rotatable substrate support surface 150 outside of the chamber 142. The cooling plate 192 can be configured to cool the portion of the wall 140 substantially parallel with and spaced apart from the rotatable substrate support surface 150 outside of the chamber 142. In some examples, the devices 100 can further comprise a means for controlling the temperature of (e.g., cooling) the cooling plate 192. The cooling plate 192 can, in some examples, be hollow such that a cooling medium can be included within the cooling plate 192, for example to dissipate heat (e.g., from the heater, from the laser energy, or a combination thereof). In some examples, the cooling medium can comprise water. When present, the cooling plate 192 can further define the set of conduits 120. Though the cooling plate 192 is only shown in FIG. 14, the cooling plate 192 can be present in any of the other embodiments of the devices 100 described herein.

The devices 100 can, for example, further be assembled together with, or in some examples can further comprise, a top cover 194, disposed outside of the chamber 142 adjacent the portion of the wall 140 substantially parallel with and spaced apart from the rotatable substrate support surface 150. The top cover 194 can, in some examples, be in contact with the portion of the wall 140 substantially parallel with and spaced apart from the rotatable substrate support surface 150 outside of the chamber 142. When present, the cooling plate 192 can be sandwiched between the portion of the wall 140 substantially parallel with and spaced apart from the rotatable substrate support surface 150 outside of the chamber 142 and the top cover 194, such that the top cover 194 is located above and in contact with the cooling plate 192. When present, the cooling plate 192 and/or the top cover 194 can further define the set of conduits 120. Though the top cover 194 is only shown in FIG. 14, the top cover 194 can be present in any of the other embodiments of the devices 100 described herein.

The devices 100 can, for example, be assembled together with, or in some examples can further comprise, an in-situ monitor, such as a camera and/or a window. In some examples, the in-situ monitor can comprise a window or viewport 134 defined by the cooling plate 192 and/or top cover 194, when present. The in-situ monitor can allow for visual inspection inside the chamber 142 when the device 100 is assembled. Though the viewport 134 is only shown in FIG. 14, the viewport 134 can be present in any of the other embodiments of the devices 100 described herein.

Devices 200

Figure 15:
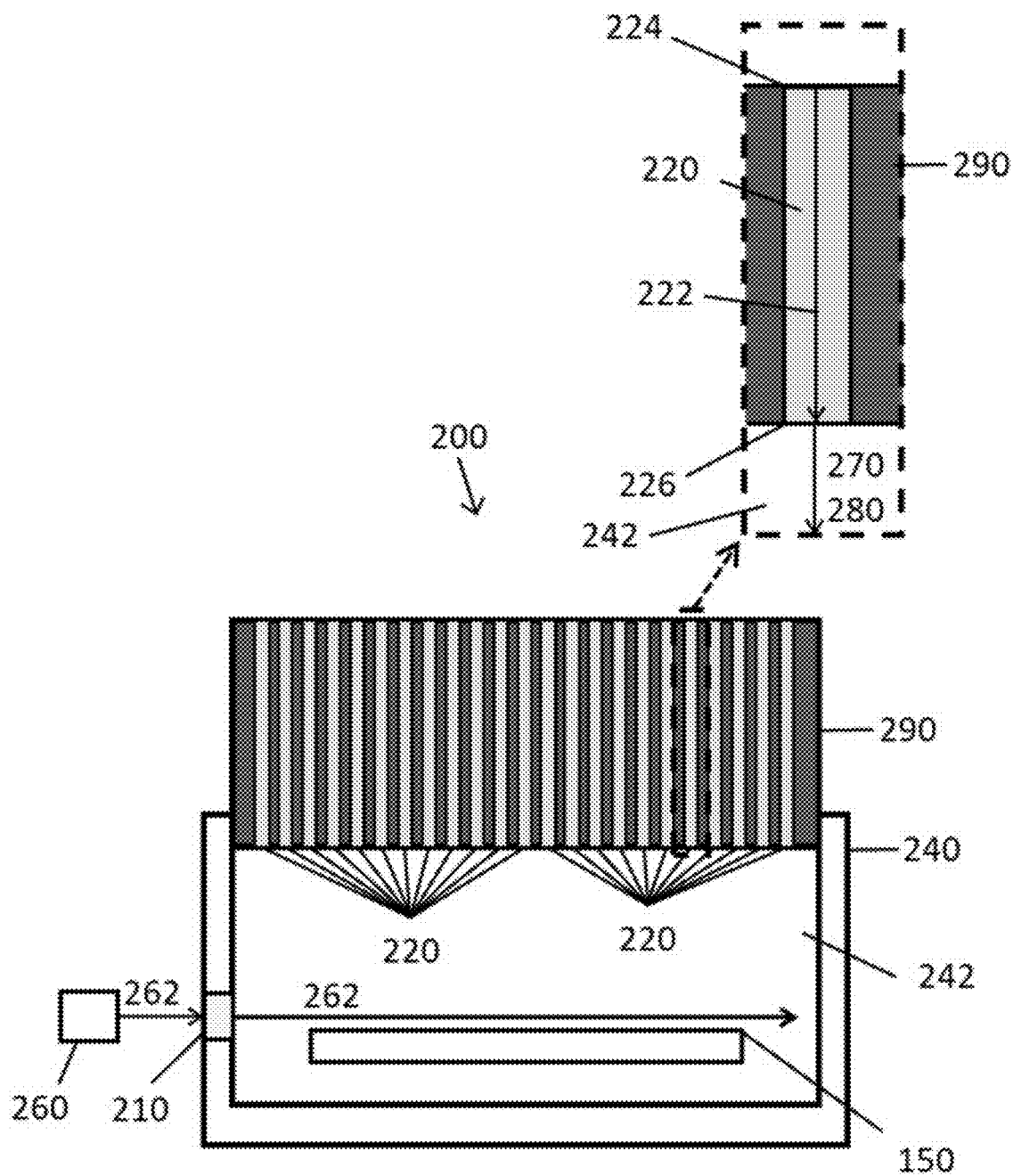
FIG. 15 is a schematic cross-sectional plan view of an example device as disclosed herein according to one implementation.

FIG. 15 shows a schematic cross-section plan view of a laser-assisted metal-organic chemical vapor deposition (MOCVD) device 200 according to one implementation described herein. Referring to FIG. 15, the device 200 comprises a wall 240 defining a chamber 142. The wall 240 can, in some examples, be hollow such that a cooling medium can be included within the wall 240, for example to dissipate heat (e.g., from the heater, from the laser energy, or a combination thereof). In some examples, the cooling medium can comprise water.

Referring again to FIG. 15, the device 200 further comprises a set of laser windows 210, wherein each of the laser windows 210 defines an exterior face 214, an interior face 216 opposite and spaced apart from the exterior face 214, and an optical path 212 extending between the interior face 216 and the exterior face 214; wherein each of the laser windows 210 is disposed within the wall 240 such that the interior face 216 further defines the chamber 242.

The set of laser windows 210 can include one or more laser windows 210 (e.g., 1 or more, 2 or more, 3 or more, 4 or more, 5 or more, 6 or more, 7 or more, 8 or more, 9 or more, 10 or more, 15 or more, 20 or more, 25 or more, 30 or more, 40 or more, 50 or more, 60 or more, 70 or more, 80 or more, 90 or more, 100 or more, 150 or more, 200 or more, 250 or more, 300 or more, 350 or more, 400 or more, 450 or more, 500 or more, 600 or more, 700 or more, 800 or more, 900 or more, or 1000 or more). The number of laser windows 210 can be selected in view of the size of the chamber 242, the size of the rotatable substrate support surface 250, or a combination thereof.

In some examples, the set of laser windows 210 is a single laser window 210. In some examples, the set of laser windows 210 is a plurality of laser windows 210 (e.g., 2 or more, 3 or more, 4 or more, 5 or more, 6 or more, 7 or more, 8 or more, 9 or more, 10 or more, 15 or more, 20 or more, 25 or more, 30 or more, 40 or more, 50 or more, 60 or more, 70 or more, 80 or more, 90 or more, 100 or more, 150 or more, 200 or more, 250 or more, 300 or more, 350 or more, 400 or more, 450 or more, 500 or more, 600 or more, 700 or more, 800 or more, 900 or more, or 1000 or more), the plurality of laser windows 210 being positioned within the wall 240 and spaced around the periphery of the chamber 242. In some examples, the set of laser windows 210 is a plurality of laser windows 210, the plurality of laser windows 210 evenly spaced around the periphery of the chamber 242. In certain examples, the chamber 242 has a substantially circular cross-section and the plurality of laser windows 210 are evenly spaced around the circumference of the chamber 242. In some examples, the set of laser windows 210 comprises an even number of laser windows 210, wherein each laser window 210 is disposed opposite another laser window 210 across the chamber 242.

Each of the one or more laser windows 210 can comprise any suitable material, such as, for example, ZnSe, ZnS, NaCl, KBr, and combinations thereof.

The cross-sectional shape of each of the set of laser windows 210 in a plane perpendicular to the central longitudinal axis of said laser window 210 can be any shape, such as a regular shape, an irregular shape, an isotropic shape, or an anisotropic shape. In some examples, the cross-sectional shape of the set of laser windows 210 can be substantially circular, ovate, ovoid, elliptic, triangular, rectangular, polygonal, etc. In some examples, the cross-sectional shape of the set of laser windows 210 can be substantially circular.

The interior face 216 and the exterior face 214 of each of the set of laser windows 210 can, independently, be any shape, such as a regular shape, an irregular shape, an isotropic shape, or an anisotropic shape. In some examples, the interior face 216 and/or the exterior face 214 of the set of laser windows 210 can have a shape that is substantially circular, ovate, ovoid, elliptic, triangular, rectangular, polygonal, etc. In some examples, the shape of the interior face 216 and/or the exterior face 214 of the set of laser windows 210 can be substantially circular. The interior face 216 and/or the exterior face 214 of each of the set of laser windows 210 can, for example, be the cross-section in a plane perpendicular to the longitudinal axis of said laser window 210, such that the shape of the interior face 216 and/or the exterior face 214 of each of the set of laser windows 210 can be the cross-sectional shape of each of the set of laser windows 210.

The number of laser windows 210, the arrangement of the laser windows 210, the cross-sectional shape of the laser windows 210, or a combination thereof can be selected, for example, in view of the number of laser beams 262 within the chamber 242, the size of the laser beam(s) 262, the wavelength(s) of the laser beam(s) 262, the intensity of the laser beam(s) 262 within the chamber 242, the size of the chamber 242, the size of the rotatable substrate support surface 250, or a combination thereof.

Referring again to FIG. 15, the device 200 further comprises a source distributor 290 and a set of conduits 220, wherein each of the conduits defines an inlet 224, an outlet 226 opposite an spaced apart from the inlet 224, and a path for fluid flow extending from the inlet 224 to the outlet 226. The set of conduits 220 can, for example, be defined by the source distributor. Referring to FIG. 15, the set of conduits 220 are defined by the source distributor 290. When the device 200 is assembled together with a rotatable substrate support surface 250 disposed within the chamber 242 and a laser device 260 for producing a laser beam 262: at least one of the set of laser windows 210 is configured such that the interior face 216 of the laser window 210 directs the laser beam 262 from the laser device 260 across the chamber 242 in a plane that is above and substantially parallel to the rotatable substrate support surface 250 disposed within the chamber 242, wherein the laser beam 262 is disposed above the rotatable substrate support surface by a distance of 10 mm or less; and the outlets 226 of the set of conduits 220 are configured to introduce a first precursor 270 and a second precursor 280 into the chamber 242 toward the rotatable substrate support surface 250, such that the first precursor 270 and the second precursor 280 flow through the laser beam 262 within the chamber 242 prior to reaching the rotatable substrate support surface 250.

As used herein, "a set of conduits 220" and "the set of conduits 220" are meant to include any number of conduits 220 in any arrangement. Thus, for example "a set of conduits 220" includes one or more conduits 220 (e.g., 2 or more, 3 or more, 4 or more, 5 or more, 6 or more, 7 or more, 8 or more, 9 or more, 10 or more, 15 or more, 20 or more, 25 or more, 30 or more, 40 or more, 50 or more, 60 or more, 70 or more, 80 or more, 90 or more, 100 or more, 150 or more, 200 or more, 250 or more, 300 or more, 350 or more, 400 or more, 450 or more, 500 or more, 600 or more, 700 or more, 800 or more, 900 or more, or 1000 or more). In some embodiments, the set of conduits 220 can comprise a plurality of conduits 220. In some embodiments, the set of conduits 220 can comprise a plurality of conduits 220 arranged in an ordered array.

The cross-sectional shape of each of conduits 220 in a plane perpendicular to the central longitudinal axis of said conduit 220 can be any shape, such as a regular shape, an irregular shape, an isotropic shape, or an anisotropic shape. In some examples, the cross-sectional shape of each of conduits 220 in the set of conduits 220 can be substantially circular, ovate, ovoid, elliptic, triangular, rectangular, polygonal, etc. In some examples, the cross-sectional shape of each of the conduits 220 can be substantially circular.

The set of conduits 220 can have an average characteristic dimension. The term "characteristic dimension," as used herein refers to the largest straight line distance between two points in the plane of the cross-sectional shape of each of the set of conduits. "Average characteristic dimension" and "mean characteristic dimension" are used interchangeably herein, and generally refer to the statistical mean characteristic dimension of the conduits in a population of conduits. For example, for a cylindrical set of conduits, the cross-sectional shape can be substantially circular and the average characteristic dimension can refer to the diameter.

The average characteristic dimension of the set of conduits 220 can, for example, be 0.1 millimeter (mm) or more (e.g., 0.25 mm or more, 0.5 mm or more, 0.75 mm or more, 1 mm or more, 1.25 mm or more, 1.5 mm or more, 1.75 mm or more, 2 mm or more, 2.25 mm or more, 2.5 mm or more, 2.75 mm or more, 3 mm or more, 3.25 mm or more, 3.5 mm or more, 3.75 mm or more, 4 mm or more, 4.25 mm or more, 4.5 mm or more, 4.75 mm or more, 5 mm or more, 5.5 mm or more, 6 mm or more, 6.5 mm or more, 7 mm or more, 7.5 mm or more, 8 mm or more, 8.5 mm or more, 9 mm or more, or 9.5 mm or more). In some examples, the average characteristic dimension of the set of conduits 220 can be 10 millimeters (mm) or less (e.g., 9.5 mm or less, 9 mm or less, 8.5 mm or less, 8 mm or less, 7.5 mm or less, 7 mm or less, 6.5 mm or less, 6 mm or less, 5.5 mm or less, 5 mm or less, 4.75 mm or less, 4.5 mm or less, 4.25 mm or less, 4 mm or less, 3.75 mm or less, 3.5 mm or less, 3.25 mm or less, 3 mm or less, 2.75 mm or less, 2.5 mm or less, 2.25 mm or less, 2 mm or less, 1.75 mm or less, 1.5 mm or less, 1.25 mm or less, 1 mm or less, 0.75 mm or less, 0.5 mm or less, or 0.25 mm or less). The average characteristic dimension of the set of conduits 220 can range from any of the minimum values described above to any of the maximum values described above. For example, the average characteristic dimension of the set of conduits 220 can be from 0.1 mm to 10 mm (e.g., from 0.1 mm to 5 mm, from 5 mm to 10 mm, from 0.1 mm to 2.5 mm, from 2.5 mm to 5 mm, from 5 mm to 7.5 mm, from 7.5 mm to 10 mm, from 0.1 mm to 9.5 mm, from 0.5 mm to 10 mm, or from 0.5 mm to 9.5 mm).

The inlets 224 and the outlets 226 of each of the conduits 220 can, independently, be any shape, such as a regular shape, an irregular shape, an isotropic shape, or an anisotropic shape. In some examples, the inlets 224 and/or the outlets 226 of the set of conduits 220 can have a shape that is substantially circular, ovate, ovoid, elliptic, triangular, rectangular, polygonal, etc. In some examples, the shape of the inlets 224 and/or the outlets 226 of the set of conduits 220 can be substantially circular. The inlets 224 and/or the outlet 226 of each of the set of conduits 220 can, for example, be the cross-section in a plane perpendicular to the central longitudinal axis of said conduit 220, such that the shape of the inlets 224 and/or the outlet 226 of each of the set of conduits 220 can be the cross-sectional shape of each of the conduits 220.

The inlets 224 and the outlets 226 of the set of conduits 220 can, independently, have an average characteristic dimension. The term "characteristic dimension," as used herein refers to the largest straight line distance between two points in the plane of the inlet or the outlet. "Average characteristic dimension" and "mean characteristic dimension" are used interchangeably herein, and generally refer to the statistical mean characteristic dimension of the inlets and/or outlets in a population of inlets and/or outlets. For example, for a cylindrical set of conduits 220, the inlets 224 and/or the outlets 226 can be substantially circular in shape and the average characteristic dimension can refer to the diameter.

The average characteristic dimension of the inlets 224 and/or the outlets 226 of the set of conduits 220 can, for example, be 0.1 millimeter (mm) or more (e.g., 0.25 mm or more, 0.5 mm or more, 0.75 mm or more, 1 mm or more, 1.25 mm or more, 1.5 mm or more, 1.75 mm or more, 2 mm or more, 2.25 mm or more, 2.5 mm or more, 2.75 mm or more, 3 mm or more, 3.25 mm or more, 3.5 mm or more, 3.75 mm or more, 4 mm or more, 4.25 mm or more, 4.5 mm or more, 4.75 mm or more, 5 mm or more, 5.5 mm or more, 6 mm or more, 6.5 mm or more, 7 mm or more, 7.5 mm or more, 8 mm or more, 8.5 mm or more, 9 mm or more, or 9.5 mm or more). In some examples, the average characteristic dimension of the inlets 224 and/or the outlets 226 of the set of conduits 220 can be 10 millimeters (mm) or less (e.g., 9.5 mm or less, 9 mm or less, 8.5 mm or less, 8 mm or less, 7.5 mm or less, 7 mm or less, 6.5 mm or less, 6 mm or less, 5.5 mm or less, 5 mm or less, 4.75 mm or less, 4.5 mm or less, 4.25 mm or less, 4 mm or less, 3.75 mm or less, 3.5 mm or less, 3.25 mm or less, 3 mm or less, 2.75 mm or less, 2.5 mm or less, 2.25 mm or less, 2 mm or less, 1.75 mm or less, 1.5 mm or less, 1.25 mm or less, 1 mm or less, 0.75 mm or less, 0.5 mm or less, or 0.25 mm or less). The average characteristic dimension of the inlets 224 and/or the outlets 226 of the set of conduits 220 can range from any of the minimum values described above to any of the maximum values described above. For example, the average characteristic dimension of the inlets 224 and/or the outlets 226 of the set of conduits 220 can be from 0.1 mm to 10 mm (e.g., from 0.1 mm to 5 mm, from 5 mm to 10 mm, from 0.1 mm to 2.5 mm, from 2.5 mm to 5 mm, from 5 mm to 7.5 mm, from 7.5 mm to 10 mm, from 0.1 mm to 9.5 mm, from 0.5 mm to 10 mm, or from 0.5 mm to 9.5 mm).

In some examples, the each of the outlets 226 of the set of conduits 220 can further comprise a nozzle (not shown) fluidly connected to each of the outlets 226 of the set of conduits 220. Each nozzle can, for example, have an average characteristic dimension and a cross-sectional shape, wherein the average characteristic dimension of the nozzles, the cross-sectional shape of the nozzles, or a combination thereof can be the same or different than that of the outlets 226 of the set of conduits 220. In some examples, the average characteristic dimension of the nozzles can be smaller than the average characteristic dimension of the outlets 226 of the set of conduits 220. In some examples, the cross-sectional shape of the nozzles can be substantially circular. The average characteristic dimension of the nozzles, the cross-sectional shape of the nozzles, the orientation of the nozzles, or a combination thereof can be used to affect and/or control how the first precursor 270 and/or the second precursor 280 is/are introduced into the chamber 242 (e.g., speed, direction, volume, etc.).

The number of conduits 220, the arrangement of the conduits 220, the cross-sectional shape of the conduits 220, the shape of the outlets 226 of the conduits 220, the average characteristic dimension of the outlets 226 of the conduits 220, the presence or absence of the nozzles fluidly connected to each of the outlets 226 of the set of conduits 220, the average characteristic dimension of the nozzles fluidly connected to each of the outlets 226 of the set of conduits 220 (when present), the cross-sectional shape of the nozzles fluidly connected to each of the outlets 226 of the set of conduits 220 (when present), or a combination thereof can be selected, for example, in view of the number of laser beams 262 within the chamber 242, the size of the laser beam(s) 262, the wavelength(s) of the laser beam(s) 262, the intensity of the laser beam(s) 262 within the chamber 242, the size of the chamber 242, the size of the rotatable substrate support surface 250, or a combination thereof.

The source distributor 290 can have a first surface and a second surface opposite and spaced apart from the first surface, wherein the set of conduits 220 traverse the source distributor 290 from the first surface to the second surface, and wherein the second surface of the source distributor 290 is substantially parallel and spaced apart from the rotatable substrate support surface 250. The source distributor 290 can, for example, form a lid to the chamber 242.

The source distributor 290 can, in some examples, be hollow such that a cooling medium can be included within the source distributor 290, for example to dissipate heat (e.g., from the heater, from the laser energy, or a combination thereof). The source distributor 290 can, in some examples, comprise inside space (not shown), which have an inlet fluidly connected to an outlet, wherein the inlet and the outlet are configured to provide a path for flowing the cooling medium through the inside space within the source distributor. In some examples, the cooling medium can comprise water.

The source distributor 290 can, for example, define the set of conduits 220. In some examples, such as shown in FIG. 15, the set of conduits 220 are defined by the source distributor 290. In some examples, the outlets 226 of the set of conduits 220 are located in an ordered array. In some examples, the outlets 226 of the set of conduits 220 are evenly spaced throughout at least a portion of the source distributor 290. In some examples, the outlets 226 of the set of conduits 220 are located in an ordered array and evenly spaced throughout at least a portion of the source distributor 290.

Figure 16:
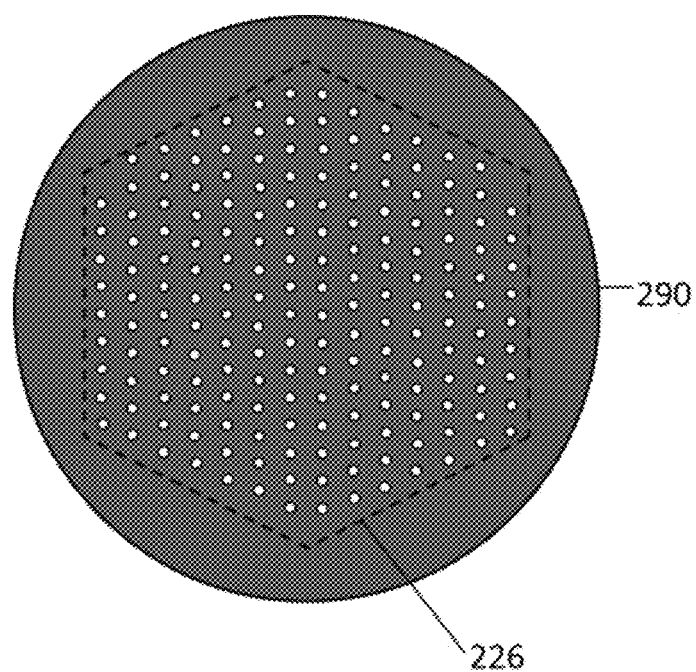
FIG. 16 is a schematic cross-sectional plan view of the second (e.g., bottom) surface of the source distributor showing the arrangement of the outlets of the set of conduits in one implementation of an example device.

FIG. 16 is a schematic cross-sectional plan view of one implementation of an example device 200 showing the second surface (e.g., bottom surface) of the source distributor 290 and the arrangement of the outlets 226 of the set of conduits 220 in one implementation of the device 800. Referring now to FIG. 16, in some examples, the device 200 comprises a source distributor 290, wherein the set of conduits 220 are defined by the source distributor 290, and the outlets 226 of the set of conduits 220 are located in an ordered array and are evenly spaced throughout at least a portion of the source distributor 290.

The outlets 226 of the set of conduits 220 are configured to introduce a first precursor 270 and a second precursor 280 into the chamber 242 toward the rotatable substrate support surface 250, such that the first precursor 270 and the second precursor 280 flow through the laser beam 262 within the chamber 242 prior to reaching the rotatable substrate support surface 250. In some examples, the outlets 226 of the set of conduits 220 are configured to introduce the first precursor 270 and the second precursor 280 substantially perpendicular to a central axis of the laser beam 262 within the chamber 242. In some examples, the outlets 226 of the set of conduits 220 are configured to introduce the first precursor 270 and the second precursor 280 substantially perpendicular to the rotatable substrate support surface 250.

In some examples, the outlets 226 of the set of conduits 220 are configured to introduce the first precursor 270 and the second precursor 280 substantially uniformly throughout the chamber 242. In some examples, the outlets 226 of the set of conduits 220 are positioned in an ordered array and evenly spaced throughout the source distributor 290, such that the outlets 226 of the set of conduits 220 are configured to introduce the first precursor 270 and the second precursor 280 substantially uniformly throughout the chamber 242.

In some examples, the set of conduits 220 comprises a plurality of conduits and the plurality of conduits can comprise a set of first conduits and a set of second conduits, the outlets of the set of first conduits being configured to introduce the first precursor 270 into the chamber 242 toward the rotatable substrate support surface 250, the outlets of the set of second conduits being configured to introduce the second precursor 280 into the chamber 242 toward the rotatable substrate support surface 250. In some examples, the outlet of one or more of the first set of conduits is/are located adjacent the outlet of at least one of the second set of conduits. In some examples, the outlet of one or more of the first set of conduits is/are located directly adjacent the outlet of at least one of the second set of conduits. In some examples, the outlets of the first set of conduits are located in an ordered array and the outlets of the second set of conduits are located in an ordered array, evenly spaced and interspersed between the outlets of the first set of conduits.

At least one of the set of laser windows 210 is configured such that the interior face 216 of the laser window 210 directs a laser beam 262 across the chamber 242 in a plane that is above and substantially parallel to the rotatable substrate support surface 250 disposed within the chamber 242. In some examples, the device 200 includes one laser window 210 which is configured such that the interior face 216 of the laser window 210 directs a laser beam 262 across the chamber 242 in a plane that is above and substantially parallel to the rotatable substrate support surface 250 disposed within the chamber 242. In some examples, the device 200 includes a plurality of laser windows 210, each of which is configured such that the interior face 216 of the laser window 210 directs a laser beam 262 across the chamber 242 in a plane that is above and substantially parallel to the rotatable substrate support surface 250 disposed within the chamber 242.

The laser beam 262 (e.g., the one or more laser beams 262) introduced into the chamber 242 is directed across the chamber 242 in a plane that is above and substantially parallel to the rotatable substrate support surface 250 disposed within the chamber 242 such that the laser beam 262 is disposed above the rotatable substrate support surface 250 by a distance of 10 millimeters (mm) or less (e.g., 9.5 mm or less, 9 mm or less, 8.5 mm or less, 8 mm or less, 7.5 mm or less, 7 mm or less, 6.5 mm or less, 6 mm or less, 5.5 mm or less, 5 mm or less, 4.75 mm or less, 4.5 mm or less, 4.25 mm or less, 4 mm or less, 3.75 mm or less, 3.5 mm or less, 3.25 mm or less, 3 mm or less, 2.75 mm or less, 2.5 mm or less, 2.25 mm or less, 2 mm or less, 1.75 mm or less, 1.5 mm or less, 1.25 mm or less, 1 mm or less, 0.75 mm or less, 0.5 mm or less, or 0.25 mm or less). In some examples the laser beam 262 is disposed above the rotatable substrate support surface 250 by a distance of 0 mm or more (e.g., 0.25 mm or more, 0.5 mm or more, 0.75 mm or more, 1 mm or more, 1.25 mm or more, 1.5 mm or more, 1.75 mm or more, 2 mm or more, 2.25 mm or more, 2.5 mm or more, 2.75 mm or more, 3 mm or more, 3.25 mm or more, 3.5 mm or more, 3.75 mm or more, 4 mm or more, 4.25 mm or more, 4.5 mm or more, 4.75 mm or more, 5 mm or more, 5.5 mm or more, 6 mm or more, 6.5 mm or more, 7 mm or more, 7.5 mm or more, 8 mm or more, 8.5 mm or more, 9 mm or more, or 9.5 mm or more). The distance that the laser beam 262 is disposed above the rotatable substrate support surface 250 can range from any of the minimum values described above to any of the maximum values described above. For example, the laser beam 262 can be disposed above the rotatable substrate support surface by a distance of from 0 mm to 10 mm (e.g., from 0 mm to 5 mm, from 5 mm to 10 mm, from 0 mm to 2.5 mm, from 2.5 mm to 5 mm, from 5 mm to 7.5 mm, from 7.5 mm to 10 mm, from 0 mm to 9 mm, from 1 mm to 10 mm, from 1 mm to 9 mm, from 0 mm to 8 mm, from 0 mm to 6 mm, from 0 mm to 4 mm, or from 1 mm to 3 mm).

Each of the one or more laser beams 262 comprises electromagnetic radiation with at least one wavelength that overlaps with at least a portion of a vibrational mode of the first precursor 270, thereby generating an active species (e.g., an irradiated first precursor) in situ. In some examples, the wavelength of the laser beam 262 is selected in view of the identity of the first precursor 270, such that the laser beam 262 comprise electromagnetic radiation with at least one wavelength that overlaps with at least a portion of a vibrational mode of the first precursor 270, such that irradiation of the first precursor 270 with the laser beam(s) 262 can enhance the cracking efficiency of the first precursor 270.

In some examples, the device 200 is configured to deposit a material via laser-assisted metal-organic vapor deposition from the first precursor 270 and the second precursor 280 on one or more substrates disposed on the rotatable substrate support surface 250 within the chamber 242. In some examples, the distance at which the laser beam 262 is located above the rotatable substrate support surface 250 can be selected, for example, such that background incorporation of carbon into the deposited material is suppressed (e.g., reduced or minimized relative to the amount of carbon incorporated in the deposited semiconductor when the laser beam 262 is located at a distance greater than 10 mm above the rotatable substrate support surface).

In some examples, the device 200 is configured to deposit a III-V semiconductor, such that the first precursor 270 comprises a V-group precursor and the second precursor 280 comprises a III-group precursor.

The first precursor 270 can, for example, comprise a V-group precursor, such as a compound, element, or composition comprising N, P, As, Sb, Bi, or a combination thereof. In some examples, the first precursor 270 can comprise a nitrogen species. In some examples, the first precursor 270 can comprise $NH_3$. The first precursor 270 can, for example, comprise a fluid, such as a gas.

The second precursor 280 can, for example, comprise a III-group precursor, such as compound, element, or composition comprising B, Al, Ga, In, Tl, or a combination thereof. In some examples, the second precursor 280 can comprise a gallium species. In some examples, the second precursor 280 can comprise trimethylgallium, triethylgallium, or a combination thereof. The second precursor 280 can, for example, comprise a fluid, such as a gas.

In some examples, the device 200 is configured to deposit a group III oxide semiconductor, such that the first precursor 270 comprises an oxygen containing precursor and the second precursor 280 comprises a III-group precursor.

In some examples, the device 200 is configured to deposit a group II-VI semiconductor material, such that the first precursor 270 comprises a VI-group precursor (e.g., a compound/composition/element comprising O, S, Se, Te, or a combination thereof) and the second precursor 280 comprises a II-group precursor (e.g., a compound/composition/element comprising Be, Mg, Ca, Sr, Ba, Zn, Cd, Hg, or a combination thereof).

In some examples, the device 200 is configured to deposit a group II-IV-$V_2$ semiconductor, such that the first precursor 270 comprises a V-group precursor (e.g., a compound, element, or composition comprising N, P, As, Sb, Bi, or a combination thereof) and the second precursor 280 comprises a mixture of a II-group precursor (e.g., a compound/composition/element comprising Be, Mg, Ca, Sr, Ba, Zn, Cd, Hg, or a combination thereof) and a IV-group precursor (e.g., a compound/composition/element comprising C, Si, Ge, Sn, Pb, or a combination thereof).

In some examples, the device 200 is configured to introduce the first precursor 270 into the chamber 242 continuously or intermittently. In some examples, the device 200 is configured to introduce the second precursor 280 continuously or intermittently.

In some examples, the device 200 is configured to introduce the first precursor 270 and the second precursor 280 into the chamber 242 alternately. In some examples, the device 200 is configured to introduce the first precursor 270 and the second precursor 280, wherein at least a portion of the introduction of the second precursor 280 is concurrent with at least a portion of the introduction of the first precursor 270, or vice versa. In some examples, the device 200 is configured to introduce the first precursor 270 and the second precursor 280 to the chamber simultaneously.

In some examples, the outlets 226 of the set of conduits 220 are further configured to introduce a dopant (e.g., one or more dopants) into the chamber 242 toward the rotatable substrate support surface 250. The one or more dopants can be selected in view of the first precursor 270 and/or the second precursor 280. The one or more dopants can be, for example, a fluid, such as a gas. In some examples, the one or more dopants can comprise an n-type dopant (e.g., silane ($SiH_4$), germane ($GeH_4$), disilane($Si_2H_6$)), a p-type dopant (e.g., bis(cyclopentadienyl)magnesium ($Cp_2Mg$), bis(methylcyclopentadienyl)magnesium (($MeCp)_2Mg$)), or a combination thereof. In some examples, the one or more dopants can comprise silane ($SiH_4$), germane ($GeH_4$), disilane ($Si_2H_6$), bis(cyclopentadienyl)magnesium ($Cp_2Mg$), bis(methylcyclopentadienyl)magnesium (($MeCp)_2Mg$), or a combination thereof. The one or more dopants can, for example, be mixed with the first precursor 270 and/or the second precursor 280 prior to introduction into the chamber 242. In some examples, the device 200 is configured to introduce the first precursor 270, the second precursor 280, and the one or more dopants into the chamber 242 consecutively in turn. In some examples, the device 200 is configured to introduce the first precursor 270 and the one or more dopants, wherein at least a portion of the introduction of the one or more dopants is concurrent with at least a portion of the introduction of the first precursor 270, or vice versa. In some examples, the device 200 is configured to introduce the second precursor 280 and the one or more dopants, wherein at least a portion of the introduction of the one or more dopants is concurrent with at least a portion of the introduction of the second precursor 280, or vice versa. In some examples, the device is configured to introduce the first precursor 270, the second precursor 280, and the one or more dopants into the chamber 242 simultaneously.

In some examples, the outlets 226 of the set of conduits 220 are further configured to introduce a carrier gas (e.g., one or more carrier gases) into the chamber 242 toward the rotatable substrate support surface 250. The one or more carrier gases can be selected in view of the first precursor 270, the second precursor 280, the one or more dopants (when present), or a combination thereof. The one or more carrier gases can be, for example, argon, helium, $H_2$, $N_2$, and the like, or combinations thereof. The one or more carrier gases can, for example, be mixed with the first precursor 270, the second precursor 280, the one or more dopants (when present), or a combination thereof prior to introduction into the chamber 242. In some examples, the device 200 is configured to introduce the first precursor 270, the second precursor 280, the one or more dopants (when present), or a combination thereof concurrently with at least a portion of the introduction of the one or more carrier gases.

The devices 200 described herein can further comprise or be assembled with a variety of additional components.

The devices 200 can, for example, be assembled together with, or in some examples can further comprise, the rotatable substrate support surface 250. The rotatable substrate support surface 250 can be any shape, such as a regular shape, an irregular shape, an isotropic shape, or an anisotropic shape. In some examples, the shape of the rotatable substrate support surface can be substantially circular, ovate, ovoid, elliptic, triangular, rectangular, polygonal, etc. In some examples, the shape of the rotatable substrate support surface can be substantially circular. The size and shape of the rotatable substrate support surface 250 can, for example, be selected in view of the size and shape of the chamber 242.

The rotatable substrate support surface 250 can support one or more substrates (not shown) (e.g., 2 or more, 3 or more, 4 or more, 5 or more, 6 or more, 7 or more, 8 or more, 9 or more, 10 or more, 15 or more, 20 or more, 25 or more, 30 or more, 35 or more, 40 or more, 45 or more, 50 or more, 60 or more, 70 or more, 80 or more, 90 or more, 100 or more, 150 or more, 200 or more, 250 or more, 300 or more, 350 or more, 400 or more, 450 or more, 500 or more, 600 or more, 700 or more, 800 or more, 900 or more, 1000 or more, 1500 or more, or 2000 or more) to be coated with a material via laser-assisted metal-organic vapor deposition from the first precursor 270 and the second precursor 280 (and one or more dopants, if present) within the chamber 242. The devices 200 can, for example, be assembled together with, or in some examples can further comprise the one or more substrates (not shown) disposed on the rotatable substrate support surface 250.

The number of substrates disposed on the rotatable substrate support surface 250 can be selected, for example, in view of the size of the one or more substrates and/or the size of the rotatable substrate support surface 250. The devices 200 can, for example, be configured to rotate the rotatable substrate support 250 surface to thereby provide a more uniform coating of the material on the one or more substrates via laser-assisted metal-organic vapor deposition.

The one or more substrates can have an average characteristic dimension. The average characteristic dimension of the one or more substrates can, for example, be 1 inch or more (e.g., 2 inches or more, 3 inches or more, 4 inches or more, 5 inches or more, 6 inches or more, 7 inches or more, 8 inches or more, 9 inches or more, 10 inches or more, 11 inches or more, 12 inches or more, 13 inches or more, 14 inches or more, 15 inches or more, 16 inches or more, 17 inches or more, 18 inches or more, 19 inches or more, 20 inches or more, 25 inches or more, 30 inches or more, or 35 inches or more). In some examples, the average characteristic dimension of the one or more substrates can be 36 inches or less (e.g., 35 inches or less, 30 inches or less, 25 inches or less, 20 inches or less, 19 inches or less, 18 inches or less, 17 inches or less, 16 inches or less, 15 inches or less, 14 inches or less, 13 inches or less, 12 inches or less, 11 inches or less, 10 inches or less, 9 inches or less, 8 inches or less, 7 inches or less, 6 inches or less, 5 inches or less, 4 inches or less, 3 inches or less, or 2 inches or less). The average characteristic dimension of the one or more substrates can range from any of the minimum values described above to any of the maximum values described above. For example, the average characteristic dimension of the one or more substrates can be from 1 inch to 36 inches (e.g., from 1 inch to 18 inches, from 18 inches to 36 inches, from 1 inch to 6 inches, from 6 inches to 12 inches, from 12 inches to 18 inches, from 18 inches to 24 inches, from 24 inches to 30 inches, from 30 inches to 36 inches, from 2 inches to 36 inches, from 1 inch to 30 inches, from 2 inches to 30 inches, from 1 inch to 18 inches, from 1 inch to 12 inches, or from 2 inches to 8 inches).

The one or more substrates can be any shape, such as a regular shape, an irregular shape, an isotropic shape, or an anisotropic shape. In some examples, the shape of the one or more substrates can be substantially circular, ovate, ovoid, elliptic, triangular, rectangular, polygonal, etc. In some examples, the shape of the one or more substrates can be substantially circular, such that the average characteristic dimension is the diameter.

The one or more substrates can comprise any suitable material. Examples of suitable substrates include, but are not limited to, bulk GaN, GaN template, sapphire, $Al_2O_3$, $LiAlO_2$, Si, SiC, zinc oxide, bulk AlN, AlN on sapphire template, and combinations thereof.

The devices 200 can, for example, be assembled together with, or in some examples can further comprise, a laser device 260 (e.g., one or more laser devices 260) for producing a laser beam 262 (e.g., one or more laser beams 262). In some examples, the devices 200 can comprise one laser device 260. In some examples, the devices 200 can comprise a plurality of laser devices 260.

Each laser device 260 can, for example, comprise one or more lasers. In some examples, the laser device 260 can further comprise a laser distributor and/or beam splitter for splitting each of the one or more lasers into a plurality of laser beams 262. In some examples, the laser device 260 can further comprise a beam shaper to control/adjust the shape of the laser beam. In some examples, the laser device 260 can further comprise a beam sizer to control/adjust the size (e.g., diameter) of the laser beam. In some examples, the laser device 260 can further comprise a beam directing and positioning module to control/adjust the direction and/or position of the laser beam. In some examples, the laser device 260 can further comprise one or more lenses, for example to control/adjust the size, shape, direction, position, uniformity (e.g., with respect to intensity), etc. of the laser beam. The one or more lenses can be any type of lens, such as a simple lens, a compound lens, a spherical lens, a toric lens, a biconvex lens, a plano-convex lens, a plano-concave lens, a negative meniscus lens, a positive meniscus lens, a biconcave lens, a converging lens, a diverging lens, a cylindrical lens, a Fresnel lens, a lenticular lens, a gradient index lens, or a combination thereof.

The wavelength(s) of the one or more lasers can be selected, for example, in view of the identity of the first precursor 270. In some examples, the one or more lasers can comprise an infrared laser. In some examples, the one or more lasers can comprise a $CO_2$ laser, such as a tunable $CO_2$ laser.

Figure 17:
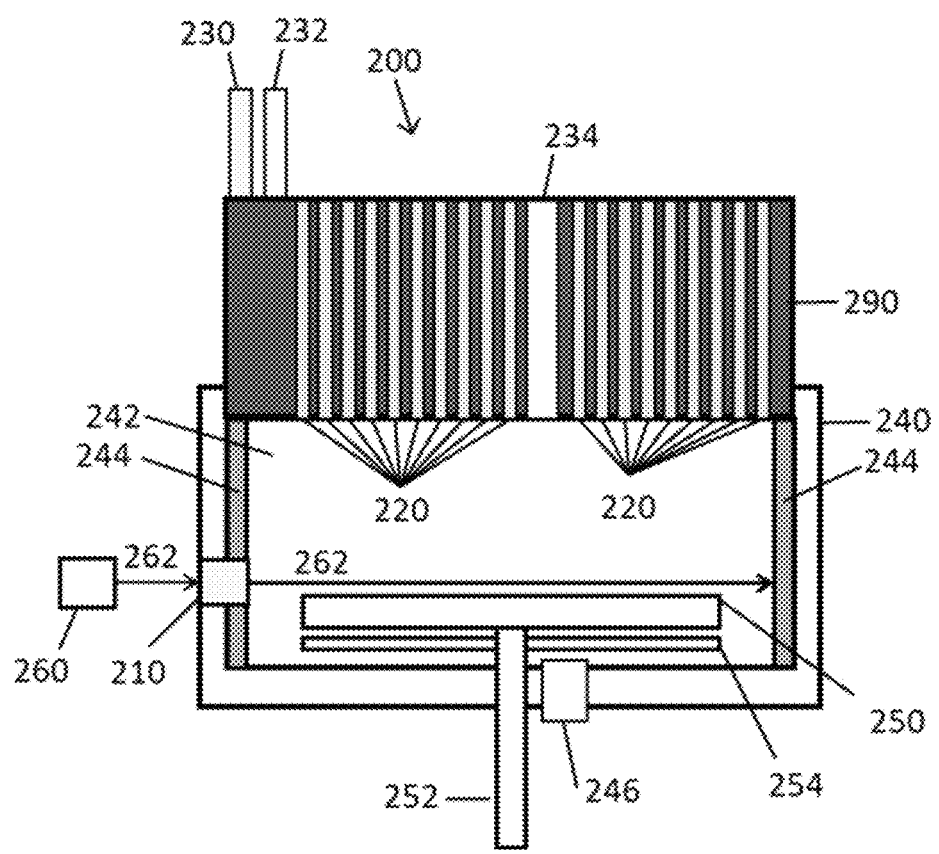
FIG. 17 is a schematic cross-sectional plan view of an example device as disclosed herein according to one implementation.

The devices 200 described herein can further comprise or be assembled with a variety of additional components, for example as shown in FIG. 17. Though the some of the elements are only shown in FIG. 17, any of the one or more additional elements or any combination of the one or more additional elements shown in FIG. 17 can be present in any of the other embodiments of the devices 200 described herein.

Referring now to FIG. 17, in some examples, the interior surface of wall 240 (e.g., the surface of the wall 240 within the chamber 242) can further comprise a coating 244, wherein the coating 244 can comprise a material that can absorb at least a portion of the laser beam energy. The interior face 216 of each of the set of laser windows 210 is substantially free of the coating 244, when present. Though the coating 244 is only shown in FIG. 17, the coating 244 can be present in any of the other embodiments of the devices 200 described herein.

In some examples, the wall 240 can further comprise an exhaust port 246 which fluidly couples the chamber 242 with an external environment. Though the exhaust port 246 is only shown in FIG. 17, the exhaust port 246 can be present in any of the other embodiments of the devices 200 described herein.

In some examples, the rotatable substrate support surface 250 can be coupled to or further comprise a rotary spindle 252. For example, the rotatable substrate support surface 250 can be centrally mounted on the rotary spindle 252, and the rotary spindle 252 can be rotated to rotate the rotatable substrate support surface 250. In some examples, the rotary spindle 252 can further be coupled to a means for rotating the rotary spindle 252. The devices 200 can, for example, be configured to rotate the rotary spindle 252 and thus rotate the rotatable substrate support surface 250 to thereby provide a more uniform coating of the material on the one or more substrates via laser-assisted metal-organic vapor deposition. Though the rotary spindle 252 is only shown in FIG. 17, the rotary spindle 252 can be present in any of the other embodiments of the devices 200 described herein.

In some examples, the devices 200 can further be assembled with, or in some examples can further comprise, a heater 254 thermally coupled to the rotatable substrate support surface 250 within the chamber 242. The heater 254 can, for example, be located below the rotatable substrate support surface 250, and optionally spaced apart from the rotatable substrate support surface 250, relative to the position of the outlets 226 of the set of conduits 220. In some examples, the devices 200 can further comprise a means for controlling the temperature of (e.g., heating) the heater 254. Though the heater 254 is only shown in FIG. 17, the heater 254 can be present in any of the other embodiments of the devices 200 described herein.

In some examples, the heater 254 can be heated such that the one or more substrates is at a temperature of 100° C. or more (e.g., 150° C. or more, 200° C. or more, 250° C. or more, 300° C. or more, 350° C. or more, 400° C. or more, 450° C. or more, 500° C. or more, 550° C. or more, 600° C. or more, 650° C. or more, 700° C. or more, 750° C. or more, 800° C. or more, 850° C. or more, 900° C. or more, 950° C. or more, 1000° C. or more, 1100° C. or more, 1200° C. or more, 1300° C. or more, 1400° C. or more, 1500° C. or more, 1600° C. or more, 1700° C. or more, 1800° C. or more, or 1900° C. or more). In some examples, the heater 254 can be heated such that the one or more substrates is at a temperature of 2000° C. or less (e.g., 1900° C. or less, 1800° C. or less, 1700° C. or less, 1600° C. or less, 1500° C. or less, 1400° C. or less, 1300° C. or less, 1200° C. or less, 1100° C. or less, 1000° C. or less, 950° C. or less, 900° C. or less, 850° C. or less, 800° C. or less, 750° C. or less, 700° C. or less, 650° C. or less, 600° C. or less, 550° C. or less, 500° C. or less, 450° C. or less, 400° C. or less, 350° C. or less, 300° C. or less, 250° C. or less, 200° C. or less, or 150° C. or less). The temperature at which the one or more substrates are heated by the heater 254 can range from any of the minimum values described above to any of the maximum values described above. For example, the heater 254 can be heated such that the one or more substrates is at a temperature of from 100° C. to 2000° C. (e.g., from 100° C. to 1000° C., from 1000° C. to 2000° C., from 100° C. to 500° C., from 500° C. to 900° C., from 900° C. to 1300° C., from 1300° C. to 1700° C., from 1700° C. to 2000° C., from 400° C. to 2000° C., from 100° C. to 1500° C., or from 400° C. to 1500° C.). In some examples, the temperature at which the one or more substrates are heated by the heater 254 can be selected in view of the identity of the second precursor 280, such that the temperature at which the one or more substrates are heated by the heater can thermally decompose the second precursor at or near the one or more substrates, to thereby form an active species (e.g., a thermal decomposition species) in situ.

The devices 200 can, for example, be assembled together with, or in some examples can further comprise, an in-situ monitor, such as a camera and/or a window. In some examples, the in-situ monitor can comprise a window or viewport 234 defined by the source distributor 290. The in-situ monitor can allow for visual inspection inside the chamber 242 when the device 200 is assembled. Though the viewport 234 is only shown in FIG. 17, the viewport 234 can be present in any of the other embodiments of the devices 200 described herein.

The devices 200 can, for example, be assembled together with, or in some examples can further comprise, a first precursor conduit 230 fluidly connected to the chamber 242 via the set of conduits 220. For example, the first precursor conduit 230 can be fluidly connected to the inlets 224 of the set of conduits 220, for example via the source distributor 290. The first precursor conduit 230 can, for example, fluidly connect a first precursor source (not shown) to the chamber 242 via the set of conduits 220. The first precursor conduit 230 can define an inlet, an outlet opposite and spaced apart from the inlet, and a path for fluid flow extending from the inlet to the outlet, wherein the inlet of the first precursor conduit 230 can be fluidly coupled to the first precursor source and the outlet of the first precursor conduit 230 can be fluidly connected to the inlets 224 of the set of conduits 220, for example via the source distributor 290. Though the first precursor conduit 230 is only shown in FIG. 17, the first precursor conduit 230 can be present in any of the other embodiments of the devices 200 described herein.

The devices 200 can, for example, be assembled together with, or in some examples can further comprise, a second precursor conduit 232 fluidly connected to the chamber 242 via the set of conduits 220. For example, the second precursor conduit 232 can be fluidly connected to the inlets 224 of the set of conduits 220, for example via the source distributor 290. The second precursor conduit 232 can, for example, fluidly connect a second precursor source (not shown) to the chamber 242 via the set of conduits 220. The second precursor conduit 232 can define an inlet, an outlet opposite and spaced apart from the inlet, and a path for fluid flow extending from the inlet to the outlet, wherein the inlet of the second precursor conduit 232 can be fluidly coupled to the second precursor source and the outlet of the second precursor conduit 232 can be fluidly connected to the inlets 224 of the set of conduits 220, for example via the source distributor 290. Though the second precursor conduit 232 is only shown in FIG. 17, the second precursor conduit 232 can be present in any of the other embodiments of the devices 200 described herein.

Figure 18:
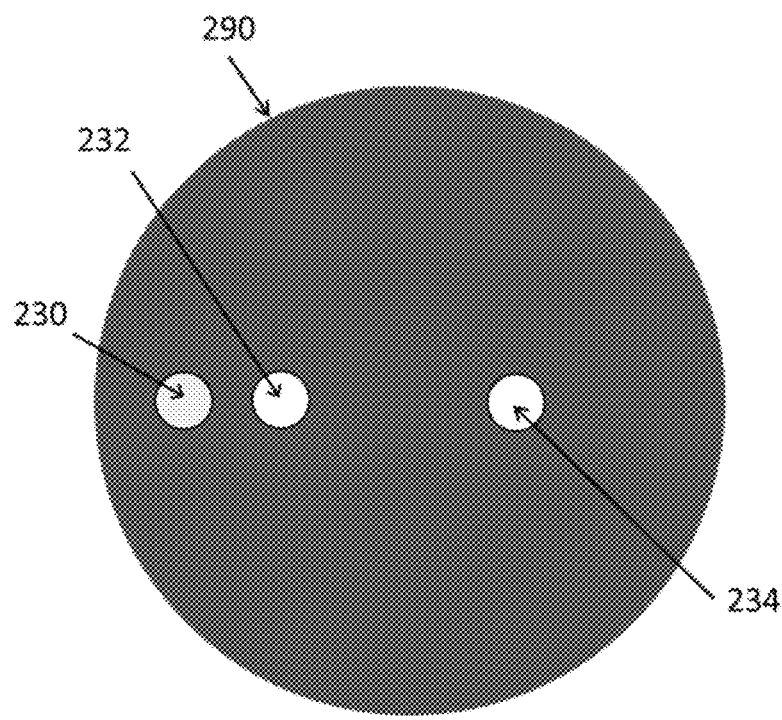
FIG. 18 is a schematic cross-sectional plan view of the first (e.g., top) surface of the source distributor showing the arrangement of the first precursor conduit, the second precursor conduit, and the viewport in one implementation of the example device shown in FIG. 17.
Figure 19:
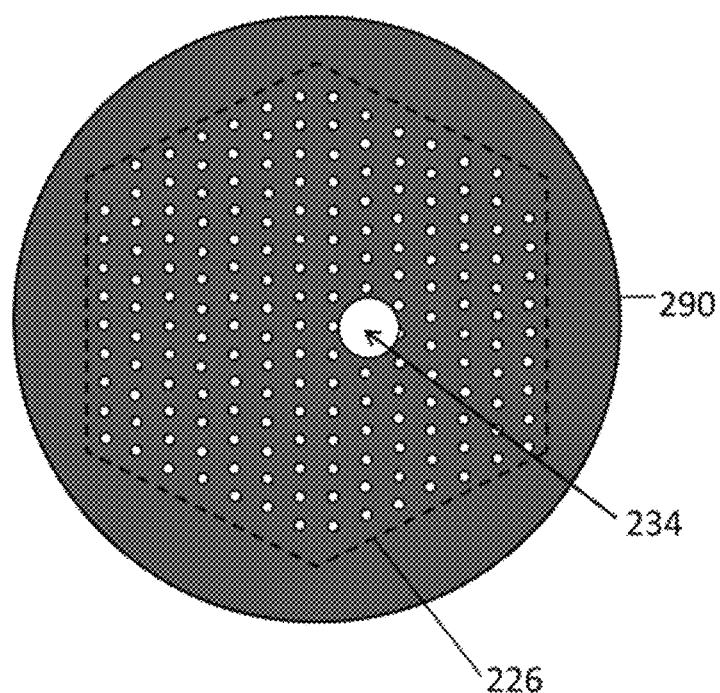
FIG. 19 is a schematic cross-sectional plan view of the second (e.g., bottom) surface of the source distributor (a view of the opposite surface of the source distributor shown in FIG. 18) showing the arrangement of the outlets of the set of conduits and the viewport in one implementation of the example device shown in FIG. 17-FIG. 18.

FIG. 18 is a schematic cross-sectional plan view of the example device 200 shown in FIG. 17, showing the first surface (e.g., top surface) of the source distributor 290 and the arrangement of the first precursor conduit 230, the second precursor conduit 232, and the viewport 234 in one implementation of the device 200. FIG. 18 is a schematic cross-sectional plan view of the example device 200 shown in FIG. 17 and FIG. 18, showing the second surface (e.g., bottom surface) of the source distributor 290 (e.g., the opposite surface as shown in FIG. 18) and the arrangement of the outlets 226 of the set of conduits 220 and the viewport 234 in one implementation of the device 200.

Devices 300

Figure 20:
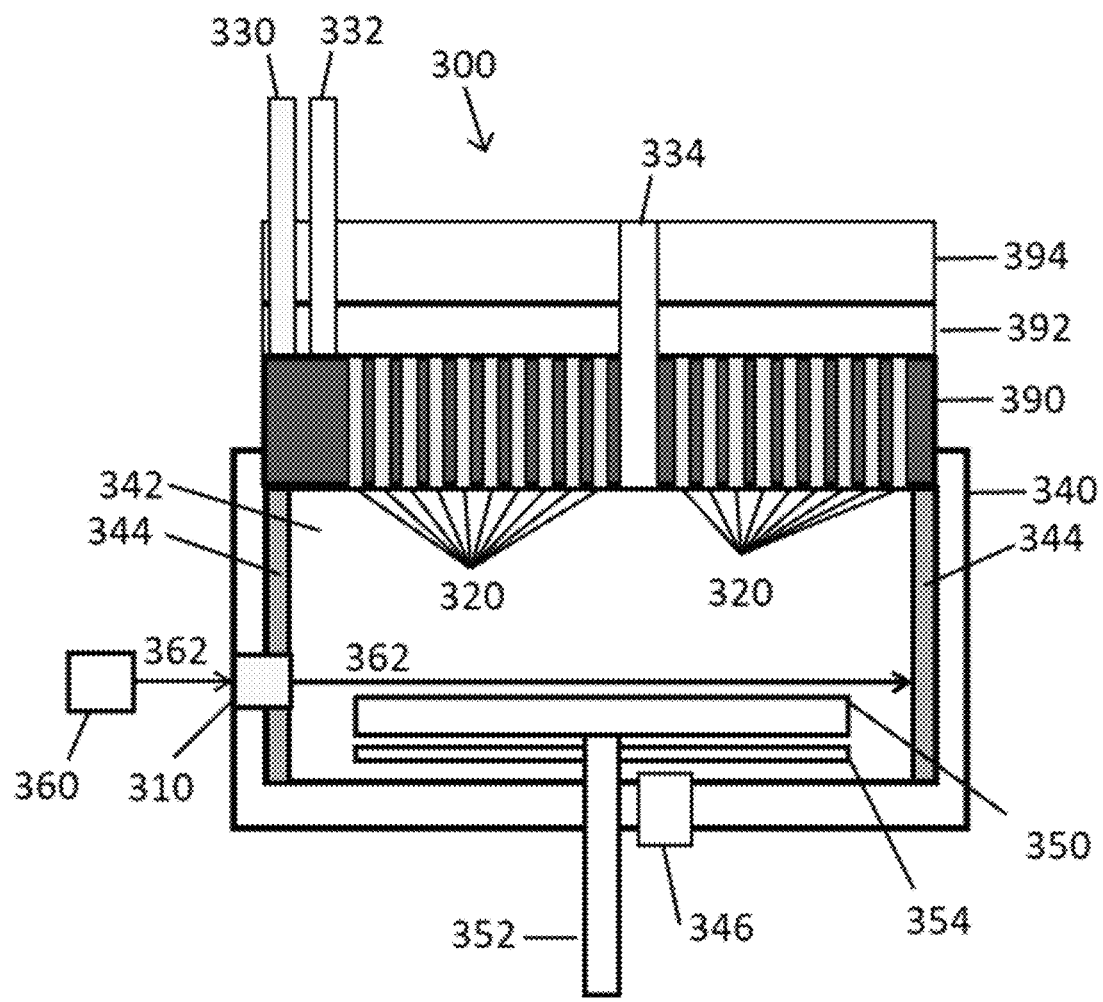
FIG. 20 is a schematic cross-sectional plan view of an example device as disclosed herein according to one implementation.

FIG. 20 shows a schematic cross-section plan view of a laser-assisted metal-organic chemical vapor deposition (MOCVD) device 300 according to one implementation described herein. Referring to FIG. 20, the device 300 comprises a wall 340 defining a chamber 342. The wall 340 can, in some examples be hollow such that a cooling medium can be included within the wall 340, for example to dissipate heat (e.g., from the heater, from the laser energy, or a combination thereof). In some examples, the cooling medium can comprise water.

The devices 300 further comprise, in some examples, a coating 344 on the interior surface of wall 340 (e.g., the surface of the wall 340 within the chamber 342). The coating 344 can, for example, comprise a material that can absorb at least a portion of the laser beam energy. The devices 300 can further comprise, in some examples, an exhaust port 346 in the wall 340 which fluidly couples the chamber 342 with an external environment.

The devices 300 can further comprise a rotatable substrate support surface 350 disposed within the chamber. The rotatable substrate support surface 350 can be any shape, such as a regular shape, an irregular shape, an isotropic shape, or an anisotropic shape. In some examples, the shape of the rotatable substrate support surface can be substantially circular, ovate, ovoid, elliptic, triangular, rectangular, polygonal, etc. In some examples, the shape of the rotatable substrate support surface can be substantially circular. The size and shape of the rotatable substrate support surface 350 can, for example, be selected in view of the size and shape of the chamber 342.

The rotatable substrate support surface 350 can support one or more substrates (not shown) (e.g., 2 or more, 3 or more, 4 or more, 5 or more, 6 or more, 7 or more, 8 or more, 9 or more, 10 or more, 15 or more, 20 or more, 25 or more, 30 or more, 35 or more, 40 or more, 45 or more, 50 or more, 60 or more, 70 or more, 80 or more, 90 or more, 100 or more, 150 or more, 200 or more, 250 or more, 300 or more, 350 or more, 400 or more, 450 or more, 500 or more, 600 or more, 700 or more, 800 or more, 900 or more, 1000 or more, 1500 or more, or 2000 or more) to be coated with a material via laser-assisted metal-organic vapor deposition from a first precursor 370 and a second precursor 380 (and one or more dopants, if present) within the chamber 342. The devices 300 can, for example, be assembled together with, or in some examples can further comprise the one or more substrates (not shown) disposed on the rotatable substrate support surface 350.

The number of substrates disposed on the rotatable substrate support surface 350 can be selected, for example, in view of the size of the one or more substrates and/or the size of the rotatable substrate support surface 350. The devices 300 can, for example, be configured to rotate the rotatable substrate support 350 surface to thereby provide a more uniform coating of the material on the one or more substrates via laser-assisted metal-organic vapor deposition.

The one or more substrates can have an average characteristic dimension. The average characteristic dimension of the one or more substrates can, for example, be 1 inch or more (e.g., 2 inches or more, 3 inches or more, 4 inches or more, 5 inches or more, 6 inches or more, 7 inches or more, 8 inches or more, 9 inches or more, 10 inches or more, 11 inches or more, 12 inches or more, 13 inches or more, 14 inches or more, 15 inches or more, 16 inches or more, 17 inches or more, 18 inches or more, 19 inches or more, 20 inches or more, 25 inches or more, 30 inches or more, or 35 inches or more). In some examples, the average characteristic dimension of the one or more substrates can be 36 inches or less (e.g., 35 inches or less, 30 inches or less, 25 inches or less, 20 inches or less, 19 inches or less, 18 inches or less, 17 inches or less, 16 inches or less, 15 inches or less, 14 inches or less, 13 inches or less, 12 inches or less, 11 inches or less, 10 inches or less, 9 inches or less, 8 inches or less, 7 inches or less, 6 inches or less, 5 inches or less, 4 inches or less, 3 inches or less, or 2 inches or less). The average characteristic dimension of the one or more substrates can range from any of the minimum values described above to any of the maximum values described above. For example, the average characteristic dimension of the one or more substrates can be from 1 inch to 36 inches (e.g., from 1 inch to 18 inches, from 18 inches to 36 inches, from 1 inch to 6 inches, from 6 inches to 12 inches, from 12 inches to 18 inches, from 18 inches to 24 inches, from 24 inches to 30 inches, from 30 inches to 36 inches, from 2 inches to 36 inches, from 1 inch to 30 inches, from 2 inches to 30 inches, from 1 inch to 18 inches, from 1 inch to 12 inches, or from 2 inches to 8 inches).

The one or more substrates can be any shape, such as a regular shape, an irregular shape, an isotropic shape, or an anisotropic shape. In some examples, the shape of the one or more substrates can be substantially circular, ovate, ovoid, elliptic, triangular, rectangular, polygonal, etc. In some examples, the shape of the one or more substrates can be substantially circular, such that the average characteristic dimension is the diameter.

The one or more substrates can comprise any suitable material. Examples of suitable substrates include, but are not limited to, bulk GaN, GaN template, sapphire, $Al_2O_3$, $LiAlO_2$, Si, SiC, zinc oxide, bulk AlN, AlN on sapphire template, and combinations thereof.

In some examples, the rotatable substrate support surface 350 can be coupled to or further comprise a rotary spindle 352. For example, the rotatable substrate support surface 350 can be centrally mounted on the rotary spindle 352, and the rotary spindle 352 can be rotated to rotate the rotatable substrate support surface 350. In some examples, the rotary spindle 352 can further be coupled to a means for rotating the rotary spindle 352. The devices 300 can, for example, be configured to rotate the rotary spindle 352 and thus rotate the rotatable substrate support surface 350 to thereby provide a more uniform coating of the material on the one or more substrates via laser-assisted metal-organic vapor deposition.

In some examples, the devices 300 can further comprise a heater 354 thermally coupled to the rotatable substrate support surface 350 within the chamber 342. The heater 354 can, for example, be located below the rotatable substrate support surface 350, and optionally spaced apart from the rotatable substrate support surface 350, relative to the position of the outlets 326 of the set of conduits 320. In some examples, the devices 300 can further comprise a means for controlling the temperature of (e.g., heating) the heater 354.

In some examples, the heater 354 can be heated such that the one or more substrates is at a temperature of 100° C. or more (e.g., 150° C. or more, 200° C. or more, 250° C. or more, 300° C. or more, 350° C. or more, 400° C. or more, 450° C. or more, 500° C. or more, 550° C. or more, 600° C. or more, 650° C. or more, 700° C. or more, 750° C. or more, 800° C. or more, 850° C. or more, 900° C. or more, 950° C. or more, 1000° C. or more, 1100° C. or more, 1200° C. or more, 1300° C. or more, 1400° C. or more, 1500° C. or more, 1600° C. or more, 1700° C. or more, 1800° C. or more, or 1900° C. or more). In some examples, the heater 354 can be heated such that the one or more substrates is at a temperature of 2000° C. or less (e.g., 1900° C. or less, 1800° C. or less, 1700° C. or less, 1600° C. or less, 1500° C. or less, 1400° C. or less, 1300° C. or less, 1200° C. or less, 1100° C. or less, 1000° C. or less, 950° C. or less, 900° C. or less, 850° C. or less, 800° C. or less, 750° C. or less, 700° C. or less, 650° C. or less, 600° C. or less, 550° C. or less, 500° C. or less, 450° C. or less, 400° C. or less, 350° C. or less, 300° C. or less, 250° C. or less, 200° C. or less, or 150° C. or less). The temperature at which the one or more substrates are heated by the heater 354 can range from any of the minimum values described above to any of the maximum values described above. For example, the heater 354 can be heated such that the one or more substrates is at a temperature of from 100° C. to 2000° C. (e.g., from 100° C. to 1000° C., from 1000° C. to 2000° C., from 100° C. to 500° C., from 500° C. to 900° C., from 900° C. to 1300° C., from 1300° C. to 1700° C., from 1700° C. to 2000° C., from 400° C. to 2000° C., from 100° C. to 1500° C., or from 400° C. to 1500° C.). In some examples, the temperature at which the one or more substrates are heated by the heater 354 can be selected in view of the identity of the second precursor 380, such that the temperature at which the one or more substrates are heated by the heater can thermally decompose the second precursor at or near the one or more substrates, to thereby form an active species (e.g., a thermal decomposition species) in situ.

The devices 300 further comprise a set of laser windows 310, wherein each of the laser windows 310 defines an exterior face 314, an interior face 316 opposite and spaced apart from the exterior face 314, and an optical path 312 extending between the interior face 316 and the exterior face 314; wherein each of the laser windows 310 is disposed within the wall 340 such that the interior face 316 further defines the chamber 342. The interior face 316 of each of the set of laser windows 310 is substantially free of the coating 344.

The set of laser windows 310 can include one or more laser windows 310 (e.g., 1 or more, 2 or more, 3 or more, 4 or more, 5 or more, 6 or more, 7 or more, 8 or more, 9 or more, 10 or more, 15 or more, 20 or more, 25 or more, 30 or more, 40 or more, 50 or more, 60 or more, 70 or more, 80 or more, 90 or more, 100 or more, 150 or more, 200 or more, 250 or more, 300 or more, 350 or more, 400 or more, 450 or more, 500 or more, 600 or more, 700 or more, 800 or more, 900 or more, or 1000 or more). The number of laser windows 310 can be selected in view of the size of the chamber 342, the size of the rotatable substrate support surface 350, or a combination thereof.

In some examples, the set of laser windows 310 is a single laser window 310. In some examples, the set of laser windows 310 is a plurality of laser windows 310 (e.g., 2 or more, 3 or more, 4 or more, 5 or more, 6 or more, 7 or more, 8 or more, 9 or more, 10 or more, 15 or more, 20 or more, 25 or more, 30 or more, 40 or more, 50 or more, 60 or more, 70 or more, 80 or more, 90 or more, 100 or more, 150 or more, 200 or more, 250 or more, 300 or more, 350 or more, 400 or more, 450 or more, 500 or more, 600 or more, 700 or more, 800 or more, 900 or more, or 1000 or more), the plurality of laser windows 310 being positioned within the wall 340 and spaced around the periphery of the chamber 342. In some examples, the set of laser windows 310 is a plurality of laser windows 310, the plurality of laser windows 310 evenly spaced around the periphery of the chamber 342. In certain examples, the chamber 342 has a substantially circular cross-section and the plurality of laser windows 310 are evenly spaced around the circumference of the chamber 342. In some examples, the set of laser windows 310 comprises an even number of laser windows 310, wherein each laser window 310 is disposed opposite another laser window 310 across the chamber 342.

Each of the one or more laser windows 310 can comprise any suitable material, such as, for example, ZnSe, ZnS, NaCl, KBr, and combinations thereof.

The cross-sectional shape of each of the set of laser windows 310 in a plane perpendicular to the central longitudinal axis of said laser window 310 can be any shape, such as a regular shape, an irregular shape, an isotropic shape, or an anisotropic shape. In some examples, the cross-sectional shape of the set of laser windows 310 can be substantially circular, ovate, ovoid, elliptic, triangular, rectangular, polygonal, etc. In some examples, the cross-sectional shape of the set of laser windows 310 can be substantially circular.

The interior face 316 and the exterior face 314 of each of the set of laser windows 310 can, independently, be any shape, such as a regular shape, an irregular shape, an isotropic shape, or an anisotropic shape. In some examples, the interior face 316 and/or the exterior face 314 of the set of laser windows 310 can have a shape that is substantially circular, ovate, ovoid, elliptic, triangular, rectangular, polygonal, etc. In some examples, the shape of the interior face 316 and/or the exterior face 314 of the set of laser windows 310 can be substantially circular. The interior face 316 and/or the exterior face 314 of each of the set of laser windows 310 can, for example, be the cross-section in a plane perpendicular to the longitudinal axis of said laser window 310, such that the shape of the interior face 316 and/or the exterior face 314 of each of the set of laser windows 310 can be the cross-sectional shape of each of the set of laser windows 310.

The number of laser windows 310, the arrangement of the laser windows 310, the cross-sectional shape of the laser windows 310, or a combination thereof can be selected, for example, in view of the number of laser beams 362 within the chamber 342, the size of the laser beams 362, the wavelength(s) of the laser beam(s) 362, the intensity of the laser beam(s) 362 within the chamber 342, the size of the chamber 342, the size of the rotatable substrate support surface 350, or a combination thereof.

The devices 300 can, for example, further comprise a laser device 360 (e.g., one or more laser devices 360) for producing a laser beam 362 (e.g., one or more laser beams 362). In some examples, the devices 300 can comprise one laser device 360. In some examples, the devices 300 can comprise a plurality of laser devices 360.

Each laser device 360 can, for example, comprise one or more lasers. In some examples, the laser device 360 can further comprise a laser distributor and/or beam splitter for splitting each of the one or more lasers into a plurality of laser beams 362. In some examples, the laser device 360 can further comprise a beam shaper to control/adjust the shape of the laser beam. In some examples, the laser device 360 can further comprise a beam sizer to control/adjust the size (e.g., diameter) of the laser beam. In some examples, the laser device 360 can further comprise a beam directing and positioning module to control/adjust the direction and/or position of the laser beam. In some examples, the laser device 360 can further comprise one or more lenses, for example to control/adjust the size, shape, direction, position, uniformity (e.g., with respect to intensity), etc. of the laser beam. The one or more lenses can be any type of lens, such as a simple lens, a compound lens, a spherical lens, a toric lens, a biconvex lens, a plano-convex lens, a plano-concave lens, a negative meniscus lens, a positive meniscus lens, a biconcave lens, a converging lens, a diverging lens, a cylindrical lens, a Fresnel lens, a lenticular lens, a gradient index lens, or a combination thereof.

The wavelength(s) of the one or more lasers can be selected, for example, in view of the identity of the first precursor 370. In some examples, the one or more lasers can comprise an infrared laser. In some examples, the one or more lasers can comprise a $CO_2$ laser, such as a tunable $CO_2$ laser.

At least one of the set of laser windows 310 is configured such that the interior face 316 of the laser window 310 directs a laser beam 362 across the chamber 342 in a plane that is above and substantially parallel to the rotatable substrate support surface 350 disposed within the chamber 342. In some examples, the device 300 includes one laser window 310 which is configured such that the interior face 316 of the laser window 210 directs a laser beam 362 across the chamber 342 in a plane that is above and substantially parallel to the rotatable substrate support surface 350 disposed within the chamber 342. In some examples, the device 300 includes a plurality of laser windows 310, each of which is configured such that the interior face 316 of the laser window 310 directs a laser beam 362 across the chamber 342 in a plane that is above and substantially parallel to the rotatable substrate support surface 350 disposed within the chamber 342.

The laser beam 362 (e.g., the one or more laser beams 362) introduced into the chamber 342 is directed across the chamber 342 in a plane that is above and substantially parallel to the rotatable substrate support surface 350 disposed within the chamber 342 such that the laser beam 362 is disposed above the rotatable substrate support surface 350 by a distance of 10 millimeters (mm) or less (e.g., 9.5 mm or less, 9 mm or less, 8.5 mm or less, 8 mm or less, 7.5 mm or less, 7 mm or less, 6.5 mm or less, 6 mm or less, 5.5 mm or less, 5 mm or less, 4.75 mm or less, 4.5 mm or less, 4.25 mm or less, 4 mm or less, 3.75 mm or less, 3.5 mm or less, 3.25 mm or less, 3 mm or less, 2.75 mm or less, 2.5 mm or less, 2.25 mm or less, 2 mm or less, 1.75 mm or less, 1.5 mm or less, 1.25 mm or less, 1 mm or less, 0.75 mm or less, 0.5 mm or less, or 0.25 mm or less). In some examples the laser beam 362 is disposed above the rotatable substrate support surface 350 by a distance of 0 mm or more (e.g., 0.25 mm or more, 0.5 mm or more, 0.75 mm or more, 1 mm or more, 1.25 mm or more, 1.5 mm or more, 1.75 mm or more, 2 mm or more, 2.25 mm or more, 2.5 mm or more, 2.75 mm or more, 3 mm or more, 3.25 mm or more, 3.5 mm or more, 3.75 mm or more, 4 mm or more, 4.25 mm or more, 4.5 mm or more, 4.75 mm or more, 5 mm or more, 5.5 mm or more, 6 mm or more, 6.5 mm or more, 7 mm or more, 7.5 mm or more, 8 mm or more, 8.5 mm or more, 9 mm or more, or 9.5 mm or more). The distance that the laser beam 362 is disposed above the rotatable substrate support surface 350 can range from any of the minimum values described above to any of the maximum values described above. For example, the laser beam 362 can be disposed above the rotatable substrate support surface by a distance of from 0 mm to 10 mm (e.g., from 0 mm to 5 mm, from 5 mm to 10 mm, from 0 mm to 2.5 mm, from 2.5 mm to 5 mm, from 5 mm to 7.5 mm, from 7.5 mm to 10 mm, from 0 mm to 9 mm, from 1 mm to 10 mm, from 1 mm to 9 mm, from 0 mm to 8 mm, from 0 mm to 6 mm, from 0 mm to 4 mm, or from 1 mm to 3 mm).

The devices 300 further comprise a set of conduits 320, wherein each of the conduits defines an inlet 324, an outlet 326 opposite an spaced apart from the inlet 324, and a path for fluid flow extending from the inlet 324 to the outlet 326.

The outlets 326 of the set of conduits 320 are configured to introduce a first precursor 370 and a second precursor 380 into the chamber 342 toward the rotatable substrate support surface 350, such that the first precursor 370 and the second precursor 380 flow through the laser beam 362 within the chamber 342 prior to reaching the rotatable substrate support surface 350.

As used herein, "a set of conduits 320" and "the set of conduits 320" are meant to include any number of conduits 320 in any arrangement. Thus, for example "a set of conduits 320" includes one or more conduits 320 (e.g., 2 or more, 3 or more, 4 or more, 5 or more, 6 or more, 7 or more, 8 or more, 9 or more, 10 or more, 15 or more, 20 or more, 25 or more, 30 or more, 40 or more, 50 or more, 60 or more, 70 or more, 80 or more, 90 or more, 100 or more, 150 or more, 200 or more, 250 or more, 300 or more, 350 or more, 400 or more, 450 or more, 500 or more, 600 or more, 700 or more, 800 or more, 900 or more, or 1000 or more). In some embodiments, the set of conduits 320 can comprise a plurality of conduits 320. In some embodiments, the set of conduits 320 can comprise a plurality of conduits 320 arranged in an ordered array.

The cross-sectional shape of each of conduits 320 in a plane perpendicular to the central longitudinal axis of said conduit 320 can be any shape, such as a regular shape, an irregular shape, an isotropic shape, or an anisotropic shape. In some examples, the cross-sectional shape of each of conduits 320 in the set of conduits 320 can be substantially circular, ovate, ovoid, elliptic, triangular, rectangular, polygonal, etc. In some examples, the cross-sectional shape of each of the conduits 320 can be substantially circular.

The set of conduits 320 can have an average characteristic dimension. The term "characteristic dimension," as used herein refers to the largest straight line distance between two points in the plane of the cross-sectional shape of each of the set of conduits. "Average characteristic dimension" and "mean characteristic dimension" are used interchangeably herein, and generally refer to the statistical mean characteristic dimension of the conduits in a population of conduits. For example, for a cylindrical set of conduits, the cross-sectional shape can be substantially circular and the average characteristic dimension can refer to the diameter.

The average characteristic dimension of the set of conduits 320 can, for example, be 0.1 millimeter (mm) or more (e.g., 0.25 mm or more, 0.5 mm or more, 0.75 mm or more, 1 mm or more, 1.25 mm or more, 1.5 mm or more, 1.75 mm or more, 2 mm or more, 2.25 mm or more, 2.5 mm or more, 2.75 mm or more, 3 mm or more, 3.25 mm or more, 3.5 mm or more, 3.75 mm or more, 4 mm or more, 4.25 mm or more, 4.5 mm or more, 4.75 mm or more, 5 mm or more, 5.5 mm or more, 6 mm or more, 6.5 mm or more, 7 mm or more, 7.5 mm or more, 8 mm or more, 8.5 mm or more, 9 mm or more, or 9.5 mm or more). In some examples, the average characteristic dimension of the set of conduits 320 can be 10 millimeters (mm) or less (e.g., 9.5 mm or less, 9 mm or less, 8.5 mm or less, 8 mm or less, 7.5 mm or less, 7 mm or less, 6.5 mm or less, 6 mm or less, 5.5 mm or less, 5 mm or less, 4.75 mm or less, 4.5 mm or less, 4.25 mm or less, 4 mm or less, 3.75 mm or less, 3.5 mm or less, 3.25 mm or less, 3 mm or less, 2.75 mm or less, 2.5 mm or less, 2.25 mm or less, 2 mm or less, 1.75 mm or less, 1.5 mm or less, 1.25 mm or less, 1 mm or less, 0.75 mm or less, 0.5 mm or less, or 0.25 mm or less). The average characteristic dimension of the set of conduits 320 can range from any of the minimum values described above to any of the maximum values described above. For example, the average characteristic dimension of the set of conduits 320 can be from 0.1 mm to 10 mm (e.g., from 0.1 mm to 5 mm, from 5 mm to 10 mm, from 0.1 mm to 2.5 mm, from 2.5 mm to 5 mm, from 5 mm to 7.5 mm, from 7.5 mm to 10 mm, from 0.1 mm to 9.5 mm, from 0.5 mm to 10 mm, or from 0.5 mm to 9.5 mm).

The inlets 324 and the outlets 326 of each of the conduits 320 can, independently, be any shape, such as a regular shape, an irregular shape, an isotropic shape, or an anisotropic shape. In some examples, the inlets 324 and/or the outlets 326 of the set of conduits 320 can have a shape that is substantially circular, ovate, ovoid, elliptic, triangular, rectangular, polygonal, etc. In some examples, the shape of the inlets 324 and/or the outlets 326 of the set of conduits 320 can be substantially circular. The inlet 324 and/or the outlet 326 of each of the set of conduits 320 can, for example, be the cross-section in a plane perpendicular to the central longitudinal axis of said conduit 320, such that the shape of the inlet 324 and/or the outlet 326 of each of the set of conduits 320 can be the cross-sectional shape of each of the conduits 320.

The inlets 324 and the outlets 326 of the set of conduits 320 can, independently, have an average characteristic dimension. The term "characteristic dimension," as used herein refers to the largest straight line distance between two points in the plane of the inlet or outlet. "Average characteristic dimension" and "mean characteristic dimension" are used interchangeably herein, and generally refer to the statistical mean characteristic dimension of the inlets or outlets in a population of inlets or outlets. For example, for a cylindrical set of conduits 320, the inlets 324 or outlets 326 can be substantially circular in shape and the average characteristic dimension can refer to the diameter.

The average characteristic dimension of the inlets 324 and/or the outlets 326 of the set of conduits 320 can, for example, be 0.1 millimeter (mm) or more (e.g., 0.25 mm or more, 0.5 mm or more, 0.75 mm or more, 1 mm or more, 1.25 mm or more, 1.5 mm or more, 1.75 mm or more, 2 mm or more, 2.25 mm or more, 2.5 mm or more, 2.75 mm or more, 3 mm or more, 3.25 mm or more, 3.5 mm or more, 3.75 mm or more, 4 mm or more, 4.25 mm or more, 4.5 mm or more, 4.75 mm or more, 5 mm or more, 5.5 mm or more, 6 mm or more, 6.5 mm or more, 7 mm or more, 7.5 mm or more, 8 mm or more, 8.5 mm or more, 9 mm or more, or 9.5 mm or more). In some examples, the average characteristic dimension of the inlets 324 and/or the outlets 326 of the set of conduits 320 can be 10 millimeters (mm) or less (e.g., 9.5 mm or less, 9 mm or less, 8.5 mm or less, 8 mm or less, 7.5 mm or less, 7 mm or less, 6.5 mm or less, 6 mm or less, 5.5 mm or less, 5 mm or less, 4.75 mm or less, 4.5 mm or less, 4.25 mm or less, 4 mm or less, 3.75 mm or less, 3.5 mm or less, 3.25 mm or less, 3 mm or less, 2.75 mm or less, 2.5 mm or less, 2.25 mm or less, 2 mm or less, 1.75 mm or less, 1.5 mm or less, 1.25 mm or less, 1 mm or less, 0.75 mm or less, 0.5 mm or less, or 0.25 mm or less). The average characteristic dimension of the inlets 324 and/or the outlets 326 of the set of conduits 320 can range from any of the minimum values described above to any of the maximum values described above. For example, the average characteristic dimension of the inlets 324 and/or the outlets 326 of the set of conduits 320 can be from 0.1 mm to 10 mm (e.g., from 0.1 mm to 5 mm, from 5 mm to 10 mm, from 0.1 mm to 2.5 mm, from 2.5 mm to 5 mm, from 5 mm to 7.5 mm, from 7.5 mm to 10 mm, from 0.1 mm to 9.5 mm, from 0.5 mm to 10 mm, or from 0.5 mm to 9.5 mm).

In some examples, the each of the outlets 326 of the set of conduits 320 can further comprise a nozzle (not shown) fluidly connected to each of the outlets 326 of the set of conduits 320. Each nozzle can, for example, have an average characteristic dimension and a cross-sectional shape, wherein the average characteristic dimension of the nozzles, the cross-sectional shape of the nozzles, or a combination thereof can be the same or different than that of the outlets 326 of the set of conduits 320. In some examples, the average characteristic dimension of the nozzles can be smaller than the average characteristic dimension of the outlets 326 of the set of conduits 320. In some examples, the cross-sectional shape of the nozzles can be substantially circular. The average characteristic dimension of the nozzles, the cross-sectional shape of the nozzles, the orientation of the nozzles, or a combination thereof can be used to affect and/or control how the first precursor 370 and/or the second precursor 380 is/are introduced into the chamber 342 (e.g., speed, direction, volume, etc.).

The number of conduits 320, the arrangement of the conduits 320, the cross-sectional shape of the conduits 320, the shape of the outlets 326 of the conduits 320, the average characteristic dimension of the outlets 326 of the conduits 320, the presence or absence of the nozzles fluidly connected to each of the outlets 326 of the set of conduits 320, the average characteristic dimension of the nozzles fluidly connected to each of the outlets 326 of the set of conduits 320 (when present), the cross-sectional shape of the nozzles fluidly connected to each of the outlets 326 of the set of conduits 320 (when present), or a combination thereof can be selected, for example, in view of the number of laser beams 362 within the chamber 342, the size of the laser beam(s) 362, the wavelength(s) of the laser beam(s) 362, the intensity of the laser beam(s) 362 within the chamber 342, the size of the chamber 342, the size of the rotatable substrate support surface 350, or a combination thereof.

The outlets 326 of the set of conduits 320 are configured to introduce a first precursor 370 and a second precursor 380 into the chamber 342 toward the rotatable substrate support surface 350, such that the first precursor 370 and the second precursor 380 flow through the laser beam 362 within the chamber 342 prior to reaching the rotatable substrate support surface 350. In some examples, the outlets 326 of the set of conduits 320 are configured to introduce the first precursor 370 and the second precursor 380 substantially perpendicular to a central axis of the laser beam 362 within the chamber 342. In some examples, the outlets 326 of the set of conduits 320 are configured to introduce the first precursor 370 and the second precursor 380 substantially perpendicular to the rotatable substrate support surface 350.

In some examples, the outlets 326 of the set of conduits 320 are configured to introduce the first precursor 370 and the second precursor 380 substantially uniformly throughout the chamber 342. In some examples, the outlets 326 of the set of conduits 320 are positioned in an ordered array and evenly spaced throughout the source distributor 390, such that the outlets 326 of the set of conduits 320 are configured to introduce the first precursor 370 and the second precursor 380 substantially uniformly throughout the chamber 342.

In some examples, the set of conduits 320 can comprise a plurality of conduits and the plurality of conduits can comprise a set of first conduits and a set of second conduits, the outlets of the set of first conduits being configured to introduce the first precursor 370 into the chamber 342 toward the rotatable substrate support surface 350, the outlets of the set of second conduits being configured to introduce the second precursor 380 into the chamber 342 toward the rotatable substrate support surface 350. In some examples, the outlet of one or more of the first set of conduits is/are located adjacent the outlet of at least one of the second set of conduits. In some examples, the outlet of one or more of the first set of conduits is/are located directly adjacent the outlet of at least one of the second set of conduits. In some examples, the outlets of the first set of conduits are located in an ordered array and the outlets of the second set of conduits are located in an ordered array, evenly spaced and interspersed between the outlets of the first set of conduits.

Each of the one or more laser beams 362 comprises electromagnetic radiation with at least one wavelength that overlaps with at least a portion of a vibrational mode of the first precursor 370, thereby generating an active species (e.g., an irradiated first precursor) in situ. In some examples, the wavelength of the laser beam 362 is selected in view of the identity of the first precursor 370, such that the laser beam 362 comprise electromagnetic radiation with at least one wavelength that overlaps with at least a portion of a vibrational mode of the first precursor 370, such that irradiation of the first precursor 370 with the laser beam(s) 362 can enhance the cracking efficiency of the first precursor 370.

In some examples, the device 300 is configured to deposit a material via laser-assisted metal-organic vapor deposition from the first precursor 370 and the second precursor 380 on one or more substrates disposed on the rotatable substrate support surface 350 within the chamber 342. In some examples, the distance at which the laser beam 362 is located above the rotatable substrate support surface 350 can be selected, for example, such that background incorporation of carbon into the deposited material is suppressed (e.g., reduced or minimized relative to the amount of carbon incorporated in the deposited semiconductor when the laser beam 362 is located at a distance greater than 10 mm above the rotatable substrate support surface).

In some examples, the device 300 is configured to deposit a III-V semiconductor, such that the first precursor 370 comprises a V-group precursor and the second precursor 380 comprises a III-group precursor.

The first precursor 370 can, for example, comprise a V-group precursor, such as a compound, element, or composition comprising N, P, As, Sb, Bi, or a combination thereof. In some examples, the first precursor 370 can comprise a nitrogen species. In some examples, the first precursor 370 can comprise $NH_3$. The first precursor 370 can, for example, comprise a fluid, such as a gas.

The second precursor 380 can, for example, comprise a III-group precursor, such as compound, element, or composition comprising B, Al, Ga, In, Tl, or a combination thereof. In some examples, the second precursor 380 can comprise a gallium species. In some examples, the second precursor 380 can comprise trimethylgallium, triethylgallium, or a combination thereof. The second precursor 380 can, for example, comprise a fluid, such as a gas.

In some examples, the device 300 is configured to deposit a group III oxide semiconductor, such that the first precursor 370 comprises an oxygen containing precursor and the second precursor 380 comprises a III-group precursor.

In some examples, the device 300 is configured to deposit a group II-VI semiconductor material, such that the first precursor 370 comprises a VI-group precursor (e.g., a compound/composition/element comprising O, S, Se, Te, or a combination thereof) and the second precursor 380 comprises a II-group precursor (e.g., a compound/composition/element comprising Be, Mg, Ca, Sr, Ba, Zn, Cd, Hg, or a combination thereof).

In some examples, the device 300 is configured to deposit a group II-IV-$V_2$ semiconductor, such that the first precursor 370 comprises a V-group precursor (e.g., a compound, element, or composition comprising N, P, As, Sb, Bi, or a combination thereof) and the second precursor 380 comprises a mixture of a II-group precursor (e.g., a compound/composition/element comprising Be, Mg, Ca, Sr, Ba, Zn, Cd, Hg, or a combination thereof) and a IV-group precursor (e.g., a compound/composition/element comprising C, Si, Ge, Sn, Pb, or a combination thereof).

In some examples, the device 300 is configured to introduce the first precursor 370 into the chamber 342 continuously or intermittently. In some examples, the device 300 is configured to introduce the second precursor 380 continuously or intermittently.

In some examples, the device 300 is configured to introduce the first precursor 370 and the second precursor 380 into the chamber 342 alternately. In some examples, the device 300 is configured to introduce the first precursor 370 and the second precursor 380, wherein at least a portion of the introduction of the second precursor 380 is concurrent with at least a portion of the introduction of the first precursor 370, or vice versa. In some examples, the device 300 is configured to introduce the first precursor 370 and the second precursor 380 to the chamber simultaneously.

In some examples, the outlets 326 of the set of conduits 320 are further configured to introduce a dopant (e.g., one or more dopants) into the chamber 342 toward the rotatable substrate support surface 350. The one or more dopants can be selected in view of the first precursor 370 and/or the second precursor 380. The one or more dopants can be, for example, a fluid, such as a gas. In some examples, the one or more dopants can comprise an n-type dopant (e.g., silane ($SiH_4$), germane ($GeH_4$), disilane($Si_2H_6$)), a p-type dopant (e.g., bis(cyclopentadienyl)magnesium ($Cp_2Mg$), bis(methylcyclopentadienyl)magnesium (($MeCp)_2Mg$)), or a combination thereof. In some examples, the one or more dopants can comprise silane ($SiH_4$), germane ($GeH_4$), disilane ($Si_2H_6$), bis(cyclopentadienyl)magnesium ($Cp_2Mg$), bis(methylcyclopentadienyl)magnesium (($MeCp)_2Mg$), or a combination thereof. The one or more dopants can, for example, be mixed with the first precursor 370 and/or the second precursor 380 prior to introduction into the chamber 342. In some examples, the device 300 is configured to introduce the first precursor 370, the second precursor 380, and the one or more dopants into the chamber 342 consecutively in turn. In some examples, the device 300 is configured to introduce the first precursor 370 and the one or more dopants, wherein at least a portion of the introduction of the one or more dopants is concurrent with at least a portion of the introduction of the first precursor 370, or vice versa. In some examples, the device 300 is configured to introduce the second precursor 380 and the one or more dopants, wherein at least a portion of the introduction of the one or more dopants is concurrent with at least a portion of the introduction of the second precursor 380, or vice versa. In some examples, the device is configured to introduce the first precursor 370, the second precursor 380, and the one or more dopants into the chamber 342 simultaneously.

In some examples, the outlets 326 of the set of conduits 320 are further configured to introduce a carrier gas (e.g., one or more carrier gases) into the chamber 342 toward the rotatable substrate support surface 350. The one or more carrier gases can be selected in view of the first precursor 370, the second precursor 380, the one or more dopants (when present), or a combination thereof. The one or more carrier gases can be, for example, argon, helium, $H_2$, $N_2$, and the like, or combinations thereof. The one or more carrier gases can, for example, be mixed with the first precursor 370, the second precursor 380, the one or more dopants (when present), or a combination thereof prior to introduction into the chamber 342. In some examples, the device 300 is configured to introduce the first precursor 370, the second precursor 380, the one or more dopants (when present), or a combination thereof concurrently with at least a portion of the introduction of the one or more carrier gases.

The devices 300 further comprise a source distributor 390, the source distributor 390 having a first surface and a second surface opposite and spaced apart from the first surface, wherein the second surface of the source distributor 390 is substantially parallel and spaced apart from the rotatable substrate support surface 350, and wherein the set of conduits 320 are defined by the source distributor 390 and traverse the source distributor 390 from the first surface to the second surface.

In some examples, the outlets 326 of the set of conduits 320 are evenly spaced throughout at least a portion of the source distributor 390. In some examples, the outlets 326 of the set of conduits 320 are located in an ordered array and are evenly spaced throughout at least a portion of the source distributor 390.

The source distributor 390 can, for example, form a lid to the chamber 342. The source distributor 390 can, in some examples, be hollow such that a cooling medium can be included within the source distributor 390, for example to dissipate heat (e.g., from the heater, from the laser energy, or a combination thereof). The source distributor 390 can, in some examples, comprise inside space (not shown), which have an inlet fluidly connected to an outlet, wherein the inlet and the outlet are configured to provide a path for flowing the cooling medium through the inside space within the source distributor. In some examples, the cooling medium can comprise water.

The devices 300 can further comprise, a cooling plate 392 thermally coupled to the source distributor 390, wherein the cooling plate 392 is in contact with the first surface of the source distributor 390; and a top cover 394, wherein the top cover 394 id located above and in contact with the cooling plate 392, such that the cooling plate 392 is sandwiched between the source distributor 390 and the top cover 394. The cooling plate 392 can be configured to cool the source distributor 392. In some examples, the devices 300 can further comprise a means for controlling the temperature of (e.g., cooling) the cooling plate 392. The cooling plate 392 can, in some examples, be hollow such that a cooling medium can be included within the cooling plate 392, for example to dissipate heat (e.g., from the heater, from the laser energy, or a combination thereof). In some examples, the cooling medium can comprise water.

The devices 300 can, for example, further comprise, an in-situ monitor, such as a camera and/or a window. In some examples, the in-situ monitor can comprise a window or viewport 334 defined by the source distributor 390, the cooling plate 392, and the top cover 394. The in-situ monitor can allow for visual inspection inside the chamber 342 when the device 300 is assembled.

The devices 300 can, for example, further comprise, a first precursor conduit 330 defining an inlet, an outlet opposite and spaced apart from the inlet, and a path for fluid flow extending from the inlet to the outlet, wherein the outlet of the first precursor conduit 330 can be fluidly connected to the inlets 324 of the set of conduits 320 via the source distributor 390; wherein the cooling plate 392 and the top cover 394 define the first precursor conduit 330. The first precursor conduit 330 can, for example, fluidly connect a first precursor source (not shown) to the chamber 342 via the set of conduits 320.

The devices 300 can, for example, further comprise, a second precursor conduit 332 defining an inlet, an outlet opposite and spaced apart from the inlet, and a path for fluid flow extending from the inlet to the outlet, wherein the outlet of the second precursor conduit 332 can be fluidly connected to the inlets 324 of the set of conduits 320 via the source distributor 390; wherein the cooling plate 392 and the top cover 394 define the second precursor conduit 332. The second precursor conduit 332 can, for example, fluidly connect a second precursor source (not shown) to the chamber 342 via the set of conduits 320.

Figure 21:
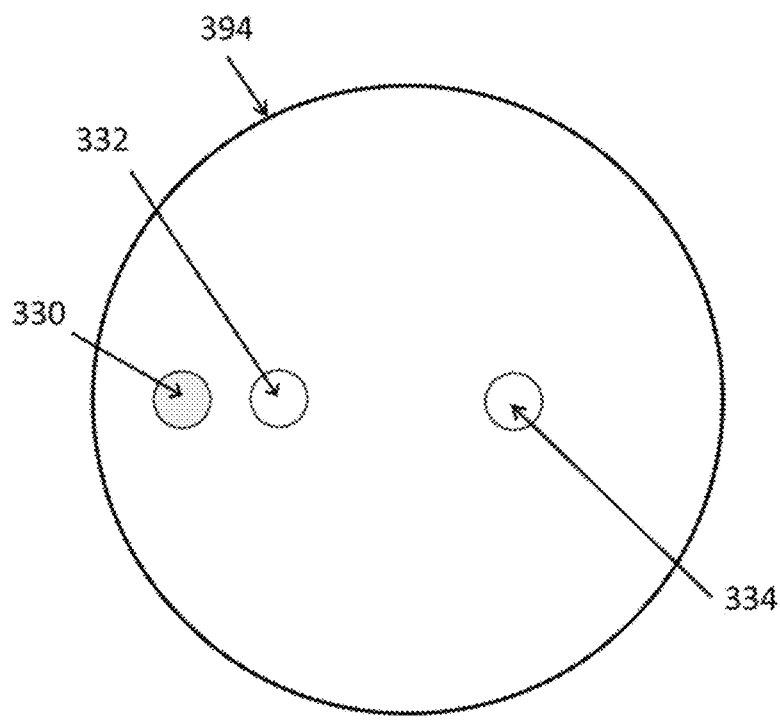
FIG. 21 is a schematic cross-sectional plan view of the top surface of the top cover showing the arrangement of the first precursor conduit, the second precursor conduit, and the viewport in one implementation of the example device shown in FIG. 20.
Figure 22:
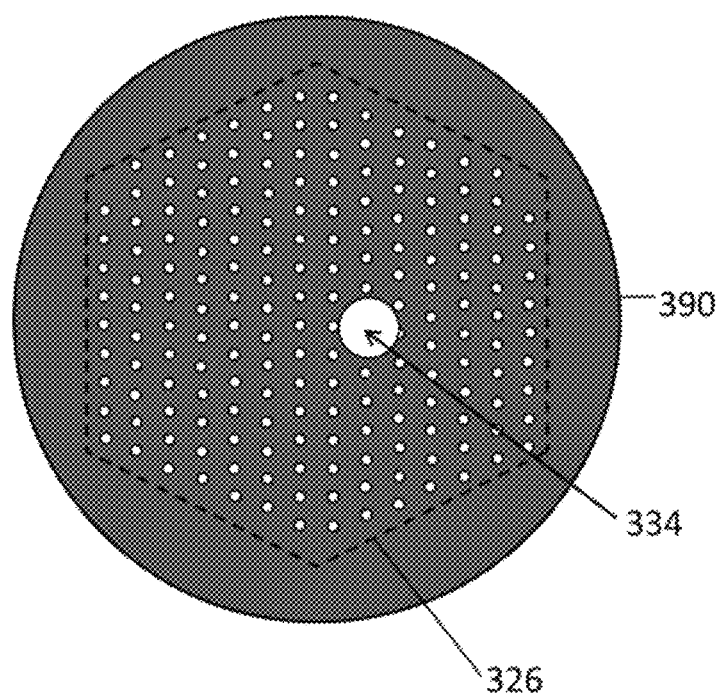
FIG. 22 is a schematic cross-sectional plan view of the second (e.g., bottom) surface of the source distributor showing the arrangement of the outlets of the set of conduits and the viewport in one implementation of the example device shown in FIG. 20-FIG. 21.

FIG. 21 is a schematic cross-sectional plan view of the example device 300 shown in FIG. 20, showing the top surface of the top cover 394 and the arrangement of the first precursor conduit 330, the second precursor conduit 332, and the viewport 334 in one implementation of the device 300. FIG. 22 is a schematic cross-sectional plan view of the example device 300 shown in FIG. 21 and FIG. 22, showing the second surface (e.g., bottom surface) of the source distributor 390 and the arrangement of the outlets 326 of the set of conduits 320 and the viewport 334 in one implementation of the device 300.

Devices 400

Figure 23:
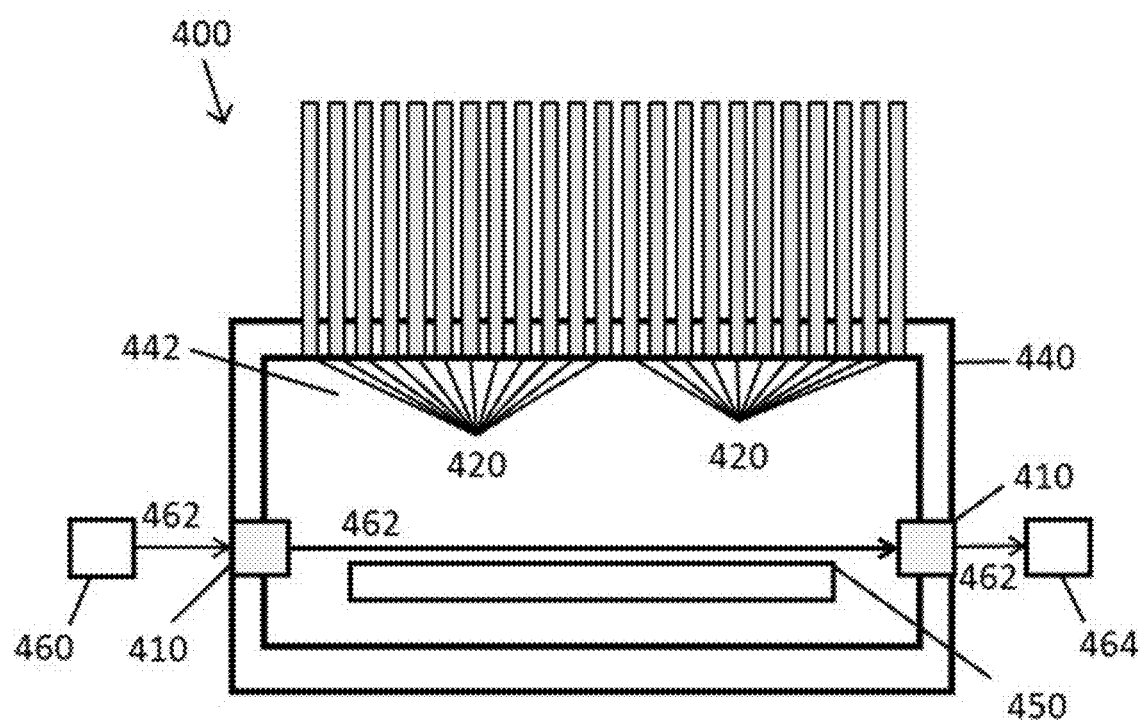
FIG. 23 is a schematic cross-sectional plan view of an example device as disclosed herein according to one implementation.

FIG. 23 shows a schematic cross-sectional plan view of a laser-assisted metal-organic chemical vapor deposition (MOCVD) device 400 according to one implementation. Referring to FIG. 23, the device 400 comprises a wall 440 defining a chamber 442. The wall 440 can, in some examples be hollow such that a cooling medium can be included within the wall 440, for example to dissipate heat (e.g., from the heater, from the laser energy, or a combination thereof). In some examples, the cooling medium can comprise water.

Referring again to FIG. 23, the device 400 further comprises a plurality of laser windows 410, wherein each of the laser windows 410 defines an exterior face 414, an interior face 416 opposite and spaced apart from the exterior face 414, and an optical path 412 extending between the interior face 416 and the exterior face 414; wherein each of the laser windows 410 is disposed within the wall 440 such that the interior face 416 further defines the chamber 442.

The plurality of laser windows 410 can include two or more laser windows 410 (e.g., 2 or more, 3 or more, 4 or more, 5 or more, 6 or more, 7 or more, 8 or more, 9 or more, 10 or more, 15 or more, 20 or more, 25 or more, 30 or more, 40 or more, 50 or more, 60 or more, 70 or more, 80 or more, 90 or more, 100 or more, 150 or more, 200 or more, 250 or more, 300 or more, 350 or more, 400 or more, 450 or more, 500 or more, 600 or more, 700 or more, 800 or more, 900 or more, or 1000 or more). The number of laser windows 410 can be selected in view of the size of the chamber 442, the size of the rotatable substrate support surface 450, or a combination thereof.

In some examples, the plurality of laser windows 410 are positioned within the wall 440 and spaced around the periphery of the chamber 442. The plurality of laser windows 410 can, for example, include 2 laser windows positioned within the wall 440 and spaced around the periphery of the chamber 442, as shown for example in FIG. 23 and FIG. 24. Referring now to FIG. 25, the plurality of laser windows 410 can, for example, include 4 laser windows positioned within the wall 440 and spaced around the periphery of the chamber 442. Referring now to FIG. 26, the plurality of laser windows 410 can, for example, include 8 laser windows positioned within the wall 440 and spaced around the periphery of the chamber 442.

Figure 24:
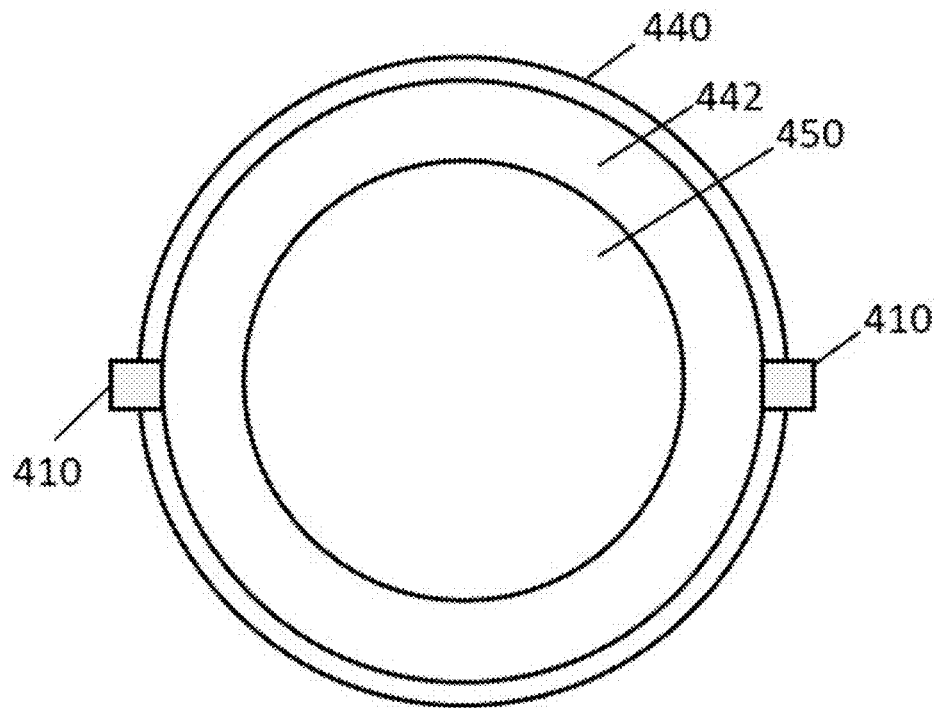
FIG. 24 is a schematic cross-sectional plan view (e.g., top down) of an example device having two laser windows.
Figure 25:
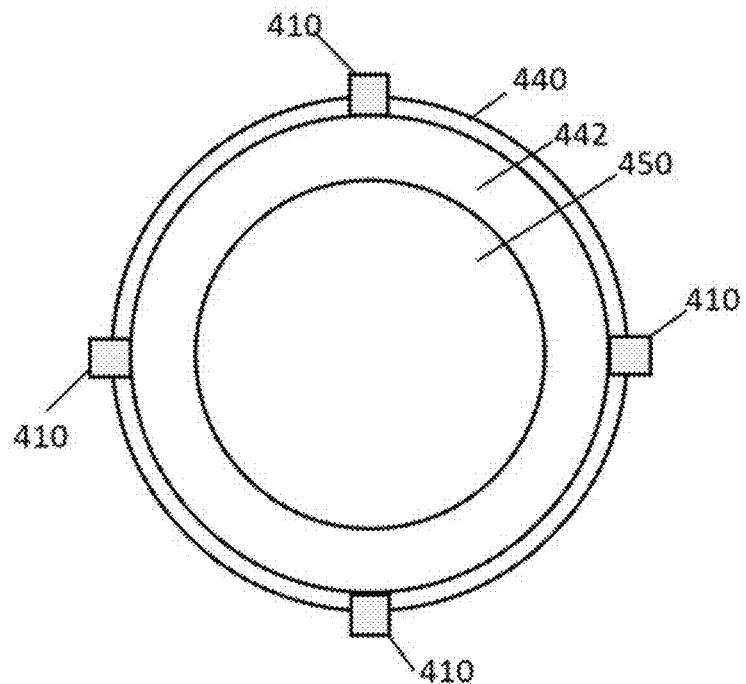
FIG. 25 is a schematic cross-sectional plan view (e.g., top down) of an example device having four laser windows.
Figure 26:
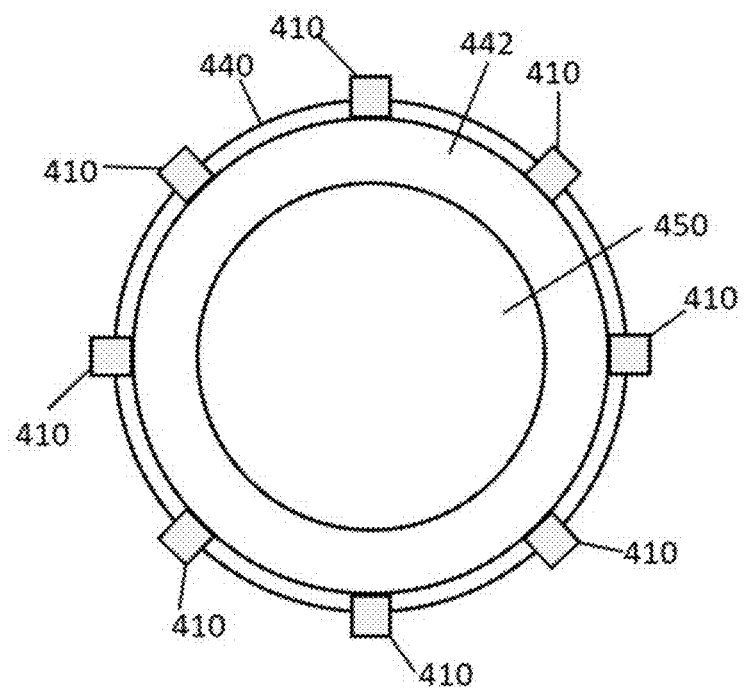
FIG. 26 is a schematic cross-sectional plan view (e.g., top down) of an example device having eight laser windows.

In some examples, the plurality of laser windows 410 are evenly spaced around the periphery of the chamber 442, as shown, for example, in FIG. 24-FIG. 26. In certain examples, the chamber 442 has a substantially circular cross-section and the plurality of laser windows 410 are evenly spaced around the circumference of the chamber 442, as shown, for example, in FIG. 24-FIG. 26.

In some examples, the plurality of laser windows 410 comprises an even number of laser windows 410, such that the plurality of laser windows comprises a one or more laser window pairs, wherein each laser window 410 in each pair disposed opposite the laser window 410 in the pair across the chamber 442, as shown, for example, in FIG. 24-FIG. 26.

Each of the plurality of laser windows 410 can comprise any suitable material, such as, for example, ZnSe, ZnS, NaCl, KBr, and combinations thereof.

The cross-sectional shape of each of the plurality of laser windows 410 in a plane perpendicular to the central longitudinal axis of said laser window 410 can be any shape, such as a regular shape, an irregular shape, an isotropic shape, or an anisotropic shape. In some examples, the cross-sectional shape of the plurality of laser windows 410 can be substantially circular, ovate, ovoid, elliptic, triangular, rectangular, polygonal, etc. In some examples, the cross-sectional shape of the plurality of laser windows 410 can be substantially circular.

The interior face 416 and the exterior face 414 of each of the plurality of laser windows 410 can, independently, be any shape, such as a regular shape, an irregular shape, an isotropic shape, or an anisotropic shape. In some examples, the interior face 416 and/or the exterior face 414 of the plurality of laser windows 410 can have a shape that is substantially circular, ovate, ovoid, elliptic, triangular, rectangular, polygonal, etc. In some examples, the shape of the interior face 416 and/or the exterior face 414 of the plurality of laser windows 410 can be substantially circular. The interior face 416 and/or the exterior face 414 of each of the plurality of laser windows 410 can, for example, be the cross-section in a plane perpendicular to the longitudinal axis of said laser window 410, such that the shape of the interior face 416 and/or the exterior face 414 of each of the plurality of laser windows 410 can be the cross-sectional shape of each of the plurality of laser windows 410.

The number of laser windows 410, the arrangement of the laser windows 410, the cross-sectional shape of the laser windows 410, or a combination thereof can be selected, for example, in view of the number of laser beams 462 within the chamber 442, the size of the laser beam(s) 462, the wavelength(s) of the laser beam(s) 462, the intensity of the laser beam(s) 462 within the chamber 442, the size of the chamber 442, the size of the rotatable substrate support surface 450, or a combination thereof.

Referring again to FIG. 23, the device 400 further comprises a set of conduits 420, wherein each of the conduits defines an inlet 424, an outlet 426 opposite an spaced apart from the inlet 424, and a path for fluid flow extending from the inlet 424 to the outlet 426. When the device 400 is assembled together with a rotatable substrate support surface 450 disposed within the chamber 442, a laser device 460 for producing a laser beam 462, and a laser dumper 464 for receiving a laser beam 462: the plurality of laser windows 410 comprises one or more laser window pairs, each laser window in each pair being disposed opposite the other laser window in the pair across the chamber 442; wherein one of the laser windows 410 in each pair is configured such that the interior face 416 of the laser window 410 directs the laser beam 462 from the laser device 460 across the chamber 442 in a plane that is above and substantially parallel to the rotatable substrate support surface 450 disposed within the chamber 442, wherein the laser beam 462 is disposed above the rotatable substrate support surface by a distance of 10 mm or less; the other laser window 410 in each pair is configured such that the interior face 416 of the laser window 410 receives the laser beam 462 after it has traversed the chamber 462 and directs the received laser beam 462 to the laser dumper 464; and the outlets 426 of the set of conduits 420 are configured to introduce a first precursor 470 and a second precursor 480 into the chamber 442 toward the rotatable substrate support surface 450, such that the first precursor 470 and the second precursor 480 flow through the laser beam 462 within the chamber 442 prior to reaching the rotatable substrate support surface 450.

As used herein, "a set of conduits 420" and "the set of conduits 420" are meant to include any number of conduits 420 in any arrangement. Thus, for example "a set of conduits 420" includes one or more conduits 420 (e.g., 2 or more, 3 or more, 4 or more, 5 or more, 6 or more, 7 or more, 8 or more, 9 or more, 10 or more, 15 or more, 20 or more, 25 or more, 30 or more, 40 or more, 50 or more, 60 or more, 70 or more, 80 or more, 90 or more, 100 or more, 150 or more, 200 or more, 250 or more, 300 or more, 350 or more, 400 or more, 450 or more, 500 or more, 600 or more, 700 or more, 800 or more, 900 or more, or 1000 or more). In some embodiments, the set of conduits 420 can comprise a plurality of conduits 420. In some embodiments, the set of conduits 420 can comprise a plurality of conduits 420 arranged in an ordered array.

The cross-sectional shape of each of conduits 420 in a plane perpendicular to the central longitudinal axis of said conduit 420 can be any shape, such as a regular shape, an irregular shape, an isotropic shape, or an anisotropic shape. In some examples, the cross-sectional shape of each of conduits 420 in the set of conduits 420 can be substantially circular, ovate, ovoid, elliptic, triangular, rectangular, polygonal, etc. In some examples, the cross-sectional shape of each of the conduits 420 can be substantially circular.

The set of conduits 420 can have an average characteristic dimension. The term "characteristic dimension," as used herein refers to the largest straight line distance between two points in the plane of the cross-sectional shape of each of the set of conduits. "Average characteristic dimension" and "mean characteristic dimension" are used interchangeably herein, and generally refer to the statistical mean characteristic dimension of the conduits in a population of conduits. For example, for a cylindrical set of conduits, the cross-sectional shape can be substantially circular and the average characteristic dimension can refer to the diameter.

The average characteristic dimension of the set of conduits 420 can, for example, be 0.1 millimeter (mm) or more (e.g., 0.25 mm or more, 0.5 mm or more, 0.75 mm or more, 1 mm or more, 1.25 mm or more, 1.5 mm or more, 1.75 mm or more, 2 mm or more, 2.25 mm or more, 2.5 mm or more, 2.75 mm or more, 3 mm or more, 3.25 mm or more, 3.5 mm or more, 3.75 mm or more, 4 mm or more, 4.25 mm or more, 4.5 mm or more, 4.75 mm or more, 5 mm or more, 5.5 mm or more, 6 mm or more, 6.5 mm or more, 7 mm or more, 7.5 mm or more, 8 mm or more, 8.5 mm or more, 9 mm or more, or 9.5 mm or more). In some examples, the average characteristic dimension of the set of conduits 420 can be 10 millimeters (mm) or less (e.g., 9.5 mm or less, 9 mm or less, 8.5 mm or less, 8 mm or less, 7.5 mm or less, 7 mm or less, 6.5 mm or less, 6 mm or less, 5.5 mm or less, 5 mm or less, 4.75 mm or less, 4.5 mm or less, 4.25 mm or less, 4 mm or less, 3.75 mm or less, 3.5 mm or less, 3.25 mm or less, 3 mm or less, 2.75 mm or less, 2.5 mm or less, 2.25 mm or less, 2 mm or less, 1.75 mm or less, 1.5 mm or less, 1.25 mm or less, 1 mm or less, 0.75 mm or less, 0.5 mm or less, or 0.25 mm or less). The average characteristic dimension of the set of conduits 420 can range from any of the minimum values described above to any of the maximum values described above. For example, the average characteristic dimension of the set of conduits 420 can be from 0.1 mm to 10 mm (e.g., from 0.1 mm to 5 mm, from 5 mm to 10 mm, from 0.1 mm to 2.5 mm, from 2.5 mm to 5 mm, from 5 mm to 7.5 mm, from 7.5 mm to 10 mm, from 0.1 mm to 9.5 mm, from 0.5 mm to 10 mm, or from 0.5 mm to 9.5 mm).

The inlets 424 and the outlets 426 of each of the conduits 420 can, independently, be any shape, such as a regular shape, an irregular shape, an isotropic shape, or an anisotropic shape. In some examples, the inlets 424 and/or the outlets 426 of the set of conduits 420 can have a shape that is substantially circular, ovate, ovoid, elliptic, triangular, rectangular, polygonal, etc. In some examples, the shape of the inlets 424 and/or the outlets 426 of the set of conduits 420 can be substantially circular. The inlet 424 and/or the outlet 426 of each of the set of conduits 420 can, for example, be the cross-section in a plane perpendicular to the central longitudinal axis of said conduit 420, such that the shape of the inlet 424 and/or the outlet 426 of each of the set of conduits 420 can be the cross-sectional shape of each of the conduits 420.

The inlets 424 and the outlets 426 of the set of conduits 420 can, independently, have an average characteristic dimension. The term "characteristic dimension," as used herein refers to the largest straight line distance between two points in the plane of the inlet or outlet. "Average characteristic dimension" and "mean characteristic dimension" are used interchangeably herein, and generally refer to the statistical mean characteristic dimension of the inlets or outlets in a population of inlets or outlets. For example, for a cylindrical set of conduits 420, the inlets 424 or the outlets 426 can be substantially circular in shape and the average characteristic dimension can refer to the diameter.

The average characteristic dimension of the inlets 424 and/or the outlets 426 of the set of conduits 420 can, for example, be 0.1 millimeter (mm) or more (e.g., 0.25 mm or more, 0.5 mm or more, 0.75 mm or more, 1 mm or more, 1.25 mm or more, 1.5 mm or more, 1.75 mm or more, 2 mm or more, 2.25 mm or more, 2.5 mm or more, 2.75 mm or more, 3 mm or more, 3.25 mm or more, 3.5 mm or more, 3.75 mm or more, 4 mm or more, 4.25 mm or more, 4.5 mm or more, 4.75 mm or more, 5 mm or more, 5.5 mm or more, 6 mm or more, 6.5 mm or more, 7 mm or more, 7.5 mm or more, 8 mm or more, 8.5 mm or more, 9 mm or more, or 9.5 mm or more). In some examples, the average characteristic dimension of the inlets 424 and/or the outlets 426 of the set of conduits 420 can be 10 millimeters (mm) or less (e.g., 9.5 mm or less, 9 mm or less, 8.5 mm or less, 8 mm or less, 7.5 mm or less, 7 mm or less, 6.5 mm or less, 6 mm or less, 5.5 mm or less, 5 mm or less, 4.75 mm or less, 4.5 mm or less, 4.25 mm or less, 4 mm or less, 3.75 mm or less, 3.5 mm or less, 3.25 mm or less, 3 mm or less, 2.75 mm or less, 2.5 mm or less, 2.25 mm or less, 2 mm or less, 1.75 mm or less, 1.5 mm or less, 1.25 mm or less, 1 mm or less, 0.75 mm or less, 0.5 mm or less, or 0.25 mm or less). The average characteristic dimension of the inlets 424 and/or the outlets 426 of the set of conduits 420 can range from any of the minimum values described above to any of the maximum values described above. For example, the average characteristic dimension of the inlets 424 and/or the outlets 426 of the set of conduits 420 can be from 0.1 mm to 10 mm (e.g., from 0.1 mm to 5 mm, from 5 mm to 10 mm, from 0.1 mm to 2.5 mm, from 2.5 mm to 5 mm, from 5 mm to 7.5 mm, from 7.5 mm to 10 mm, from 0.1 mm to 9.5 mm, from 0.5 mm to 10 mm, or from 0.5 mm to 9.5 mm).

In some examples, the each of the outlets 426 of the set of conduits 420 can further comprise a nozzle (not shown) fluidly connected to each of the outlets 426 of the set of conduits 420. Each nozzle can, for example, have an average characteristic dimension and a cross-sectional shape, wherein the average characteristic dimension of the nozzles, the cross-sectional shape of the nozzles, or a combination thereof can be the same or different than that of the outlets 426 of the set of conduits 420. In some examples, the average characteristic dimension of the nozzles can be smaller than the average characteristic dimension of the outlets 426 of the set of conduits 420. In some examples, the cross-sectional shape of the nozzles can be substantially circular. The average characteristic dimension of the nozzles, the cross-sectional shape of the nozzles, the orientation of the nozzles, or a combination thereof can be used to affect and/or control how the first precursor 470 and/or the second precursor 480 is/are introduced into the chamber 442 (e.g., speed, direction, volume, etc.).

The number of conduits 420, the arrangement of the conduits 420, the cross-sectional shape of the conduits 420, the shape of the outlets 426 of the conduits 420, the average characteristic dimension of the outlets 426 of the conduits 420, the presence or absence of the nozzles fluidly connected to each of the outlets 426 of the set of conduits 420, the average characteristic dimension of the nozzles fluidly connected to each of the outlets 426 of the set of conduits 420 (when present), the cross-sectional shape of the nozzles fluidly connected to each of the outlets 426 of the set of conduits 420 (when present), or a combination thereof can be selected, for example, in view of the number of laser beams 462 within the chamber 442, the size of the laser beam(s) 462, the wavelength(s) of the laser beam(s) 462, the intensity of the laser beam(s) 462 within the chamber 442, the size of the chamber 442, the size of the rotatable substrate support surface 450, or a combination thereof.

The outlets 426 of the set of conduits 420 are configured to introduce a first precursor 470 and a second precursor 480 into the chamber 442 toward the rotatable substrate support surface 450, such that the first precursor 470 and the second precursor 480 flow through the laser beam 462 within the chamber 442 prior to reaching the rotatable substrate support surface 450. In some examples, the outlets 426 of the set of conduits 420 are configured to introduce the first precursor 470 and the second precursor 480 substantially perpendicular to a central axis of the laser beam 462 within the chamber 442. In some examples, the outlets 426 of the set of conduits 420 are configured to introduce the first precursor 470 and the second precursor 480 substantially perpendicular to the rotatable substrate support surface 450.

In some examples, the outlets 426 of the conduits 420 are located in an ordered array. In some examples, the outlets 426 of the set of conduits 420 are configured to introduce the first precursor 470 and the second precursor 480 substantially uniformly throughout the chamber 442. In some examples, the outlets 426 of the set of conduits 420 are positioned in an ordered array and evenly spaced throughout the chamber 442, such that the outlets 426 of the set of conduits 420 are configured to introduce the first precursor 470 and the second precursor 480 substantially uniformly throughout the chamber 442.

In some examples, the set of conduits 420 comprises a plurality of conduits 420 and the plurality of conduits 420 can comprise a set of first conduits and a set of second conduits, the outlets of the set of first conduits being configured to introduce the first precursor 470 into the chamber 442 toward the rotatable substrate support surface 450, the outlets of the set of second conduits being configured to introduce the second precursor 480 into the chamber 442 toward the rotatable substrate support surface 450. In some examples, the outlet of one or more of the first set of conduits is/are located adjacent the outlet of at least one of the second set of conduits. In some examples, the outlet of one or more of the first set of conduits is/are located directly adjacent the outlet of at least one of the second set of conduits. In some examples, the outlets of the first set of conduits are located in an ordered array and the outlets of the second set of conduits are located in an ordered array, evenly spaced and interspersed between the outlets of the first set of conduits.

The plurality of laser windows 410 comprises one or more laser window pairs, each laser window in each pair being disposed opposite the other laser window in the pair across the chamber 442; wherein one of the laser windows 410 in each pair is configured such that the interior face 416 of the laser window 410 directs the laser beam 462 from the laser device 460 across the chamber 442 in a plane that is above and substantially parallel to the rotatable substrate support surface 450 disposed within the chamber 442; and the other laser window 410 in each pair is configured such that the interior face 416 of the laser window 410 receives the laser beam 462 after it has traversed the chamber 462 and directs the received laser beam 462 to the laser dumper 464.

Figure 27:
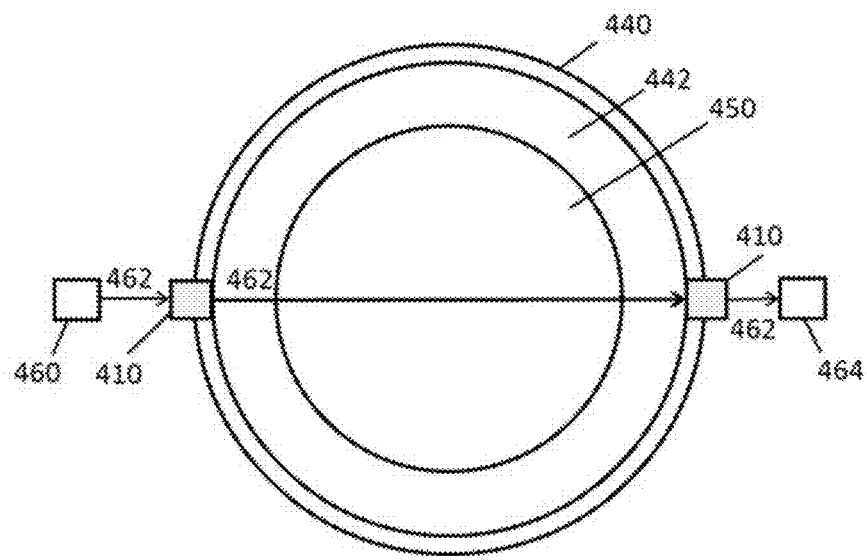
FIG. 27 is a schematic cross-sectional plan view (e.g., top down) of an example device having one laser window pair, each laser window in the pair being disposed opposite the other laser window in the pair across the chamber, wherein one of the laser windows in the pair is configured such that the interior face of the laser window directs the laser beam from the laser device across the chamber in a plane that is above and substantially parallel to the rotatable substrate support surface disposed within the chamber; and the other laser window in the pair is configured such that the interior face of the laser window receives the laser beam after it has traversed the chamber and directs the received laser beam to the laser dumper.

In some examples, the device 400 includes one laser window pair 410, each laser window in the pair being disposed opposite the other laser window in the pair across the chamber 442, wherein one of the laser windows 410 in the pair is configured such that the interior face 416 of the laser window 410 directs the laser beam 462 from the laser device 460 across the chamber 442 in a plane that is above and substantially parallel to the rotatable substrate support surface 450 disposed within the chamber 442; and the other laser window 410 in the pair is configured such that the interior face 416 of the laser window 410 receives the laser beam 462 after it has traversed the chamber 462 and directs the received laser beam 462 to the laser dumper 464, as shown in FIG. 27.

Figure 28:
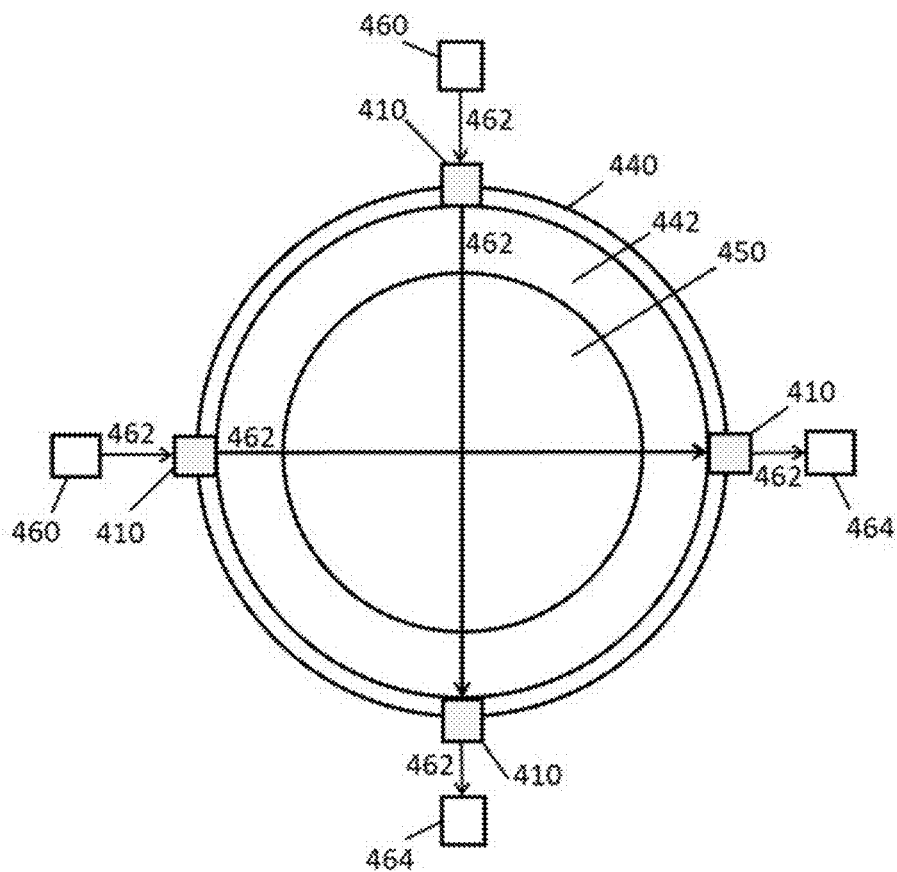
FIG. 28 is a schematic cross-sectional plan view (e.g., top down) of an example device having two laser window pairs, each laser window in each pair being disposed opposite the other laser window in the pair across the chamber, wherein one of the laser windows in each pair is configured such that the interior face of the laser window directs the laser beam from the laser device across the chamber in a plane that is above and substantially parallel to the rotatable substrate support surface disposed within the chamber; and the other laser window in each pair is configured such that the interior face of the laser window receives the laser beam after it has traversed the chamber and directs the received laser beam to the laser dumper.

In some examples, the device 400 includes two laser window pairs 410, each laser window in each pair being disposed opposite the other laser window in the pair across the chamber 442, wherein one of the laser windows 410 in each pair is configured such that the interior face 416 of the laser window 410 directs the laser beam 462 from the laser device 460 across the chamber 442 in a plane that is above and substantially parallel to the rotatable substrate support surface 450 disposed within the chamber 442; and the other laser window 410 in each pair is configured such that the interior face 416 of the laser window 410 receives the laser beam 462 after it has traversed the chamber 462 and directs the received laser beam 462 to the laser dumper 464, as shown in FIG. 28.

Figure 29:
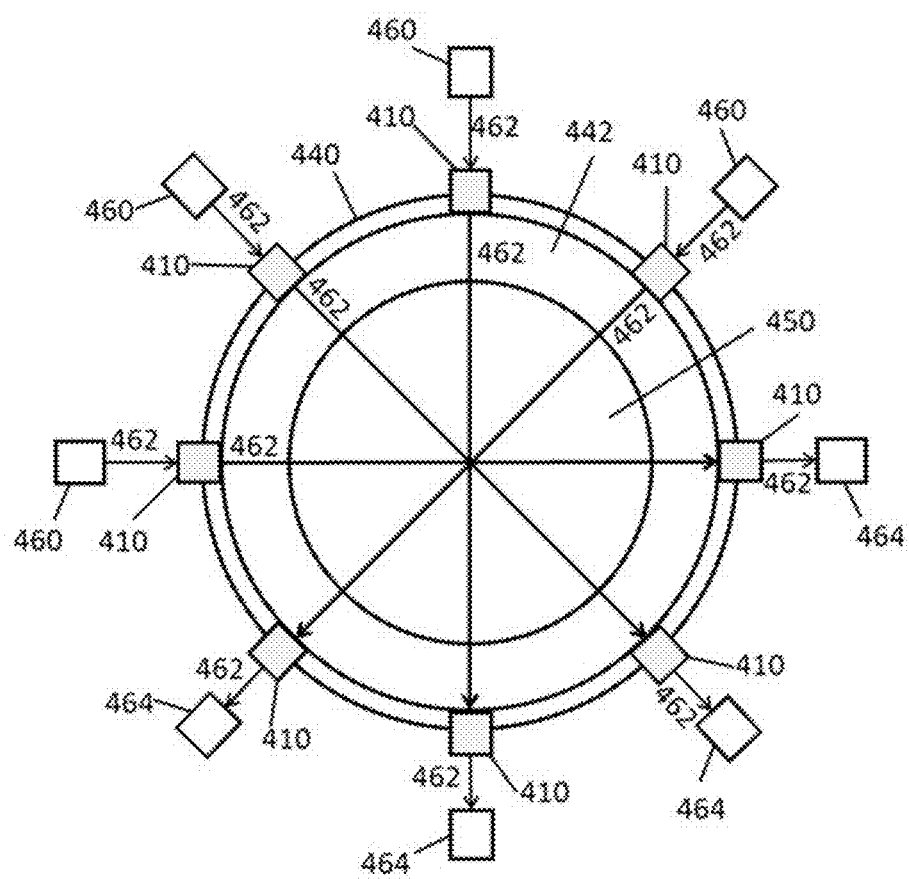
FIG. 29 is a schematic cross-sectional plan view (e.g., top down) of an example device having four laser window pairs, each laser window in each pair being disposed opposite the other laser window in the pair across the chamber, wherein one of the laser windows in each pair is configured such that the interior face of the laser window directs the laser beam from the laser device across the chamber in a plane that is above and substantially parallel to the rotatable substrate support surface disposed within the chamber; and the other laser window in each pair is configured such that the interior face of the laser window receives the laser beam after it has traversed the chamber and directs the received laser beam to the laser dumper.

In some examples, the device 400 includes four laser window pairs 410, each laser window in each pair being disposed opposite the other laser window in the pair across the chamber 442, wherein one of the laser windows 410 in each pair is configured such that the interior face 416 of the laser window 410 directs the laser beam 462 from the laser device 460 across the chamber 442 in a plane that is above and substantially parallel to the rotatable substrate support surface 450 disposed within the chamber 442; and the other laser window 410 in each pair is configured such that the interior face 416 of the laser window 410 receives the laser beam 462 after it has traversed the chamber 462 and directs the received laser beam 462 to the laser dumper 464, as shown in FIG. 29.

In some examples, the device 400 includes a plurality of laser window pairs each laser window 410 in each pair being disposed opposite the other laser window 410 in the pair across the chamber 442; wherein one of the laser windows 410 in each pair is configured such that the interior face 416 of the laser window 410 directs the laser beam 462 from the laser device 460 across the chamber 442 in a plane that is above and substantially parallel to the rotatable substrate support surface 450 disposed within the chamber 442; and the other laser window 410 in each pair is configured such that the interior face 416 of the laser window 410 receives the laser beam 462 after it has traversed the chamber 462 and directs the received laser beam 462 to the laser dumper 464.

The laser beam 462 (e.g., the one or more laser beams 462) introduced into the chamber 442 is directed across the chamber 442 in a plane that is above and substantially parallel to the rotatable substrate support surface 450 disposed within the chamber 442 such that the laser beam 462 is disposed above the rotatable substrate support surface 450 by a distance of 10 millimeters (mm) or less (e.g., 9.5 mm or less, 9 mm or less, 8.5 mm or less, 8 mm or less, 7.5 mm or less, 7 mm or less, 6.5 mm or less, 6 mm or less, 5.5 mm or less, 5 mm or less, 4.75 mm or less, 4.5 mm or less, 4.25 mm or less, 4 mm or less, 3.75 mm or less, 3.5 mm or less, 3.25 mm or less, 3 mm or less, 2.75 mm or less, 2.5 mm or less, 2.25 mm or less, 2 mm or less, 1.75 mm or less, 1.5 mm or less, 1.25 mm or less, 1 mm or less, 0.75 mm or less, 0.5 mm or less, or 0.25 mm or less). In some examples the laser beam 462 is disposed above the rotatable substrate support surface 450 by a distance of 0 mm or more (e.g., 0.25 mm or more, 0.5 mm or more, 0.75 mm or more, 1 mm or more, 1.25 mm or more, 1.5 mm or more, 1.75 mm or more, 2 mm or more, 2.25 mm or more, 2.5 mm or more, 2.75 mm or more, 3 mm or more, 3.25 mm or more, 3.5 mm or more, 3.75 mm or more, 4 mm or more, 4.25 mm or more, 4.5 mm or more, 4.75 mm or more, 5 mm or more, 5.5 mm or more, 6 mm or more, 6.5 mm or more, 7 mm or more, 7.5 mm or more, 8 mm or more, 8.5 mm or more, 9 mm or more, or 9.5 mm or more). The distance that the laser beam 462 is disposed above the rotatable substrate support surface 450 can range from any of the minimum values described above to any of the maximum values described above. For example, the laser beam 462 can be disposed above the rotatable substrate support surface by a distance of from 0 mm to 10 mm (e.g., from 0 mm to 5 mm, from 5 mm to 10 mm, from 0 mm to 2.5 mm, from 2.5 mm to 5 mm, from 5 mm to 7.5 mm, from 7.5 mm to 10 mm, from 0 mm to 9 mm, from 1 mm to 10 mm, from 1 mm to 9 mm, from 0 mm to 8 mm, from 0 mm to 6 mm, from 0 mm to 4 mm, or from 1 mm to 3 mm).

Each of the one or more laser beams 462 comprises electromagnetic radiation with at least one wavelength that overlaps with at least a portion of a vibrational mode of the first precursor 470, thereby generating an active species (e.g., an irradiated first precursor) in situ. In some examples, the wavelength of the laser beam 462 is selected in view of the identity of the first precursor 470, such that the laser beam 462 comprises electromagnetic radiation with at least one wavelength that overlaps with at least a portion of a vibrational mode of the first precursor 470, such that irradiation of the first precursor 470 with the laser beam(s) 462 can enhance the cracking efficiency of the first precursor 470.

In some examples, the device 400 is configured to deposit a material via laser-assisted metal-organic vapor deposition from the first precursor 470 and the second precursor 480 on one or more substrates disposed on the rotatable substrate support surface 450 within the chamber 442. In some examples, the distance at which the laser beam 462 is located above the rotatable substrate support surface 450 can be selected, for example, such that background incorporation of carbon into the deposited material is suppressed (e.g., reduced or minimized relative to the amount of carbon incorporated in the deposited semiconductor when the laser beam 462 is located at a distance greater than 10 mm above the rotatable substrate support surface).

In some examples, the device 400 is configured to deposit a III-V semiconductor, such that the first precursor 470 comprises a V-group precursor and the second precursor 480 comprises a III-group precursor.

The first precursor 470 can, for example, comprise a V-group precursor, such as a compound, element, or composition comprising N, P, As, Sb, Bi, or a combination thereof. In some examples, the first precursor 470 can comprise a nitrogen species. In some examples, the first precursor 470 can comprise $NH_3$. The first precursor 470 can, for example, comprise a fluid, such as a gas. In some examples, the devices 400 can further comprise a first precursor source (not shown) fluidly coupled to the chamber 442 via the set of conduits 420.

The second precursor 480 can, for example, comprise a III-group precursor, such as compound, element, or composition comprising B, Al, Ga, In, Tl, or a combination thereof. In some examples, the second precursor 480 can comprise a gallium species. In some examples, the second precursor 480 can comprise trimethylgallium, triethylgallium, or a combination thereof. The second precursor 480 can, for example, comprise a fluid, such as a gas. In some examples, the devices 400 can further comprise a second precursor source (not shown) fluidly coupled to the chamber 442 via the set of conduits 420.

In some examples, the device 400 is configured to deposit a group III oxide semiconductor, such that the first precursor 470 comprises an oxygen containing precursor and the second precursor 480 comprises a III-group precursor.

In some examples, the device 400 is configured to deposit a group II-VI semiconductor material, such that the first precursor 470 comprises a VI-group precursor (e.g., a compound/composition/element comprising O, S, Se, Te, or a combination thereof) and the second precursor 480 comprises a II-group precursor (e.g., a compound/composition/element comprising Be, Mg, Ca, Sr, Ba, Zn, Cd, Hg, or a combination thereof).

In some examples, the device 400 is configured to deposit a group $II-IV-V_2$ semiconductor, such that the first precursor 470 comprises a V-group precursor (e.g., a compound, element, or composition comprising N, P, As, Sb, Bi, or a combination thereof) and the second precursor 480 comprises a mixture of a II-group precursor (e.g., a compound/composition/element comprising Be, Mg, Ca, Sr, Ba, Zn, Cd, Hg, or a combination thereof) and a IV-group precursor (e.g., a compound/composition/element comprising C, Si, Ge, Sn, Pb, or a combination thereof).

In some examples, the device 400 is configured to introduce the first precursor 470 into the chamber 442 continuously or intermittently. In some examples, the device 400 is configured to introduce the second precursor 480 continuously or intermittently.

In some examples, the device 400 is configured to introduce the first precursor 470 and the second precursor 480 into the chamber 442 alternately. In some examples, the device 400 is configured to introduce the first precursor 470 and the second precursor 480, wherein at least a portion of the introduction of the second precursor 480 is concurrent with at least a portion of the introduction of the first precursor 470, or vice versa. In some examples, the device 400 is configured to introduce the first precursor 470 and the second precursor 480 to the chamber simultaneously.

In some examples, the outlets 426 of the set of conduits 420 are further configured to introduce a dopant (e.g., one or more dopants) into the chamber 442 toward the rotatable substrate support surface 450. The one or more dopants can be selected in view of the first precursor 470 and/or the second precursor 480. The one or more dopants can be, for example, a fluid, such as a gas. In some examples, the one or more dopants can comprise an n-type dopant (e.g., silane ($SiH_4$), germane ($GeH_4$), disilane($Si_2H_6$)), a p-type dopant (e.g., bis(cyclopentadienyl)magnesium ($Cp_2Mg$), bis(methylcyclopentadienyl)magnesium (($MeCp)_2Mg$)), or a combination thereof. In some examples, the one or more dopants can comprise silane ($SiH_4$), germane ($GeH_4$), disilane ($Si_2H_6$), bis(cyclopentadienyl)magnesium ($Cp_2Mg$), bis(methylcyclopentadienyl)magnesium (($MeCp)_2Mg$), or a combination thereof. The one or more dopants can, for example, be mixed with the first precursor 470 and/or the second precursor 480 prior to introduction into the chamber 442. In some examples, the device 400 is configured to introduce the first precursor 470, the second precursor 480, and the one or more dopants into the chamber 442 consecutively in turn. In some examples, the device 400 is configured to introduce the first precursor 470 and the one or more dopants, wherein at least a portion of the introduction of the one or more dopants is concurrent with at least a portion of the introduction of the first precursor 470, or vice versa. In some examples, the device 400 is configured to introduce the second precursor 480 and the one or more dopants, wherein at least a portion of the introduction of the one or more dopants is concurrent with at least a portion of the introduction of the second precursor 480, or vice versa. In some examples, the device is configured to introduce the first precursor 470, the second precursor 480, and the one or more dopants into the chamber 442 simultaneously.

In some examples, the outlets 426 of the set of conduits 420 are further configured to introduce a carrier gas (e.g., one or more carrier gases) into the chamber 442 toward the rotatable substrate support surface 450. The one or more carrier gases can be selected in view of the first precursor 470, the second precursor 480, the one or more dopants (when present), or a combination thereof. The one or more carrier gases can be, for example, argon, helium, $H_2$, $N_2$, and the like, or combinations thereof. The one or more carrier gases can, for example, be mixed with the first precursor 470, the second precursor 480, the one or more dopants (when present), or a combination thereof prior to introduction into the chamber 442. In some examples, the device 400 is configured to introduce the first precursor 470, the second precursor 480, the one or more dopants (when present), or a combination thereof concurrently with at least a portion of the introduction of the one or more carrier gases.

The devices 400 described herein can further comprise or be assembled with a variety of additional components. The devices 400 can, for example, be assembled together with, or in some examples can further comprise, the rotatable substrate support surface 450.

The rotatable substrate support surface 450 can be any shape, such as a regular shape, an irregular shape, an isotropic shape, or an anisotropic shape. In some examples, the shape of the rotatable substrate support surface 450 can be substantially circular, ovate, ovoid, elliptic, triangular, rectangular, polygonal, etc. In some examples, the shape of the rotatable substrate support surface can be substantially circular. The size and shape of the rotatable substrate support surface 450 can, for example, be selected in view of the size and shape of the chamber 442.

The rotatable substrate support surface 450 can support one or more substrates (not shown) (e.g., 2 or more, 3 or more, 4 or more, 5 or more, 6 or more, 7 or more, 8 or more, 9 or more, 10 or more, 15 or more, 20 or more, 25 or more, 30 or more, 35 or more, 40 or more, 45 or more, 50 or more, 60 or more, 70 or more, 80 or more, 90 or more, 100 or more, 150 or more, 200 or more, 250 or more, 300 or more, 350 or more, 400 or more, 450 or more, 500 or more, 600 or more, 700 or more, 800 or more, 900 or more, 1000 or more, 1500 or more, or 2000 or more) to be coated with a material via laser-assisted metal-organic vapor deposition from the first precursor 470 and the second precursor 480 (and one or more dopants, if present) within the chamber 442. The devices 400 can, for example, be assembled together with, or in some examples can further comprise the one or more substrates (not shown) disposed on the rotatable substrate support surface 450.

The number of substrates disposed on the rotatable substrate support surface 450 can be selected, for example, in view of the size of the one or more substrates and/or the size of the rotatable substrate support surface 450. The devices 400 can, for example, be configured to rotate the rotatable substrate support 450 surface to thereby provide a more uniform coating of the material on the one or more substrates via laser-assisted metal-organic vapor deposition.

The one or more substrates can have an average characteristic dimension. The average characteristic dimension of the one or more substrates can, for example, be 1 inch or more (e.g., 2 inches or more, 3 inches or more, 4 inches or more, 5 inches or more, 6 inches or more, 7 inches or more, 8 inches or more, 9 inches or more, 10 inches or more, 11 inches or more, 12 inches or more, 13 inches or more, 14 inches or more, 15 inches or more, 16 inches or more, 17 inches or more, 18 inches or more, 19 inches or more, 20 inches or more, 25 inches or more, 30 inches or more, or 35 inches or more). In some examples, the average characteristic dimension of the one or more substrates can be 36 inches or less (e.g., 35 inches or less, 30 inches or less, 25 inches or less, 20 inches or less, 19 inches or less, 18 inches or less, 17 inches or less, 16 inches or less, 15 inches or less, 14 inches or less, 13 inches or less, 12 inches or less, 11 inches or less, 10 inches or less, 9 inches or less, 8 inches or less, 7 inches or less, 6 inches or less, 5 inches or less, 4 inches or less, 3 inches or less, or 2 inches or less). The average characteristic dimension of the one or more substrates can range from any of the minimum values described above to any of the maximum values described above. For example, the average characteristic dimension of the one or more substrates can be from 1 inch to 36 inches (e.g., from 1 inch to 18 inches, from 18 inches to 36 inches, from 1 inch to 6 inches, from 6 inches to 12 inches, from 12 inches to 18 inches, from 18 inches to 24 inches, from 24 inches to 30 inches, from 30 inches to 36 inches, from 2 inches to 36 inches, from 1 inch to 30 inches, from 2 inches to 30 inches, from 1 inch to 18 inches, from 1 inch to 12 inches, or from 2 inches to 8 inches).

The one or more substrates can be any shape, such as a regular shape, an irregular shape, an isotropic shape, or an anisotropic shape. In some examples, the shape of the one or more substrates can be substantially circular, ovate, ovoid, elliptic, triangular, rectangular, polygonal, etc. In some examples, the shape of the one or more substrates can be substantially circular, such that the average characteristic dimension is the diameter.

The one or more substrates can comprise any suitable material. Examples of suitable substrates include, but are not limited to, bulk GaN, GaN template, sapphire, $Al_2O_3$, $LiAlO_2$, Si, SiC, zinc oxide, bulk AlN, AlN on sapphire template, and combinations thereof.

The devices 400 can, for example, be assembled together with, or in some examples can further comprise, a laser device 460 (e.g., one or more laser devices 460) for producing a laser beam 462 (e.g., one or more laser beams 462). In some examples, the devices 400 can comprise one laser device 460, as shown in FIG. 27. In some examples, the devices 400 can comprise two laser devices 460, as shown in FIG. 28. In some examples, the devices 400 can comprise four laser devices 460, as shown in FIG. 29.

Each laser device 460 can, for example, comprise one or more lasers. In some examples, the laser device 460 can further comprise a laser distributor and/or beam splitter for splitting each of the one or more lasers into a plurality of laser beams 462. In some examples, the laser device 460 can further comprise a beam shaper to control/adjust the shape of the laser beam. In some examples, the laser device 460 can further comprise a beam sizer to control/adjust the size (e.g., diameter) of the laser beam. In some examples, the laser device 460 can further comprise a beam directing and positioning module to control/adjust the direction and/or position of the laser beam. In some examples, the laser device 460 can further comprise one or more lenses, for example to control/adjust the size, shape, direction, position, uniformity (e.g., with respect to intensity), etc. of the laser beam. The one or more lenses can be any type of lens, such as a simple lens, a compound lens, a spherical lens, a toric lens, a biconvex lens, a plano-convex lens, a plano-concave lens, a negative meniscus lens, a positive meniscus lens, a biconcave lens, a converging lens, a diverging lens, a cylindrical lens, a Fresnel lens, a lenticular lens, a gradient index lens, or a combination thereof.

The wavelength(s) of the one or more lasers can be selected, for example, in view of the identity of the first precursor 470. In some examples, the one or more lasers can comprise an infrared laser. In some examples, the one or more lasers can comprise a $CO_2$ laser, such as a tunable $CO_2$ laser.

The devices 400 can, for example, be assembled together with, or in some examples can further comprise, a laser dumper 464 (e.g., one or more laser dumpers 464) for receiving a laser beam 462 (e.g., one or more laser beams 462) after the laser beam has traversed the chamber. In some examples, the devices 400 can comprise one laser dumper 464, as shown in FIG. 27. In some examples, the devices 400 can comprise two laser dumpers 464, as shown in FIG. 28. In some examples, the devices 400 can comprise four laser dumpers 464, as shown in FIG. 29. Each laser dumper 464 can, for example, be configured to receive a laser beam 462 (e.g., one or more laser beams 462) after the laser beam 462 has traversed the chamber and dissipate the energy of the received laser beam 462.

Figure 30:
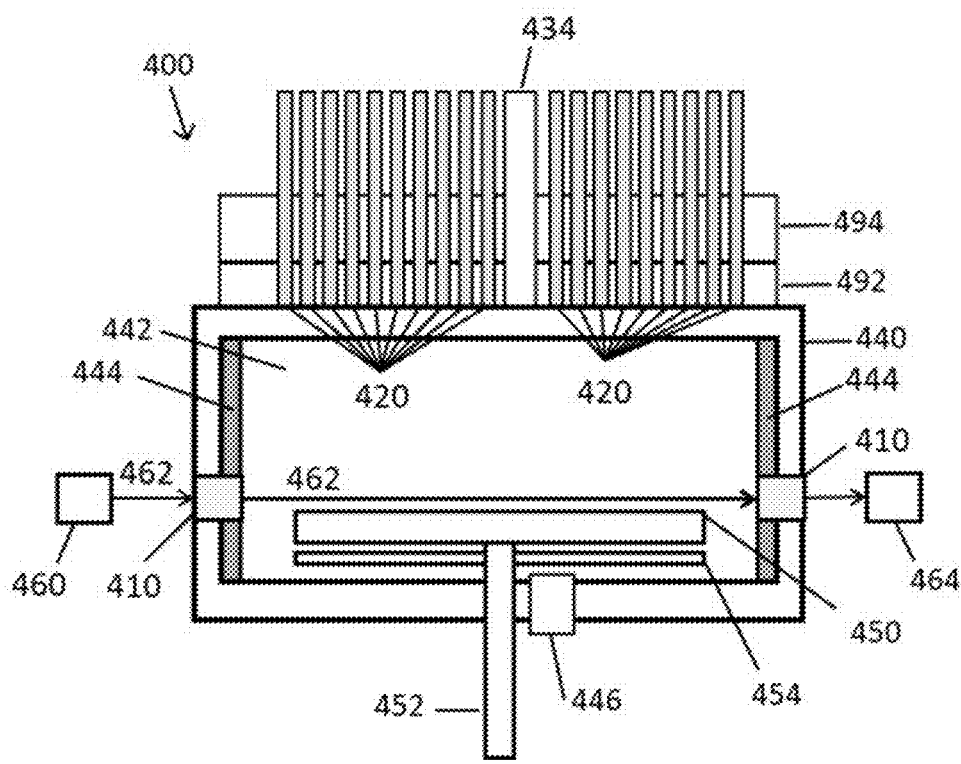
FIG. 30 is a schematic cross-sectional plan view of an example device as disclosed herein according to one implementation.

The devices 400 described herein can further comprise or be assembled with a variety of additional components, for example as shown in FIG. 30. Though the some of the elements are only shown in FIG. 30, any of the one or more additional elements or any combination of the one or more additional elements shown in FIG. 30 can be present in any of the other embodiments of the devices 400 described herein.

Referring now to FIG. 30, in some examples, the interior surface of wall 440 (e.g., the surface of the wall 440 within the chamber 442) can further comprise a coating 444, wherein the coating 444 can comprise a material that can absorb at least a portion of the laser beam energy. The interior face 416 of each of the plurality of laser windows 410 is substantially free of the coating 444, when present. Though the coating 444 is only shown in FIG. 30, the coating 444 can be present in any of the other embodiments of the devices 400 described herein.

In some examples, the wall 440 can further comprise an exhaust port 446 which fluidly couples the chamber 442 with an external environment. Though the exhaust port 446 is only shown in FIG. 30, the exhaust port 446 can be present in any of the other embodiments of the devices 400 described herein.

In some examples, the rotatable substrate support surface 450 can be coupled to or further comprise a rotary spindle 452. For example, the rotatable substrate support surface 450 can be centrally mounted on the rotary spindle 452, and the rotary spindle 452 can be rotated to rotate the rotatable substrate support surface 450. In some examples, the rotary spindle 452 can further be coupled to a means for rotating the rotary spindle 452. The devices 400 can, for example, be configured to rotate the rotary spindle 452 and thus rotate the rotatable substrate support surface 450 to thereby provide a more uniform coating of the material on the one or more substrates via laser-assisted metal-organic vapor deposition. Though the rotary spindle 452 is only shown in FIG. 30, the rotary spindle 452 can be present in any of the other embodiments of the devices 400 described herein.

In some examples, the devices 400 can further be assembled with, or in some examples can further comprise, a heater 454 thermally coupled to the rotatable substrate support surface 450 within the chamber 442. The heater 454 can, for example, be located below the rotatable substrate support surface 450, and optionally spaced apart from the rotatable substrate support surface 450, relative to the position of the outlets 426 of the set of conduits 420. In some examples, the devices 400 can further comprise a means for controlling the temperature of (e.g., heating) the heater 454. Though the heater 454 is only shown in FIG. 30, the heater 454 can be present in any of the other embodiments of the devices 400 described herein.

In some examples, the heater 454 can be heated such that the one or more substrates is at a temperature of 100° C. or more (e.g., 150° C. or more, 200° C. or more, 250° C. or more, 300° C. or more, 350° C. or more, 400° C. or more, 450° C. or more, 500° C. or more, 550° C. or more, 600° C. or more, 650° C. or more, 700° C. or more, 750° C. or more, 800° C. or more, 850° C. or more, 900° C. or more, 950° C. or more, 1000° C. or more, 1100° C. or more, 1200° C. or more, 1300° C. or more, 1400° C. or more, 1500° C. or more, 1600° C. or more, 1700° C. or more, 1800° C. or more, or 1900° C. or more). In some examples, the heater 454 can be heated such that the one or more substrates is at a temperature of 2000° C. or less (e.g., 1900° C. or less, 1800° C. or less, 1700° C. or less, 1600° C. or less, 1500° C. or less, 1400° C. or less, 1300° C. or less, 1200° C. or less, 1100° C. or less, 1000° C. or less, 950° C. or less, 900° C. or less, 850° C. or less, 800° C. or less, 750° C. or less, 700° C. or less, 650° C. or less, 600° C. or less, 550° C. or less, 500° C. or less, 450° C. or less, 400° C. or less, 350° C. or less, 300° C. or less, 250° C. or less, 200° C. or less, or 150°

C. or less). The temperature at which the one or more substrates are heated by the heater 454 can range from any of the minimum values described above to any of the maximum values described above. For example, the heater 454 can be heated such that the one or more substrates is at a temperature of from 100° C. to 2000° C. (e.g., from 100° C. to 1000° C., from 1000° C. to 2000° C., from 100° C. to 500° C., from 500° C. to 900° C., from 900° C. to 1300° C., from 1300° C. to 1700° C., from 1700° C. to 2000° C., from 400° C. to 2000° C., from 100° C. to 1500° C., or from 400° C. to 1500° C.). In some examples, the temperature at which the one or more substrates are heated by the heater 454 can be selected in view of the identity of the second precursor 480, such that the temperature at which the one or more substrates are heated by the heater can thermally decompose the second precursor at or near the one or more substrates, to thereby form an active species (e.g., a thermal decomposition species) in situ.

The devices 400 can, for example, be assembled together with, or in some examples can further comprise, a cooling plate 492 disposed outside the chamber 442 adjacent and thermally coupled to the portion of the wall 440 substantially parallel with and spaced apart from the rotatable substrate support surface 450. The cooling plate can 492, in some examples, be in contact with the portion of the wall 440 substantially parallel with and spaced apart from the rotatable substrate support surface 450 outside of the chamber 442. The cooling plate 492 can be configured to cool the portion of the wall 440 substantially parallel with and spaced apart from the rotatable substrate support surface 450 outside of the chamber 442. In some examples, the devices 400 can further comprise a means for controlling the temperature of (e.g., cooling) the cooling plate 492. The cooling plate 492 can, in some examples, be hollow such that a cooling medium can be included within the cooling plate 492, for example to dissipate heat (e.g., from the heater, from the laser energy, or a combination thereof). In some examples, the cooling medium can comprise water. When present, the cooling plate 492 can further define the set of conduits 420. Though the cooling plate 492 is only shown in FIG. 30, the cooling plate 492 can be present in any of the other embodiments of the devices 400 described herein.

The devices 400 can, for example, further be assembled together with, or in some examples can further comprise, a top cover 494, disposed outside of the chamber 442 adjacent the portion of the wall 440 substantially parallel with and spaced apart from the rotatable substrate support surface 450. The top cover 494 can, in some examples, be in contact with the portion of the wall 440 substantially parallel with and spaced apart from the rotatable substrate support surface 450 outside of the chamber 442. When present, the cooling plate 492 can be sandwiched between the portion of the wall 440 substantially parallel with and spaced apart from the rotatable substrate support surface 450 outside of the chamber 442 and the top cover 494, such that the top cover 494 is located above and in contact with the cooling plate 492. When present, the cooling plate 492 and/or the top cover 494 can further define the set of conduits 420. Though the top cover 494 is only shown in FIG. 30, the top cover 494 can be present in any of the other embodiments of the devices 400 described herein.

The devices 400 can, for example, be assembled together with, or in some examples can further comprise, an in-situ monitor, such as a camera and/or a window. In some examples, the in-situ monitor can comprise a window or viewport 434 defined by the cooling plate 492 and/or top cover 494, when present. The in-situ monitor can allow for visual inspection inside the chamber 442 when the device 400 is assembled. Though the viewport 434 is only shown in FIG. 30, the viewport 434 can be present in any of the other embodiments of the devices 400 described herein.

Devices 500

Figure 31:
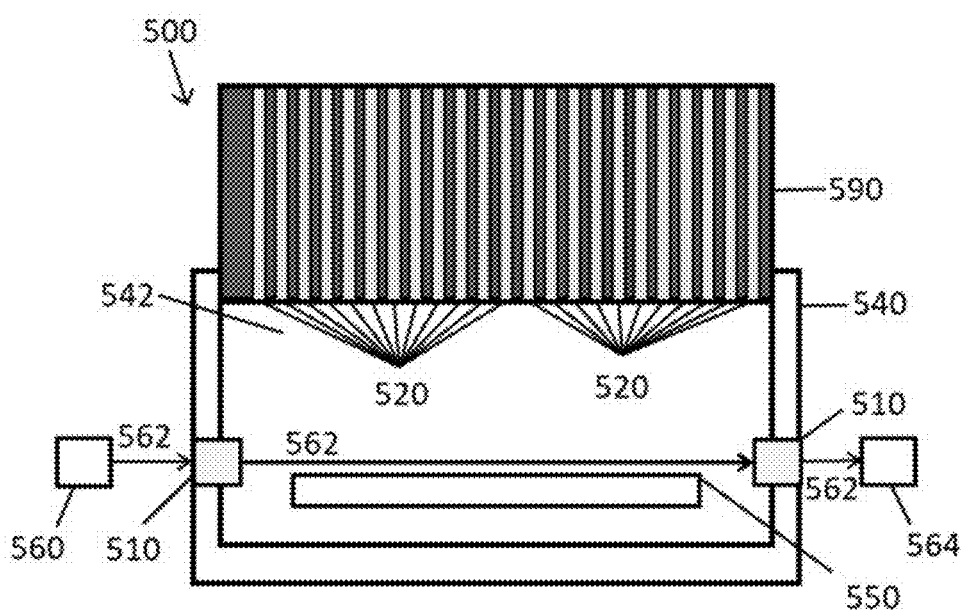
FIG. 31 is a schematic cross-sectional plan view of an example device as disclosed herein according to one implementation.

FIG. 31 shows a schematic cross-section plan view of a laser-assisted metal-organic chemical vapor deposition (MOCVD) device 500 according to one implementation described herein. Referring to FIG. 31, the device 500 comprises a wall 540 defining a chamber 542. The wall 540 can, in some examples be hollow such that a cooling medium can be included within the wall 540, for example to dissipate heat (e.g., from the heater, from the laser energy, or a combination thereof). In some examples, the cooling medium can comprise water.

Referring again to FIG. 31, the device 500 further comprises a plurality of laser windows 510, wherein each of the laser windows 510 defines an exterior face 514, an interior face 516 opposite and spaced apart from the exterior face 514, and an optical path 512 extending between the interior face 516 and the exterior face 514; wherein each of the laser windows 510 is disposed within the wall 540 such that the interior face 516 further defines the chamber 542.

The plurality of laser windows 510 can include two or more laser windows 510 (e.g., 2 or more, 3 or more, 4 or more, 5 or more, 6 or more, 7 or more, 8 or more, 9 or more, 10 or more, 15 or more, 20 or more, 25 or more, 30 or more, 40 or more, 50 or more, 60 or more, 70 or more, 80 or more, 90 or more, 100 or more, 150 or more, 200 or more, 250 or more, 300 or more, 350 or more, 400 or more, 450 or more, 500 or more, 600 or more, 700 or more, 800 or more, 900 or more, or 1000 or more). The number of laser windows 510 can be selected in view of the size of the chamber 542, the size of the rotatable substrate support surface 550, or a combination thereof.

In some examples, the plurality of laser windows 510 are positioned within the wall 540 and spaced around the periphery of the chamber 542. In some examples, the plurality of laser windows 510 are evenly spaced around the periphery of the chamber 542. In certain examples, the chamber 542 has a substantially circular cross-section and the plurality of laser windows 510 are evenly spaced around the circumference of the chamber 542.

In some examples, the plurality of laser windows 510 comprises an even number of laser windows 510, such that the plurality of laser windows comprises a one or more laser window pairs, wherein each laser window 510 in each pair disposed opposite the laser window 510 in the pair across the chamber 542, as shown, for example, in FIG. 31.

Each of the plurality of laser windows 510 can comprise any suitable material, such as, for example, ZnSe, ZnS, NaCl, KBr, and combinations thereof.

The cross-sectional shape of each of the plurality of laser windows 510 in a plane perpendicular to the central longitudinal axis of said laser window 510 can be any shape, such as a regular shape, an irregular shape, an isotropic shape, or an anisotropic shape. In some examples, the cross-sectional shape of the plurality of laser windows 510 can be substantially circular, ovate, ovoid, elliptic, triangular, rectangular, polygonal, etc. In some examples, the cross-sectional shape of the plurality of laser windows 510 can be substantially circular.

The interior face 516 and the exterior face 514 of each of the plurality of laser windows 510 can, independently, be any shape, such as a regular shape, an irregular shape, an isotropic shape, or an anisotropic shape. In some examples, the interior face 516 and/or the exterior face 514 of the plurality of laser windows 510 can have a shape that is substantially circular, ovate, ovoid, elliptic, triangular, rectangular, polygonal, etc. In some examples, the shape of the interior face 516 and/or the exterior face 514 of the plurality of laser windows 510 can be substantially circular. The interior face 516 and/or the exterior face 514 of each of the plurality of laser windows 510 can, for example, be the cross-section in a plane perpendicular to the longitudinal axis of said laser window 510, such that the shape of the interior face 516 and/or the exterior face 514 of each of the plurality of laser windows 510 can be the cross-sectional shape of each of the plurality of laser windows 510.

The number of laser windows 510, the arrangement of the laser windows 510, the cross-sectional shape of the laser windows 510, or a combination thereof can be selected, for example, in view of the number of laser beams 562 within the chamber 542, the size of the laser beam(s) 562, the wavelength(s) of the laser beam(s) 562, the intensity of the laser beam(s) 562 within the chamber 542, the size of the chamber 542, the size of the rotatable substrate support surface 550, or a combination thereof.

Referring again to FIG. 31, the device 500 further comprises a source distributor 590 and a set of conduits 520, wherein each of the conduits defines an inlet 524, an outlet 526 opposite an spaced apart from the inlet 524, and a path for fluid flow extending from the inlet 524 to the outlet 526. The set of conduits 520 can, for example, be defined by the source distributor 590. Referring to FIG. 31, the set of conduits 520 are defined by the source distributor 590. When the device 500 is assembled together with a rotatable substrate support surface 550 disposed within the chamber 542, a laser device 560 for producing a laser beam 562, and a laser dumper 564 for receiving a laser beam 562: the plurality of laser windows 510 comprises one or more laser window pairs, each laser window in each pair being disposed opposite the other laser window in the pair across the chamber 542; wherein one of the laser windows 510 in each pair is configured such that the interior face 516 of the laser window 510 directs the laser beam 562 from the laser device 560 across the chamber 542 in a plane that is above and substantially parallel to the rotatable substrate support surface 550 disposed within the chamber 542, wherein the laser beam 562 is disposed above the rotatable substrate support surface by a distance of 10 mm or less; the other laser window 510 in each pair is configured such that the interior face 516 of the laser window 510 receives the laser beam 562 after it has traversed the chamber 562 and directs the received laser beam 562 to the laser dumper 564; and the outlets 526 of the set of conduits 520 are configured to introduce a first precursor 570 and a second precursor 580 into the chamber 542 toward the rotatable substrate support surface 550, such that the first precursor 570 and the second precursor 580 flow through the laser beam 562 within the chamber 542 prior to reaching the rotatable substrate support surface 550.

As used herein, "a set of conduits 520" and "the set of conduits 520" are meant to include any number of conduits 520 in any arrangement. Thus, for example "a set of conduits 520" includes one or more conduits 520 (e.g., 2 or more, 3 or more, 4 or more, 5 or more, 6 or more, 7 or more, 8 or more, 9 or more, 10 or more, 15 or more, 20 or more, 25 or more, 30 or more, 40 or more, 50 or more, 60 or more, 70 or more, 80 or more, 90 or more, 100 or more, 150 or more, 200 or more, 250 or more, 300 or more, 350 or more, 400 or more, 450 or more, 500 or more, 600 or more, 700 or more, 800 or more, 900 or more, or 1000 or more). In some embodiments, the set of conduits 520 can comprise a plurality of conduits 520. In some embodiments, the set of conduits 520 can comprise a plurality of conduits 520 arranged in an ordered array.

The cross-sectional shape of each of conduits 520 in a plane perpendicular to the central longitudinal axis of said conduit 520 can be any shape, such as a regular shape, an irregular shape, an isotropic shape, or an anisotropic shape. In some examples, the cross-sectional shape of each of conduits 520 in the set of conduits 520 can be substantially circular, ovate, ovoid, elliptic, triangular, rectangular, polygonal, etc. In some examples, the cross-sectional shape of each of the conduits 520 can be substantially circular.

The set of conduits 520 can have an average characteristic dimension. The term "characteristic dimension," as used herein refers to the largest straight line distance between two points in the plane of the cross-sectional shape of each of the set of conduits. "Average characteristic dimension" and "mean characteristic dimension" are used interchangeably herein, and generally refer to the statistical mean characteristic dimension of the conduits in a population of conduits. For example, for a cylindrical set of conduits, the cross-sectional shape can be substantially circular and the average characteristic dimension can refer to the diameter.

The average characteristic dimension of the set of conduits 520 can, for example, be 0.1 millimeter (mm) or more (e.g., 0.25 mm or more, 0.5 mm or more, 0.75 mm or more, 1 mm or more, 1.25 mm or more, 1.5 mm or more, 1.75 mm or more, 2 mm or more, 2.25 mm or more, 2.5 mm or more, 2.75 mm or more, 3 mm or more, 3.25 mm or more, 3.5 mm or more, 3.75 mm or more, 4 mm or more, 4.25 mm or more, 4.5 mm or more, 4.75 mm or more, 5 mm or more, 5.5 mm or more, 6 mm or more, 6.5 mm or more, 7 mm or more, 7.5 mm or more, 8 mm or more, 8.5 mm or more, 9 mm or more, or 9.5 mm or more). In some examples, the average characteristic dimension of the set of conduits 520 can be 10 millimeters (mm) or less (e.g., 9.5 mm or less, 9 mm or less, 8.5 mm or less, 8 mm or less, 7.5 mm or less, 7 mm or less, 6.5 mm or less, 6 mm or less, 5.5 mm or less, 5 mm or less, 4.75 mm or less, 4.5 mm or less, 4.25 mm or less, 4 mm or less, 3.75 mm or less, 3.5 mm or less, 3.25 mm or less, 3 mm or less, 2.75 mm or less, 2.5 mm or less, 2.25 mm or less, 2 mm or less, 1.75 mm or less, 1.5 mm or less, 1.25 mm or less, 1 mm or less, 0.75 mm or less, 0.5 mm or less, or 0.25 mm or less). The average characteristic dimension of the set of conduits 520 can range from any of the minimum values described above to any of the maximum values described above. For example, the average characteristic dimension of the set of conduits 520 can be from 0.1 mm to 10 mm (e.g., from 0.1 mm to 5 mm, from 5 mm to 10 mm, from 0.1 mm to 2.5 mm, from 2.5 mm to 5 mm, from 5 mm to 7.5 mm, from 7.5 mm to 10 mm, from 0.1 mm to 9.5 mm, from 0.5 mm to 10 mm, or from 0.5 mm to 9.5 mm).

The inlets 524 and the outlets 526 of each of the conduits 520 can, independently, be any shape, such as a regular shape, an irregular shape, an isotropic shape, or an anisotropic shape. In some examples, the inlets 524 and/or the outlets 526 of the set of conduits 520 can have a shape that is substantially circular, ovate, ovoid, elliptic, triangular, rectangular, polygonal, etc. In some examples, the shape of the inlets 524 and/or the outlets 526 of the set of conduits 520 can be substantially circular. The inlet 524 and/or the outlet 526 of each of the set of conduits 520 can, for example, be the cross-section in a plane perpendicular to the central longitudinal axis of said conduit 520, such that the shape of the inlet 524 and/or the outlet 526 of each of the set of conduits 520 can be the cross-sectional shape of each of the conduits 520.

The inlets 524 and the outlets 526 of the set of conduits 520 can, independently, have an average characteristic dimension. The term "characteristic dimension," as used herein refers to the largest straight line distance between two points in the plane of the inlet or the outlet. "Average characteristic dimension" and "mean characteristic dimension" are used interchangeably herein, and generally refer to the statistical mean characteristic dimension of the inlets or outlets in a population of inlets or outlets. For example, for a cylindrical set of conduits 520, the inlets 524 or the outlets 526 can be substantially circular in shape and the average characteristic dimension can refer to the diameter.

The average characteristic dimension of the inlets 524 and/or the outlets 526 of the set of conduits 520 can, for example, be 0.1 millimeter (mm) or more (e.g., 0.25 mm or more, 0.5 mm or more, 0.75 mm or more, 1 mm or more, 1.25 mm or more, 1.5 mm or more, 1.75 mm or more, 2 mm or more, 2.25 mm or more, 2.5 mm or more, 2.75 mm or more, 3 mm or more, 3.25 mm or more, 3.5 mm or more, 3.75 mm or more, 4 mm or more, 4.25 mm or more, 4.5 mm or more, 4.75 mm or more, 5 mm or more, 5.5 mm or more, 6 mm or more, 6.5 mm or more, 7 mm or more, 7.5 mm or more, 8 mm or more, 8.5 mm or more, 9 mm or more, or 9.5 mm or more). In some examples, the average characteristic dimension of the inlets 524 and/or the outlets 526 of the set of conduits 520 can be 10 millimeters (mm) or less (e.g., 9.5 mm or less, 9 mm or less, 8.5 mm or less, 8 mm or less, 7.5 mm or less, 7 mm or less, 6.5 mm or less, 6 mm or less, 5.5 mm or less, 5 mm or less, 4.75 mm or less, 4.5 mm or less, 4.25 mm or less, 4 mm or less, 3.75 mm or less, 3.5 mm or less, 3.25 mm or less, 3 mm or less, 2.75 mm or less, 2.5 mm or less, 2.25 mm or less, 2 mm or less, 1.75 mm or less, 1.5 mm or less, 1.25 mm or less, 1 mm or less, 0.75 mm or less, 0.5 mm or less, or 0.25 mm or less). The average characteristic dimension of the inlets 524 and/or the outlets 526 of the set of conduits 520 can range from any of the minimum values described above to any of the maximum values described above. For example, the average characteristic dimension of the inlets 524 and/or the outlets 526 of the set of conduits 520 can be from 0.1 mm to 10 mm (e.g., from 0.1 mm to 5 mm, from 5 mm to 10 mm, from 0.1 mm to 2.5 mm, from 2.5 mm to 5 mm, from 5 mm to 7.5 mm, from 7.5 mm to 10 mm, from 0.1 mm to 9.5 mm, from 0.5 mm to 10 mm, or from 0.5 mm to 9.5 mm).

In some examples, the each of the outlets 526 of the set of conduits 520 can further comprise a nozzle (not shown) fluidly connected to each of the outlets 526 of the set of conduits 520. Each nozzle can, for example, have an average characteristic dimension and a cross-sectional shape, wherein the average characteristic dimension of the nozzles, the cross-sectional shape of the nozzles, or a combination thereof can be the same or different than that of the outlets 526 of the set of conduits 520. In some examples, the average characteristic dimension of the nozzles can be smaller than the average characteristic dimension of the outlets 526 of the set of conduits 520. In some examples, the cross-sectional shape of the nozzles can be substantially circular. The average characteristic dimension of the nozzles, the cross-sectional shape of the nozzles, the orientation of the nozzles, or a combination thereof can be used to affect and/or control how the first precursor 570 and/or the second precursor 580 is/are introduced into the chamber 542 (e.g., speed, direction, volume, etc.).

The number of conduits 520, the arrangement of the conduits 520, the cross-sectional shape of the conduits 520, the shape of the outlets 526 of the conduits 520, the average characteristic dimension of the outlets 526 of the conduits 520, the presence or absence of the nozzles fluidly connected to each of the outlets 526 of the set of conduits 520, the average characteristic dimension of the nozzles fluidly connected to each of the outlets 526 of the set of conduits 520 (when present), the cross-sectional shape of the nozzles fluidly connected to each of the outlets 526 of the set of conduits 520 (when present), or a combination thereof can be selected, for example, in view of the number of laser beams 562 within the chamber 542, the size of the laser beam(s) 562, the wavelength(s) of the laser beam(s) 562, the intensity of the laser beam(s) 562 within the chamber 542, the size of the chamber 542, the size of the rotatable substrate support surface 550, or a combination thereof.

The source distributor 590 can have a first surface and a second surface opposite and spaced apart from the first surface, wherein the set of conduits 520 traverse the source distributor 590 from the first surface to the second surface, and wherein the second surface of the source distributor 590 is substantially parallel and spaced apart from the rotatable substrate support surface 550. The source distributor 590 can, for example, form a lid to the chamber 542.

The source distributor 590 can, in some examples, be hollow such that a cooling medium can be included within the source distributor 590, for example to dissipate heat (e.g., from the heater, from the laser energy, or a combination thereof). The source distributor 590 can, in some examples, comprise inside space (not shown), which have an inlet fluidly connected to an outlet, wherein the inlet and the outlet are configured to provide a path for flowing the cooling medium through the inside space within the source distributor. In some examples, the cooling medium can comprise water.

The source distributor 590 can, for example, define the set of conduits 520. In some examples, such as shown in FIG. 31, the set of conduits 520 are defined by the source distributor 590. In some examples, the outlets 526 of the set of conduits 520 are located in an ordered array. In some examples, the outlets 526 of the set of conduits 520 are evenly spaced throughout at least a portion of the source distributor 590. In some examples, the outlets 526 of the set of conduits 520 are located in an ordered array and are evenly spaced throughout at least a portion of the source distributor 590.

The outlets 526 of the set of conduits 520 are configured to introduce a first precursor 570 and a second precursor 580 into the chamber 542 toward the rotatable substrate support surface 550, such that the first precursor 570 and the second precursor 580 flow through the laser beam 562 within the chamber 542 prior to reaching the rotatable substrate support surface 550. In some examples, the outlets 526 of the set of conduits 520 are configured to introduce the first precursor 570 and the second precursor 580 substantially perpendicular to a central axis of the laser beam 562 within the chamber 542. In some examples, the outlets 526 of the set of conduits 520 are configured to introduce the first precursor 570 and the second precursor 580 substantially perpendicular to the rotatable substrate support surface 550.

In some examples, the outlets 526 of the set of conduits 520 are configured to introduce the first precursor 570 and the second precursor 580 substantially uniformly throughout the chamber 542. In some examples, the outlets 526 of the set of conduits 520 are positioned in an ordered array and evenly spaced throughout the source distributor 590, such that the outlets 526 of the set of conduits 520 are configured to introduce the first precursor 570 and the second precursor 580 substantially uniformly throughout the chamber 542.

In some examples, the set of conduits 520 comprises a plurality of conduits and the plurality of conduits can comprise a set of first conduits and a set of second conduits, the outlets of the set of first conduits being configured to introduce the first precursor 570 into the chamber 542 toward the rotatable substrate support surface 550, the outlets of the set of second conduits being configured to introduce the second precursor 580 into the chamber 542 toward the rotatable substrate support surface 550. In some examples, the outlet of one or more of the first set of conduits is/are located adjacent the outlet of at least one of the second set of conduits. In some examples, the outlet of one or more of the first set of conduits is/are located directly adjacent the outlet of at least one of the second set of conduits. In some examples, the outlets of the first set of conduits are located in an ordered array and the outlets of the second set of conduits are located in an ordered array, evenly spaced and interspersed between the outlets of the first set of conduits.

The plurality of laser windows 510 comprises one or more laser window pairs, each laser window in each pair being disposed opposite the other laser window in the pair across the chamber 542; wherein one of the laser windows 510 in each pair is configured such that the interior face 516 of the laser window 510 directs the laser beam 562 from the laser device 560 across the chamber 542 in a plane that is above and substantially parallel to the rotatable substrate support surface 550 disposed within the chamber 542; and the other laser window 510 in each pair is configured such that the interior face 516 of the laser window 510 receives the laser beam 562 after it has traversed the chamber 562 and directs the received laser beam 562 to the laser dumper 564.

In some examples, the device 500 includes one laser window pair 510, each laser window in the pair being disposed opposite the other laser window in the pair across the chamber 542, wherein one of the laser windows 510 in the pair is configured such that the interior face 516 of the laser window 510 directs the laser beam 562 from the laser device 560 across the chamber 542 in a plane that is above and substantially parallel to the rotatable substrate support surface 550 disposed within the chamber 542; and the other laser window 510 in the pair is configured such that the interior face 516 of the laser window 510 receives the laser beam 562 after it has traversed the chamber 562 and directs the received laser beam 562 to the laser dumper 564.

In some examples, the device 500 includes a plurality of laser window pairs each laser window 510 in each pair being disposed opposite the other laser window 510 in the pair across the chamber 542; wherein one of the laser windows 510 in each pair is configured such that the interior face 516 of the laser window 510 directs the laser beam 562 from the laser device 560 across the chamber 542 in a plane that is above and substantially parallel to the rotatable substrate support surface 550 disposed within the chamber 542; and the other laser window 510 in each pair is configured such that the interior face 516 of the laser window 510 receives the laser beam 562 after it has traversed the chamber 562 and directs the received laser beam 562 to the laser dumper 564.

The laser beam 562 (e.g., the one or more laser beams 562) introduced into the chamber 542 is directed across the chamber 542 in a plane that is above and substantially parallel to the rotatable substrate support surface 550 disposed within the chamber 542 such that the laser beam 562 is disposed above the rotatable substrate support surface 550 by a distance of 10 millimeters (mm) or less (e.g., 9.5 mm or less, 9 mm or less, 8.5 mm or less, 8 mm or less, 7.5 mm or less, 7 mm or less, 6.5 mm or less, 6 mm or less, 5.5 mm or less, 5 mm or less, 4.75 mm or less, 4.5 mm or less, 4.25 mm or less, 4 mm or less, 3.75 mm or less, 3.5 mm or less, 3.25 mm or less, 3 mm or less, 2.75 mm or less, 2.5 mm or less, 2.25 mm or less, 2 mm or less, 1.75 mm or less, 1.5 mm or less, 1.25 mm or less, 1 mm or less, 0.75 mm or less, 0.5 mm or less, or 0.25 mm or less). In some examples the laser beam 562 is disposed above the rotatable substrate support surface 550 by a distance of 0 mm or more (e.g., 0.25 mm or more, 0.5 mm or more, 0.75 mm or more, 1 mm or more, 1.25 mm or more, 1.5 mm or more, 1.75 mm or more, 2 mm or more, 2.25 mm or more, 2.5 mm or more, 2.75 mm or more, 3 mm or more, 3.25 mm or more, 3.5 mm or more, 3.75 mm or more, 4 mm or more, 4.25 mm or more, 4.5 mm or more, 4.75 mm or more, 5 mm or more, 5.5 mm or more, 6 mm or more, 6.5 mm or more, 7 mm or more, 7.5 mm or more, 8 mm or more, 8.5 mm or more, 9 mm or more, or 9.5 mm or more). The distance that the laser beam 562 is disposed above the rotatable substrate support surface 550 can range from any of the minimum values described above to any of the maximum values described above. For example, the laser beam 562 can be disposed above the rotatable substrate support surface by a distance of from 0 mm to 10 mm (e.g., from 0 mm to 5 mm, from 5 mm to 10 mm, from 0 mm to 2.5 mm, from 2.5 mm to 5 mm, from 5 mm to 7.5 mm, from 7.5 mm to 10 mm, from 0 mm to 9 mm, from 1 mm to 10 mm, from 1 mm to 9 mm, from 0 mm to 8 mm, from 0 mm to 6 mm, from 0 mm to 4 mm, or from 1 mm to 3 mm).

Each of the one or more laser beams 562 comprises electromagnetic radiation with at least one wavelength that overlaps with at least a portion of a vibrational mode of the first precursor 570, thereby generating an active species (e.g., an irradiated first precursor) in situ. In some examples, the wavelength of the laser beam 562 is selected in view of the identity of the first precursor 570, such that the laser beam 562 comprise electromagnetic radiation with at least one wavelength that overlaps with at least a portion of a vibrational mode of the first precursor 570, such that irradiation of the first precursor 570 with the laser beam(s) 562 can enhance the cracking efficiency of the first precursor 570.

In some examples, the device 500 is configured to deposit a material via laser-assisted metal-organic vapor deposition from the first precursor 570 and the second precursor 580 on one or more substrates disposed on the rotatable substrate support surface 550 within the chamber 542. In some examples, the distance at which the laser beam 562 is located above the rotatable substrate support surface 550 can be selected, for example, such that background incorporation of carbon into the deposited material is suppressed (e.g., reduced or minimized relative to the amount of carbon incorporated in the deposited semiconductor when the laser beam 562 is located at a distance greater than 10 mm above the rotatable substrate support surface).

In some examples, the device 500 is configured to deposit a III-V semiconductor, such that the first precursor 570 comprises a V-group precursor and the second precursor 580 comprises a III-group precursor.

The first precursor 570 can, for example, comprise a V-group precursor, such as a compound, element, or composition comprising N, P, As, Sb, Bi, or a combination thereof. In some examples, the first precursor 570 can comprise a nitrogen species. In some examples, the first precursor 570 can comprise $NH_3$. The first precursor 570 can, for example, comprise a fluid, such as a gas.

The second precursor 580 can, for example, comprise a III-group precursor, such as compound, element, or composition comprising B, Al, Ga, In, Tl, or a combination thereof. In some examples, the second precursor 580 can comprise a gallium species. In some examples, the second precursor 580 can comprise trimethylgallium, triethylgallium, or a combination thereof. The second precursor 580 can, for example, comprise a fluid, such as a gas.

In some examples, the device 500 is configured to deposit a group III oxide semiconductor, such that the first precursor 570 comprises an oxygen containing precursor and the second precursor 580 comprises a III-group precursor.

In some examples, the device 500 is configured to deposit a group II-VI semiconductor material, such that the first precursor 570 comprises a VI-group precursor (e.g., a compound/composition/element comprising O, S, Se, Te, or a combination thereof) and the second precursor 580 comprises a II-group precursor (e.g., a compound/composition/element comprising Be, Mg, Ca, Sr, Ba, Zn, Cd, Hg, or a combination thereof).

In some examples, the device 500 is configured to deposit a group II-IV-$V_2$ semiconductor, such that the first precursor 570 comprises a V-group precursor (e.g., a compound, element, or composition comprising N, P, As, Sb, Bi, or a combination thereof) and the second precursor 580 comprises a mixture of a II-group precursor (e.g., a compound/composition/element comprising Be, Mg, Ca, Sr, Ba, Zn, Cd, Hg, or a combination thereof) and a IV-group precursor (e.g., a compound/composition/element comprising C, Si, Ge, Sn, Pb, or a combination thereof).

In some examples, the device 500 is configured to introduce the first precursor 570 into the chamber 542 continuously or intermittently. In some examples, the device 500 is configured to introduce the second precursor 580 continuously or intermittently.

In some examples, the device 500 is configured to introduce the first precursor 570 and the second precursor 580 into the chamber 542 alternately. In some examples, the device 500 is configured to introduce the first precursor 570 and the second precursor 580, wherein at least a portion of the introduction of the second precursor 580 is concurrent with at least a portion of the introduction of the first precursor 570, or vice versa. In some examples, the device 500 is configured to introduce the first precursor 570 and the second precursor 580 to the chamber simultaneously.

In some examples, the outlets 526 of the set of conduits 520 are further configured to introduce a dopant (e.g., one or more dopants) into the chamber 542 toward the rotatable substrate support surface 550. The one or more dopants can be selected in view of the first precursor 570 and/or the second precursor 580. The one or more dopants can be, for example, a fluid, such as a gas. In some examples, the one or more dopants can comprise an n-type dopant (e.g., silane ($SiH_4$), germane ($GeH_4$), disilane($Si_2H_6$)), a p-type dopant (e.g., bis(cyclopentadienyl)magnesium ($Cp_2Mg$), bis(methylcyclopentadienyl)magnesium (($MeCp)_2Mg$)), or a combination thereof. In some examples, the one or more dopants can comprise silane ($SiH_4$), germane ($GeH_4$), disilane ($Si_2H_6$), bis(cyclopentadienyl)magnesium ($Cp_2Mg$), bis(methylcyclopentadienyl)magnesium (($MeCp)_2Mg$), or a combination thereof. The one or more dopants can, for example, be mixed with the first precursor 570 and/or the second precursor 580 prior to introduction into the chamber 542. In some examples, the device 500 is configured to introduce the first precursor 570, the second precursor 580, and the one or more dopants into the chamber 542 consecutively in turn. In some examples, the device 500 is configured to introduce the first precursor 570 and the one or more dopants, wherein at least a portion of the introduction of the one or more dopants is concurrent with at least a portion of the introduction of the first precursor 570, or vice versa. In some examples, the device 500 is configured to introduce the second precursor 580 and the one or more dopants, wherein at least a portion of the introduction of the one or more dopants is concurrent with at least a portion of the introduction of the second precursor 580, or vice versa. In some examples, the device is configured to introduce the first precursor 570, the second precursor 580, and the one or more dopants into the chamber 542 simultaneously.

In some examples, the outlets 526 of the set of conduits 520 are further configured to introduce a carrier gas (e.g., one or more carrier gases) into the chamber 542 toward the rotatable substrate support surface 550. The one or more carrier gases can be selected in view of the first precursor 570, the second precursor 580, the one or more dopants (when present), or a combination thereof. The one or more carrier gases can be, for example, argon, helium, $H_2$, $N_2$, and the like, or combinations thereof. The one or more carrier gases can, for example, be mixed with the first precursor 570, the second precursor 580, the one or more dopants (when present), or a combination thereof prior to introduction into the chamber 542. In some examples, the device 500 is configured to introduce the first precursor 570, the second precursor 580, the one or more dopants (when present), or a combination thereof concurrently with at least a portion of the introduction of the one or more carrier gases.

The devices 500 described herein can further comprise or be assembled with a variety of additional components.

The devices 500 can, for example, be assembled together with, or in some examples can further comprise, the rotatable substrate support surface 550. The rotatable substrate support surface 550 can be any shape, such as a regular shape, an irregular shape, an isotropic shape, or an anisotropic shape. In some examples, the shape of the rotatable substrate support surface can be substantially circular, ovate, ovoid, elliptic, triangular, rectangular, polygonal, etc. In some examples, the shape of the rotatable substrate support surface can be substantially circular. The size and shape of the rotatable substrate support surface 550 can, for example, be selected in view of the size and shape of the chamber 542.

The rotatable substrate support surface 550 can support one or more substrates (not shown) (e.g., 2 or more, 3 or more, 4 or more, 5 or more, 6 or more, 7 or more, 8 or more, 9 or more, 10 or more, 15 or more, 20 or more, 25 or more, 30 or more, 35 or more, 40 or more, 45 or more, 50 or more, 60 or more, 70 or more, 80 or more, 90 or more, 100 or more, 150 or more, 200 or more, 250 or more, 300 or more, 350 or more, 400 or more, 450 or more, 500 or more, 600 or more, 700 or more, 800 or more, 900 or more, 1000 or more, 1500 or more, or 2000 or more) to be coated with a material via laser-assisted metal-organic vapor deposition from the first precursor 570 and the second precursor 580 (and one or more dopants, if present) within the chamber 542. The devices 500 can, for example, be assembled together with, or in some examples can further comprise the one or more substrates (not shown) disposed on the rotatable substrate support surface 550.

The number of substrates disposed on the rotatable substrate support surface 550 can be selected, for example, in view of the size of the one or more substrates and/or the size of the rotatable substrate support surface 550. The devices 500 can, for example, be configured to rotate the rotatable substrate support 550 surface to thereby provide a more uniform coating of the material on the one or more substrates via laser-assisted metal-organic vapor deposition.

The one or more substrates can have an average characteristic dimension. The average characteristic dimension of the one or more substrates can, for example, be 1 inch or more (e.g., 2 inches or more, 3 inches or more, 4 inches or more, 5 inches or more, 6 inches or more, 7 inches or more, 8 inches or more, 9 inches or more, 10 inches or more, 11 inches or more, 12 inches or more, 13 inches or more, 14 inches or more, 15 inches or more, 16 inches or more, 17 inches or more, 18 inches or more, 19 inches or more, 20 inches or more, 25 inches or more, 30 inches or more, or 35 inches or more). In some examples, the average characteristic dimension of the one or more substrates can be 36 inches or less (e.g., 35 inches or less, 30 inches or less, 25 inches or less, 20 inches or less, 19 inches or less, 18 inches or less, 17 inches or less, 16 inches or less, 15 inches or less, 14 inches or less, 13 inches or less, 12 inches or less, 11 inches or less, 10 inches or less, 9 inches or less, 8 inches or less, 7 inches or less, 6 inches or less, 5 inches or less, 4 inches or less, 3 inches or less, or 2 inches or less). The average characteristic dimension of the one or more substrates can range from any of the minimum values described above to any of the maximum values described above. For example, the average characteristic dimension of the one or more substrates can be from 1 inch to 36 inches (e.g., from 1 inch to 18 inches, from 18 inches to 36 inches, from 1 inch to 6 inches, from 6 inches to 12 inches, from 12 inches to 18 inches, from 18 inches to 24 inches, from 24 inches to 30 inches, from 30 inches to 36 inches, from 2 inches to 36 inches, from 1 inch to 30 inches, from 2 inches to 30 inches, from 1 inch to 18 inches, from 1 inch to 12 inches, or from 2 inches to 8 inches).

The one or more substrates can be any shape, such as a regular shape, an irregular shape, an isotropic shape, or an anisotropic shape. In some examples, the shape of the one or more substrates can be substantially circular, ovate, ovoid, elliptic, triangular, rectangular, polygonal, etc. In some examples, the shape of the one or more substrates can be substantially circular, such that the average characteristic dimension is the diameter.

The one or more substrates can comprise any suitable material. Examples of suitable substrates include, but are not limited to, bulk GaN, GaN template, sapphire, $Al_2O_3$, $LiAlO_2$, Si, SiC, zinc oxide, bulk AlN, AlN on sapphire template, and combinations thereof.

The devices 500 can, for example, be assembled together with, or in some examples can further comprise, a laser device 560 (e.g., one or more laser devices 560) for producing a laser beam 562 (e.g., one or more laser beams 562). In some examples, the devices 500 can comprise one laser device 560. In some examples, the devices 500 can comprise a plurality of laser devices 260.

Each laser device 560 can, for example, comprise one or more lasers. In some examples, the laser device 560 can further comprise a laser distributor and/or beam splitter for splitting each of the one or more lasers into a plurality of laser beams 562. In some examples, the laser device 560 can further comprise a beam shaper to control/adjust the shape of the laser beam. In some examples, the laser device 560 can further comprise a beam sizer to control/adjust the size (e.g., diameter) of the laser beam. In some examples, the laser device 560 can further comprise a beam directing and positioning module to control/adjust the direction and/or position of the laser beam. In some examples, the laser device 560 can further comprise one or more lenses, for example to control/adjust the size, shape, direction, position, uniformity (e.g., with respect to intensity), etc. of the laser beam. The one or more lenses can be any type of lens, such as a simple lens, a compound lens, a spherical lens, a toric lens, a biconvex lens, a plano-convex lens, a plano-concave lens, a negative meniscus lens, a positive meniscus lens, a biconcave lens, a converging lens, a diverging lens, a cylindrical lens, a Fresnel lens, a lenticular lens, a gradient index lens, or a combination thereof.

The wavelength(s) of the one or more lasers can be selected, for example, in view of the identity of the first precursor 570. In some examples, the one or more lasers can comprise an infrared laser. In some examples, the one or more lasers can comprise a $CO_2$ laser, such as a tunable $CO_2$ laser.

The devices 500 can, for example, be assembled together with, or in some examples can further comprise, a laser dumper 564 (e.g., one or more laser dumpers 564) for receiving a laser beam 562 (e.g., one or more laser beams 562) after the laser beam has traversed the chamber. In some examples, the devices 500 can comprise one laser dumper 564. In some examples, the devices 500 can comprise a plurality of laser dumpers 564. Each laser dumper 564 can, for example, be configured to receive a laser beam 562 (e.g., one or more laser beams 562) after the laser beam 562 has traversed the chamber and dissipate the energy of the received laser beam 562.

Figure 32:
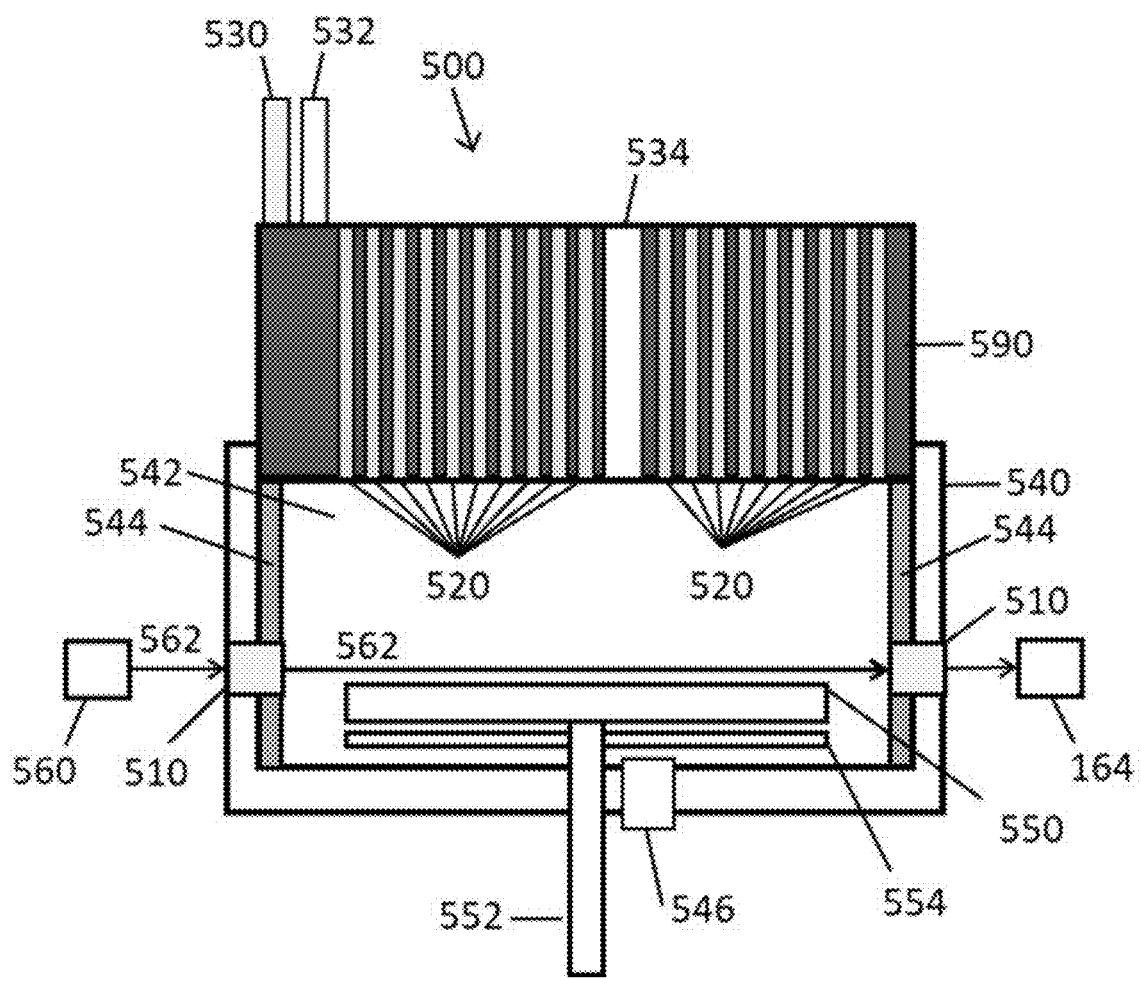
FIG. 32 is a schematic cross-sectional plan view of an example device as disclosed herein according to one implementation.

The devices 500 described herein can further comprise or be assembled with a variety of additional components, for example as shown in FIG. 32. Though the some of the elements are only shown in FIG. 32, any of the one or more additional elements or any combination of the one or more additional elements shown in FIG. 32 can be present in any of the other embodiments of the devices 500 described herein.

Referring now to FIG. 32, in some examples, the interior surface of wall 540 (e.g., the surface of the wall 540 within the chamber 542) can further comprise a coating 544, wherein the coating 544 can comprise a material that can absorb at least a portion of the laser beam energy. The interior face 516 of each of the plurality of laser windows 510 is substantially free of the coating 544, when present. Though the coating 544 is only shown in FIG. 32, the coating 544 can be present in any of the other embodiments of the devices 500 described herein.

In some examples, the wall 540 can further comprise an exhaust port 546 which fluidly couples the chamber 542 with an external environment. Though the exhaust port 546 is only shown in FIG. 32, the exhaust port 546 can be present in any of the other embodiments of the devices 500 described herein.

In some examples, the rotatable substrate support surface 550 can be coupled to or further comprise a rotary spindle 552. For example, the rotatable substrate support surface 550 can be centrally mounted on the rotary spindle 552, and the rotary spindle 552 can be rotated to rotate the rotatable substrate support surface 550. In some examples, the rotary spindle 552 can further be coupled to a means for rotating the rotary spindle 552. The devices 500 can, for example, be configured to rotate the rotary spindle 552 and thus rotate the rotatable substrate support surface 550 to thereby provide a more uniform coating of the material on the one or more substrates via laser-assisted metal-organic vapor deposition. Though the rotary spindle 552 is only shown in FIG. 32, the rotary spindle 552 can be present in any of the other embodiments of the devices 500 described herein.

In some examples, the devices 500 can further be assembled with, or in some examples can further comprise, a heater 554 thermally coupled to the rotatable substrate support surface 550 within the chamber 542. The heater 554 can, for example, be located below the rotatable substrate support surface 550, and optionally spaced apart from the rotatable substrate support surface 550, relative to the position of the outlets 526 of the set of conduits 520. In some examples, the devices 500 can further comprise a means for controlling the temperature of (e.g., heating) the heater 554. Though the heater 554 is only shown in FIG. 32, the heater 554 can be present in any of the other embodiments of the devices 500 described herein.

In some examples, the heater 554 can be heated such that the one or more substrates is at a temperature of 100° C. or more (e.g., 150° C. or more, 200° C. or more, 250° C. or more, 300° C. or more, 350° C. or more, 400° C. or more, 450° C. or more, 500° C. or more, 550° C. or more, 600° C. or more, 650° C. or more, 700° C. or more, 750° C. or more, 800° C. or more, 850° C. or more, 900° C. or more, 950° C. or more, 1000° C. or more, 1100° C. or more, 1200° C. or more, 1300° C. or more, 1400° C. or more, 1500° C. or more, 1600° C. or more, 1700° C. or more, 1800° C. or more, or 1900° C. or more). In some examples, the heater 554 can be heated such that the one or more substrates is at a temperature of 2000° C. or less (e.g., 1900° C. or less, 1800° C. or less, 1700° C. or less, 1600° C. or less, 1500° C. or less, 1400° C. or less, 1300° C. or less, 1200° C. or less, 1100° C. or less, 1000° C. or less, 950° C. or less, 900° C. or less, 850° C. or less, 800° C. or less, 750° C. or less, 700° C. or less, 650° C. or less, 600° C. or less, 550° C. or less, 500° C. or less, 450° C. or less, 400° C. or less, 350° C. or less, 300° C. or less, 250° C. or less, 200° C. or less, or 150° C. or less). The temperature at which the one or more substrates are heated by the heater 554 can range from any of the minimum values described above to any of the maximum values described above. For example, the heater 554 can be heated such that the one or more substrates is at a temperature of from 100° C. to 2000° C. (e.g., from 100° C. to 1000° C., from 1000° C. to 2000° C., from 100° C. to 500° C., from 500° C. to 900° C., from 900° C. to 1300° C., from 1300° C. to 1700° C., from 1700° C. to 2000° C., from 400° C. to 2000° C., from 100° C. to 1500° C., or from 400° C. to 1500° C.). In some examples, the temperature at which the one or more substrates are heated by the heater 554 can be selected in view of the identity of the second precursor 580, such that the temperature at which the one or more substrates are heated by the heater can thermally decompose the second precursor at or near the one or more substrates, to thereby form an active species (e.g., a thermal decomposition species) in situ.

The devices 500 can, for example, be assembled together with, or in some examples can further comprise, an in-situ monitor, such as a camera and/or a window. In some examples, the in-situ monitor can comprise a window or viewport 534 defined by the source distributor 590. The in-situ monitor can allow for visual inspection inside the chamber 542 when the device 500 is assembled. Though the viewport 534 is only shown in FIG. 32, the viewport 534 can be present in any of the other embodiments of the devices 500 described herein.

The devices 500 can, for example, be assembled together with, or in some examples can further comprise, a first precursor conduit 530 fluidly connected to the chamber 542 via the set of conduits 520. For example, the first precursor conduit 530 can be fluidly connected to the inlets 524 of the set of conduits 520, for example via the source distributor 590. The first precursor conduit 530 can, for example, fluidly connect a first precursor source (not shown) to the chamber 542 via the set of conduits 520. The first precursor conduit 530 can define an inlet, an outlet opposite and spaced apart from the inlet, and a path for fluid flow extending from the inlet to the outlet, wherein the inlet of the first precursor conduit 530 can be fluidly coupled to the first precursor source and the outlet of the first precursor conduit 530 can be fluidly connected to the inlets 524 of the set of conduits 520, for example via the source distributor 590. Though the first precursor conduit 530 is only shown in FIG. 32, the first precursor conduit 530 can be present in any of the other embodiments of the devices 500 described herein.

The devices 500 can, for example, be assembled together with, or in some examples can further comprise, a second precursor conduit 532 fluidly connected to the chamber 542 via the set of conduits 520. For example, the second precursor conduit 532 can be fluidly connected to the inlets 524 of the set of conduits 520, for example via the source distributor 590. The second precursor conduit 532 can, for example, fluidly connect a second precursor source (not shown) to the chamber 542 via the set of conduits 520. The second precursor conduit 532 can define an inlet, an outlet opposite and spaced apart from the inlet, and a path for fluid flow extending from the inlet to the outlet, wherein the inlet of the second precursor conduit 532 can be fluidly coupled to the second precursor source and the outlet of the second precursor conduit 532 can be fluidly connected to the inlets 524 of the set of conduits 520, for example via the source distributor 590. Though the second precursor conduit 532 is only shown in FIG. 32, the second precursor conduit 532 can be present in any of the other embodiments of the devices 500 described herein.

Devices 600

Figure 33:
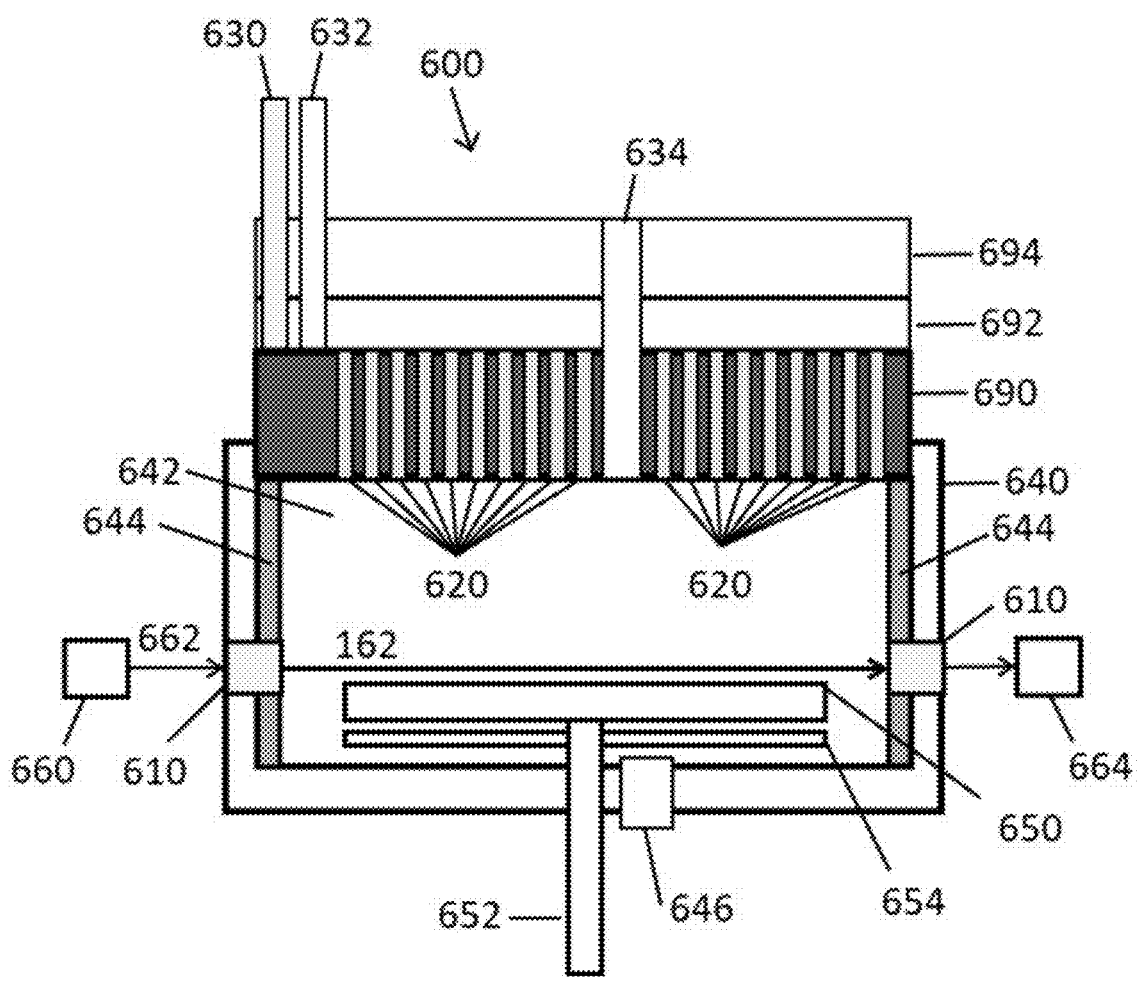
FIG. 33 is a schematic cross-sectional plan view of an example device as disclosed herein according to one implementation.

FIG. 33 shows a schematic cross-section plan view of a laser-assisted metal-organic chemical vapor deposition (MOCVD) device 600 according to one implementation described herein. Referring to FIG. 33, the device 600 comprises a wall 640 defining a chamber 642. The wall 640 can, in some examples be hollow such that a cooling medium can be included within the wall 640, for example to dissipate heat (e.g., from the heater, from the laser energy, or a combination thereof). In some examples, the cooling medium can comprise water.

The devices 600 further comprise, in some examples, a coating 644 on the interior surface of wall 640 (e.g., the surface of the wall 640 within the chamber 642). The coating 644 can, for example, comprise a material that can absorb at least a portion of the laser beam energy. The devices 600 can further comprise, in some examples, an exhaust port 646 in the wall 640 which fluidly couples the chamber 642 with an external environment.

The devices 600 can further comprise a rotatable substrate support surface 650 disposed within the chamber. The rotatable substrate support surface 650 can be any shape, such as a regular shape, an irregular shape, an isotropic shape, or an anisotropic shape. In some examples, the shape of the rotatable substrate support surface can be substantially circular, ovate, ovoid, elliptic, triangular, rectangular, polygonal, etc. In some examples, the shape of the rotatable substrate support surface can be substantially circular. The size and shape of the rotatable substrate support surface 650 can, for example, be selected in view of the size and shape of the chamber 542.

The rotatable substrate support surface 650 can support one or more substrates (not shown) (e.g., 2 or more, 3 or more, 4 or more, 5 or more, 6 or more, 7 or more, 8 or more, 9 or more, 10 or more, 15 or more, 20 or more, 25 or more, 30 or more, 35 or more, 40 or more, 45 or more, 50 or more, 60 or more, 70 or more, 80 or more, 90 or more, 100 or more, 150 or more, 200 or more, 250 or more, 300 or more, 350 or more, 400 or more, 450 or more, 500 or more, 600 or more, 700 or more, 800 or more, 900 or more, 1000 or more, 1500 or more, or 2000 or more) to be coated with a material via laser-assisted metal-organic vapor deposition from a first precursor 670 and a second precursor 680 (and one or more dopants, if present) within the chamber 642. The devices 600 can, for example, be assembled together with, or in some examples can further comprise the one or more substrates (not shown) disposed on the rotatable substrate support surface 650.

The number of substrates disposed on the rotatable substrate support surface 650 can be selected, for example, in view of the size of the one or more substrates and/or the size of the rotatable substrate support surface 650. The devices 600 can, for example, be configured to rotate the rotatable substrate support 650 surface to thereby provide a more uniform coating of the material on the one or more substrates via laser-assisted metal-organic vapor deposition.

The one or more substrates can have an average characteristic dimension. The average characteristic dimension of the one or more substrates can, for example, be 1 inch or more (e.g., 2 inches or more, 3 inches or more, 4 inches or more, 5 inches or more, 6 inches or more, 7 inches or more, 8 inches or more, 9 inches or more, 10 inches or more, 11 inches or more, 12 inches or more, 13 inches or more, 14 inches or more, 15 inches or more, 16 inches or more, 17 inches or more, 18 inches or more, 19 inches or more, 20 inches or more, 25 inches or more, 30 inches or more, or 35 inches or more). In some examples, the average characteristic dimension of the one or more substrates can be 36 inches or less (e.g., 35 inches or less, 30 inches or less, 25 inches or less, 20 inches or less, 19 inches or less, 18 inches or less, 17 inches or less, 16 inches or less, 15 inches or less, 14 inches or less, 13 inches or less, 12 inches or less, 11 inches or less, 10 inches or less, 9 inches or less, 8 inches or less, 7 inches or less, 6 inches or less, 5 inches or less, 4 inches or less, 3 inches or less, or 2 inches or less). The average characteristic dimension of the one or more substrates can range from any of the minimum values described above to any of the maximum values described above. For example, the average characteristic dimension of the one or more substrates can be from 1 inch to 36 inches (e.g., from 1 inch to 18 inches, from 18 inches to 36 inches, from 1 inch to 6 inches, from 6 inches to 12 inches, from 12 inches to 18 inches, from 18 inches to 24 inches, from 24 inches to 30 inches, from 30 inches to 36 inches, from 2 inches to 36 inches, from 1 inch to 30 inches, from 2 inches to 30 inches, from 1 inch to 18 inches, from 1 inch to 12 inches, or from 2 inches to 8 inches).

The one or more substrates can be any shape, such as a regular shape, an irregular shape, an isotropic shape, or an anisotropic shape. In some examples, the shape of the one or more substrates can be substantially circular, ovate, ovoid, elliptic, triangular, rectangular, polygonal, etc. In some examples, the shape of the one or more substrates can be substantially circular, such that the average characteristic dimension is the diameter.

The one or more substrates can comprise any suitable material. Examples of suitable substrates include, but are not limited to, bulk GaN, GaN template, sapphire, $Al_2O_3$, $LiAlO_2$, Si, SiC, zinc oxide, bulk AlN, AlN on sapphire template, and combinations thereof.

In some examples, the rotatable substrate support surface 650 can be coupled to or further comprise a rotary spindle 652. For example, the rotatable substrate support surface 650 can be centrally mounted on the rotary spindle 652, and the rotary spindle 652 can be rotated to rotate the rotatable substrate support surface 650. In some examples, the rotary spindle 652 can further be coupled to a means for rotating the rotary spindle 652. The devices 600 can, for example, be configured to rotate the rotary spindle 652 and thus rotate the rotatable substrate support surface 650 to thereby provide a more uniform coating of the material on the one or more substrates via laser-assisted metal-organic vapor deposition.

In some examples, the devices 600 can further comprise a heater 654 thermally coupled to the rotatable substrate support surface 650 within the chamber 642. The heater 654 can, for example, be located below the rotatable substrate support surface 650, and optionally spaced apart from the rotatable substrate support surface 650, relative to the position of the outlets 626 of the set of conduits 620. In some examples, the devices 600 can further comprise a means for controlling the temperature of (e.g., heating) the heater 654.

In some examples, the heater 654 can be heated such that the one or more substrates is at a temperature of 100° C. or more (e.g., 150° C. or more, 200° C. or more, 250° C. or more, 300° C. or more, 350° C. or more, 400° C. or more, 450° C. or more, 500° C. or more, 550° C. or more, 600° C. or more, 650° C. or more, 700° C. or more, 750° C. or more, 800° C. or more, 850° C. or more, 900° C. or more, 950° C. or more, 1000° C. or more, 1100° C. or more, 1200° C. or more, 1300° C. or more, 1400° C. or more, 1500° C. or more, 1600° C. or more, 1700° C. or more, 1800° C. or more, or 1900° C. or more). In some examples, the heater 654 can be heated such that the one or more substrates is at a temperature of 2000° C. or less (e.g., 1900° C. or less, 1800° C. or less, 1700° C. or less, 1600° C. or less, 1500° C. or less, 1400° C. or less, 1300° C. or less, 1200° C. or less, 1100° C. or less, 1000° C. or less, 950° C. or less, 900° C. or less, 850° C. or less, 800° C. or less, 750° C. or less, 700° C. or less, 650° C. or less, 600° C. or less, 550° C. or less, 500° C. or less, 450° C. or less, 400° C. or less, 350° C. or less, 300° C. or less, 250° C. or less, 200° C. or less, or 150° C. or less). The temperature at which the one or more substrates are heated by the heater 654 can range from any of the minimum values described above to any of the maximum values described above. For example, the heater 654 can be heated such that the one or more substrates is at a temperature of from 100° C. to 2000° C. (e.g., from 100° C. to 1000° C., from 1000° C. to 2000° C., from 100° C. to 500° C., from 500° C. to 900° C., from 900° C. to 1300° C., from 1300° C. to 1700° C., from 1700° C. to 2000° C., from 400° C. to 2000° C., from 100° C. to 1500° C., or from 400° C. to 1500° C.). In some examples, the temperature at which the one or more substrates are heated by the heater 654 can be selected in view of the identity of the second precursor 680, such that the temperature at which the one or more substrates are heated by the heater can thermally decompose the second precursor at or near the one or more substrates, to thereby form an active species (e.g., a thermal decomposition species) in situ.

The devices 600 further comprises a plurality of laser windows 610, wherein each of the laser windows 610 defines an exterior face 614, an interior face 616 opposite and spaced apart from the exterior face 614, and an optical path 612 extending between the interior face 616 and the exterior face 614; wherein each of the laser windows 610 is disposed within the wall 640 such that the interior face 616 further defines the chamber 642. The interior face 616 of each of the plurality of laser windows 610 is substantially free of the coating 644.

The plurality of laser windows 610 can include two or more laser windows 610 (e.g., 2 or more, 3 or more, 4 or more, 5 or more, 6 or more, 7 or more, 8 or more, 9 or more, 10 or more, 15 or more, 20 or more, 25 or more, 30 or more, 40 or more, 50 or more, 60 or more, 70 or more, 80 or more, 90 or more, 100 or more, 150 or more, 200 or more, 250 or more, 300 or more, 350 or more, 400 or more, 450 or more, 500 or more, 600 or more, 700 or more, 800 or more, 900 or more, or 1000 or more). The number of laser windows 610 can be selected in view of the size of the chamber 642, the size of the rotatable substrate support surface 650, or a combination thereof.

In some examples, the plurality of laser windows 610 are positioned within the wall 640 and spaced around the periphery of the chamber 642. In some examples, the plurality of laser windows 610 are positioned within the wall 640 and evenly spaced around the periphery of the chamber 642. In certain examples, the chamber 642 has a substantially circular cross-section and the plurality of laser windows 610 are evenly spaced around the circumference of the chamber 642.

In some examples, the plurality of laser windows 610 comprises an even number of laser windows 610, such that the plurality of laser windows comprises a one or more laser window pairs, wherein each laser window 610 in each pair disposed opposite the laser window 610 in the pair across the chamber 642.

Each of the plurality of laser windows 610 can comprise any suitable material, such as, for example, ZnSe, ZnS, NaCl, KBr, and combinations thereof.

The cross-sectional shape of each of the plurality of laser windows 610 in a plane perpendicular to the central longitudinal axis of said laser window 610 can be any shape, such as a regular shape, an irregular shape, an isotropic shape, or an anisotropic shape. In some examples, the cross-sectional shape of the plurality of laser windows 610 can be substantially circular, ovate, ovoid, elliptic, triangular, rectangular, polygonal, etc. In some examples, the cross-sectional shape of the plurality of laser windows 610 can be substantially circular.

The interior face 616 and the exterior face 614 of each of the plurality of laser windows 610 can, independently, be any shape, such as a regular shape, an irregular shape, an isotropic shape, or an anisotropic shape. In some examples, the interior face 616 and/or the exterior face 614 of the plurality of laser windows 610 can have a shape that is substantially circular, ovate, ovoid, elliptic, triangular, rectangular, polygonal, etc. In some examples, the shape of the interior face 616 and/or the exterior face 614 of the plurality of laser windows 610 can be substantially circular. The interior face 616 and/or the exterior face 614 of each of the plurality of laser windows 610 can, for example, be the cross-section in a plane perpendicular to the longitudinal axis of said laser window 610, such that the shape of the interior face 616 and/or the exterior face 614 of each of the plurality of laser windows 610 can be the cross-sectional shape of each of the plurality of laser windows 610.

The number of laser windows 610, the arrangement of the laser windows 610, the cross-sectional shape of the laser windows 610, or a combination thereof can be selected, for example, in view of the number of laser beams 662 within the chamber 642, the size of the laser beam(s) 662, the wavelength(s) of the laser beam(s) 662, the intensity of the laser beam(s) 662 within the chamber 642, the size of the chamber 642, the size of the rotatable substrate support surface 650, or a combination thereof.

The devices 600 can, for example, further comprise a laser device 660 (e.g., one or more laser devices 660) for producing a laser 662 (e.g., one or more laser beams 662). In some examples, the devices 600 can comprise one laser device 660. In some examples, the devices 600 can comprise a plurality of laser devices 660.

Each laser device 660 can, for example, comprise one or more lasers. In some examples, the laser device 660 can further comprise a laser distributor and/or beam splitter for splitting each of the one or more lasers into a plurality of laser beams 662. In some examples, the laser device 660 can further comprise a beam shaper to control/adjust the shape of the laser beam. In some examples, the laser device 660 can further comprise a beam sizer to control/adjust the size (e.g., diameter) of the laser beam. In some examples, the laser device 660 can further comprise a beam directing and positioning module to control/adjust the direction and/or position of the laser beam. In some examples, the laser device 660 can further comprise one or more lenses, for example to control/adjust the size, shape, direction, position, uniformity (e.g., with respect to intensity), etc. of the laser beam. The one or more lenses can be any type of lens, such as a simple lens, a compound lens, a spherical lens, a toric lens, a biconvex lens, a plano-convex lens, a plano-concave lens, a negative meniscus lens, a positive meniscus lens, a biconcave lens, a converging lens, a diverging lens, a cylindrical lens, a Fresnel lens, a lenticular lens, a gradient index lens, or a combination thereof.

The wavelength(s) of the one or more lasers can be selected, for example, in view of the identity of the first precursor 670. In some examples, the one or more lasers can comprise an infrared laser. In some examples, the one or more lasers can comprise a $CO_2$ laser, such as a tunable $CO_2$ laser.

The devices 600 can, for example, further comprise, a laser dumper 664 (e.g., one or more laser dumpers 664) for receiving a laser beam 662 (e.g., one or more laser beams 662) after the laser beam has traversed the chamber. In some examples, the devices 600 can comprise one laser dumper 664. In some examples, the devices 600 can comprise a plurality of laser dumpers 664. Each laser dumper 664 can, for example, be configured to receive a laser beam 662 (e.g., one or more laser beams 662) after the laser beam 662 has traversed the chamber and dissipate the energy of the received laser beam 662.

The plurality of laser windows 610 comprises one or more laser window pairs, each laser window in each pair being disposed opposite the other laser window in the pair across the chamber 642; wherein one of the laser windows 610 in each pair is configured such that the interior face 616 of the laser window 610 directs the laser beam 662 from the laser device 660 across the chamber 642 in a plane that is above and substantially parallel to the rotatable substrate support surface 650 disposed within the chamber 642; and the other laser window 610 in each pair is configured such that the interior face 616 of the laser window 610 receives the laser beam 662 after it has traversed the chamber 662 and directs the received laser beam 662 to the laser dumper 664.

In some examples, the device 600 includes one laser window pair 610, each laser window in the pair being disposed opposite the other laser window in the pair across the chamber 642, wherein one of the laser windows 610 in the pair is configured such that the interior face 616 of the laser window 610 directs the laser beam 662 from the laser device 660 across the chamber 642 in a plane that is above and substantially parallel to the rotatable substrate support surface 650 disposed within the chamber 642; and the other laser window 610 in the pair is configured such that the interior face 616 of the laser window 610 receives the laser beam 662 after it has traversed the chamber 662 and directs the received laser beam 662 to the laser dumper 664.

In some examples, the device 600 includes a plurality of laser window pairs each laser window 610 in each pair being disposed opposite the other laser window 610 in the pair across the chamber 642; wherein one of the laser windows 610 in each pair is configured such that the interior face 616 of the laser window 610 directs the laser beam 662 from the laser device 660 across the chamber 642 in a plane that is above and substantially parallel to the rotatable substrate support surface 650 disposed within the chamber 642; and the other laser window 610 in each pair is configured such that the interior face 616 of the laser window 610 receives the laser beam 662 after it has traversed the chamber 662 and directs the received laser beam 662 to the laser dumper 664.

The laser beam 662 (e.g., the one or more laser beams 662) introduced into the chamber 642 is directed across the chamber 642 in a plane that is above and substantially parallel to the rotatable substrate support surface 650 disposed within the chamber 642 such that the laser beam 662 is disposed above the rotatable substrate support surface 650 by a distance of 10 millimeters (mm) or less (e.g., 9.5 mm or less, 9 mm or less, 8.5 mm or less, 8 mm or less, 7.5 mm or less, 7 mm or less, 6.5 mm or less, 6 mm or less, 5.5 mm or less, 5 mm or less, 4.75 mm or less, 4.5 mm or less, 4.25 mm or less, 4 mm or less, 3.75 mm or less, 3.5 mm or less, 3.25 mm or less, 3 mm or less, 2.75 mm or less, 2.5 mm or less, 2.25 mm or less, 2 mm or less, 1.75 mm or less, 1.5 mm or less, 1.25 mm or less, 1 mm or less, 0.75 mm or less, 0.5 mm or less, or 0.25 mm or less). In some examples the laser beam 662 is disposed above the rotatable substrate support surface 650 by a distance of 0 mm or more (e.g., 0.25 mm or more, 0.5 mm or more, 0.75 mm or more, 1 mm or more, 1.25 mm or more, 1.5 mm or more, 1.75 mm or more, 2 mm or more, 2.25 mm or more, 2.5 mm or more, 2.75 mm or more, 3 mm or more, 3.25 mm or more, 3.5 mm or more, 3.75 mm or more, 4 mm or more, 4.25 mm or more, 4.5 mm or more, 4.75 mm or more, 5 mm or more, 5.5 mm or more, 6 mm or more, 6.5 mm or more, 7 mm or more, 7.5 mm or more, 8 mm or more, 8.5 mm or more, 9 mm or more, or 9.5 mm or more). The distance that the laser beam 662 is disposed above the rotatable substrate support surface 650 can range from any of the minimum values described above to any of the maximum values described above. For example, the laser beam 662 can be disposed above the rotatable substrate support surface by a distance of from 0 mm to 10 mm (e.g., from 0 mm to 5 mm, from 5 mm to 10 mm, from 0 mm to 2.5 mm, from 2.5 mm to 5 mm, from 5 mm to 7.5 mm, from 7.5 mm to 10 mm, from 0 mm to 9 mm, from 1 mm to 10 mm, from 1 mm to 9 mm, from 0 mm to 8 mm, from 0 mm to 6 mm, from 0 mm to 4 mm, or from 1 mm to 3 mm).

The devices 600 further comprise a set of conduits 620, wherein each of the conduits defines an inlet 624, an outlet 626 opposite an spaced apart from the inlet 624, and a path for fluid flow extending from the inlet 624 to the outlet 626. The outlets 626 of the set of conduits 620 are configured to introduce a first precursor 670 and a second precursor 680 into the chamber 642 toward the rotatable substrate support surface 650, such that the first precursor 670 and the second precursor 680 flow through the laser beam 662 within the chamber 642 prior to reaching the rotatable substrate support surface 650.

As used herein, "a set of conduits 620" and "the set of conduits 620" are meant to include any number of conduits 620 in any arrangement. Thus, for example "a set of conduits 620" includes one or more conduits 620 (e.g., 2 or more, 3 or more, 4 or more, 5 or more, 6 or more, 7 or more, 8 or more, 9 or more, 10 or more, 15 or more, 20 or more, 25 or more, 30 or more, 40 or more, 50 or more, 60 or more, 70 or more, 80 or more, 90 or more, 100 or more, 150 or more, 200 or more, 250 or more, 300 or more, 350 or more, 400 or more, 450 or more, 500 or more, 600 or more, 700 or more, 800 or more, 900 or more, or 1000 or more). In some embodiments, the set of conduits 620 can comprise a plurality of conduits 620. In some embodiments, the set of conduits 620 can comprise a plurality of conduits 620 arranged in an ordered array.

The cross-sectional shape of each of conduits 620 in a plane perpendicular to the central longitudinal axis of said conduit 620 can be any shape, such as a regular shape, an irregular shape, an isotropic shape, or an anisotropic shape. In some examples, the cross-sectional shape of each of conduits 620 in the set of conduits 620 can be substantially circular, ovate, ovoid, elliptic, triangular, rectangular, polygonal, etc. In some examples, the cross-sectional shape of each of the conduits 620 can be substantially circular.

The set of conduits 620 can have an average characteristic dimension. The term "characteristic dimension," as used herein refers to the largest straight line distance between two points in the plane of the cross-sectional shape of each of the set of conduits. "Average characteristic dimension" and "mean characteristic dimension" are used interchangeably herein, and generally refer to the statistical mean characteristic dimension of the conduits in a population of conduits. For example, for a cylindrical set of conduits, the cross-sectional shape can be substantially circular and the average characteristic dimension can refer to the diameter.

The average characteristic dimension of the set of conduits 620 can, for example, be 0.1 millimeter (mm) or more (e.g., 0.25 mm or more, 0.5 mm or more, 0.75 mm or more, 1 mm or more, 1.25 mm or more, 1.5 mm or more, 1.75 mm or more, 2 mm or more, 2.25 mm or more, 2.5 mm or more, 2.75 mm or more, 3 mm or more, 3.25 mm or more, 3.5 mm or more, 3.75 mm or more, 4 mm or more, 4.25 mm or more, 4.5 mm or more, 4.75 mm or more, 5 mm or more, 5.5 mm or more, 6 mm or more, 6.5 mm or more, 7 mm or more, 7.5 mm or more, 8 mm or more, 8.5 mm or more, 9 mm or more, or 9.5 mm or more). In some examples, the average characteristic dimension of the set of conduits 620 can be 10 millimeters (mm) or less (e.g., 9.5 mm or less, 9 mm or less, 8.5 mm or less, 8 mm or less, 7.5 mm or less, 7 mm or less, 6.5 mm or less, 6 mm or less, 5.5 mm or less, 5 mm or less, 4.75 mm or less, 4.5 mm or less, 4.25 mm or less, 4 mm or less, 3.75 mm or less, 3.5 mm or less, 3.25 mm or less, 3 mm or less, 2.75 mm or less, 2.5 mm or less, 2.25 mm or less, 2 mm or less, 1.75 mm or less, 1.5 mm or less, 1.25 mm or less, 1 mm or less, 0.75 mm or less, 0.5 mm or less, or 0.25 mm or less). The average characteristic dimension of the set of conduits 620 can range from any of the minimum values described above to any of the maximum values described above. For example, the average characteristic dimension of the set of conduits 620 can be from 0.1 mm to 10 mm (e.g., from 0.1 mm to 5 mm, from 5 mm to 10 mm, from 0.1 mm to 2.5 mm, from 2.5 mm to 5 mm, from 5 mm to 7.5 mm, from 7.5 mm to 10 mm, from 0.1 mm to 9.5 mm, from 0.5 mm to 10 mm, or from 0.5 mm to 9.5 mm).

The inlets 624 and the outlets 626 of each of the conduits 620 can, independently, be any shape, such as a regular shape, an irregular shape, an isotropic shape, or an anisotropic shape. In some examples, the inlets 624 and/or the outlets 626 of the set of conduits 620 can have a shape that is substantially circular, ovate, ovoid, elliptic, triangular, rectangular, polygonal, etc. In some examples, the shape of the inlets 624 and/or the outlets 626 of the set of conduits 620 can be substantially circular. The inlet 624 and/or the outlet 626 of each of the set of conduits 620 can, for example, be the cross-section in a plane perpendicular to the central longitudinal axis of said conduit 620, such that the shape of the inlet 624 and/or the outlet 626 of each of the set of conduits 620 can be the cross-sectional shape of each of the conduits 620.

The inlets 624 and the outlets 626 of the set of conduits 620 can, independently, have an average characteristic dimension. The term "characteristic dimension," as used herein refers to the largest straight line distance between two points in the plane of the inlet or the outlet. "Average characteristic dimension" and "mean characteristic dimension" are used interchangeably herein, and generally refer to the statistical mean characteristic dimension of the inlets or the outlets in a population of inlets or outlets. For example, for a cylindrical set of conduits 620, the inlets 624 and/or the outlets 626 can be substantially circular in shape and the average characteristic dimension can refer to the diameter.

The average characteristic dimension of the inlets 624 and/or the outlets 626 of the set of conduits 620 can, for example, be 0.1 millimeter (mm) or more (e.g., 0.25 mm or more, 0.5 mm or more, 0.75 mm or more, 1 mm or more, 1.25 mm or more, 1.5 mm or more, 1.75 mm or more, 2 mm or more, 2.25 mm or more, 2.5 mm or more, 2.75 mm or more, 3 mm or more, 3.25 mm or more, 3.5 mm or more, 3.75 mm or more, 4 mm or more, 4.25 mm or more, 4.5 mm or more, 4.75 mm or more, 5 mm or more, 5.5 mm or more, 6 mm or more, 6.5 mm or more, 7 mm or more, 7.5 mm or more, 8 mm or more, 8.5 mm or more, 9 mm or more, or 9.5 mm or more). In some examples, the average characteristic dimension of the inlets 624 and/or the outlets 626 of the set of conduits 620 can be 10 millimeters (mm) or less (e.g., 9.5 mm or less, 9 mm or less, 8.5 mm or less, 8 mm or less, 7.5 mm or less, 7 mm or less, 6.5 mm or less, 6 mm or less, 5.5 mm or less, 5 mm or less, 4.75 mm or less, 4.5 mm or less, 4.25 mm or less, 4 mm or less, 3.75 mm or less, 3.5 mm or less, 3.25 mm or less, 3 mm or less, 2.75 mm or less, 2.5 mm or less, 2.25 mm or less, 2 mm or less, 1.75 mm or less, 1.5 mm or less, 1.25 mm or less, 1 mm or less, 0.75 mm or less, 0.5 mm or less, or 0.25 mm or less). The average characteristic dimension of the inlets 624 and/or the outlets 626 of the set of conduits 620 can range from any of the minimum values described above to any of the maximum values described above. For example, the average characteristic dimension of the inlets 624 and/or the outlets 626 of the set of conduits 620 can be from 0.1 mm to 10 mm (e.g., from 0.1 mm to 5 mm, from 5 mm to 10 mm, from 0.1 mm to 2.5 mm, from 2.5 mm to 5 mm, from 5 mm to 7.5 mm, from 7.5 mm to 10 mm, from 0.1 mm to 9.5 mm, from 0.5 mm to 10 mm, or from 0.5 mm to 9.5 mm).

In some examples, the each of the outlets 626 of the set of conduits 620 can further comprise a nozzle (not shown) fluidly connected to each of the outlets 626 of the set of conduits 620. Each nozzle can, for example, have an average characteristic dimension and a cross-sectional shape, wherein the average characteristic dimension of the nozzles, the cross-sectional shape of the nozzles, or a combination thereof can be the same or different than that of the outlets 626 of the set of conduits 620. In some examples, the average characteristic dimension of the nozzles can be smaller than the average characteristic dimension of the outlets 626 of the set of conduits 620. In some examples, the cross-sectional shape of the nozzles can be substantially circular. The average characteristic dimension of the nozzles, the cross-sectional shape of the nozzles, the orientation of the nozzles, or a combination thereof can be used to affect and/or control how the first precursor 670 and/or the second precursor 680 is/are introduced into the chamber 642 (e.g., speed, direction, volume, etc.).

The number of conduits 620, the arrangement of the conduits 620, the cross-sectional shape of the conduits 620, the shape of the outlets 626 of the conduits 620, the average characteristic dimension of the outlets 626 of the conduits 620, the presence or absence of the nozzles fluidly connected to each of the outlets 626 of the set of conduits 620, the average characteristic dimension of the nozzles fluidly connected to each of the outlets 626 of the set of conduits 620 (when present), the cross-sectional shape of the nozzles fluidly connected to each of the outlets 626 of the set of conduits 620 (when present), or a combination thereof can be selected, for example, in view of the number of laser beams 662 within the chamber 642, the size of the laser beam(s) 662, the wavelength(s) of the laser beam(s) 662, the intensity of the laser beam(s) 662 within the chamber 642, the size of the chamber 642, the size of the rotatable substrate support surface 650, or a combination thereof.

The outlets 626 of the set of conduits 620 are configured to introduce a first precursor 670 and a second precursor 680 into the chamber 642 toward the rotatable substrate support surface 650, such that the first precursor 670 and the second precursor 680 flow through the laser beam 662 within the chamber 642 prior to reaching the rotatable substrate support surface 650. In some examples, the outlets 626 of the set of conduits 620 are configured to introduce the first precursor 670 and the second precursor 680 substantially perpendicular to a central axis of the laser beam 662 within the chamber 642. In some examples, the outlets 626 of the set of conduits 620 are configured to introduce the first precursor 670 and the second precursor 680 substantially perpendicular to the rotatable substrate support surface 650.

In some examples, the outlets 626 of the set of conduits 620 are configured to introduce the first precursor 670 and the second precursor 680 substantially uniformly throughout the chamber 642. In some examples, the outlets 626 of the set of conduits 620 are positioned in an ordered array and evenly spaced throughout the source distributor 690, such that the outlets 626 of the set of conduits 620 are configured to introduce the first precursor 670 and the second precursor 680 substantially uniformly throughout the chamber 642.

In some examples, the set of conduits 620 can comprise a plurality of conduits and the plurality of conduits can comprise a set of first conduits and a set of second conduits, the outlets of the set of first conduits being configured to introduce the first precursor 670 into the chamber 642 toward the rotatable substrate support surface 650, the outlets of the set of second conduits being configured to introduce the second precursor 680 into the chamber 642 toward the rotatable substrate support surface 650. In some examples, the outlet of one or more of the first set of conduits is/are located adjacent the outlet of at least one of the second set of conduits. In some examples, the outlet of one or more of the first set of conduits is/are located directly adjacent the outlet of at least one of the second set of conduits. In some examples, the outlets of the first set of conduits are located in an ordered array and the outlets of the second set of conduits are located in an ordered array, evenly spaced and interspersed between the outlets of the first set of conduits.

Each of the one or more laser beams 662 comprises electromagnetic radiation with at least one wavelength that overlaps with at least a portion of a vibrational mode of the first precursor 670, thereby generating an active species (e.g., an irradiated first precursor) in situ. In some examples, the wavelength of the laser beam 662 is selected in view of the identity of the first precursor 670, such that the laser beam 662 comprise electromagnetic radiation with at least one wavelength that overlaps with at least a portion of a vibrational mode of the first precursor 670, such that irradiation of the first precursor 670 with the laser beam(s) 662 can enhance the cracking efficiency of the first precursor 670.

In some examples, the device 600 is configured to deposit a material via laser-assisted metal-organic vapor deposition from the first precursor 670 and the second precursor 680 on one or more substrates disposed on the rotatable substrate support surface 650 within the chamber 642. In some examples, the distance at which the laser beam 662 is located above the rotatable substrate support surface 650 can be selected, for example, such that background incorporation of carbon into the deposited material is suppressed (e.g., reduced or minimized relative to the amount of carbon incorporated in the deposited semiconductor when the laser beam 662 is located at a distance greater than 10 mm above the rotatable substrate support surface).

In some examples, the device 600 is configured to deposit a III-V semiconductor, such that the first precursor 670 comprises a V-group precursor and the second precursor 680 comprises a III-group precursor.

The first precursor 670 can, for example, comprise a V-group precursor, such as a compound, element, or composition comprising N, P, As, Sb, Bi, or a combination thereof. In some examples, the first precursor 670 can comprise a nitrogen species. In some examples, the first precursor 670 can comprise $NH_3$. The first precursor 670 can, for example, comprise a fluid, such as a gas.

The second precursor 680 can, for example, comprise a III-group precursor, such as compound, element, or composition comprising B, Al, Ga, In, Tl, or a combination thereof. In some examples, the second precursor 680 can comprise a gallium species. In some examples, the second precursor 680 can comprise trimethylgallium, triethylgallium, or a combination thereof. The second precursor 680 can, for example, comprise a fluid, such as a gas.

In some examples, the device 600 is configured to deposit a group III oxide semiconductor, such that the first precursor 670 comprises an oxygen containing precursor and the second precursor 680 comprises a III-group precursor.

In some examples, the device 600 is configured to deposit a group II-VI semiconductor material, such that the first precursor 670 comprises a VI-group precursor (e.g., a compound/composition/element comprising O, S, Se, Te, or a combination thereof) and the second precursor 680 comprises a II-group precursor (e.g., a compound/composition/element comprising Be, Mg, Ca, Sr, Ba, Zn, Cd, Hg, or a combination thereof).

In some examples, the device 600 is configured to deposit a group II-IV-$V_2$ semiconductor, such that the first precursor 670 comprises a V-group precursor (e.g., a compound, element, or composition comprising N, P, As, Sb, Bi, or a combination thereof) and the second precursor 680 comprises a mixture of a II-group precursor (e.g., a compound/composition/element comprising Be, Mg, Ca, Sr, Ba, Zn, Cd, Hg, or a combination thereof) and a IV-group precursor (e.g., a compound/composition/element comprising C, Si, Ge, Sn, Pb, or a combination thereof).

In some examples, the device 600 is configured to introduce the first precursor 670 into the chamber 642 continuously or intermittently. In some examples, the device 600 is configured to introduce the second precursor 680 continuously or intermittently.

In some examples, the device 600 is configured to introduce the first precursor 670 and the second precursor 680 into the chamber 642 alternately. In some examples, the device 600 is configured to introduce the first precursor 670 and the second precursor 680, wherein at least a portion of the introduction of the second precursor 680 is concurrent with at least a portion of the introduction of the first precursor 670, or vice versa. In some examples, the device 600 is configured to introduce the first precursor 670 and the second precursor 680 to the chamber simultaneously.

In some examples, the outlets 626 of the set of conduits 620 are further configured to introduce a dopant (e.g., one or more dopants) into the chamber 642 toward the rotatable substrate support surface 650. The one or more dopants can be selected in view of the first precursor 670 and/or the second precursor 680. The one or more dopants can be, for example, a fluid, such as a gas. In some examples, the one or more dopants can comprise an n-type dopant (e.g., silane ($SiH_4$), germane ($GeH_4$), disilane($Si_2H_6$)), a p-type dopant (e.g., bis(cyclopentadienyl)magnesium ($Cp_2Mg$), bis(methylcyclopentadienyl)magnesium (($MeCp)_2Mg$)), or a combination thereof. In some examples, the one or more dopants can comprise silane ($SiH_4$), germane ($GeH_4$), disilane ($Si_2H_6$), bis(cyclopentadienyl)magnesium ($Cp_2Mg$), bis(m-ethylcyclopentadienyl)magnesium (($MeCp)_2Mg$), or a combination thereof. The one or more dopants can, for example, be mixed with the first precursor 670 and/or the second precursor 680 prior to introduction into the chamber 642. In some examples, the device 600 is configured to introduce the first precursor 670, the second precursor 680, and the one or more dopants into the chamber 642 consecutively in turn. In some examples, the device 600 is configured to introduce the first precursor 670 and the one or more dopants, wherein at least a portion of the introduction of the one or more dopants is concurrent with at least a portion of the introduction of the first precursor 670, or vice versa. In some examples, the device 600 is configured to introduce the second precursor 680 and the one or more dopants, wherein at least a portion of the introduction of the one or more dopants is concurrent with at least a portion of the introduction of the second precursor 680, or vice versa. In some examples, the device is configured to introduce the first precursor 670, the second precursor 680, and the one or more dopants into the chamber 642 simultaneously.

In some examples, the outlets 626 of the set of conduits 620 are further configured to introduce a carrier gas (e.g., one or more carrier gases) into the chamber 642 toward the rotatable substrate support surface 650. The one or more carrier gases can be selected in view of the first precursor 670, the second precursor 680, the one or more dopants (when present), or a combination thereof. The one or more carrier gases can be, for example, argon, helium, $H_2$, $N_2$, and the like, or combinations thereof. The one or more carrier gases can, for example, be mixed with the first precursor 670, the second precursor 680, the one or more dopants (when present), or a combination thereof prior to introduction into the chamber 642. In some examples, the device 600 is configured to introduce the first precursor 670, the second precursor 680, the one or more dopants (when present), or a combination thereof concurrently with at least a portion of the introduction of the one or more carrier gases.

The devices 600 further comprise a source distributor 690, the source distributor 690 having a first surface and a second surface opposite and spaced apart from the first surface, wherein the second surface of the source distributor 690 is substantially parallel and spaced apart from the rotatable substrate support surface 650, and wherein the set of conduits 620 are defined by the source distributor 690 and traverse the source distributor 690 from the first surface to the second surface.

In some examples, the outlets 626 of the set of conduits 620 are evenly spaced throughout at least a portion of the source distributor 690. In some examples, the outlets 626 of the set of conduits 620 are located in an ordered array and are evenly spaced throughout at least a portion of the source distributor 690.

The source distributor 690 can, for example, form a lid to the chamber 642. The source distributor 690 can, in some examples, be hollow such that a cooling medium can be included within the source distributor 690, for example to dissipate heat (e.g., from the heater, from the laser energy, or a combination thereof). The source distributor 690 can, in some examples, comprise inside space (not shown), which have an inlet fluidly connected to an outlet, wherein the inlet and the outlet are configured to provide a path for flowing the cooling medium through the inside space within the source distributor. In some examples, the cooling medium can comprise water.

The devices 600 can further comprise, a cooling plate 692 thermally coupled to the source distributor 690, wherein the cooling plate 692 is in contact with the first surface of the source distributor 690; and a top cover 694, wherein the top cover 694 id located above and in contact with the cooling plate 692, such that the cooling plate 692 is sandwiched between the source distributor 690 and the top cover 694. The cooling plate 692 can be configured to cool the source distributor 692. In some examples, the devices 600 can further comprise a means for controlling the temperature of (e.g., cooling) the cooling plate 692. The cooling plate 692 can, in some examples, be hollow such that a cooling medium can be included within the cooling plate 692, for example to dissipate heat (e.g., from the heater, from the laser energy, or a combination thereof). In some examples, the cooling medium can comprise water.

The devices 600 can, for example, further comprise, an in-situ monitor, such as a camera and/or a window. In some examples, the in-situ monitor can comprise a window or viewport 634 defined by the source distributor 690, the cooling plate 692, and the top cover 694. The in-situ monitor can allow for visual inspection inside the chamber 642 when the device 600 is assembled.

The devices 600 can, for example, further comprise, a first precursor conduit 630 defining an inlet, an outlet opposite and spaced apart from the inlet, and a path for fluid flow extending from the inlet to the outlet, wherein the outlet of the first precursor conduit 630 can be fluidly connected to the inlets 624 of the set of conduits 620 via the source distributor 690; wherein the cooling plate 692 and the top cover 694 define the first precursor conduit 630. The first precursor conduit 630 can, for example, fluidly connect a first precursor source (not shown) to the chamber 642 via the set of conduits 620.

The devices 600 can, for example, further comprise, a second precursor conduit 632 defining an inlet, an outlet opposite and spaced apart from the inlet, and a path for fluid flow extending from the inlet to the outlet, wherein the outlet of the second precursor conduit 632 can be fluidly connected to the inlets 624 of the set of conduits 620 via the source distributor 690; wherein the cooling plate 692 and the top cover 694 define the second precursor conduit 632. The second precursor conduit 632 can, for example, fluidly connect a second precursor source (not shown) to the chamber 642 via the set of conduits 620.

Methods and Systems

Also disclosed herein are methods of depositing a material on one or more substrates via laser-assisted metal-organic chemical vapor deposition using any of the devices described herein.

Disclosed herein are methods of depositing a material from a first precursor and a second precursor on one or more substrates disposed on rotatable substrate support surface within a chamber via laser-assisted metal-organic chemical vapor deposition. The methods can, for example, comprise: directing a laser beam across a chamber in a plane that is above and substantially parallel to a rotatable substrate support surface disposed within the chamber, wherein the laser beam is disposed above the rotatable substrate support surface by a distance of 10 mm or less; introducing a first precursor and a second precursor into the chamber toward the rotatable substrate support surface, such that the first precursor and the second precursor flow through the laser beam within the chamber prior to reaching the rotatable substrate support surface; and heating the one or more substrates at a temperature sufficient to thermally decompose the second precursor at or near the one or more substrates, thereby generating a thermal decomposition species (e.g., an active species) in situ; wherein the laser beam comprises electromagnetic radiation with at least one wavelength that overlaps with at least a portion of a vibrational mode of the first precursor, thereby generating an irradiated first precursor (e.g., an active species) in situ; wherein the irradiated first precursor and the thermal decomposition species react to form the material, which deposits on the one or more substrates.

The laser beam (e.g., the one or more laser beams) is directed across the chamber in a plane that is above and substantially parallel to the rotatable substrate support surface disposed within the chamber such that the laser beam is disposed above the rotatable substrate support surface by a distance of 10 millimeters (mm) or less (e.g., 9.5 mm or less, 9 mm or less, 8.5 mm or less, 8 mm or less, 7.5 mm or less, 7 mm or less, 6.5 mm or less, 6 mm or less, 5.5 mm or less, 5 mm or less, 4.75 mm or less, 4.5 mm or less, 4.25 mm or less, 4 mm or less, 3.75 mm or less, 3.5 mm or less, 3.25 mm or less, 3 mm or less, 2.75 mm or less, 2.5 mm or less, 2.25 mm or less, 2 mm or less, 1.75 mm or less, 1.5 mm or less, 1.25 mm or less, 1 mm or less, 0.75 mm or less, 0.5 mm or less, or 0.25 mm or less). In some examples the laser beam is disposed above the rotatable substrate support surface by a distance of 0 mm or more (e.g., 0.25 mm or more, 0.5 mm or more, 0.75 mm or more, 1 mm or more, 1.25 mm or more, 1.5 mm or more, 1.75 mm or more, 2 mm or more, 2.25 mm or more, 2.5 mm or more, 2.75 mm or more, 3 mm or more, 3.25 mm or more, 3.5 mm or more, 3.75 mm or more, 4 mm or more, 4.25 mm or more, 4.5 mm or more, 4.75 mm or more, 5 mm or more, 5.5 mm or more, 6 mm or more, 6.5 mm or more, 7 mm or more, 7.5 mm or more, 8 mm or more, 8.5 mm or more, 9 mm or more, or 9.5 mm or more). The distance that the laser beam is disposed above the rotatable substrate support surface can range from any of the minimum values described above to any of the maximum values described above. For example, the laser beam can be disposed above the rotatable substrate support surface by a distance of from 0 mm to 10 mm (e.g., from 0 mm to 5 mm, from 5 mm to 10 mm, from 0 mm to 2.5 mm, from 2.5 mm to 5 mm, from 5 mm to 7.5 mm, from 7.5 mm to 10 mm, from 0 mm to 9 mm, from 1 mm to 10 mm, from 1 mm to 9 mm, from 0 mm to 8 mm, from 0 mm to 6 mm, from 0 mm to 4 mm, or from 1 mm to 3 mm).

In some examples, the distance at which the laser beam is located above the rotatable substrate support surface can be selected, for example, such that background incorporation of carbon into the deposited material is suppressed (e.g., reduced or minimized relative to the amount of carbon incorporated in the deposited semiconductor when the laser beam is located at a distance greater than 10 mm above the rotatable substrate support surface).

Each of the one or more laser beams comprises electromagnetic radiation with at least one wavelength that overlaps with at least a portion of a vibrational mode of the first precursor, thereby generating an active species (e.g., an irradiated first precursor) in situ. In some examples, the wavelength of the laser beam is selected in view of the identity of the first precursor, such that the laser beam comprise electromagnetic radiation with at least one wavelength that overlaps with at least a portion of a vibrational mode of the first precursor, such that irradiation of the first precursor with the laser beam(s) can enhance the cracking efficiency of the first precursor.

The laser beam can, for example, be provided by a laser device, such as a laser. The wavelength(s) of the one or more lasers can be selected, for example, in view of the identity of the first precursor. In some examples, the one or more lasers can comprise an infrared laser. In some examples, the one or more lasers can comprise a $CO_2$ laser, such as a tunable $CO_2$ laser.

The laser beam can, for example, have a power of 50 Watts (W) or more (e.g., 60 W or more, 70 W or more, 80 W or more, 90 W or more, 100 W or more, 125 W or more, 150 W or more, 175 W or more, 200 W or more, 225 W or more, 250 W or more, 300 W or more, 350 W or more, 400 W or more, 450 W or more, 500 W or more, 600 W or more, 700 W or more, 800 W or more, 900 W or more, 1000 W or more, 1250 W or more, 1500 W or more, 1750 W or more, 2000 W or more, 2250 W or more, 2500 W or more, or 2750 W or more). In some examples, the laser beam can have a power of 3000 W or less (e.g., 2750 W or less, 2500 W or less, 2250 W or less, 2000 W or less, 1750 W or less, 1500 W or less, 1250 W or less, 1000 W or less, 900 W or less, 800 W or less, 700 W or less, 600 W or less, 500 W or less, 450 W or less, 400 W or less, 350 W or less, 300 W or less, 250 W or less, 225 W or less, 175 W or less, 150 W or less, 125 W or less, 100 W or less, 90 W or less, 80 W or less, 70 W or less, or 60 W or less). The power of the laser beam can range from any of the minimum values described above to any of the maximum values described above. For example, the laser beam can have a power of from 50 W to 3000 W (e.g., from 50 W to 1500 W, from 1500 W to 3000 W, from 50 W to 1000 W, from 1000 W to 2000 W, from 2000 W to 3000 W, from 60 W to 3000 W, from 50 W to 2750 W, or from 60 W to 2750 W).

The methods can, in some examples, further comprise directing the laser beam to a laser dumper after the laser beam has traversed the chamber. The laser dumper can, for example, dissipate the energy of the received laser beam.

In some examples, the temperature at which the one or more substrates heated can be 100° C. or more (e.g., 150° C. or more, 200° C. or more, 250° C. or more, 300° C. or more, 350° C. or more, 400° C. or more, 450° C. or more, 500° C. or more, 550° C. or more, 600° C. or more, 650° C. or more, 700° C. or more, 750° C. or more, 800° C. or more, 850° C. or more, 900° C. or more, 950° C. or more, 1000° C. or more, 1100° C. or more, 1200° C. or more, 1300° C. or more, 1400° C. or more, 1500° C. or more, 1600° C. or more, 1700° C. or more, 1800° C. or more, or 1900° C. or more). In some examples, the temperature at which the one or more substrates heated can be 2000° C. or less (e.g., 1900° C. or less, 1800° C. or less, 1700° C. or less, 1600° C. or less, 1500° C. or less, 1400° C. or less, 1300° C. or less, 1200° C. or less, 1100° C. or less, 1000° C. or less, 950° C. or less, 900° C. or less, 850° C. or less, 800° C. or less, 750° C. or less, 700° C. or less, 650° C. or less, 600° C. or less, 550° C. or less, 500° C. or less, 450° C. or less, 400° C. or less, 350° C. or less, 300° C. or less, 250° C. or less, 200° C. or less, or 150° C. or less). The temperature at which the one or more substrates is heated can range from any of the minimum values described above to any of the maximum values described above. For example, the temperature at which the one or more substrates heated can be from 100° C. to 2000° C. (e.g., from 100° C. to 1000° C., from 1000° C. to 2000° C., from 100° C. to 500° C., from 500° C. to 900° C., from 900° C. to 1300° C., from 1300° C. to 1700° C., from 1700° C. to 2000° C., from 400° C. to 2000° C., from 100° C. to 1500° C., or from 400° C. to 1500° C.). In some examples, the temperature at which the one or more substrates are heated can be selected in view of the identity of the second precursor, such that the temperature at which the one or more substrates are heated by the heater can thermally decompose the second precursor at or near the one or more substrates.

In some examples, the first precursor and the second precursor are introduced into the chamber in a direction that is substantially perpendicular to a central axis of the laser beam within the chamber. In some examples, the first precursor and the second precursor are introduced into the chamber in a direction that is substantially perpendicular to the rotatable substrate support surface. In some examples, the first precursor and the second precursor are introduced substantially uniformly throughout the chamber.

The first precursor can, for example, comprise a fluid, such as a gas. The second precursor can, for example, comprise a fluid, such as a gas.

In some examples, the material deposited by the methods comprises a III-V semiconductor, such that the first precursor comprises a V-group precursor and the second precursor comprises a III-group precursor. The first precursor can, for example, comprise a V-group precursor, such as a compound, element, or composition comprising N, P, As, Sb, Bi, or a combination thereof. In some examples, the first precursor can comprise a nitrogen species. In some examples, the first precursor can comprise $NH_3$. The second precursor can, for example, comprise a III-group precursor, such as compound, element, or composition comprising B, Al, Ga, In, Tl, or a combination thereof. In some examples, the second precursor can comprise a gallium species. In some examples, the second precursor can comprise trimethylgallium, triethylgallium, or a combination thereof.

In some examples, the material deposited by the methods comprises a group III oxide semiconductor, such that the first precursor comprises an oxygen containing precursor and the second precursor comprises a III-group precursor.

In some examples, the material deposited by the methods comprises a group II-VI semiconductor material, such that the first precursor comprises a VI-group precursor (e.g., a compound/composition/element comprising O, S, Se, Te, or a combination thereof) and the second precursor comprises a II-group precursor (e.g., a compound/composition/element comprising Be, Mg, Ca, Sr, Ba, Zn, Cd, Hg, or a combination thereof).

In some examples, the material deposited by the methods comprises a group $II-IV-V_2$ semiconductor, such that the first precursor comprises a V-group precursor (e.g., a compound, element, or composition comprising N, P, As, Sb, Bi, or a combination thereof) and the second precursor comprises a mixture of a II-group precursor (e.g., a compound/composition/element comprising Be, Mg, Ca, Sr, Ba, Zn, Cd, Hg, or a combination thereof) and a IV-group precursor (e.g., a compound/composition/element comprising C, Si, Ge, Sn, Pb, or a combination thereof).

In some examples, the first precursor is introduced into the chamber continuously or intermittently. In some examples, the second precursor is introduced into the chamber continuously or intermittently.

In some examples, the first precursor and the second precursor are introduced into the chamber alternately. In some examples, at least a portion of the introduction of the second precursor is concurrent with at least a portion of the introduction of the first precursor, or vice versa. In some examples, the first precursor and the second precursor are introduced to the chamber simultaneously.

In some examples, the first precursor is introduced into the chamber at a flow rate of greater than 0 standard liters per minute (slm) or more (e.g., 0.1 slm or more, 0.25 slm or more, 0.5 slm or more, 0.75 slm or more, 1 slm or more, 1.25 slm or more, 1.5 slm or more, 1.75 slm or more, 2 slm or more, 2.25 slm or more, 2.5 slm or more, 2.75 slm or more, 3 slm or more, 3.25 slm or more, 3.5 slm or more, 3.75 slm or more, 4 slm or more, 4.25 slm or more, 4.5 slm or more, 4.75 slm or more, 5 slm or more, 5.5 slm or more, 6 slm or more, 6.5 slm or more, 7 slm or more, 7.5 slm or more, 8 slm or more, 8.5 slm or more, 9 slm or more, or 9.5 slm or more), for example when the chamber is a 2" chamber. In some examples, the first precursor is introduced into the chamber at a flow rate of 10 slm or less (e.g., 9.5 slm or less, 9 slm or less, 8.5 slm or less, 8 slm or less, 7.5 slm or less, 7 slm or less, 6.5 slm or less, 6 slm or less, 5.5 slm or less, 5 slm or less, 4.75 slm or less, 4.5 slm or less, 4.25 slm or less, 4 slm or less, 3.75 slm or less, 3.5 slm or less, 3.25 slm or less, 3 slm or less, 2.75 slm or less, 2.5 slm or less, 2.25 slm or less, 2 slm or less, 1.75 slm or less, 1.5 slm or less, 1.25 slm or less, 1 slm or less, 0.75 slm or less, 0.5 slm or less, or 0.25 slm or less), for example when the chamber is a 2" chamber. The flow rate that the first precursor is introduced into the chamber, for example when the chamber is a 2" chamber, can range from any of the minimum values described above to any of the maximum values described above. For example, the first precursor can be introduced into the chamber at a flow rate of from greater than 0 slm to 10 slm (e.g., from greater than 0 slm to 5 slm, from 5 slm to 10 slm, from greater than 0 slm to 2.5 slm, from 2.5 slm to 5 slm, from 5 slm to 7.5 slm, from 7.5 slm to 10 slm, from greater than 0 slm to 9.5 slm, from 0.1 slm to 10 slm, or from 0.1 slm to 9.5 slm), for example for a 2" chamber. The flow rate of the first precursor can be selected, for example, in view of the size of the chamber. For example, the flow rate of the first precursor can increase or decrease relative to the above flow rates for a larger or smaller chamber. In some examples, the flow rate of the first precursor for a chamber of a given size can be linearly proportional to the above flow rates based on a proportion factor, wherein the proportion factor can be the relative change in the area of the cross-section of the chamber (in a plane parallel to the substrate support surface) to that of a 2" chamber.

In some examples, the second precursor is introduced into the chamber at a rate of greater than 0 mmol/min or more (e.g., 0.1 mmol/min or more, 0.25 mmol/min or more, 0.5 mmol/min or more, 0.75 mmol/min or more, 1 mmol/min or more, 1.25 mmol/min or more, 1.5 mmol/min or more, 1.75 mmol/min or more, 2 mmol/min or more, 2.25 mmol/min or more, 2.5 mmol/min or more, 2.75 mmol/min or more, 3 mmol/min or more, 3.25 mmol/min or more, 3.5 mmol/min or more, 3.75 mmol/min or more, 4 mmol/min or more, 4.25 mmol/min or more, 4.5 mmol/min or more, 4.75 mmol/min or more, 5 mmol/min or more, 5.5 mmol/min or more, 6 mmol/min or more, 6.5 mmol/min or more, 7 mmol/min or more, 7.5 mmol/min or more, 8 mmol/min or more, 8.5 mmol/min or more, 9 mmol/min or more, or 9.5 mmol/min or more), for example when the chamber is a 2" chamber. In some examples, the second precursor is introduced into the chamber at a flow rate of 10 mmol/min or less (e.g., 9.5 mmol/min or less, 9 mmol/min or less, 8.5 mmol/min or less, 8 mmol/min or less, 7.5 mmol/min or less, 7 mmol/min or less, 6.5 mmol/min or less, 6 mmol/min or less, 5.5 mmol/min or less, 5 mmol/min or less, 4.75 mmol/min or less, 4.5 mmol/min or less, 4.25 mmol/min or less, 4 mmol/min or less, 3.75 mmol/min or less, 3.5 mmol/min or less, 3.25 mmol/min or less, 3 mmol/min or less, 2.75 mmol/min or less, 2.5 mmol/min or less, 2.25 mmol/min or less, 2 mmol/min or less, 1.75 mmol/min or less, 1.5 mmol/min or less, 1.25 mmol/min or less, 1 mmol/min or less, 0.75 mmol/min or less, 0.5 mmol/min or less, or 0.25 mmol/min or less), for example when the chamber is a 2" chamber. The flow rate that the second precursor is introduced into the chamber, for example when the chamber is a 2" chamber, can range from any of the minimum values described above to any of the maximum values described above. For example, the second precursor can be introduced into the chamber at a flow rate of from greater than 0 mmol/min to 10 mmol/min (e.g., from greater than 0 mmol/min to 5 mmol/min, from 5 mmol/min to 10 mmol/min, from greater than 0 mmol/min to 2.5 mmol/min, from 2.5 mmol/min to 5 mmol/min, from 5 mmol/min to 7.5 mmol/min, from 7.5 mmol/min to 10 mmol/min, from greater than 0 mmol/min to 9.5 mmol/min, from 0.1 mmol/min to 10 mmol/min, or from 0.1 mmol/min to 9.5 mmol/min), for example for a 2" chamber. The flow rate of the second precursor can be selected, for example, in view of the size of the chamber. For example, the flow rate of the second precursor can increase or decrease relative to the above flow rates for a larger or smaller chamber. In some examples, the flow rate of the second precursor for a chamber of a given size can be linearly proportional to the above flow rates based on a proportion factor, wherein the proportion factor can be the relative change in the area of the cross-section of the chamber (in a plane parallel to the substrate support surface) to that of a 2" chamber.

In some examples, the methods further comprise introducing a dopant (e.g., one or more dopants) into the chamber toward the rotatable substrate support surface. The one or more dopants can be selected in view of the first precursor and/or the second precursor. The one or more dopants can be, for example, a fluid, such as a gas. In some examples, the one or more dopants can comprise an n-type dopant (e.g., silane ($SiH_4$), germane ($GeH_4$), disilane($Si_2H_6$)), a p-type dopant (e.g., bis(cyclopentadienyl)magnesium ($Cp_2Mg$), bis(methylcyclopentadienyl)magnesium (($MeCp)_2Mg$)), or a combination thereof. In some examples, the one or more dopants can comprise silane ($SiH_4$), germane ($GeH_4$), disilane($Si_2H_6$), bis(cyclopentadienyl)magnesium ($Cp_2Mg$), bis(methylcyclopentadienyl)magnesium (($MeCp)_2Mg$), or a combination thereof. The methods can, for example, comprise mixing the one or more dopants with the first precursor and/or the second precursor prior to introduction into the chamber. In some examples, the first precursor, the second precursor, and the one or more dopants are introduced into the chamber consecutively in turn. In some examples, at least a portion of the introduction of the one or more dopants is concurrent with at least a portion of the introduction of the first precursor, or vice versa. In some examples, at least a portion of the introduction of the one or more dopants is concurrent with at least a portion of the introduction of the second precursor, or vice versa. In some examples, the first precursor, the second precursor, and the one or more dopants are introduced into the chamber simultaneously.

In some examples, the methods further comprise introducing a carrier gas (e.g., one or more carrier gases) into the chamber toward the rotatable substrate support surface. The one or more carrier gases can be selected in view of the first precursor, the second precursor, the one or more dopants (when present), or a combination thereof. The one or more carrier gases can be, for example, argon, helium, $H_2$, $N_2$, and the like, or combinations thereof. The methods can, for example, comprise mixing the one or more carrier gases with the first precursor, the second precursor, the one or more dopants (when present), or a combination thereof prior to introduction into the chamber. In some examples, the first precursor, the second precursor, the one or more dopants (when present), or a combination thereof are introduced concurrently with at least a portion of the introduction of the one or more carrier gases.

In some examples, the methods can further comprise rotating the rotatable substrate support surface. Rotating the rotatable substrate support surface can, for example, provide a more uniform coating of the material on the one or more substrates via laser-assisted metal-organic vapor deposition.

One or more substrates (e.g., 2 or more, 3 or more, 4 or more, 5 or more, 6 or more, 7 or more, 8 or more, 9 or more, 10 or more, 15 or more, 20 or more, 25 or more, 30 or more, 35 or more, 40 or more, 45 or more, 50 or more, 60 or more, 70 or more, 80 or more, 90 or more, 100 or more, 150 or more, 200 or more, 250 or more, 300 or more, 350 or more, 400 or more, 450 or more, 500 or more, 600 or more, 700 or more, 800 or more, 900 or more, 1000 or more, 1500 or more, or 2000 or more) are coated with the material via laser-assisted metal-organic vapor deposition from the first precursor and the second precursor (and one or more dopants, if present) within the chamber. The number of substrates disposed on the rotatable substrate support surface can be selected, for example, in view of the size of the one or more substrates and/or the size of the rotatable substrate support surface.

The one or more substrates can have an average characteristic dimension. The average characteristic dimension of the one or more substrates can, for example, be 1 inch or more (e.g., 2 inches or more, 3 inches or more, 4 inches or more, 5 inches or more, 6 inches or more, 7 inches or more, 8 inches or more, 9 inches or more, 10 inches or more, 11 inches or more, 12 inches or more, 13 inches or more, 14 inches or more, 15 inches or more, 16 inches or more, 17 inches or more, 18 inches or more, 19 inches or more, 20 inches or more, 25 inches or more, 30 inches or more, or 35 inches or more). In some examples, the average characteristic dimension of the one or more substrates can be 36 inches or less (e.g., 35 inches or less, 30 inches or less, 25 inches or less, 20 inches or less, 19 inches or less, 18 inches or less, 17 inches or less, 16 inches or less, 15 inches or less, 14 inches or less, 13 inches or less, 12 inches or less, 11 inches or less, 10 inches or less, 9 inches or less, 8 inches or less, 7 inches or less, 6 inches or less, 5 inches or less, 4 inches or less, 3 inches or less, or 2 inches or less). The average characteristic dimension of the one or more substrates can range from any of the minimum values described above to any of the maximum values described above. For example, the average characteristic dimension of the one or more substrates can be from 1 inch to 36 inches (e.g., from 1 inch to 18 inches, from 18 inches to 36 inches, from 1 inch to 6 inches, from 6 inches to 12 inches, from 12 inches to 18 inches, from 18 inches to 24 inches, from 24 inches to 30 inches, from 30 inches to 36 inches, from 2 inches to 36 inches, from 1 inch to 30 inches, from 2 inches to 30 inches, from 1 inch to 18 inches, from 1 inch to 12 inches, or from 2 inches to 8 inches).

The one or more substrates can be any shape, such as a regular shape, an irregular shape, an isotropic shape, or an anisotropic shape. In some examples, the shape of the one or more substrates can be substantially circular, ovate, ovoid, elliptic, triangular, rectangular, polygonal, etc. In some examples, the shape of the one or more substrates can be substantially circular, such that the average characteristic dimension is the diameter.

The one or more substrates can comprise any suitable material. Examples of suitable substrates include, but are not limited to, bulk GaN, GaN template, sapphire, $Al_2O_3$, $LiAlO_2$, Si, SiC, zinc oxide, bulk AlN, AlN on sapphire template, and combinations thereof.

The methods can, for example, suppresses incorporation of carbon into the material. In some examples, the material made by the methods described herein can have a lower amount of carbon incorporated therein relative to the amount of carbon incorporated in a material made using a comparable method, but wherein the laser beam is located at a distance greater than 10 mm above the rotatable substrate support surface.

In some examples, the material made by the methods described herein can have an average carbon concentration of 0 carbon atoms per cubic centimeter of material or more (e.g., 1 $cm^{-3}$ or more, 2 $cm^{-3}$ or more, 3 $cm^{-3}$ or more, 4 $cm^{-3}$ or more, 5 $cm^{-3}$ or more, 10 $cm^{-3}$ or more, 15 $cm^{-3}$ or more, 20 $cm^{-3}$ or more, 25 $cm^{-3}$ or more, 30 $cm^{-3}$ or more, 35 $cm^{-3}$ or more, 40 $cm^{-3}$ or more, 45 $cm^{-3}$ or more, 50 $cm^{-3}$ or more, 60 $cm^{-3}$ or more, 70 $cm^{-3}$ or more, 80 $cm^{-3}$ or more, 90 $cm^{-3}$ or more, 100 $cm^{-3}$ or more, 150 $cm^{-3}$ or more, 200 $cm^{-3}$ or more, 250 $cm^{-3}$ or more, 300 $cm^{-3}$ or more, 350 $cm^{-3}$ or more, 400 $cm^{-3}$ or more, 450 $cm^{-3}$ or more, 500 $cm^{-3}$ or more, 600 $cm^{-3}$ or more, 700 $cm^{-3}$ or more, 800 $cm^{-3}$ or more, 900 $cm^{-3}$ or more, $1\times10^3$ $cm^{-3}$ or more, $2.5\times10^3$ $cm^{-3}$ or more, $5\times10^3$ $cm^{-3}$ or more, $7.5\times10^3$ $cm^{-3}$ or more, $1\times10^4$ $cm^{-3}$ or more, $2.5\times10^4$ $cm^{-3}$ or more, $5\times10^4$ $cm^{-3}$ or more, $7.5\times10^4$ $cm^{-3}$ or more, $1\times10^5$ $cm^{-3}$ or more, $2.5\times10^5$ $cm^{-3}$ or more, $5\times10^5$ $cm^{-3}$ or more, $7.5\times10^5$ $cm^{-3}$ or more, $1\times10^6$ $cm^{-3}$ or more, $5\times10^6$ $cm^{-3}$ or more, $1\times10^7$ $cm^{-3}$ or more, $5\times10^7$ $cm^{-3}$ or more, $1\times10^8$ $cm^{-3}$ or more, $5\times10^8$ $cm^{-3}$ or more, $1\times10^9$ $cm^{-3}$ or more, $5\times10^9$ $cm^{-3}$ or more, $1\times10^{10}$ $cm^{-3}$ or more, $5\times10^{10}$ $cm^{-3}$ or more, $1\times10^{11}$ $cm^{-3}$ or more, $5\times10^{11}$ $cm^{-3}$ or more, $1\times10^{12}$ $cm^{-3}$ or more, $5\times10^{12}$ $cm^{-3}$ or more, $1\times10^{13}$ $cm^{-3}$ or more, $5\times10^{13}$ $cm^{-3}$ or more, $1\times10^{14}$ $cm^{-3}$ or more, $5\times10^{14}$ $cm^{-3}$ or more, $1\times10^{15}$ $cm^{-3}$ or more, $5\times10^{15}$ $cm^{-3}$ or more, $1\times10^{16}$ $cm^{-3}$ or more, or $5\times10^{16}$ $cm^{-3}$ or more).

In some examples, the material made by the methods described herein can have an average carbon concentration of $1\times10^{17}$ $cm^{-3}$ or less (e.g., $5\times10^{16}$ $cm^{-3}$ or less, $1\times10^{16}$ $cm^{-3}$ or less, $5\times10^{15}$ $cm^{-3}$ or less, $1\times10^{15}$ $cm^{-3}$ or less, $5\times10^{14}$ $cm^{-3}$ or less, $1\times10^{14}$ $cm^{-3}$ or less, $5\times10^{13}$ $cm^{-3}$ or less, $1\times10^{13}$ $cm^{-3}$ or less, $5\times10^{12}$ $cm^{-3}$ or less, $1\times10^{12}$ $cm^{-3}$ or less, $5\times10^{11}$ $cm^{-3}$ or less, $1\times10^{11}$ $cm^{-3}$ or less, $5\times10^{10}$ $cm^{-3}$ or less, $1\times10^{10}$ $cm^{-3}$ or less, $5\times10^{9}$ $cm^{-3}$ or less, $1\times10^{9}$ $cm^{-3}$ or less, $5\times10^{8}$ $cm^{-3}$ or less, $1\times10^{8}$ $cm^{-3}$ or less, $5\times10^{7}$ $cm^{-3}$ or less, $1\times10^{7}$ $cm^{-3}$ or less, $5\times10^{6}$ $cm^{-3}$ or less, $1\times10^{6}$ $cm^{-3}$ or less, $7.5\times10^{5}$ $cm^{-3}$ or less, $5\times10^{5}$ $cm^{-3}$ or less, $2.5\times10^{5}$ $cm^{-3}$ or less, $1\times10^{5}$ $cm^{-3}$ or less, $7.5\times10^{4}$ $cm^{-3}$ or less, $5\times10^4$ cm$^{-3}$ or less, $2.5\times10^4$ cm$^{-3}$ or less, $1\times10^4$ cm$^{-3}$ or less, $7.5\times10^3$ cm$^{-3}$ or less, $5\times10^3$ cm$^{-3}$ or less, $2.5\times10^3$ cm$^{-3}$ or less, $1\times10^3$ cm$^{-3}$ or less, 900 cm$^{-3}$ or less, 800 cm$^{-3}$ or less, 700 cm$^{-3}$ or less, 600 cm$^{-3}$ or less, 500 cm$^{-3}$ or less, 450 cm$^{-3}$ or less, 400 cm$^{-3}$ or less, 350 cm$^{-3}$ or less, 300 cm$^{-3}$ or less, 250 cm$^{-3}$ or less, 200 cm$^{-3}$ or less, 150 cm$^{-3}$ or less, 100 cm$^{-3}$ or less, 90 cm$^{-3}$ or less, 80 cm$^{-3}$ or less, 70 cm$^{-3}$ or less, 60 cm$^{-3}$ or less, 50 cm$^{-3}$ or less, 45 cm$^{-3}$ or less, 40 cm$^{-3}$ or less, 35 cm$^{-3}$ or less, 30 cm$^{-3}$ or less, 25 cm$^{-3}$ or less, 20 cm$^{-3}$ or less, 15 cm$^{-3}$ or less, 10 cm$^{-3}$ or less, 5 cm$^{-3}$ or less, or 1 cm$^{-3}$ or less).

The average carbon concentration of a material made by the methods described herein can range from any of the minimum values described above to any of the maximum values described above. For example, the material made by the methods described herein can have an average carbon concentration of from 0 to $1\times10^{17}$ cm$^{-3}$ (e.g., from 0 to $1\times10^3$ cm$^{-3}$, from $1\times10^3$ to $1\times10^6$ cm$^{-3}$, from $1\times10^6$ to $1\times10^9$ cm$^{-3}$, from $1\times10^9$ to $1\times10^{12}$ cm$^{-3}$, from $1\times10^{12}$ to $1\times10^{15}$ cm$^{-3}$, from $1\times10^{15}$ to $1\times10^{17}$ cm$^{-3}$, from 0 to $1\times10^{17}$ cm$^{-3}$, from 0 to $1\times10^{15}$ cm$^{-3}$, from 0 to $1\times10^{12}$ cm$^{-3}$, from 0 to $1\times10^9$ cm$^{-3}$, from 0 to $1\times10^6$ cm$^{-3}$, from 0 to $1\times10^4$ cm$^{-3}$, or from 0 to 100 cm$^{-3}$).

In some examples, the material made by the methods described herein can be grown at an average growth rate of 0.1 micrometers per hour (μm/hr) or more (e.g., 0.25 μm/hr or more, 0.5 μm/hr or more, 1 μm/hr or more, 1.25 μm/hr or more, 1.5 μm/hr or more, 1.75 μm/hr or more, 2 μm/hr or more, 2.25 μm/hr or more, 2.5 μm/hr or more, 3 μm/hr or more, 3.5 μm/hr or more, 4 μm/hr or more, 4.5 μm/hr or more, 5 μm/hr or more, 6 μm/hr or more, 7 μm/hr or more, 8 μm/hr or more, 9 μm/hr or more, 10 μm/hr or more, 15 μm/hr or more, 20 μm/hr or more, 25 μm/hr or more, 30 μm/hr or more, 35 μm/hr or more, 40 μm/hr or more, 45 μm/hr or more, 50 μm/hr or more, 60 μm/hr or more, 70 μm/hr or more, 80 μm/hr or more, or 90 μm/hr or more). In some examples, In some examples, the material made by the methods described herein can be grown at an average growth rate of 100 μm/hr or less (e.g., 90 μm/hr or less, 80 μm/hr or less, 70 μm/hr or less, 60 μm/hr or less, 50 μm/hr or less, 45 μm/hr or less, 40 μm/hr or less, 35 μm/hr or less, 30 μm/hr or less, 25 μm/hr or less, 20 μm/hr or less, 15 μm/hr or less, 10 μm/hr or less, 9 μm/hr or less, 8 μm/hr or less, 7 μm/hr or less, 6 μm/hr or less, 5 μm/hr or less, 4.5 μm/hr or less, 4 μm/hr or less, 3.5 μm/hr or less, 3 μm/hr or less, 2.5 μm/hr or less, 2.25 μm/hr or less, 2 μm/hr or less, 1.75 μm/hr or less, 1.5 μm/hr or less, 1.25 μm/hr or less, 1 μm/hr or less, 0.5 μm/hr or less, or 0.25 μm/hr or less). The average growth rate of the material can range from any of the minimum values described above to any of the maximum values described above. For example, the material made by the methods described herein can be grown at an average growth rate of from 0.1 to 100 μm/hr (e.g., from 0.1 to 50 μm/hr, from 50 to 100 μm/hr, from 1 to 20 μm/hr, from 20 to 40 μm/hr, from 40 to 60 μm/hr, from 60 to 80 μm/hr, from 80 to 100 μm/hr, from 0.1 to 90 μm/hr, from 1 to 100 μm/hr, or from 1 to 90 μm/hr).

Also disclosed herein are methods comprising of depositing a material, for example a III-V semiconductor material, on one or more substrates via laser-assisted metal-organic chemical vapor deposition using any of the devices described herein. Also disclosed herein are coated substrates made by any of the methods described herein. Also disclosed herein are methods of use of any of the coated substrates made by any of the methods described herein, for example in optical devices, electronic devices, etc. Also disclosed herein are systems comprising any of the devices described herein and one or more components assembled therewith.

A number of embodiments of the invention have been described. Nevertheless, it will be understood that various modifications may be made without departing from the spirit and scope of the invention. Accordingly, other embodiments are within the scope of the following claims.

The examples below are intended to further illustrate certain aspects of the systems and methods described herein, and are not intended to limit the scope of the claims.

EXAMPLES

The following examples are set forth below to illustrate the methods and results according to the disclosed subject matter. These examples are not intended to be inclusive of all aspects of the subject matter disclosed herein, but rather to illustrate representative methods and results. These examples are not intended to exclude equivalents and variations of the present invention which are apparent to one skilled in the art.

Efforts have been made to ensure accuracy with respect to numbers (e.g., amounts, temperature, etc.) but some errors and deviations should be accounted for. Unless indicated otherwise, parts are parts by weight, temperature is in ° C. or is at ambient temperature, and pressure is at or near atmospheric. There are numerous variations and combinations of measurement conditions, e.g., component concentrations, temperatures, pressures and other measurement ranges and conditions that can be used to optimize the described process.

Example 1

Described herein are methods and devices for suppressing background carbon incorporation using laser-assisted MOCVD growth of nitride based semiconductors. For example, described herein are growth methods and reactor designs for laser assisted MOCVD to minimize background carbon impurities incorporation in nitride-based semiconductor materials and devices. The issue of background C impurity in nitride-based semiconductors represents one of the key bottlenecks for advancing device technologies.

Nitride based semiconductors include group III-Nitride, group II-IV-N$_2$, and other N-contained semiconductors. Among the nitride-based semiconductors, group-III nitrides, including InN, GaN, AlN, BN and their alloys, represent technologically important materials for both optoelectronic and electronic device applications. The direct energy band gaps of III-nitrides can range between 0.64 and 6.14 eV, which covers a wide spectral range from deep ultraviolet to infrared. Moreover, III-nitrides have high electron saturation velocity, high critical electric field, high radiation resistance, and decent thermal performance Therefore, III-nitrides have attracted significant interests in device applications (Matsuoka et al. Applied Physics Letters 81 (7), 1246-1248 (2002); Wu. Journal of Applied Physics 106 (1), 5 (2009); Mukai et al. Japanese Journal of Applied Physics 38 (7R), 3976 (1999); Mishra et al. Proceedings of the IEEE 90 (6), 1022-1031 (2002)).

Metalorganic chemical vapor deposition (MOCVD) represents an industry preferred semiconductor growth method, which has been widely adopted in the production of nitride-based optoelectronic and electronic devices, such as light-emitting diodes, lasers, and high-frequency, high-power transistors. The typical group-III precursors are metalorganics, such as trimethylgallium (TMGa), triethylgallium (TEGa), trimethylindium (TMIn), trimethylaluminum (TMAl), etc. As a result, carbon impurities originating from the precursors are often incorporated in relatively high concentrations in III-nitrides grown by MOCVD. For example, the unintentionally doped carbon concentrations in MOCVD grown GaN films are typically at mid-$10^{15}$ to low-$10^{16}$ cm$^{-3}$ (Zhang et al. Phys. Status Solidi A 2021, 2000469). It has been proposed that carbon is incorporated preferentially as a substitution on nitrogen site in n-type GaN, giving rise to a deep acceptor level, which is responsible for compensating the n-type doping (Wu et al. Physical review letters, 2018, 121(14): 145505). The relatively high background carbon concentration limits the capability of achieving controllable low doping at low-mid $10^{15}$ cm$^3$ level in GaN epi-film, which is a key requirement of GaN-on-GaN vertical devices targeting for high power applications (Ohta et al. Jpn. J. Appl. Phys. 57(4S), 04FG09 (2018); Baliga, Fundamentals of Power Semiconductor Devices, Springer Science & Business Media, 2010).

Moreover, the deep nature of the carbon acceptors can also account for radiative and non-radiative recombination centers in nitrides. It has been reported that the carbon impurities can give rise to the widely observed yellow luminescence of GaN, though there is likely more than one source that contribute for the yellow luminescence (Lyons et al. Appl. Phys. Lett. 97, 152108 (2010)). The carbon impurities can also induce deep levels in the band gap of MN which can lead to a broad ultraviolet luminescence band (Nagashima et al. Applied Physics Express, 2012, 5(12): 125501). As for InN, the impact of carbon impurities on the optical properties is still not well established because of the nature of narrow band gap of InN. But the emission efficiency of InGaN based LEDs was improved with lower residual carbon in InGaN/GaN MQWs (Yang et al. Optics Express, 2016, 24(13): 13824-13831). Clearly, the incorporated carbon impurities in III-nitrides can affect device performances and raise reliability issues.

The carbon incorporation in MOCVD III-nitrides is significantly affected by the stoichiometric balance, which depends on the effective precursor molar ratio of N species and group-III species Ammonia ($NH_3$) is the most widely used precursor for N in MOCVD epitaxy of III-nitrides. However, the cracking efficiency of $NH_3$ is very low at the typical growth temperatures of III-nitrides. It was reported that pyrolysis of $NH_3$ starts approximately at 450° C. And the thermal decomposition efficiency is only ~4% even at temperature as high as 950° C., which is typical for GaN MOCVD growth (White et al. J. Am. Chem. Soc. 27, 373-386 (1905); Ban. J. Electrochem. Soc. 119, 761-765 (1972)). The limited N species can facilitate the formation of nitrogen vacancies and hence the incorporation of carbon impurities, which preferentially occupy the nitrogen sites.

Figure 34:
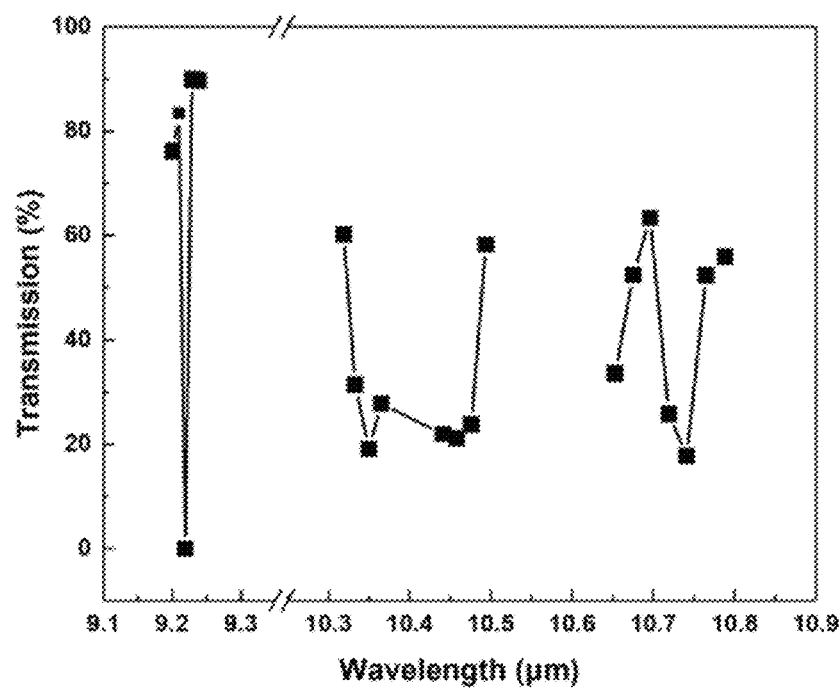
FIG. 34 shows the transmission % of a tunable $CO_2$ laser beam with different wavelength through an MOCVD reactor with a constant $NH_3$ flow rate.
Figure 35:
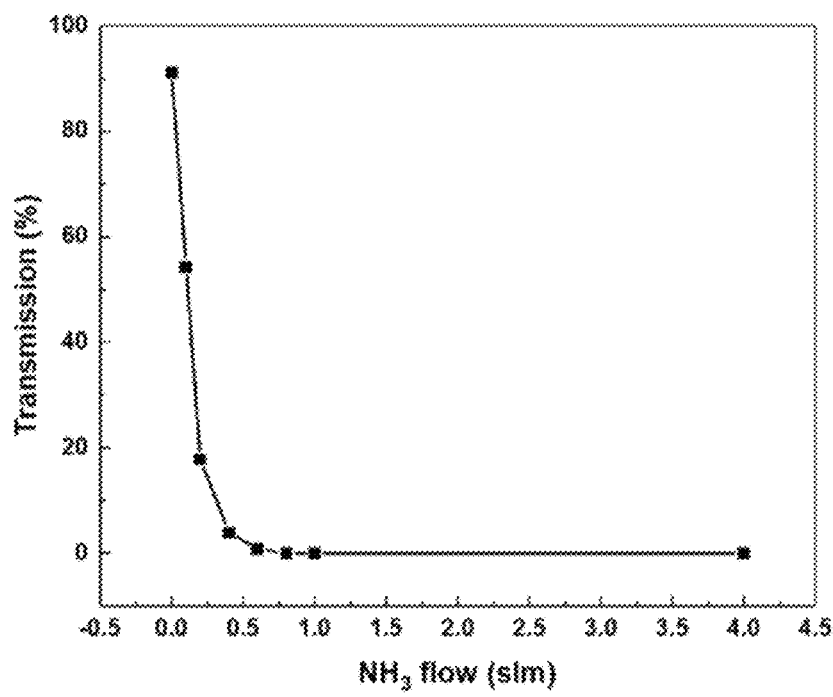
FIG. 35 shows the transmission % of a tunable $CO_2$ laser beam at 9.219 µm as a function of the $NH_3$ flow rate.

One of the strategies to suppress the carbon incorporation in MOCVD epitaxy of III-nitrides is to increase the N radicals through the enhancement of $NH_3$ cracking efficiency. From previous studies, the infrared active vibrational modes of a molecule can be excited by using resonant wavelengths, which in turn leads to the breaking of atomic bonds (Zare. Science 279, 1875 (1998)). The wagging modes of $NH_3$ at 932.51, 968.32 and 1084.63 cm$^{-1}$ coincides with the 10.719, 10.35 and 9.219 μm optical wavelengths (Golgir et al. Cryst. Growth Des. 14, 6248-6253 (2014)). These wavelengths can be generated from an infrared (IR) laser, for example, a tunable $CO_2$ laser. Described herein is an MOCVD reactor with a vertical showerhead design, where the $CO_2$ laser passes through the reactor chamber with a parallel beam 2 mm above the sample surface. FIG. 34 shows the wavelength dependent transmission rate of CO2 laser beam through an MOCVD reactor with a constant $NH_3$ flow rate and reactor pressure. It shows that 9.219 μm has the strongest absorption when passing through the $NH_3$ gas. FIG. 34 shows the dependence of laser transmission at wavelength of 9.219 μm as a function of the NH3 flow rate. The transmission % of the laser beam strongly depends on the $NH_3$ flow rate, indicating the laser beam was fully absorbed by $NH_3$ when the $NH_3$ flow rate is higher than 1 slm.

Figure 36:
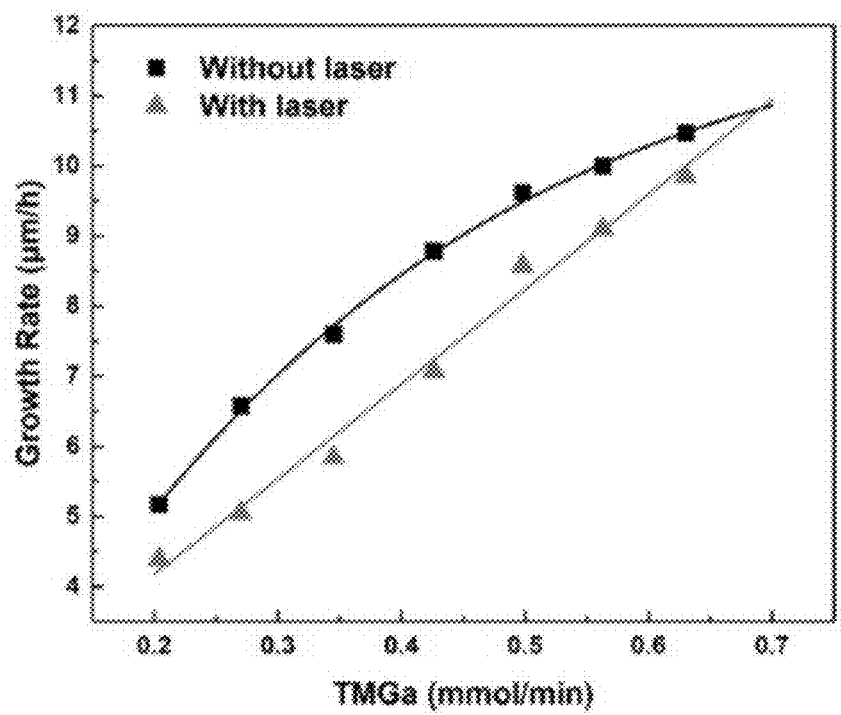
FIG. 36 shows a comparison of MOCVD GaN growth rate as a function of the TMGa molar flow rate without and with $CO_2$ laser irradiation.

For typical MOCVD growth of GaN, much higher V/III ratio is used to grow high quality GaN films. GaN growth rate increases as TMGa increases. However, as the TMGa increases further, the V/III ratio decreases, and eventually the growth rate will be limited by the available N precursor, as shown in FIG. 36. In contrast, by implementing a 9.219 μm laser with 250 W power, the efficient decomposition of $NH_3$ allows the maintenance of high V/III ratio even TMGa increases. Therefore, the GaN growth rate increases monotonically as TMGa increases, as shown in FIG. 36. This indicates that the growth mechanisms gradually transformed from Ga-limited region to N-limited region due to limited $NH_3$ pyrolysis efficiency in the conventional MOCVD GaN. In the case of laser assisted MOCVD growth of GaN, the growth rates depends on the TMGa flow rate within the range studied in FIG. 36.

The methods and devices described herein suppress background C incorporation in nitride-based semiconductor MOCVD growth, which is extremely important when fast growth rate is required. For example, as shown in FIG. 36, the C impurity concentrations in the GaN films grown with growth rates >2-3 um/hr are expected to be much higher than the typical MOCVD GaN growth conditions. By employing the proposed growth techniques, one can achieve fast GaN growth rate while maintaining low C impurity concentration.

Figure 37:
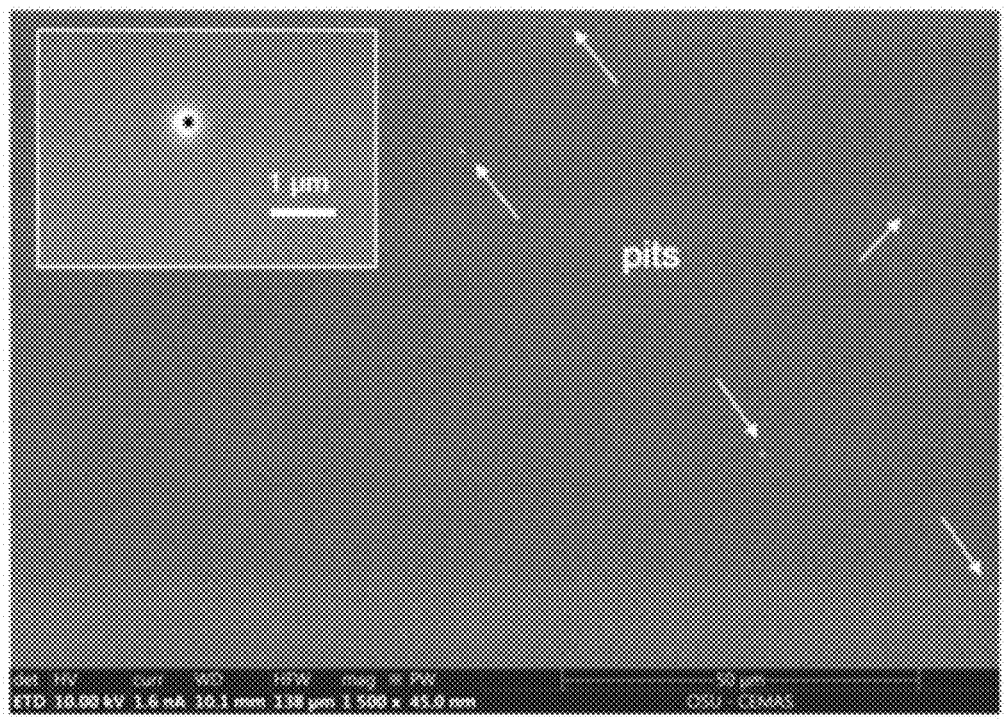
FIG. 37 is a SEM image for a GaN film grown without $CO_2$ laser irradiation. The inset is the SEM image of a pit with large magnification.
Figure 38:
FIG. 38 is a SEM image for a GaN film grown with $CO_2$ laser irradiation.

FIG. 37 and FIG. 38 show the SEM images for GaN films grown without and with CO2 laser irradiation, respectively. The growth conditions, including chamber pressure (150 torr), TMGa flow rates ($5.63 \times 10^{-4}$ mol/min), V/III ratio (317) and surface temperature (1024° C.), were set the same. The growth rates of GaN samples grown without and with laser irradiation were 9.3 μm/h and 8.5 μm/h, respectively. As shown in FIG. 37, V-type pits were observed at density of about $4 \times 10^4$ cm$^{-2}$ on the surface of the sample grown without laser irradiation. The large magnification SEM image of the surface pit was shown as the inset in FIG. 37. The V-pits are typical for GaN grown under low V/III ratio or low temperature when the effective N species supply is not sufficient. In the case of the laser assisted MOCVD growth of GaN film, no obvious pits were observed, indicating improved $NH_3$ cracking efficiency with laser irradiation.

Figure 39:
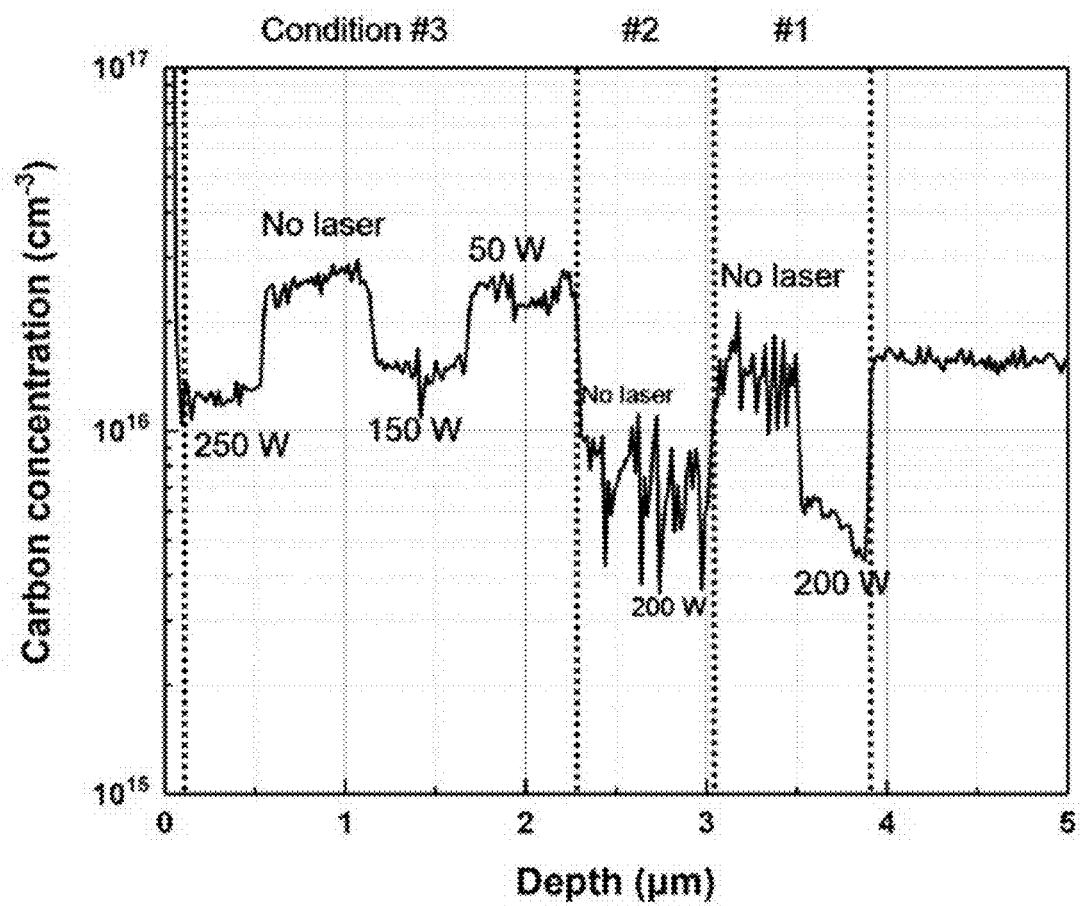
FIG. 39 is a quantitative SIMS profile of carbon concentrations in multiple GaN stacks grown with different growth conditions and laser beam parameters.
Figure 40:
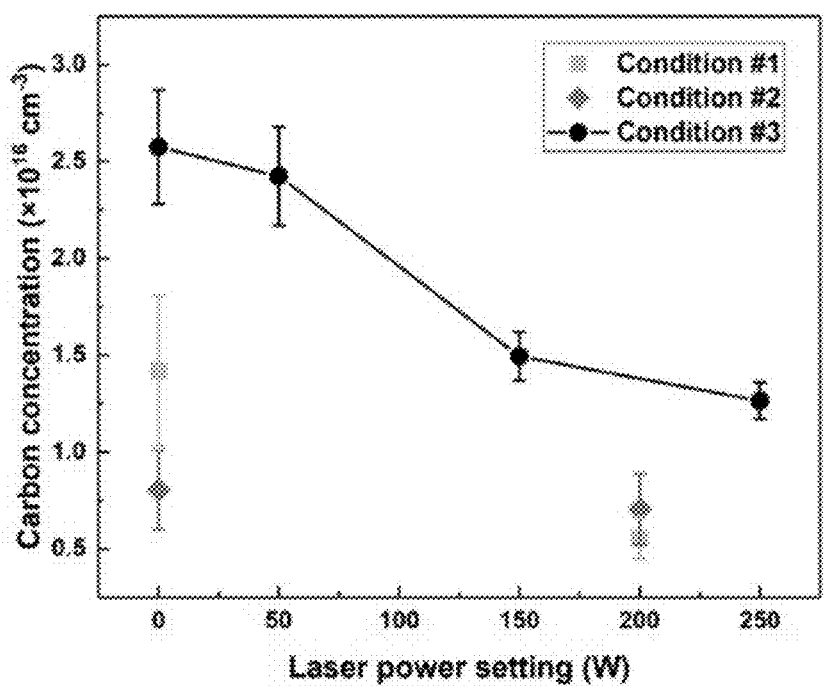
FIG. 40 shows the background C concentration as a function of laser power with different growth conditions (#1, #2, and #3).

FIG. 39 shows quantitative SIMS profile of carbon impurity concentrations in multiple GaN stacks grown with different growth conditions and laser beam parameters. The growth conditions for each sublayer were summarized in Table 1. FIG. 40 shows the extracted carbon level in different GaN sublayers as a function of the laser power. For GaN layers grown without laser, the background carbon concentrations increased when the VIII ratio or chamber pressure is lower. The carbon incorporations were suppressed by laser irradiation for all the growth conditions (#1, #2, and #3), as compared to that without laser. Moreover, as shown in FIG. 40, a clear trend can be seen that the carbon concentration decreases with increasing of the laser power.

The results demonstrate that $CO_2$ laser can be successfully used to suppress the carbon impurities of MOCVD grown GaN films.

TABLE 1

Summary of growth conditions.

| | Pressure (torr) | Temperature (° C.) | $NH_3$ (slm) | TMGa (mmol/min) | V/III ratio |
|---|---|---|---|---|---|
| Condition #1 | 200 | 950 | 4 | 0.2 | 892.9 |
| Condition #2 | 200 | 950 | 4 | 0.07 | 2551 |
| Condition #3 | 150 | 950 | 4 | 0.2 | 892.9 |

Figure 41:
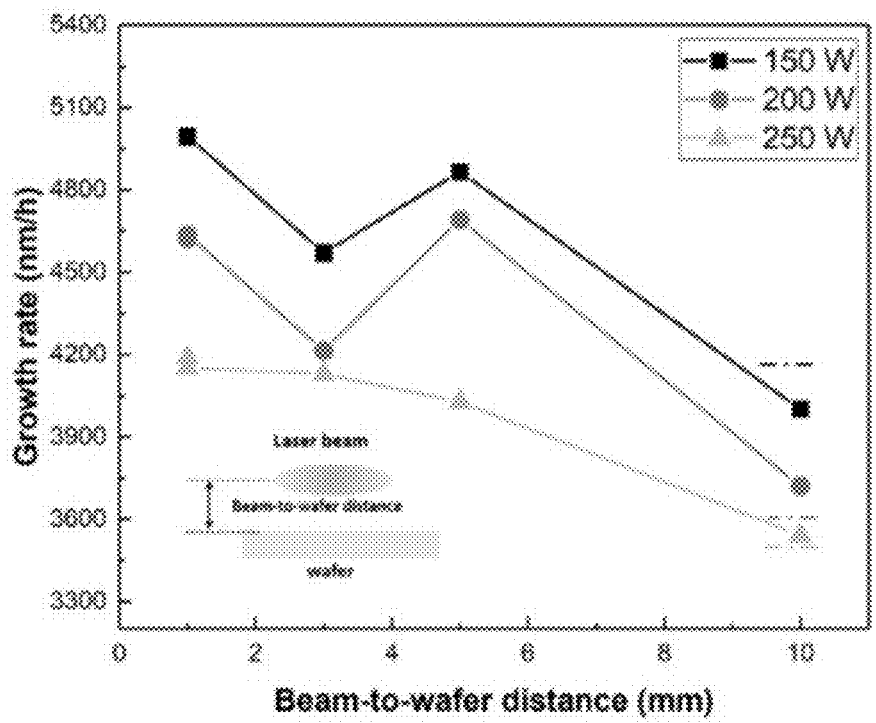
FIG. 41 shows the GaN MOCVD growth rate as a function of the beam-to-wafer distance for various laser power (150, 200, and 250 W) with lens. The dashed lines indicate the growth rate obtained with original Gaussian shape laser beam.

However, the laser interaction with $NH_3$ can also increase the parasitic gas phase reaction if the decomposition of $NH_3$ happens prior the species reach the growth surface. FIG. 41 shows the trend of the GaN growth rate as a function of the beam-to-wafer surface distance, for different laser power (150 W, 200 W, 250 W). In this study, the laser beam was compressed to an oval shape (14 mm*4 mm) from the original Gaussian distributed laser beam (14 mm*14 mm) using a ZnSe lens. The dashed lines in FIG. 41 indicate the growth rate obtained with the original laser beam without the lens. As shown in FIG. 41, the growth rate decreases when the laser beam moved away from the growth surface, which means the parasitic gas phase reaction becomes more severe. In addition, the by-products of parasitic gas phase reaction can also deteriorate the growth quality and promote the impurities incorporation. Therefore, the laser beam used for low carbon incorporation in III-nitride MOCVD growth can have an enhanced $NH_3$ cracking efficiency and suppressed parasitic gas phase reaction.

To summarize parameters that can affect the laser-assisted GaN MOCVD epitaxy:
1) MOCVD GaN film growth rate increases as TMGa precursor flow rate increases, and the background C impurity incorporation increases simultaneously. The use of the laser-assisted growth technique with efficient cracking efficiency of $NH_3$ can suppress C impurity incorporation significantly. This approach can enable MOCVD GaN growth with growth rate of up to 15-20 um/hr and with low background C impurity concentration at low-mid $10^{15}$ $cm^{-3}$.
2) The $NH_3$ cracking efficiency is proportional to the resonant laser power density. Higher flow rate of $NH_3$ will require higher laser power in order to efficiently crack the injected $NH_3$ precursor.
3) The suppression of C impurity incorporation depends on the laser power density. The higher the laser power density used, the lower C impurity incorporation in the GaN epitaxial film. The minimum power density is 50 W with a laser beam diameter of 14 mm. The laser power can be increased to 1000 W or even higher. Also, the laser power density can be increased by employing a lens to focus the beam to small sizes.
4) The position of the laser beam introduced into the growth chamber should be placed close to the growth surface (between 0 to 10 mm) When the laser beam is placed away from the growth chamber, it will facilitate the gas phase reaction and leads to the reduction of GaN growth rate, and potential particle formation.

Laser Beam Delivery Path

Figure 42:
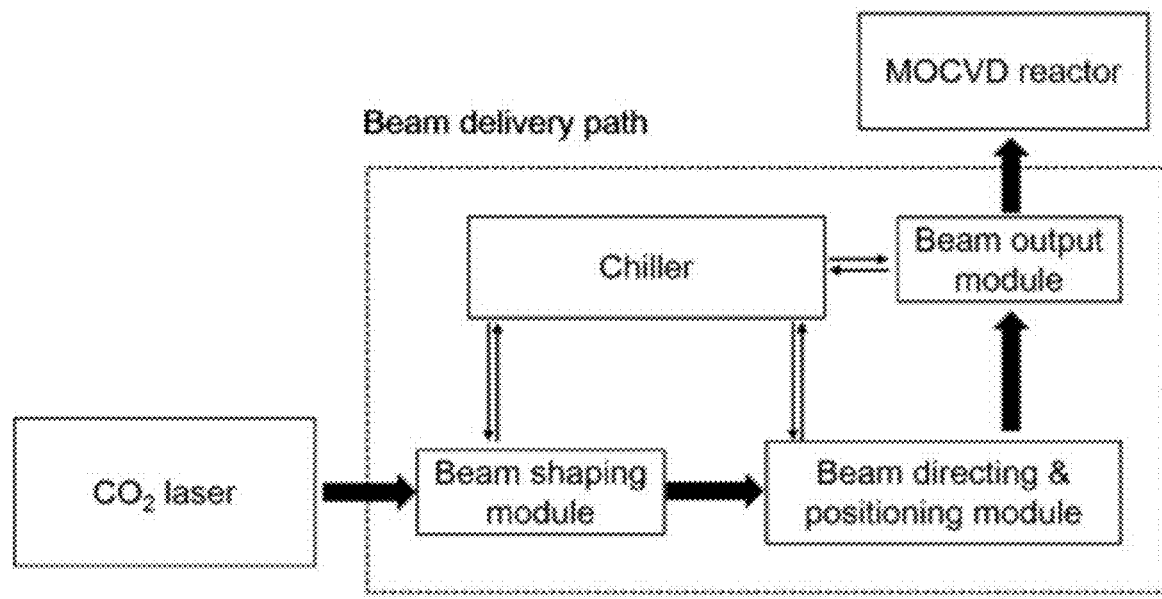
FIG. 42 is a schematic of a beam delivery path between a $CO_2$ laser instrument and a MOCVD reactor.

FIG. 42 is a schematic of a beam delivery path between a $CO_2$ laser instrument and MOCVD reactor which includes a beam shaping module, a beam directing and positioning module, a beam output module, and a chiller.

The beam shaping module is used to produce desired beam shapes or beam arrays. It can include lenses, mirrors, beam expanders, gratings, beam splitter, etc.

The beam directing and positioning module is used to deliver the laser beam from the $CO_2$ laser instrument to the MOCVD reactor with adjustable direction and position inside the MOCVD reactor. It can include mirrors, mechanical components, etc.

The beam output module is used to connect the MOCVD reactor compactly. It can include mechanical components.

The chiller is used to remove heat generated in the beam delivery path during laser operation.

MOCVD Reactor

Figure 43:
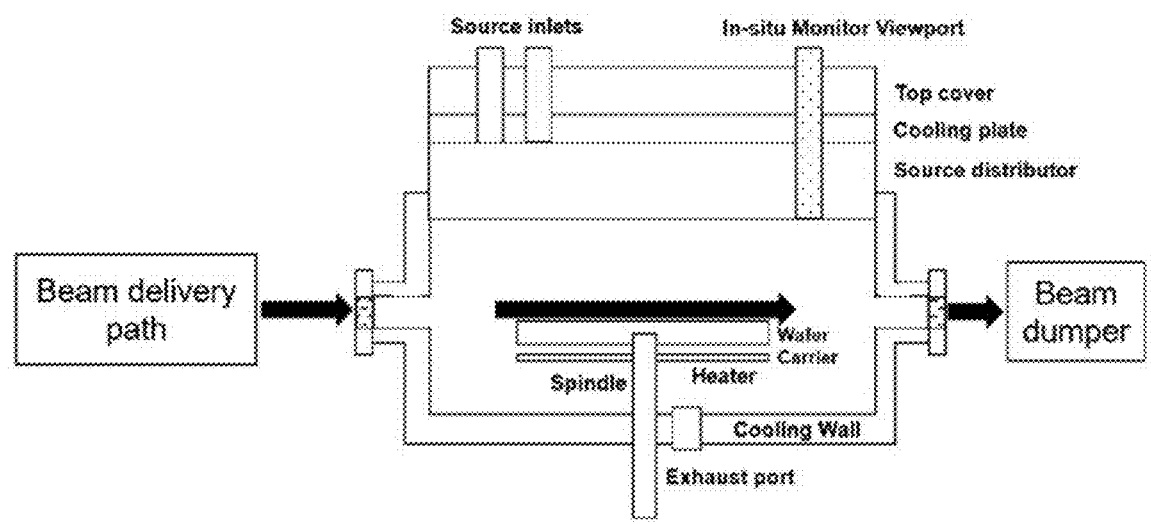
FIG. 43 is a sectional schematic view of an example laser assisted MOCVD reactor.

FIG. 43 shows a schematic of the laser assisted MOCVD reactor which includes a chamber frame and shower head.

The chamber frame comprises a cooling wall, multiple viewports, rotary spindle, and heating plate. The chamber frame and multiple viewports are hollow and are designed for cooling process water to take away the heat from heater and scattering laser energy. The rotary spindle is installed in the center of chamber. The wafer carrier is sat on the top of spindle and above the heating plate. The dimension of wafer carrier can be scaled up, considering the dimension of chamber frame, e.g., for multiple wafer production. The spindle is surrounded by the heating plate. The viewports contain windows which have a high transmission rate for the laser beam. The laser beams or laser arrays pass through the one or more viewports and interact with the precursors in the reactor. The direction and position of laser beam inside the reactor determined by the beam shaping module and beam directing & positioning module in beam delivery path.

Figure 44:
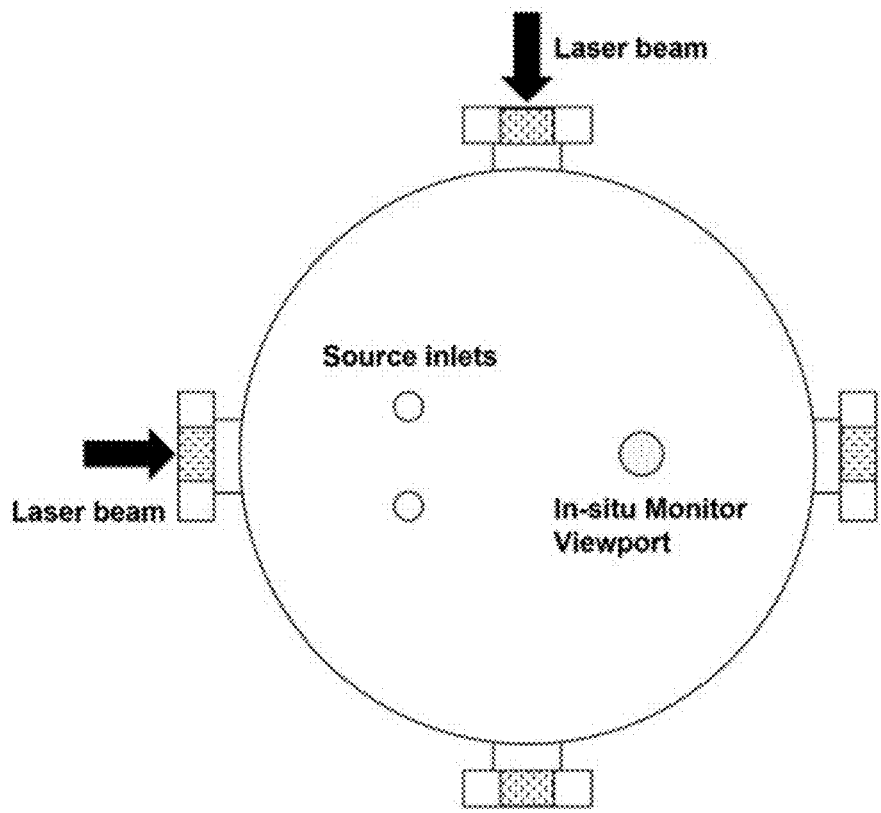
FIG. 44 is a top schematic view of an example laser assisted MOCVD reactor.

FIG. 44 shows an example of laser assisted MOCVD reactor with four viewports, while the laser beams or laser arrays are input from two orthogonal directions. The laser beam energy can be fully absorbed inside the reactor, or absorbed by beam dumper installed outside the reactor.

The shower head comprises source inlets, a source distributor, cooling plate and top cover and in-situ monitor viewport. The III-group precursor, V-group precursor, and doping sources are mixed with carrier gases, then injected from the source distributor. The cooling plate is inserted between top cover and source distributor to remove heat generated from the heating plate and scattered laser energy. The precursor inlets are integrated in the top cover and connected with the source distributor.

MOCVD Reaction Mechanisms

The TMGa thermal decomposition pathway is:

$$(CH_3)_3Ga \rightarrow (CH_3)_2Ga + CH_3 \quad (1)$$

$$(CH_3)_2Ga \rightarrow (CH_3)Ga + CH_3 \quad (2)$$

$$(CH_3)Ga \rightarrow Ga + CH_3 \quad (3)$$

The thermal decomposition of TMGa happens at approximately 723 K. Thus, this pathway is significant only near the hot growth surface.

The adduct formation and oligomerization pathway is:

$$(CH_3)_3Ga + NH_3 \rightarrow (CH_3)_3Ga:NH_3 \quad (4)$$

$$(CH_3)_3Ga:NH_3 \rightarrow (CH_3)_2Ga:NH_2 + CH_4 \quad (5)$$

$$3[(CH_3)_3Ga:NH_3] \rightarrow [(CH_3)_2Ga:NH_2]_3 \quad (6)$$

$$[(CH_3)_2Ga:NH_2]_3 \rightarrow 3GaN + 6CH_4 \quad (7)$$

The activation energies of reactions in the adduct and oligomerization pathway are relatively low and thus this pathway can happen at lower temperatures in the gas phase away from the growth surface.

The $NH_3$ pyrolysis and laser assisted cracking pathway is:

$$NH_3 \rightarrow NH_2 + H \quad (8)$$

$$NH_2 \rightarrow NH + H \quad (9)$$

The pyrolysis of $NH_3$ is generally not considered to be a major competing pathway due to its low efficiency. The $CO_2$ laser beam can significantly promote $NH_3$ cracking and provide sufficient $NH_2$ and NH species.

Figure 45:
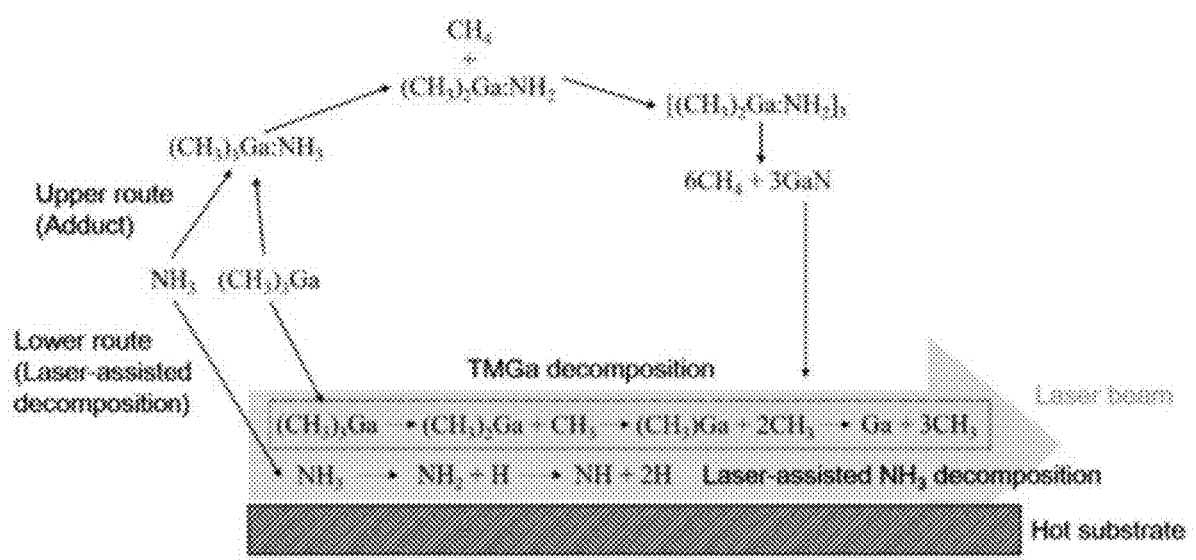
FIG. 45 shows the GaN chemical reaction pathway with $CO_2$ laser beam passing through the growth surface.

FIG. 45 shows the GaN chemical reaction pathway with $CO_2$ laser beam passing through the growth surface. The formation of adduct is believed to degrade the film quality and consumes the precursors. Particles and impurity incorporation can be serious with gas-phase reactions in the adduct pathway absorbing on the growth surface. The laser assisted $NH_3$ cracking close to the growth interface can promote the GaN deposition through the TMGa decomposition pathway and hence suppresses the adduct pathway. Therefore, the unintentional carbon incorporation can be suppressed with the growth methods described herein.

Chamber Design

The chamber is designed for laser assisted MOCVD growth for nitride-based semiconductors targeting for low background C incorporation. This apparatus design can be used for single or multiple wafer growth. A typical GaN growth can be performed by the following steps:

1. The substrates are loaded on wafer carriers and then transferred to the growth chamber. The substrates can be bulk GaN, GaN template, sapphire, Si, SiC and etc. GaN growth on GaN template is introduced here as an example.
2. The wafer carriers are loaded on spindle.
3. The rotation speed of the wafer carrier, the heater power, the chamber pressure, and the process gas flow rates are ramped up. $NH_3$ can be supplied during heating up to prevent decomposition of substrates.
4. A thermal cleaning process with $H_2$ carrier gas can be used prior GaN growth.
5. After thermal cleaning, the laser system is turned on. The laser energy is introduced to the chamber.
6. $NH_3$ interacting with the laser beam crack first and then the cracked N species are distributed from the laser input region to other regions due to the high rotation speed of the wafer carrier.
7. TMGa is introduced into the growth chamber after several minutes of stabilization of $NH_3$ cracking. Laser-assisted GaN growth will initiate after TMGa is introduced into the chamber.
8. TMGa and the laser system are turned off when the growth finishes. $NH_3$ can be kept on to protect the GaN epilayer from decomposition at high temperatures.
9. The heater power and rotation speed are ramped down. $NH_3$ can be turned off when temperature is low enough.
10. The wafer carriers can be taken out from the growth chamber after the growth recipe is complete.

This laser-assisted MOCVD chamber design and growth technique can provide a new route to achieve III-N materials and devices with low background carbon incorporation, which is not possible with the conventional chamber design and growth technique. The same concept of laser-assisted MOCVD chamber design and growth technique can be applied for materials systems other than III-nitrides, such as II-IV-$N_2$, and other nitride based semiconductors. For other materials than nitrides, a similar method is applicable but a different laser excitation wavelength may be needed for efficient coupling between the laser beam with the precursors.

Other advantages which are obvious and which are inherent to the invention will be evident to one skilled in the art. It will be understood that certain features and sub-combinations are of utility and may be employed without reference to other features and sub-combinations. This is contemplated by and is within the scope of the claims. Since many possible embodiments may be made of the invention without departing from the scope thereof, it is to be understood that all matter herein set forth or shown in the accompanying drawings is to be interpreted as illustrative and not in a limiting sense.

The methods of the appended claims are not limited in scope by the specific methods described herein, which are intended as illustrations of a few aspects of the claims and any methods that are functionally equivalent are intended to fall within the scope of the claims. Various modifications of the methods in addition to those shown and described herein are intended to fall within the scope of the appended claims. Further, while only certain representative method steps disclosed herein are specifically described, other combinations of the method steps also are intended to fall within the scope of the appended claims, even if not specifically recited. Thus, a combination of steps, elements, components, or constituents may be explicitly mentioned herein or less, however, other combinations of steps, elements, components, and constituents are included, even though not explicitly stated.

What is claimed is:

1. A laser-assisted metal-organic chemical vapor deposition (MOCVD) device, the device comprising:
    a wall defining a chamber;
    a set of laser windows, wherein each of the laser windows defines an exterior face, an interior face opposite and spaced apart from the exterior face, and an optical path extending between the interior face and the exterior face;
    wherein each of the laser windows is disposed within the wall such that the interior face further defines the chamber;
    a set of conduits, wherein each of the conduits defines an inlet, an outlet opposite and spaced apart from the inlet, and a path for fluid flow extending from the inlet to the outlet; and
    wherein, when the device is assembled together with a rotatable substrate support surface disposed within the chamber and a laser device for producing a laser beam:
    at least one of the set of laser windows is configured such that the interior face of the laser window directs the laser beam from the laser device across the chamber in a plane that is above and substantially parallel to the rotatable substrate support surface disposed within the chamber, wherein the laser beam is disposed above the rotatable substrate support surface by a distance of 10 mm or less; and
    the outlets of the set of conduits are configured to introduce a first precursor and a second precursor into the chamber toward the rotatable substrate support surface, such that the first precursor and the second precursor flow through the laser beam within the chamber prior to reaching the rotatable substrate support surface.

2. The device of claim 1, wherein the first precursor is a V-group precursor and the second precursor is a III-group precursor.

3. The device of claim 1, wherein the outlets of the set of conduits are configured to introduce the first precursor and the second precursor substantially perpendicular to a central axis of the laser beam within the chamber.

4. The device of claim 1, further comprising a source distributor, wherein the set of conduits are defined by the source distributor.

5. The device of claim 4, wherein the outlets of the set of conduits are evenly spaced throughout the source distributor.

6. The device of claim 1, wherein the set of conduits comprise a set of first conduits and a set of second conduits, the outlets of the set of first conduits being configured to introduce the first precursor into the chamber toward the rotatable substrate support surface, the outlets of the set of second conduits being configured to introduce the second precursor into the chamber toward the rotatable substrate support surface.

7. The device of claim 1, wherein the laser beam is disposed above the rotatable substrate support surface by a distance of 5 mm or less.

8. The device of claim 1, wherein the set of laser windows comprises a plurality of laser windows positioned within the wall, wherein the plurality of laser windows are spaced around a periphery of the chamber.

9. The device of claim 8, wherein the plurality of laser windows are evenly spaced around the periphery of the chamber.

10. The device of claim 8, wherein each laser window is disposed opposite another laser window across the chamber.

11. The device of claim 10, wherein at least one of the set of laser windows is configured such that the interior face of the laser window receives the laser beam after it has traversed the chamber.

12. The device of claim 11, further comprising a laser dumper configured to receive the laser beam after is has traversed the laser window.

13. The device of claim 1, further comprising a laser device for producing the laser beam.

14. A laser-assisted metal-organic chemical vapor deposition (MOCVD) device, the device comprising:
    a wall defining a chamber;
    a plurality of laser windows, wherein each of the laser windows defines an exterior face, an interior face opposite and spaced apart from the exterior face, and an optical path extending between the interior face and the exterior face;
    wherein each of the laser windows is disposed within the wall such that the interior face further defines the chamber;
    wherein the plurality of laser windows comprises one or more laser window pairs, each laser window in each pair being disposed opposite the other across the chamber;
    a source distributor defining a set of conduits, wherein each of the set of conduits defines an inlet, an outlet opposite and spaced apart from the inlet, and a path for fluid flow extending from the inlet to the outlet;
    wherein, when the device is assembled together with a rotatable substrate support surface disposed within the chamber, a laser device for producing a laser beam, and a laser dumper for receiving the laser beam:
    one of the laser windows in each pair is configured such that the interior face of the laser window directs the laser beam from the laser device across the chamber in a plane that is above and substantially parallel to the rotatable substrate support surface disposed within the chamber, wherein the laser beam is disposed above the rotatable substrate support surface by a distance of 10 mm or less;
    the other laser window in each pair is configured such that the interior face of the laser window receives the laser beam after it has traversed the chamber and directs the received laser beam to the laser dumper; and
    the outlets of the set of conduits are configured to introduce a first precursor and a second precursor into the chamber toward the rotatable substrate support surface, such that the first precursor and the second precursor flow through the laser beam within the chamber prior to reaching the rotatable substrate support surface.

15. The device of claim 14, wherein the first precursor is a V-group precursor and the second precursor is a III-group precursor.

16. The device of claim 14, wherein the laser beam is disposed above the rotatable substrate support surface by a distance of 5 mm or less.

17. A method of depositing a material from a first precursor and a second precursor on one or more substrates disposed on rotatable substrate support surface within a chamber via laser-assisted metal-organic chemical vapor deposition, the method comprising:
    directing a laser beam across a chamber in a plane that is above and substantially parallel to a rotatable substrate support surface disposed within the chamber, wherein the laser beam is disposed above the rotatable substrate support surface by a distance of 10 mm or less;
    introducing a first precursor and a second precursor into the chamber toward the rotatable substrate support surface, such that the first precursor and the second precursor flow through the laser beam within the chamber prior to reaching the rotatable substrate support surface; and
    heating the one or more substrates at a temperature sufficient to thermally decompose the second precursor at or near the one or more substrates, thereby generating a thermal decomposition species in situ;
    wherein the laser beam comprises electromagnetic radiation with at least one wavelength that overlaps with at least a portion of a vibrational mode of the first precursor, thereby generating an irradiated first precursor in situ;
    wherein the irradiated first precursor and the thermal decomposition species react to form the material, which deposits on the one or more substrates.

18. The method of claim 17, wherein the first precursor is a V-group precursor and the second precursor is a III-group precursor.

19. The method of claim 17, wherein the method suppresses incorporation of carbon into the material.

20. A material made by the method of claim 17, wherein the material has a lower amount of carbon incorporated therein relative to the amount of carbon incorporated in a material made using a comparable method, but wherein the laser beam is located at a distance greater than 10 mm above the rotatable substrate support surface.

* * * * *